(12) United States Patent
Lamkin et al.

(10) Patent No.: US 10,620,294 B2
(45) Date of Patent: Apr. 14, 2020

(54) INFLATED TUBULAR SOLAR CONCENTRATORS

(71) Applicant: Cool Earth Solar, Inc., Pleasanton, CA (US)

(72) Inventors: Robert Lamkin, Pleasanton, CA (US); James Page, Oakland, CA (US); John Liptac, Livermore, CA (US); Gregory Meess, Oakland, CA (US); Paul Dentinger, Sunol, CA (US); Jacques Belanger, Livermore, CA (US)

(73) Assignee: COOL EARTH SOLAR, INC., Livermore, CA (US)

( * ) Notice: Subject to any disclaimer, the term of this patent is extended or adjusted under 35 U.S.C. 154(b) by 0 days.

(21) Appl. No.: 14/358,592

(22) PCT Filed: Nov. 15, 2012

(86) PCT No.: PCT/US2012/065279
§ 371 (c)(1),
(2) Date: May 15, 2014

(87) PCT Pub. No.: WO2013/074790
PCT Pub. Date: May 23, 2013

(65) Prior Publication Data
US 2014/0373900 A1 Dec. 25, 2014

Related U.S. Application Data

(60) Provisional application No. 61/560,547, filed on Nov. 16, 2011, provisional application No. 61/652,114, filed on May 25, 2012.

(51) Int. Cl.
*H02S 20/10* (2014.01)
*H02S 40/22* (2014.01)
(Continued)

(52) U.S. Cl.
CPC ............. *G01S 3/7861* (2013.01); *F24S 23/00* (2018.05); *F24S 23/31* (2018.05); *F24S 23/745* (2018.05);
(Continued)

(58) Field of Classification Search
CPC ....... H01L 31/054; H02S 20/10; H02S 20/32; H02S 30/20; H02S 40/22; G02B 7/18;
(Continued)

(56) References Cited

U.S. PATENT DOCUMENTS 3,125,091 A * 3/1964 Sleeper ...................... F24J 2/06
  126/624
5,482,571 A * 1/1996 Yamada ................ H01L 31/048
  136/251

(Continued)

FOREIGN PATENT DOCUMENTS

EP 1521044 4/2005

OTHER PUBLICATIONS

International Search Report and Written Opinion for International Application No. PCT/US2012/065279, dated Mar. 26, 2013, 16 pages.

(Continued)

*Primary Examiner* — Bethany L Martin
(74) *Attorney, Agent, or Firm* — Kilpatrick Townsend & Stockton

(57) ABSTRACT

A solar collector utilizes an inflated tubular film which concentrates sunlight onto a solar receiver. The film incorporates refractive elements in a pattern which focuses light in one or two dimensions to create foci in the form of lines, spots, or other shapes. The film may be replaceable. The film may include layers of material to optimize optical, structural, thermal, and durability characteristics.

23 Claims, 120 Drawing Sheets

(51) Int. Cl.

| | |
|---|---|
| G01S 3/786 | (2006.01) |
| G02B 5/04 | (2006.01) |
| G02B 19/00 | (2006.01) |
| G02B 27/09 | (2006.01) |
| H01L 31/054 | (2014.01) |
| H02S 20/00 | (2014.01) |
| F24S 23/30 | (2018.01) |
| F24S 30/452 | (2018.01) |
| F24S 23/00 | (2018.01) |
| F24S 23/74 | (2018.01) |
| F24S 30/425 | (2018.01) |
| G02B 7/183 | (2006.01) |
| H02S 40/00 | (2014.01) |
| F24S 30/00 | (2018.01) |

(52) U.S. Cl.
CPC .......... *F24S 30/425* (2018.05); *F24S 30/452* (2018.05); *G02B 5/04* (2013.01); *G02B 5/045* (2013.01); *G02B 7/183* (2013.01); *G02B 19/0004* (2013.01); *G02B 19/0042* (2013.01); *G02B 27/0972* (2013.01); *H01L 31/0543* (2014.12); *H01L 31/0547* (2014.12); *H02S 20/00* (2013.01); *H02S 40/00* (2013.01); *F24S 2030/14* (2018.05); *F24S 2030/145* (2018.05); *Y02E 10/44* (2013.01); *Y02E 10/47* (2013.01); *Y02E 10/52* (2013.01)

(58) Field of Classification Search
CPC ...... G02B 7/1805; G02B 7/181; G02B 7/183; G01S 3/7861
See application file for complete search history.

(56) References Cited

U.S. PATENT DOCUMENTS

| | | | |
|---|---|---|---|
| 6,111,190 A | 8/2000 | O'Neill et al. | |
| 7,866,035 B2 | 1/2011 | Cummings et al. | |
| 8,074,638 B2 | 12/2011 | Cummings | |
| 9,285,139 B2 | 3/2016 | Page et al. | |
| 2004/0187907 A1* | 9/2004 | Morgal | F24J 2/38 136/246 |
| 2005/0011513 A1* | 1/2005 | Johnson | F24J 2/07 126/698 |
| 2008/0057776 A1 | 3/2008 | Cummings | |
| 2008/0165437 A1 | 7/2008 | DiDomenico | |
| 2008/0168981 A1 | 7/2008 | Cummings et al. | |
| 2008/0174853 A1* | 7/2008 | Danner | G02B 1/105 359/296 |
| 2009/0064994 A1* | 3/2009 | Weatherby | F24J 2/085 126/700 |
| 2009/0223555 A1* | 9/2009 | Ammar | H01L 31/0543 136/246 |
| 2010/0154868 A1* | 6/2010 | Kourtakis | H01L 31/02168 136/251 |
| 2010/0177406 A1 | 7/2010 | Walker | |
| 2010/0224232 A1 | 9/2010 | Cummings et al. | |
| 2010/0278480 A1 | 11/2010 | Vasylyev | |
| 2011/0088686 A1 | 4/2011 | Hochberg et al. | |
| 2011/0100429 A1 | 5/2011 | Mughal | |
| 2011/0277815 A1 | 11/2011 | Sankrithi et al. | |
| 2012/0092772 A1* | 4/2012 | Salomon | F24J 2/06 359/598 |
| 2012/0167949 A1 | 7/2012 | Dentinger et al. | |
| 2012/0201965 A1* | 8/2012 | Soucek | C09D 5/00 427/386 |
| 2012/0227789 A1 | 9/2012 | Lamkin et al. | |
| 2012/0279216 A1 | 11/2012 | Otsuka | |
| 2013/0112239 A1 | 5/2013 | Liptac et al. | |
| 2013/0314774 A1 | 11/2013 | Page et al. | |

OTHER PUBLICATIONS

U.S. Appl. No. 13/676,437, "Non Final Office Action," dated Jul. 28, 2014, 16 pages.
U.S. Appl. No. 13/676,437, "Final Office Action," dated Mar. 19, 2015, 13 pages.
U.S. Appl. No. 13/676,437, "Non-Final Office Action," dated Oct. 29, 2015, 15 pages.
U.S. Appl. No. 13/676,437, "Final Office Action," dated Jul. 12, 2016, 21 pages.
U.S. Appl. No. 13/676,437, "Non Final Office Action," dated Dec. 1, 2016, 34 pages.
O'Neil et al., "Inflatable Lenses for Space Photovoltaic Concentrator Arrays," Presented at the 26th IEEE PVSC, Anaheim California, Oct. 3, 1997, 4 pages.
Jenkins et al., "Surface Precision of Inflatable Membrane Reflectors," ASME, vol. 120, No. 4, Nov. 1, 1998, 8 pages.
Swanson, Photovoltaic Concentrators,, Handbook of Photovoltaic Science and Engineering, Ch. 11, 2003, 55 pages.
Soh et al., "Optimal Thickness Variation of an Inflatable Circular Membrane Mirror," Journal of the Korean Physical Society, vol. 44, No. 4, Apr. 2004, pp. 854-858.
Miller et al., Analysis of Transmitted Optical Spectrum Enabling Accelerated Testing of Multijunction Concentrating Photovoltaic Designs, Optical Engineering, vol. 50, No. 1, Jan. 31, 2011, 17 pages.

* cited by examiner

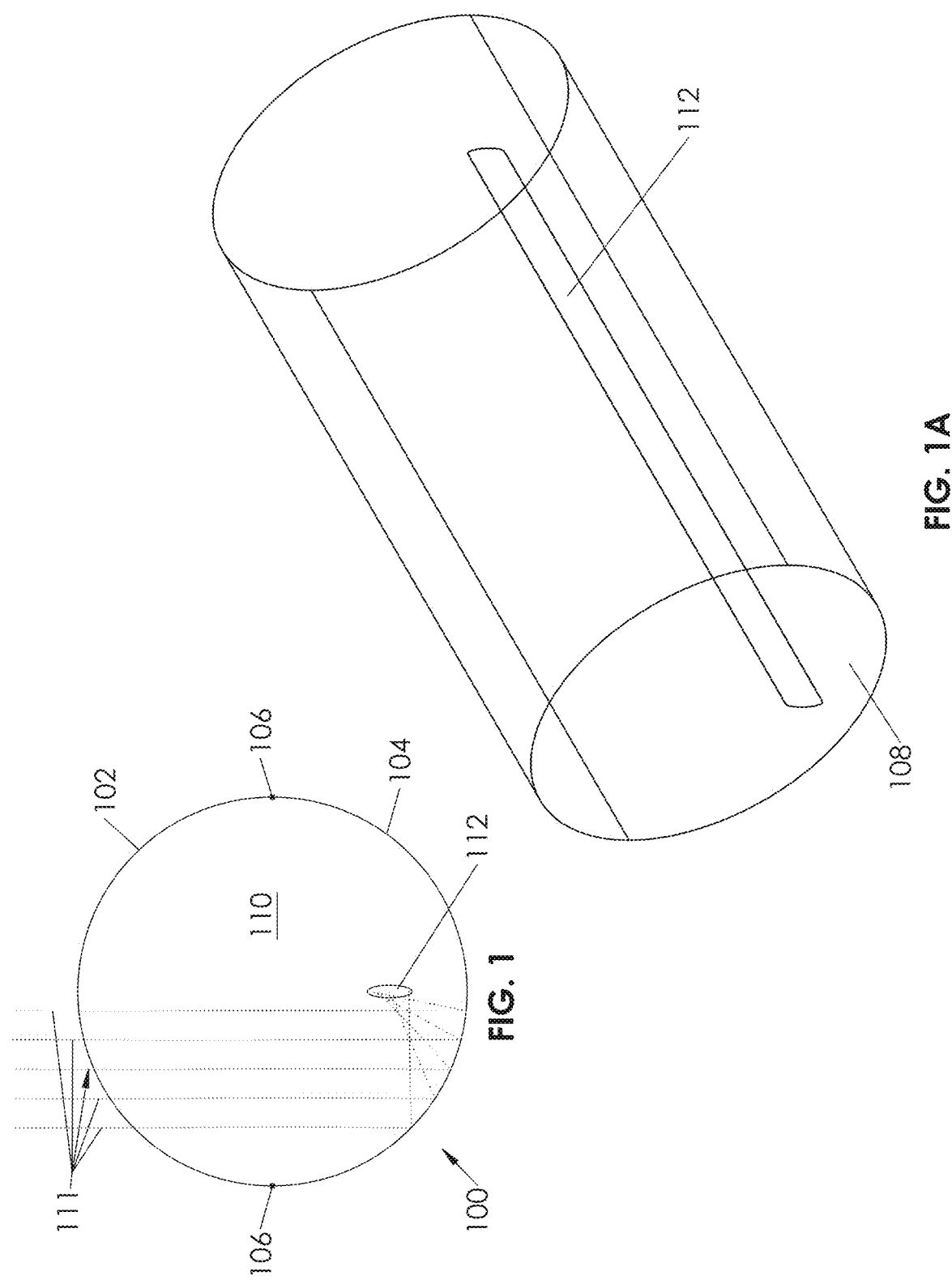

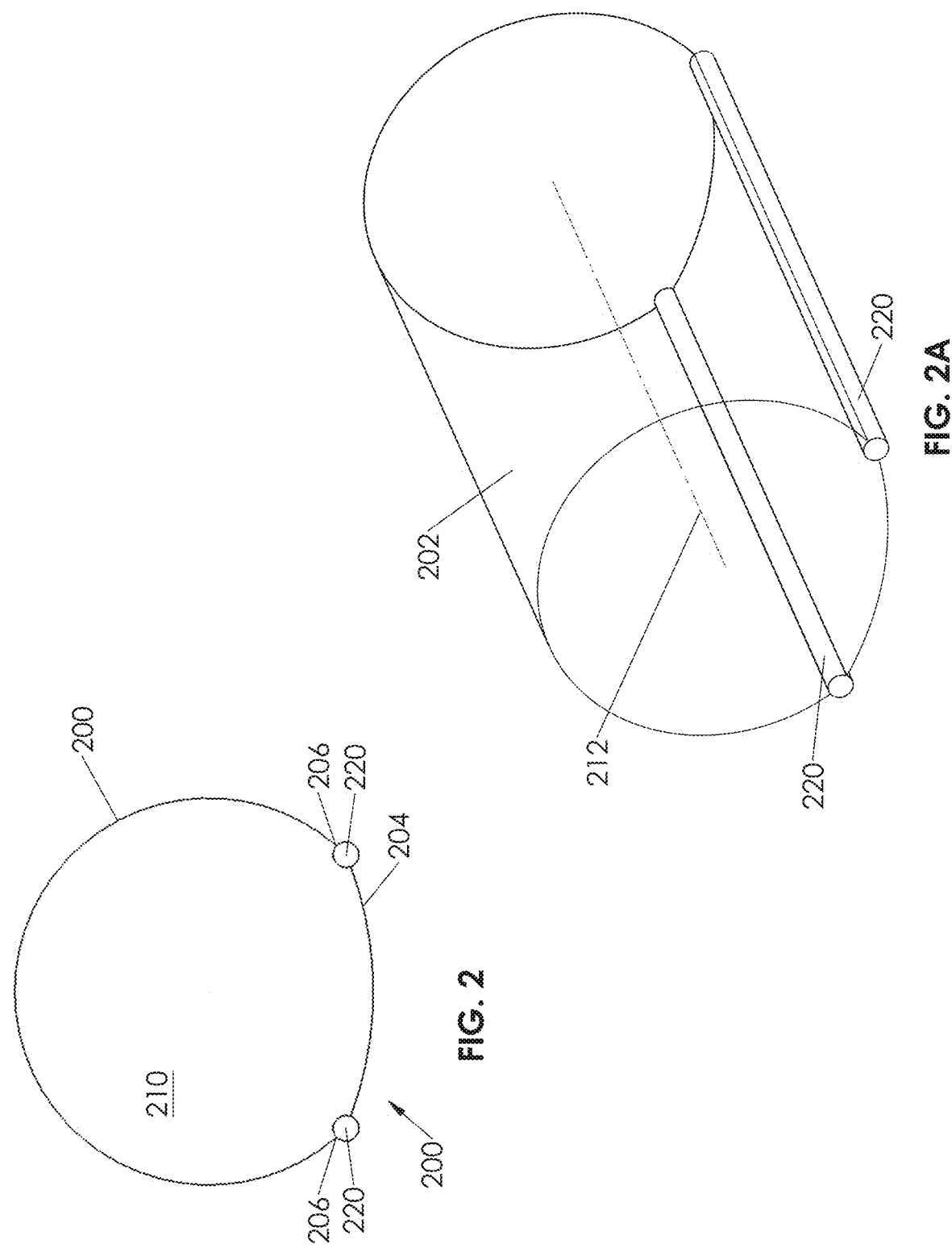

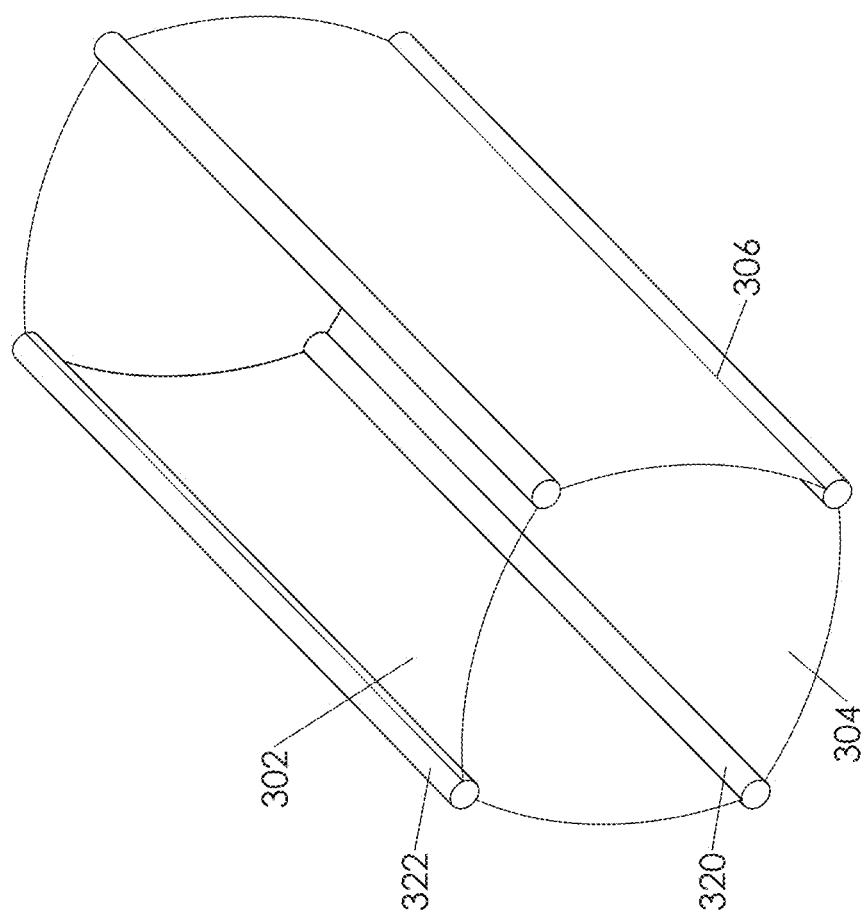
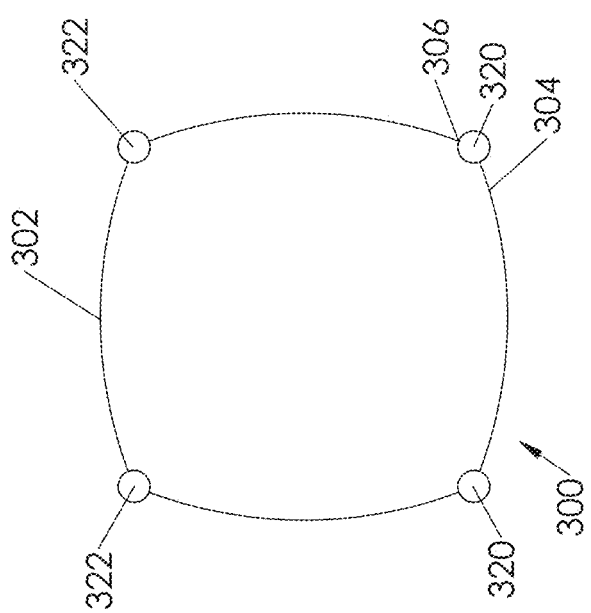

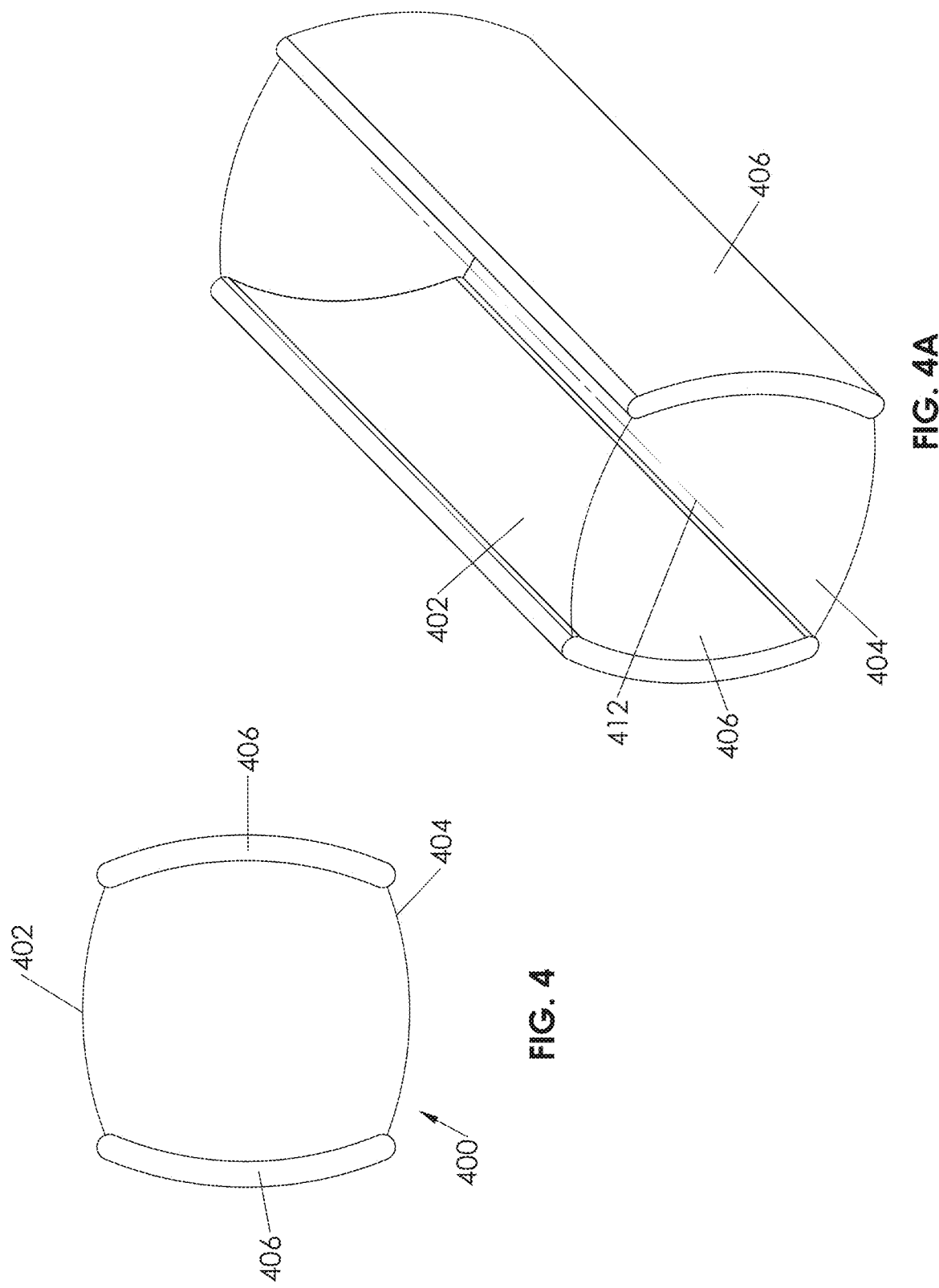

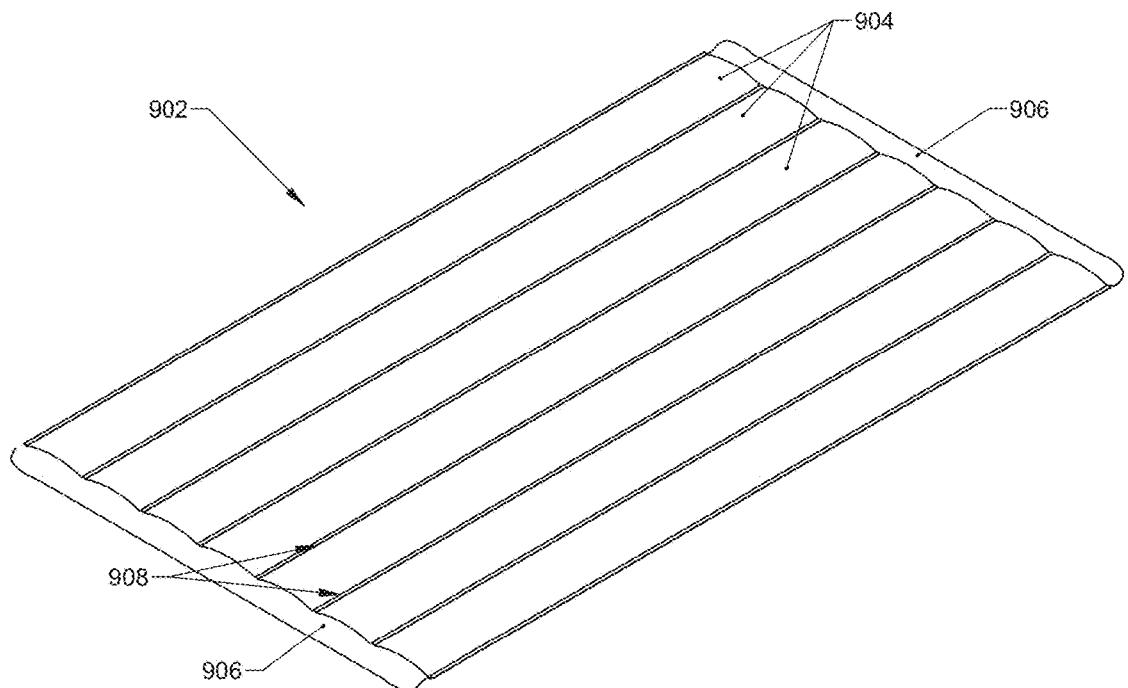
FIG. 9A
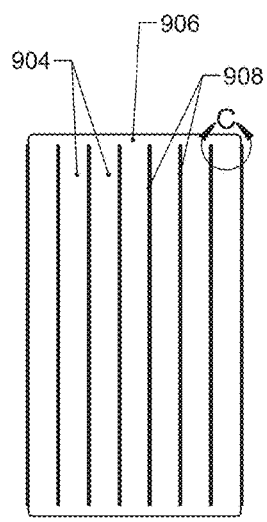  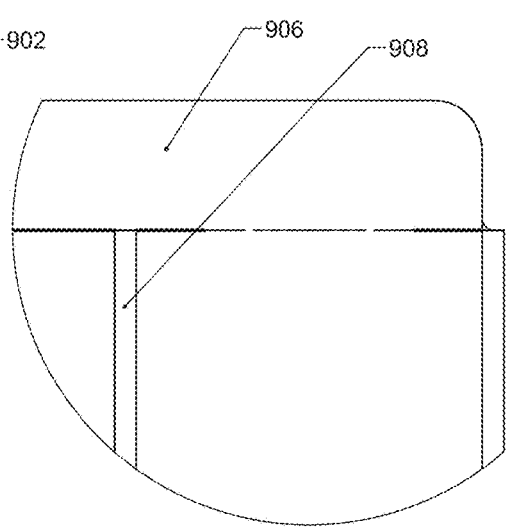 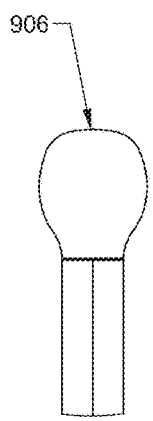
FIG. 9B    FIG. 9C    DETAIL C SCALE 1:4    FIG. 9E
FIG. 9D

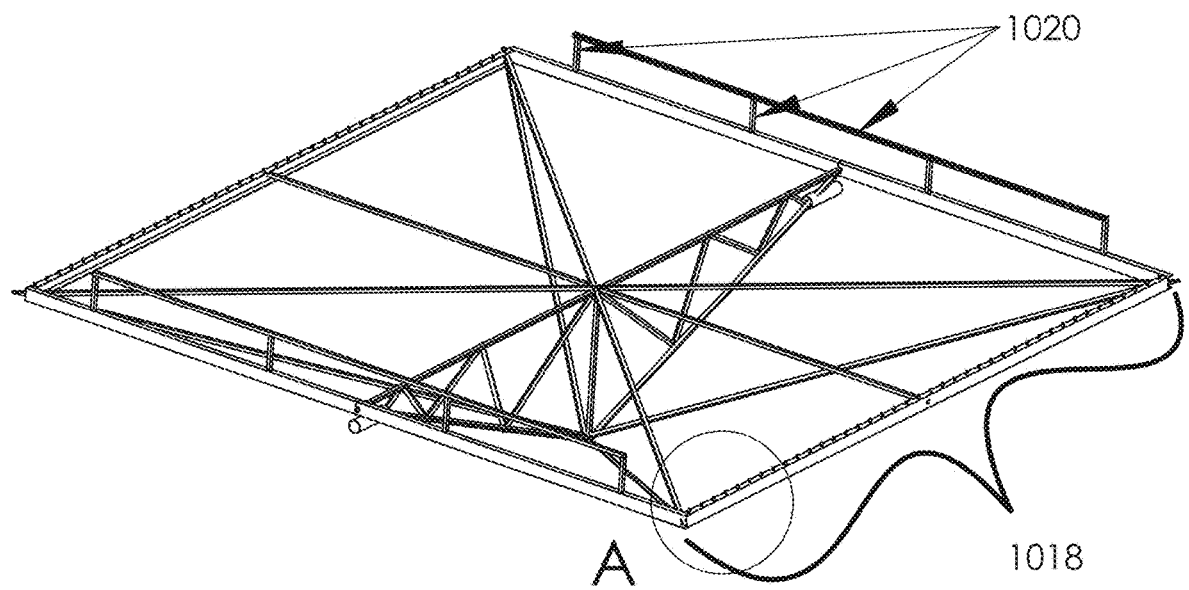
FIG. 10F
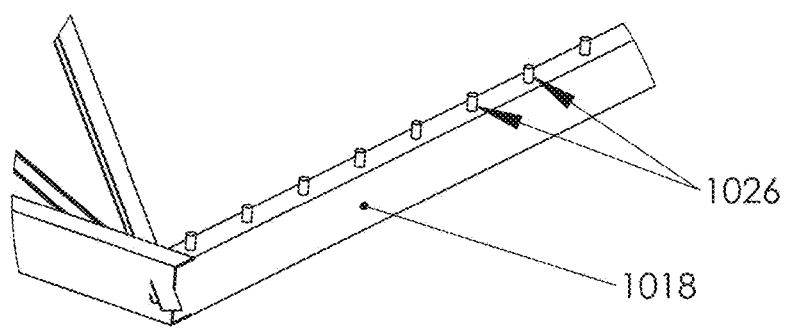
FIG. 10G  Detail A

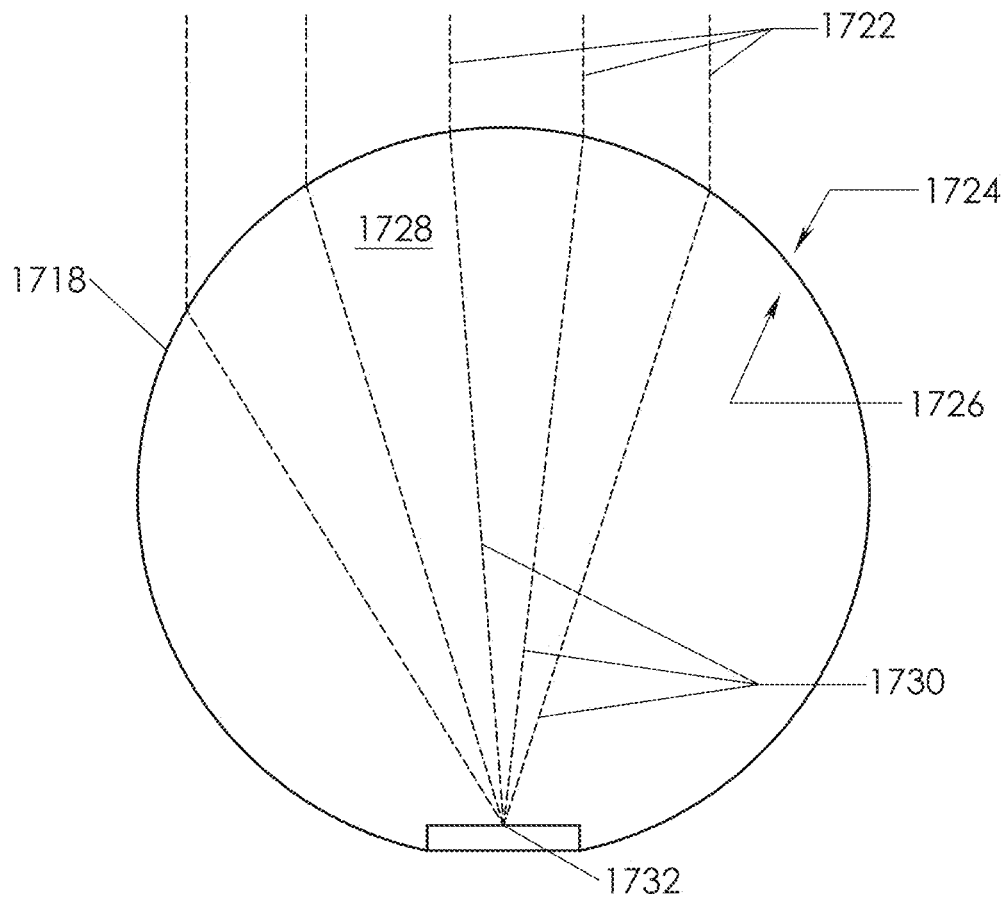
FIG. 17C1
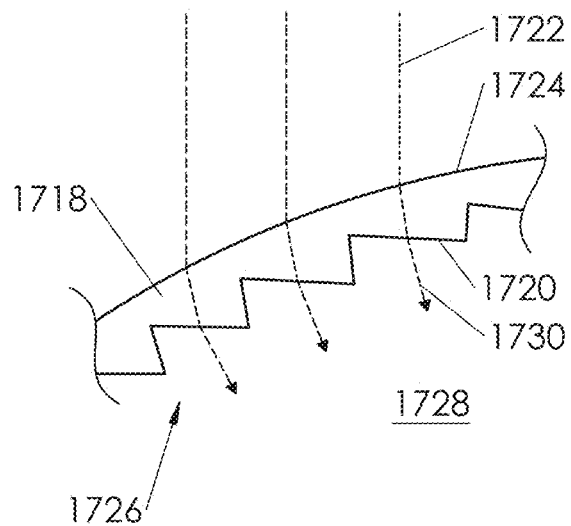
FIG. 17C2

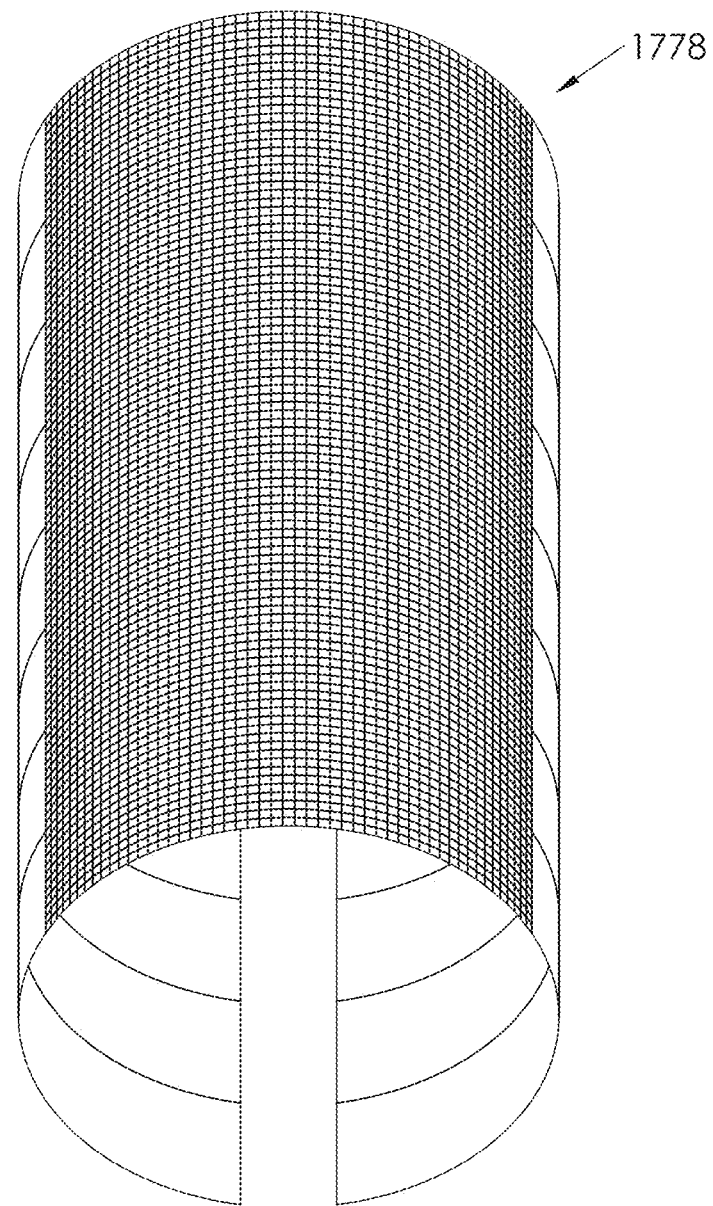
FIG. 17G1

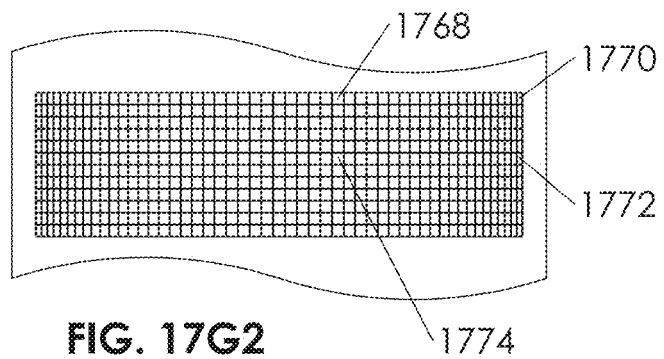
FIG. 17G2
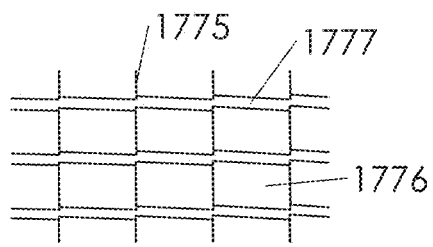
FIG. 17G3
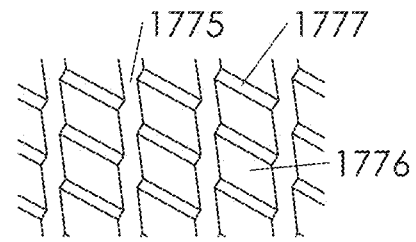
FIG. 17G4
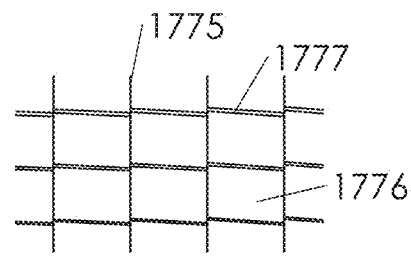
FIG. 17G5
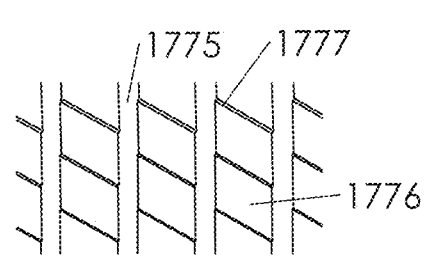
FIG. 17G6

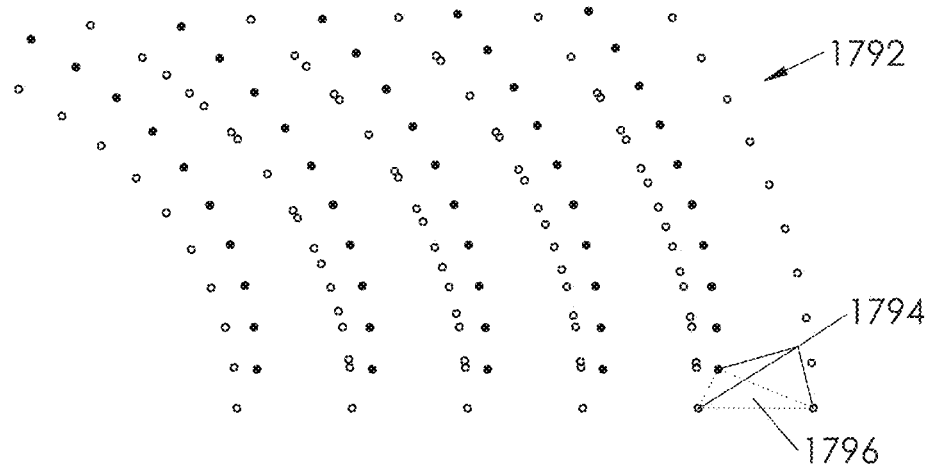
FIG. 1711
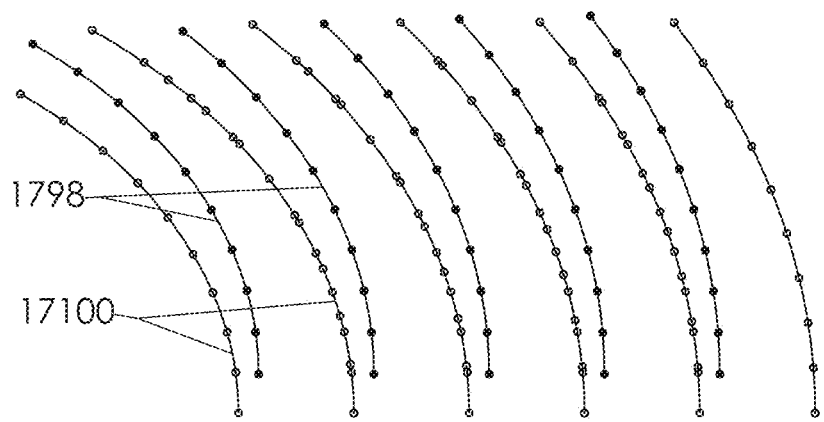
FIG. 1712

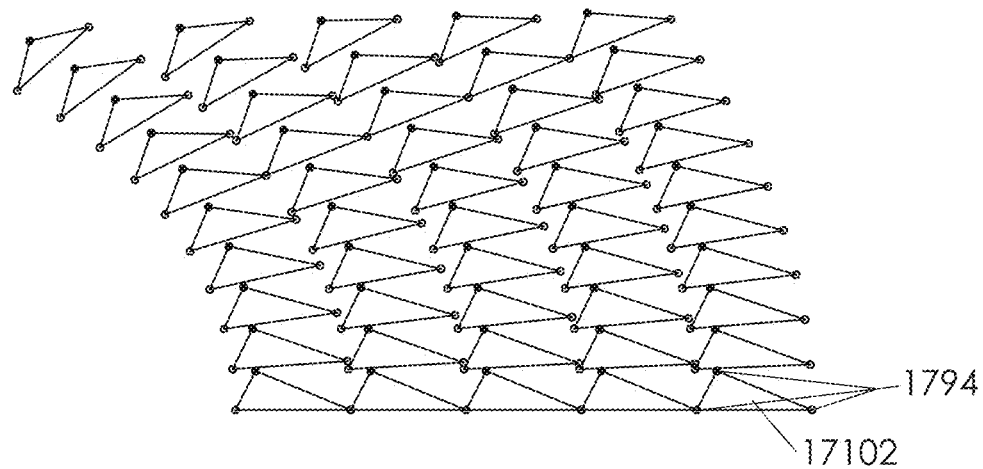
FIG. 1713
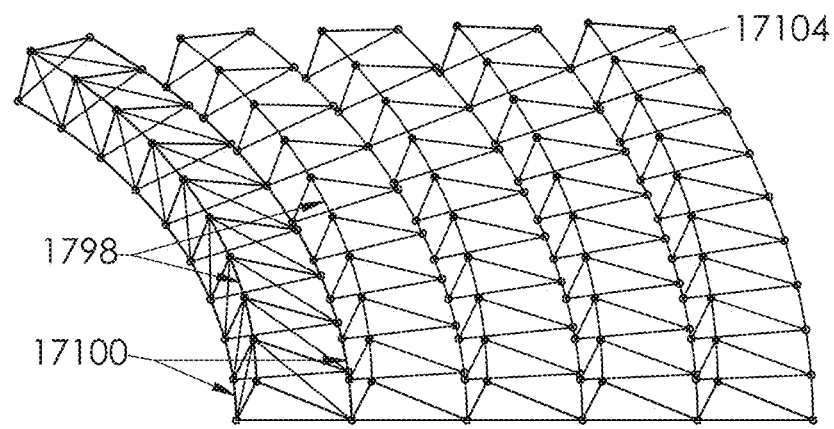
FIG. 1714

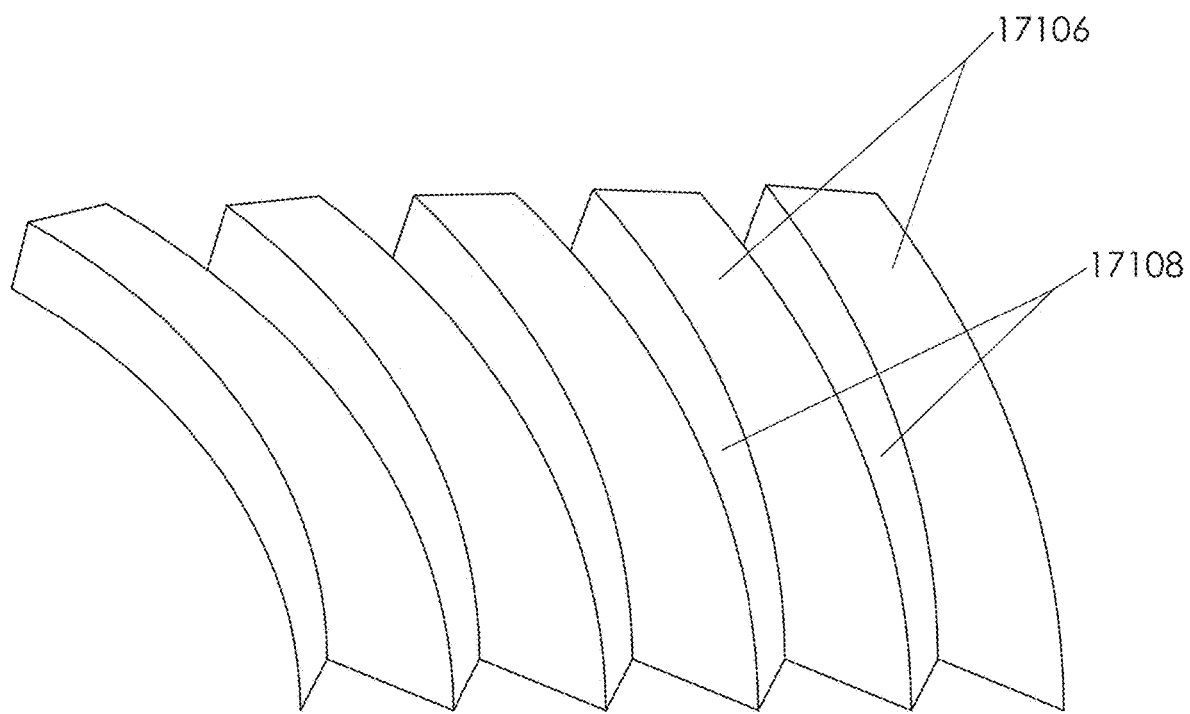
FIG. 1715

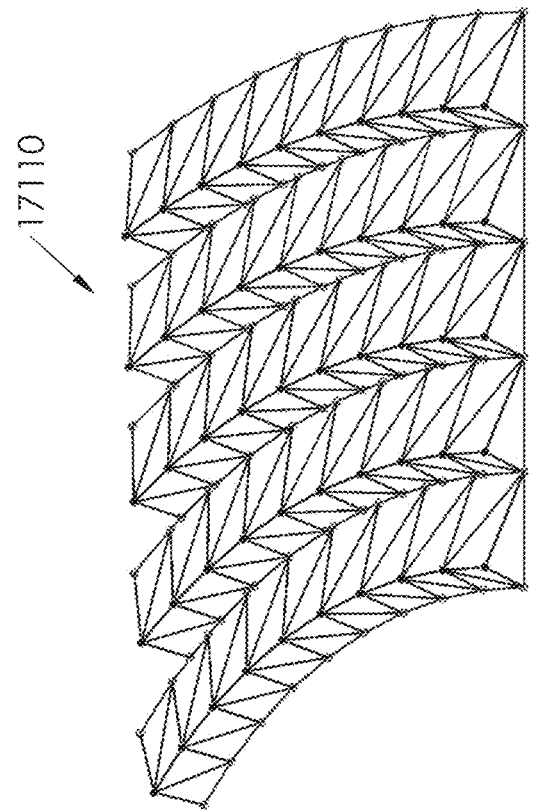
FIG. 1716
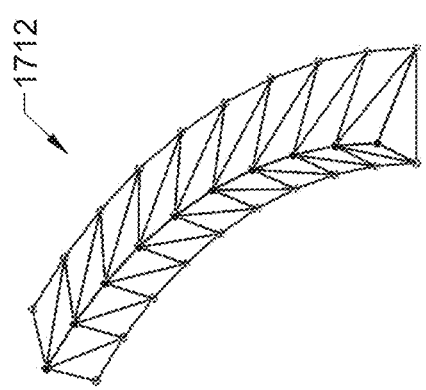
FIG. 1717
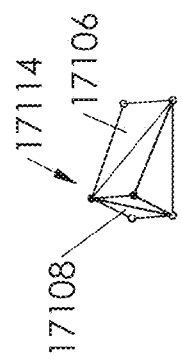
FIG. 1718

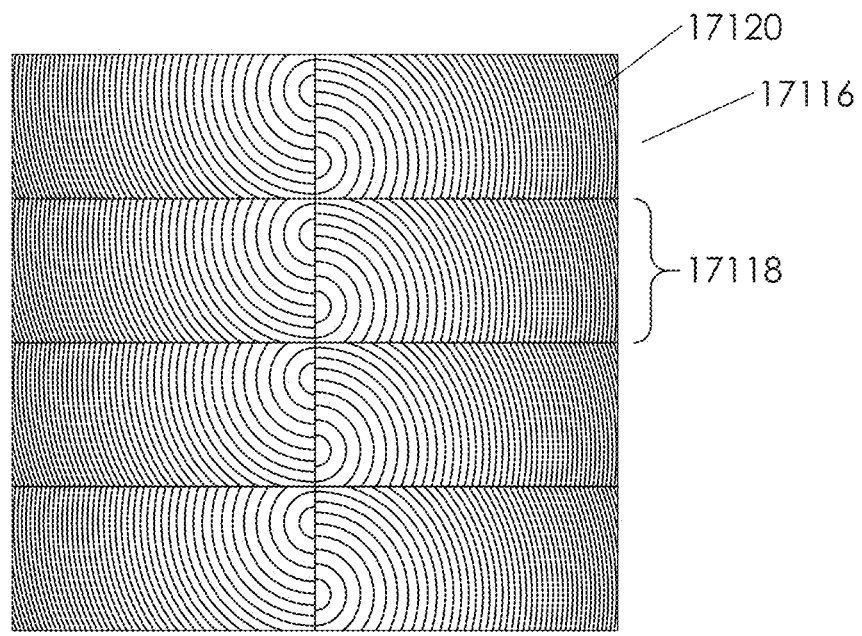
FIG. 17J1
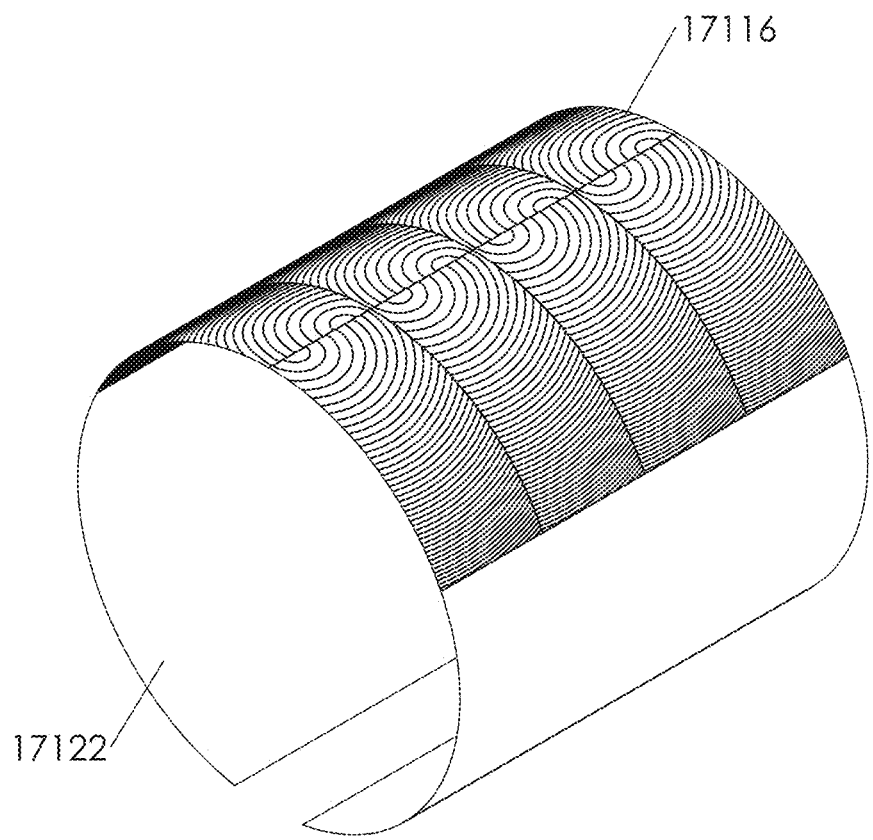
FIG. 17J2

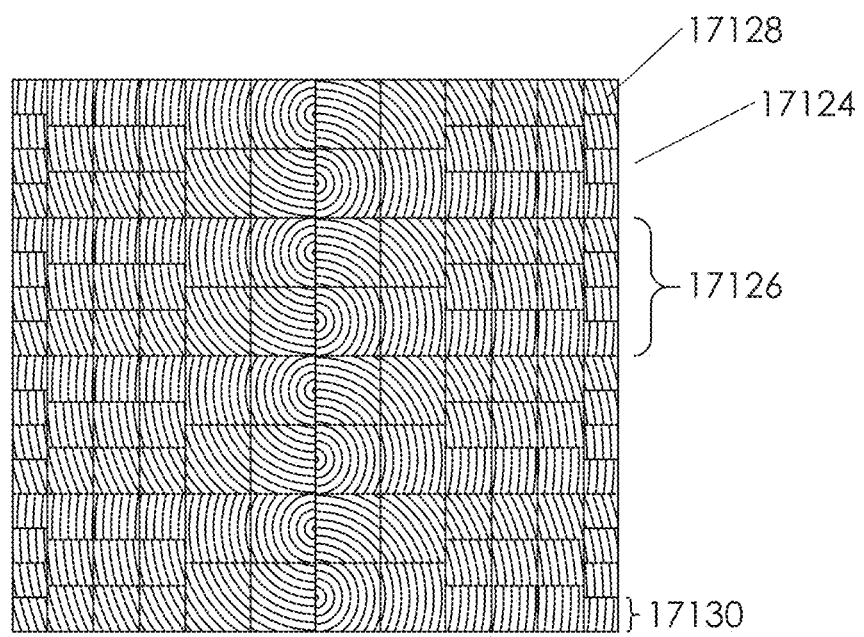
FIG. 17K1
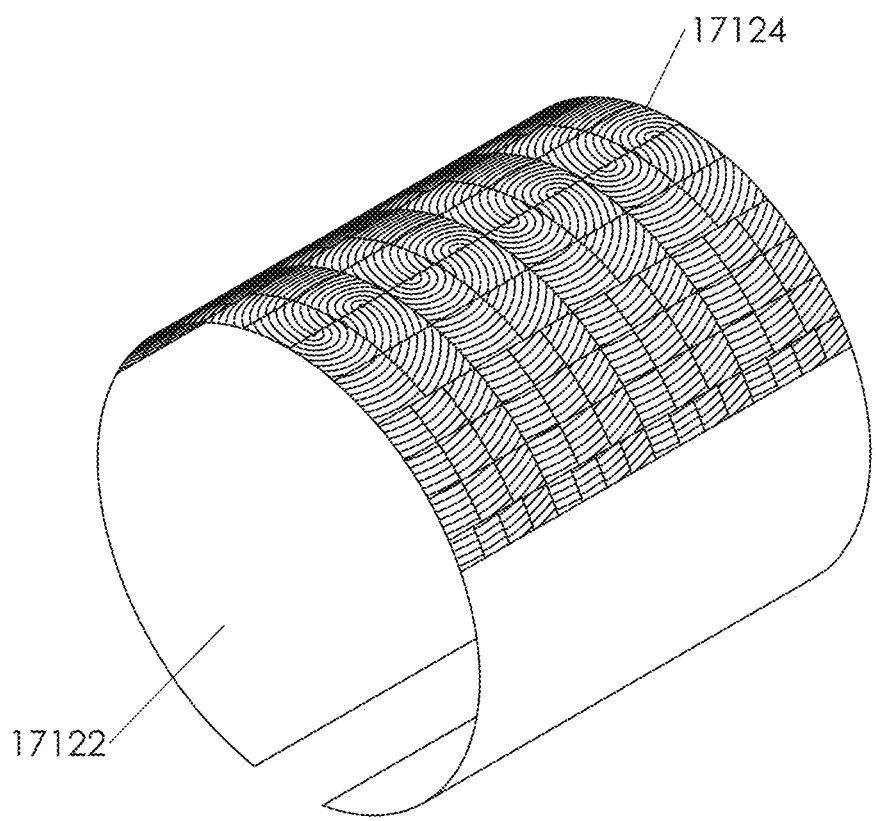
FIG. 17K2

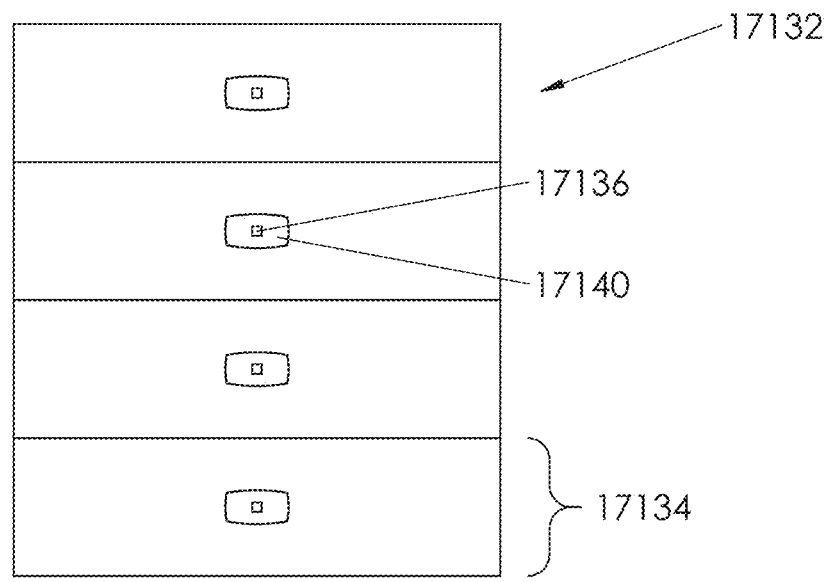
FIG. 17L1
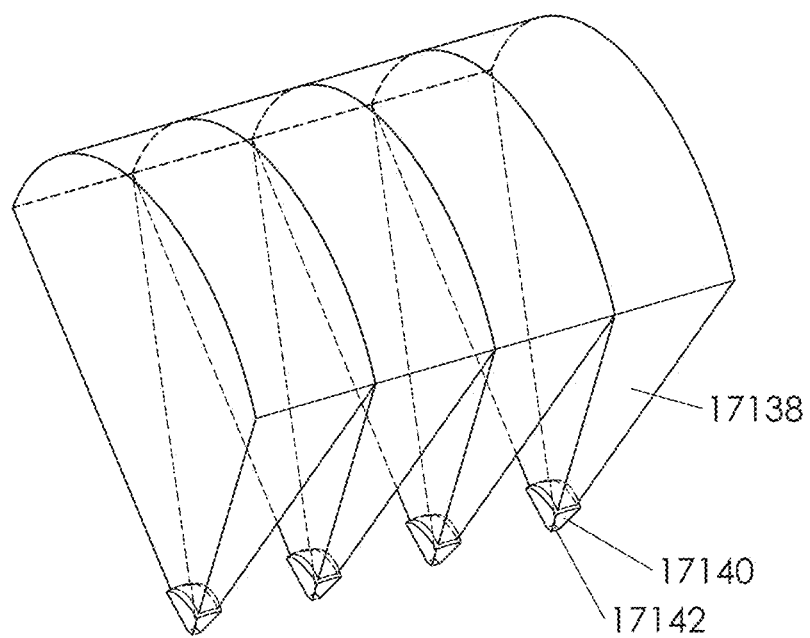
FIG. 17L2

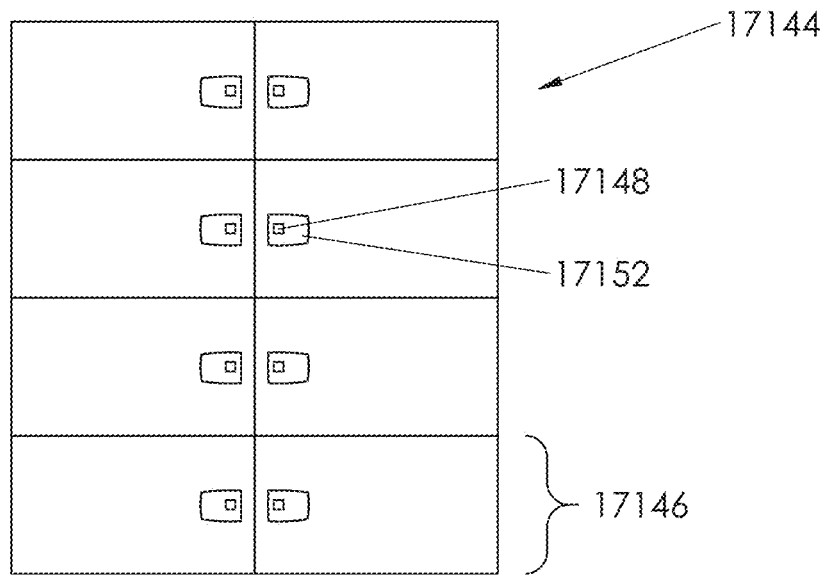
FIG. 17M1
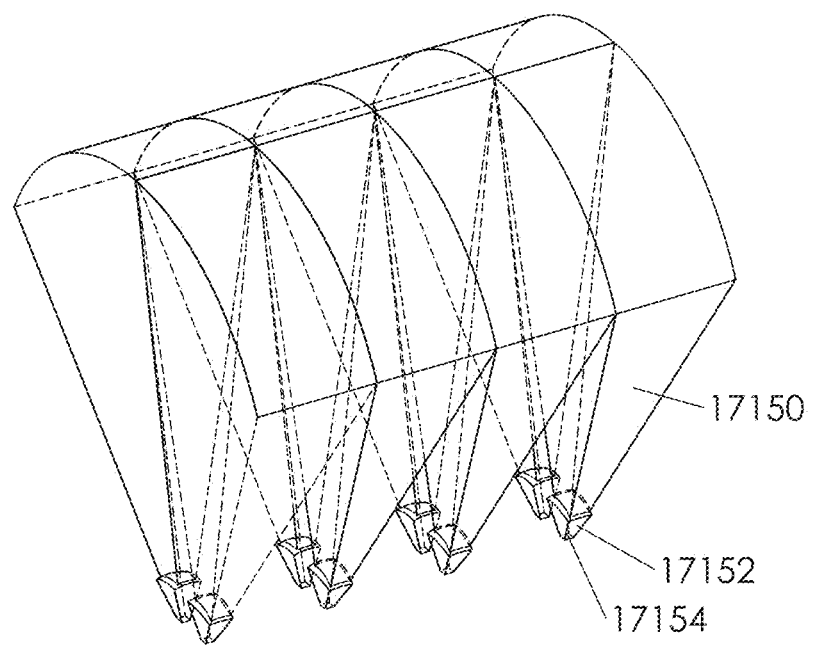
FIG. 17M2

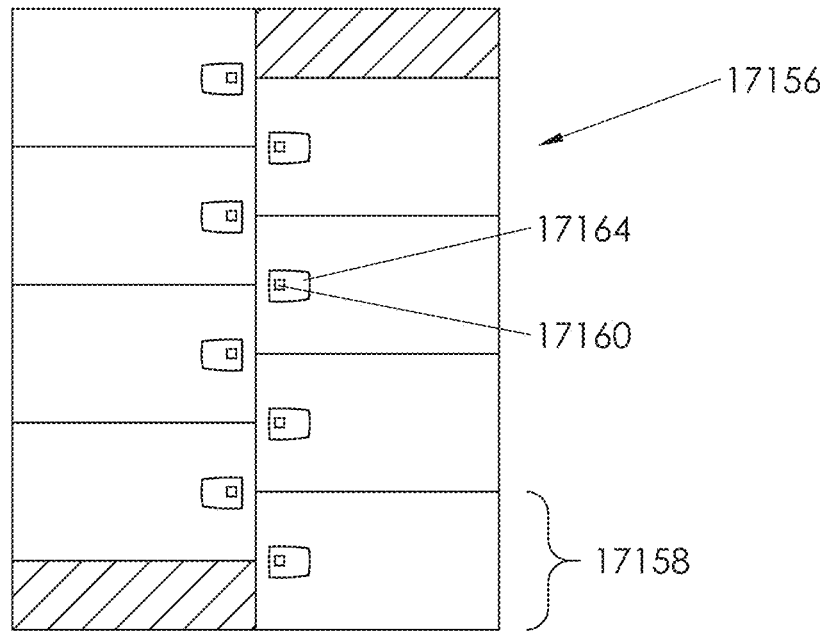
FIG. 17N1
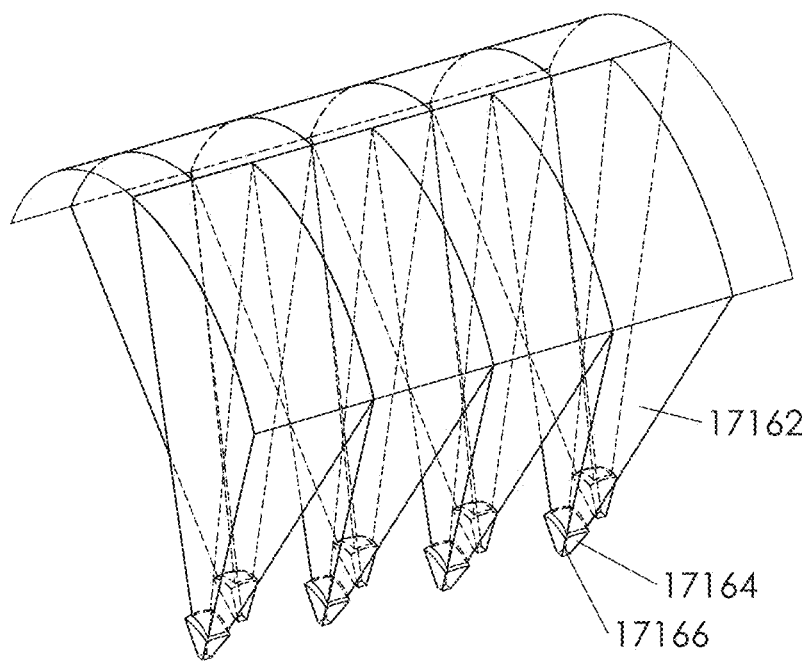
FIG. 17N2

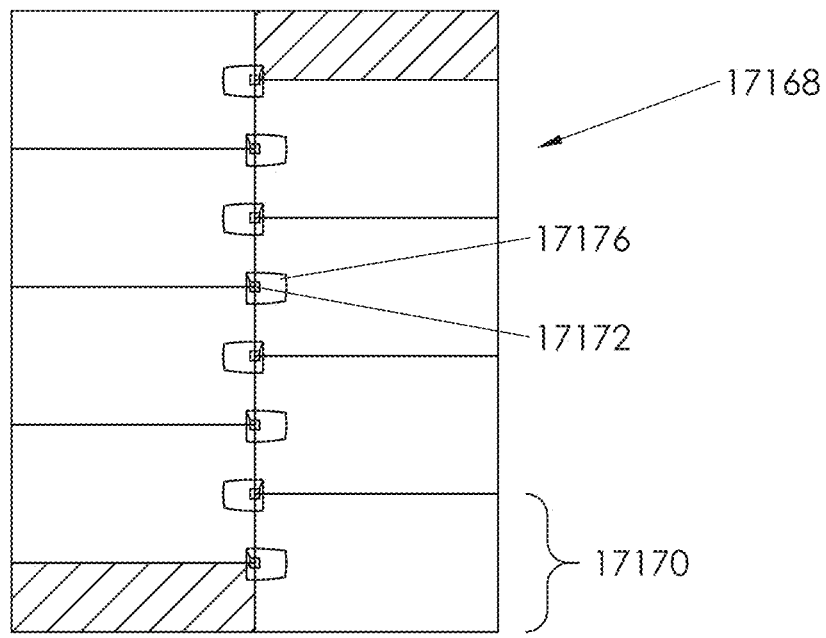
FIG. 1701
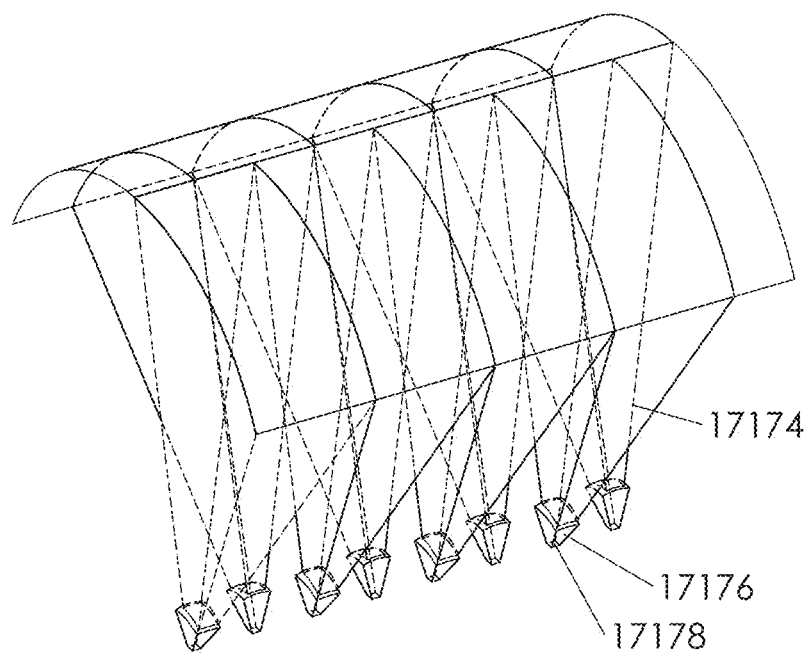
FIG. 1702

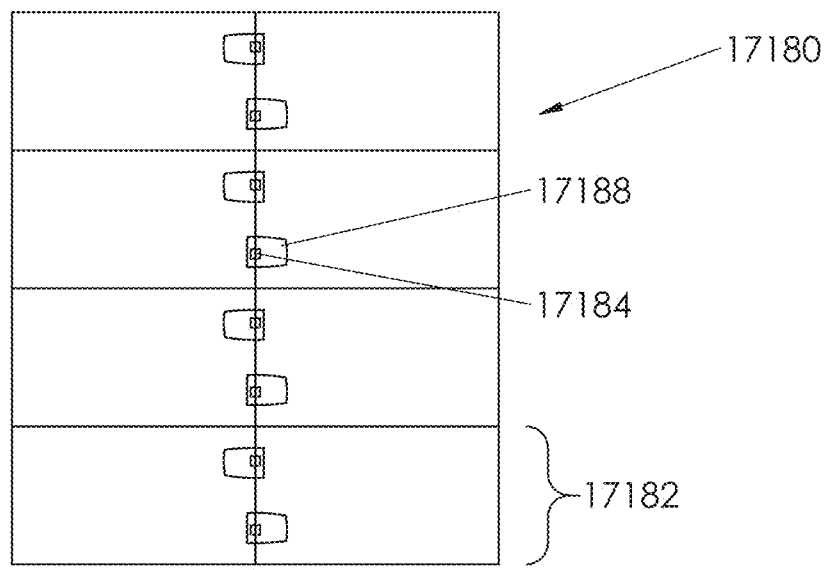
FIG. 17P1
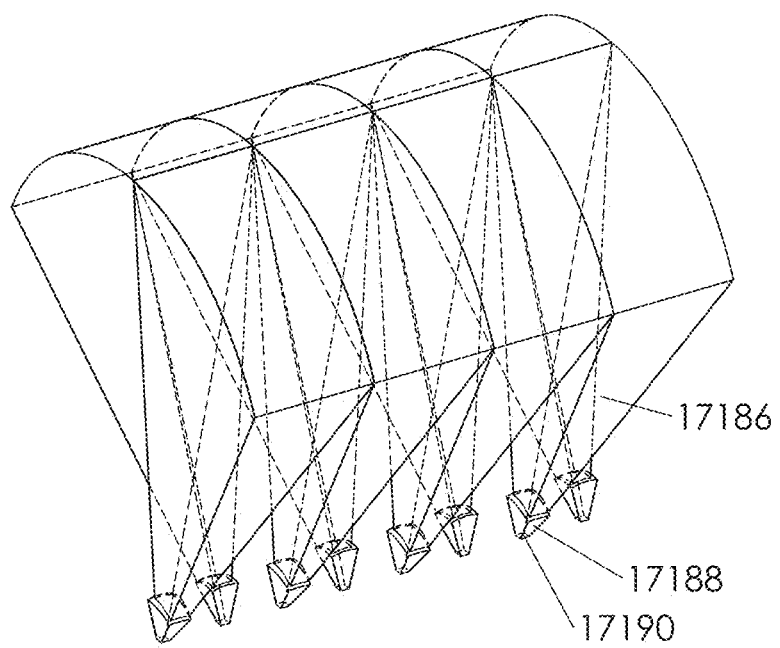
FIG. 17P2

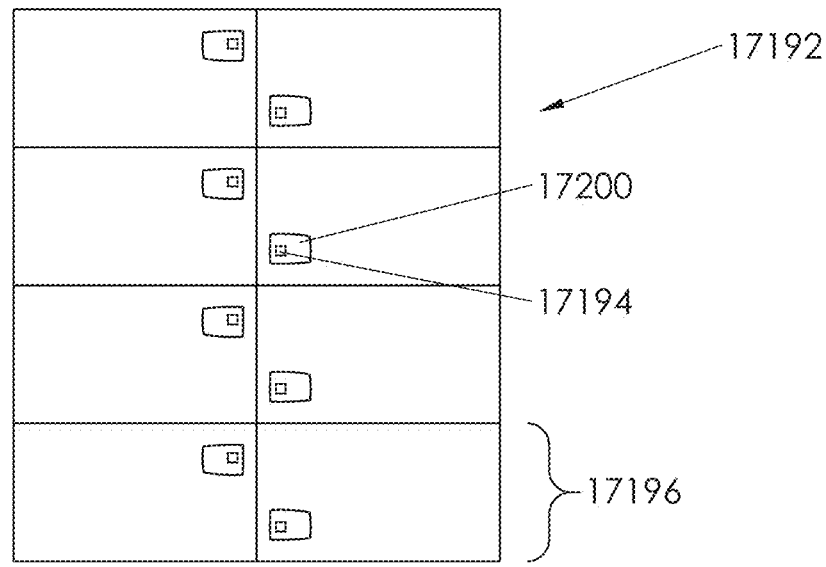
FIG. 17Q1
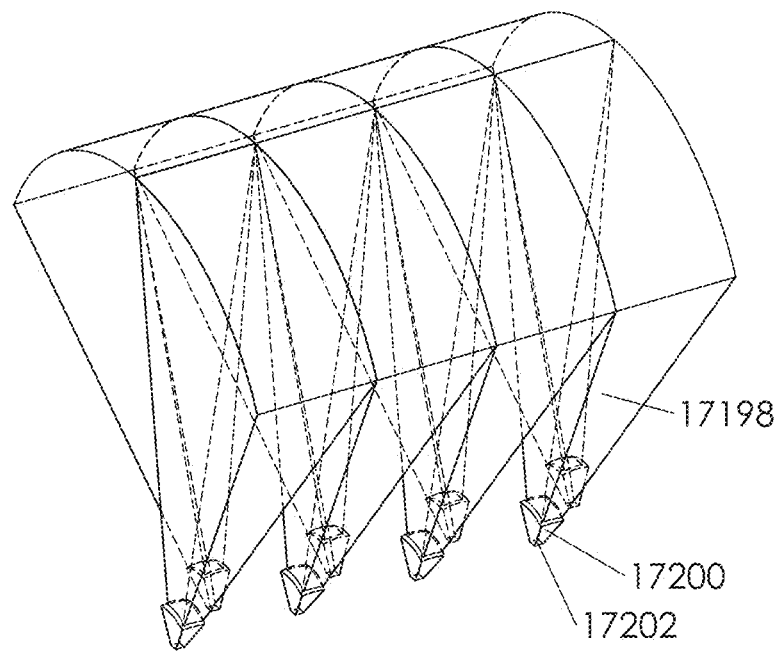
FIG. 17Q2

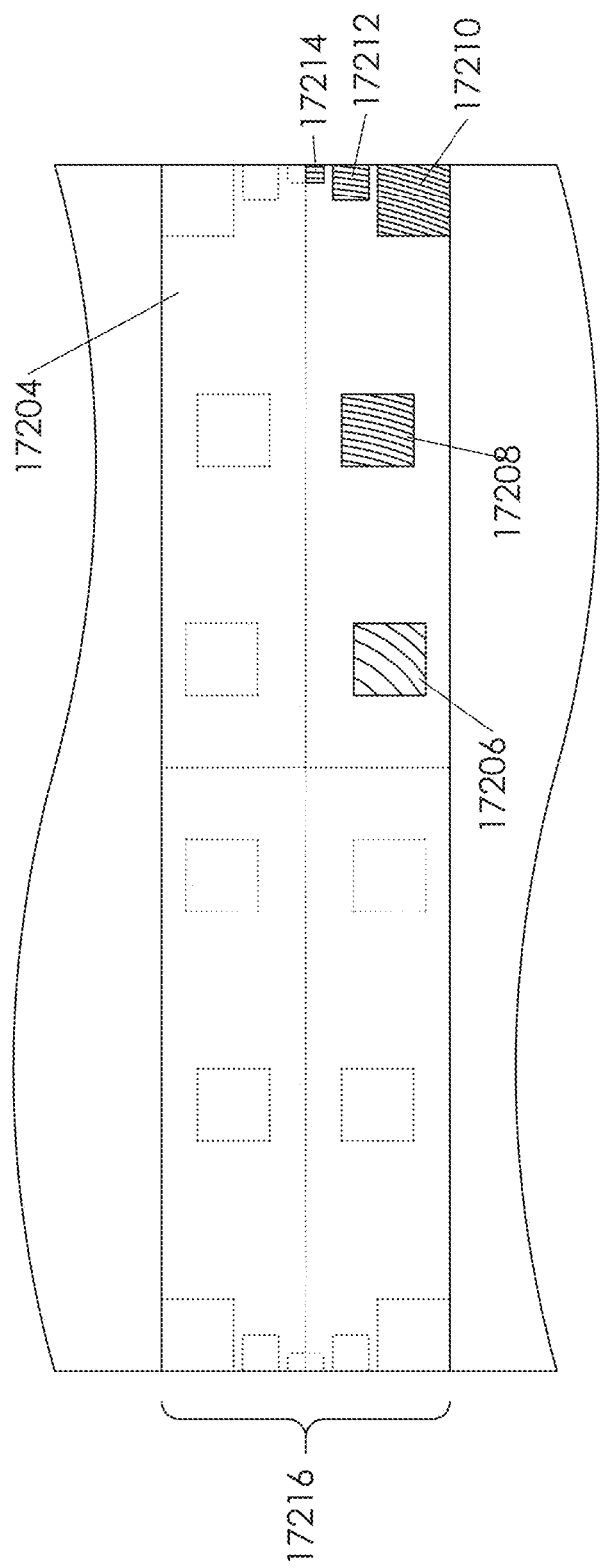
FIG. 17R1

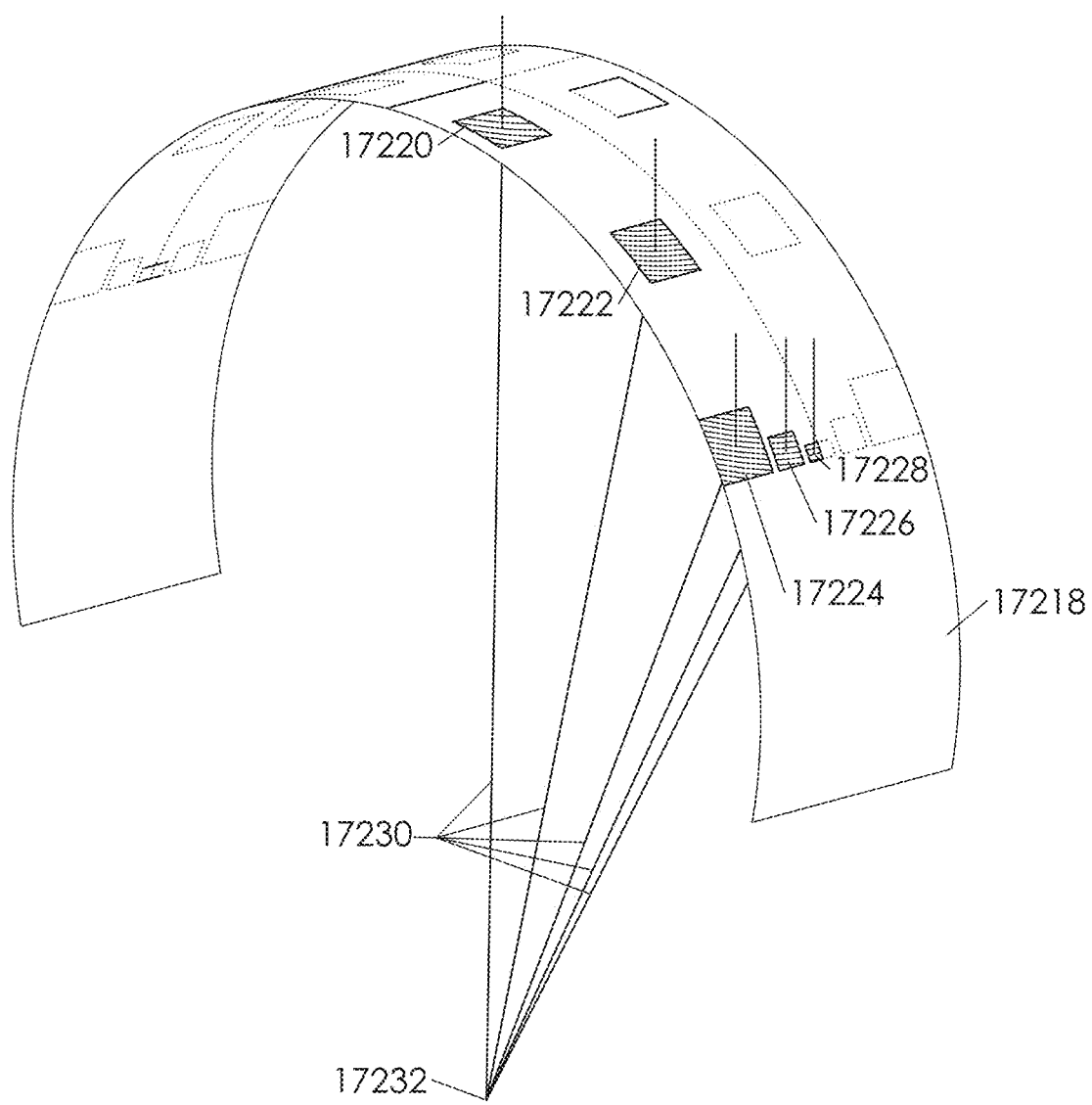
FIG. 17R2

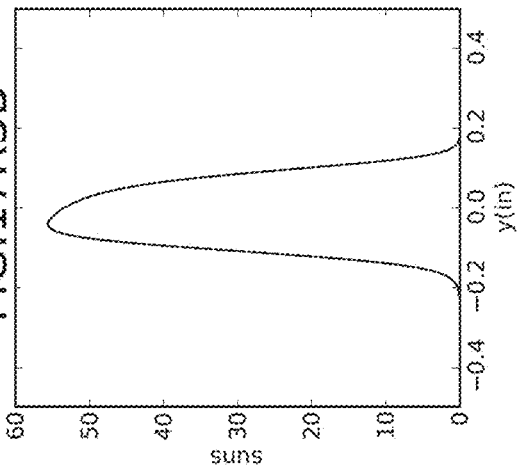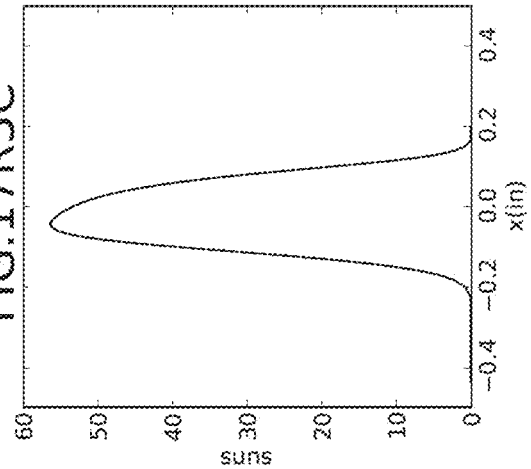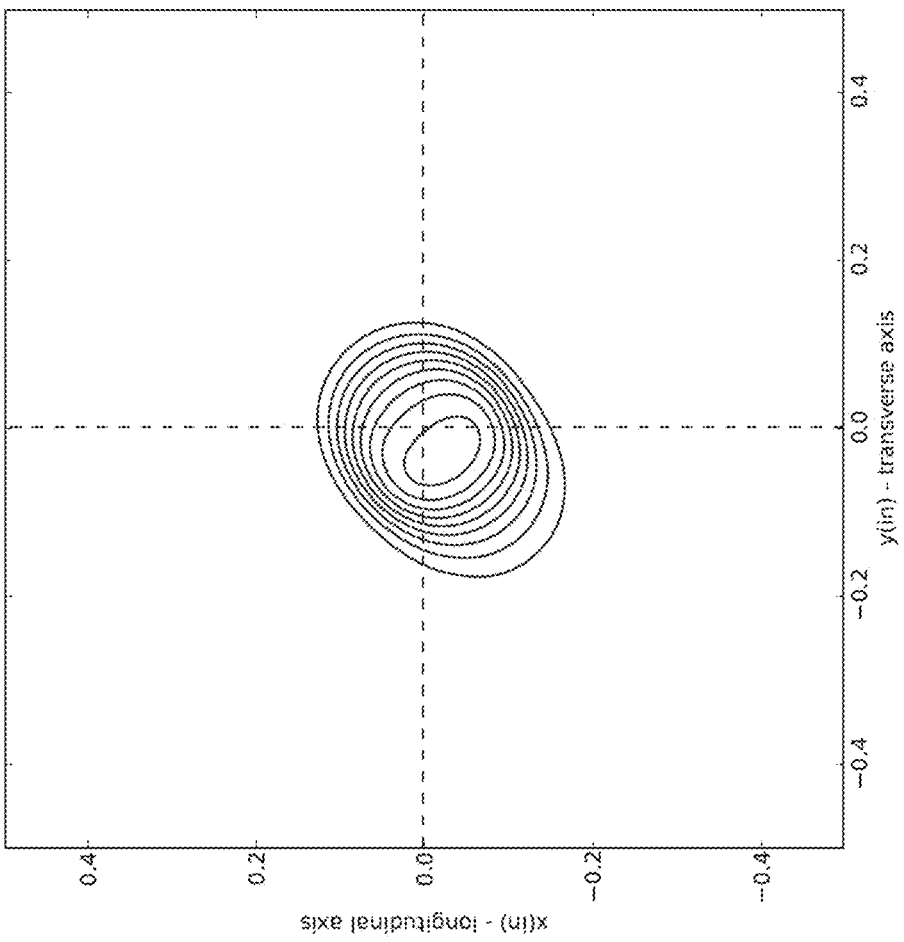

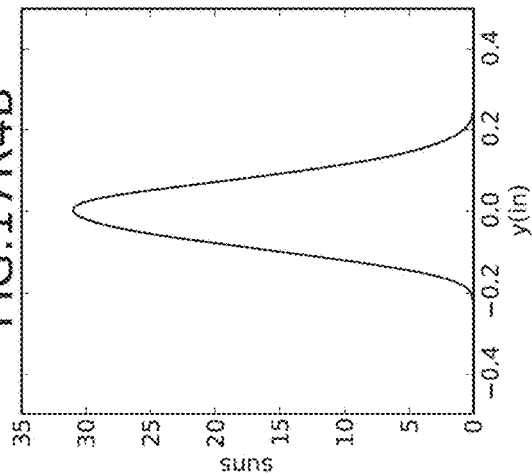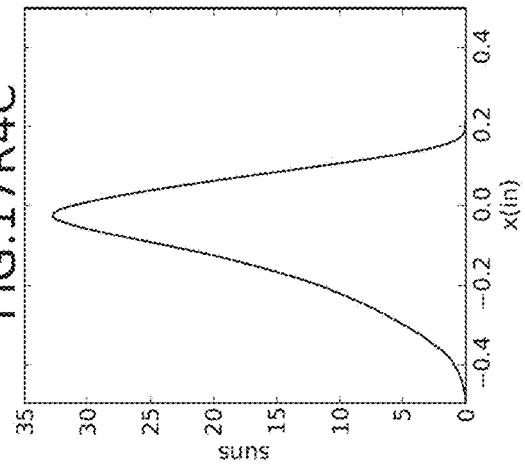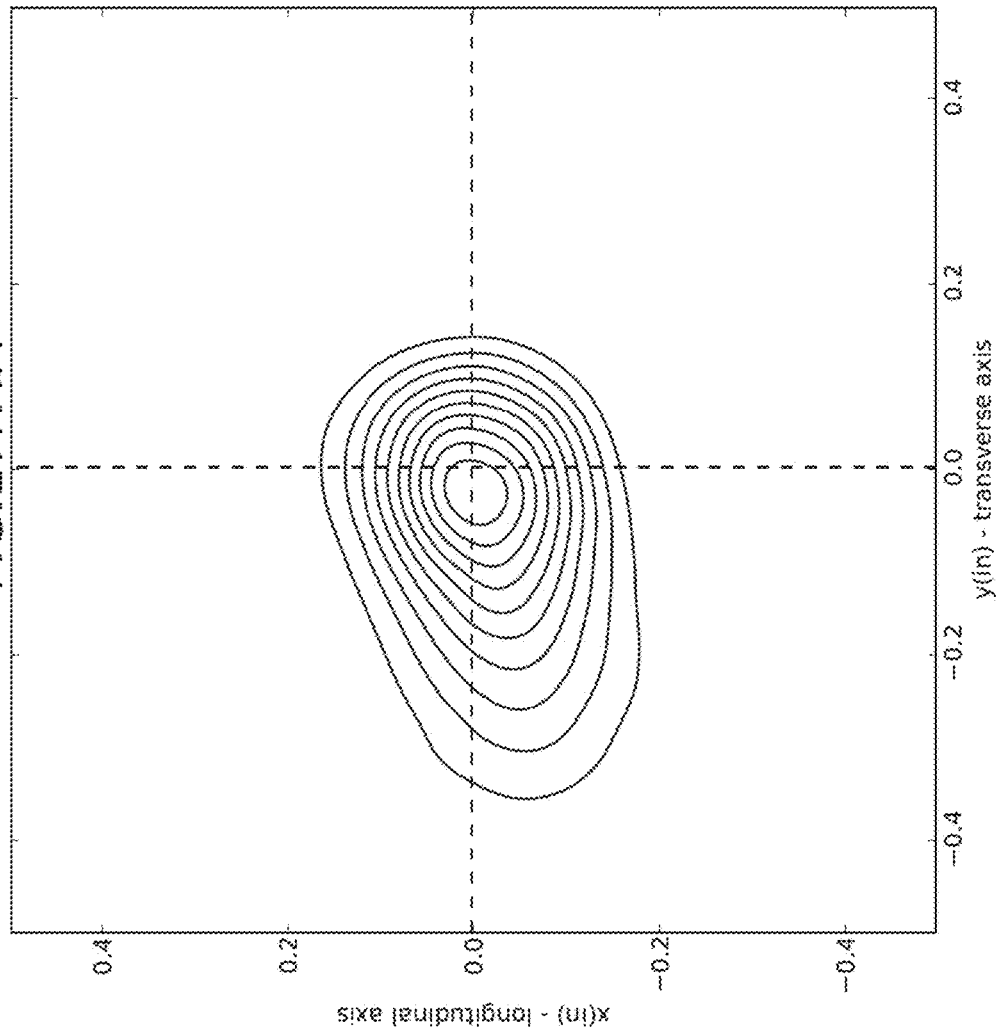

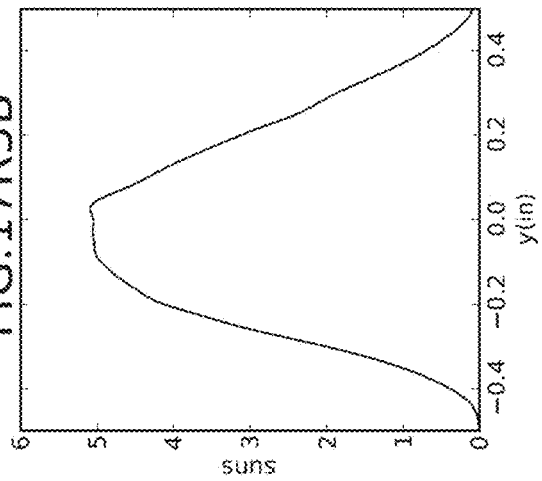
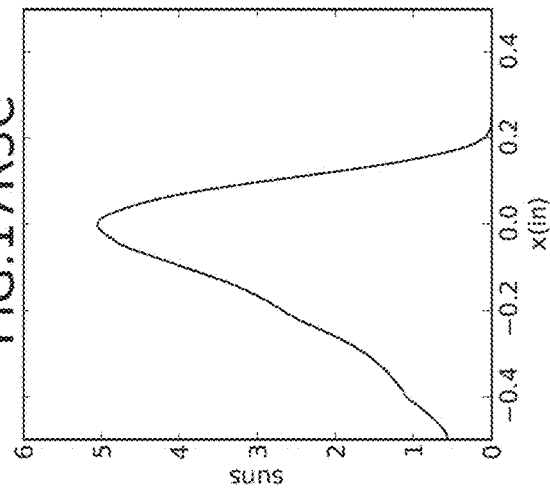
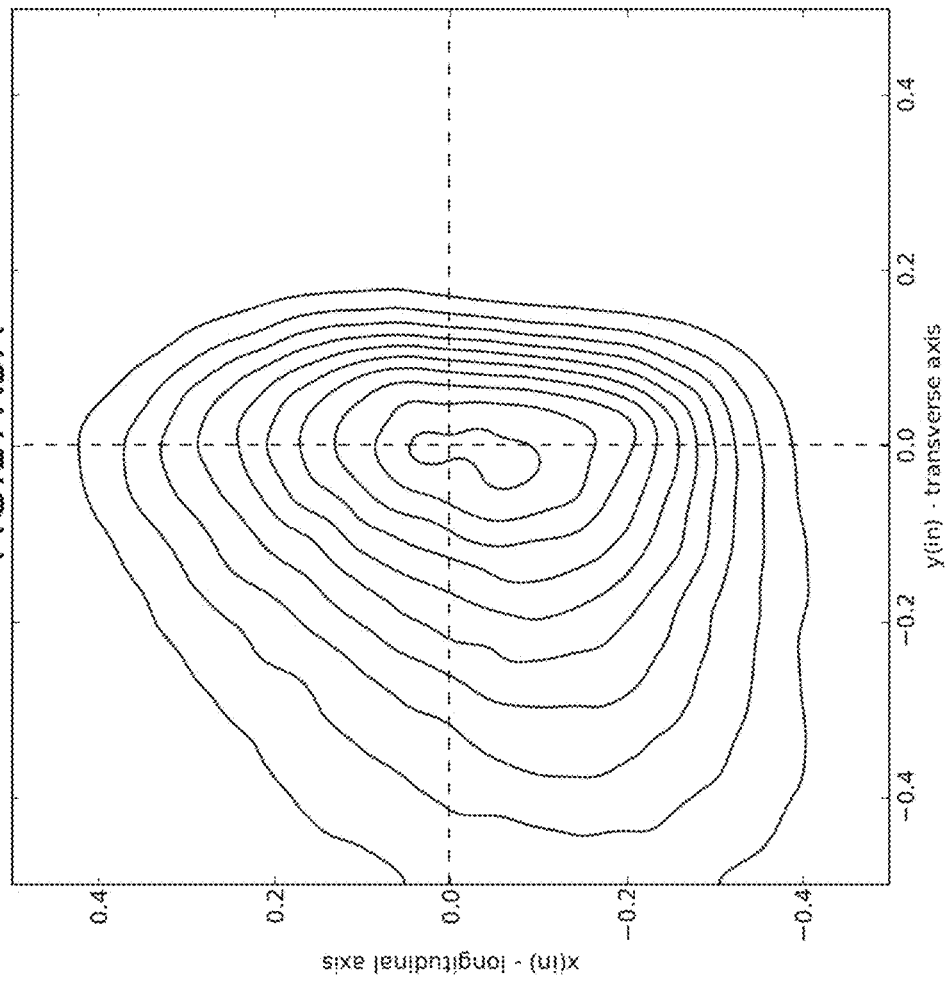

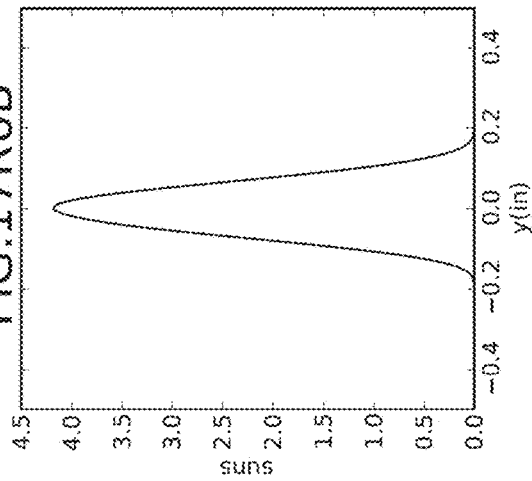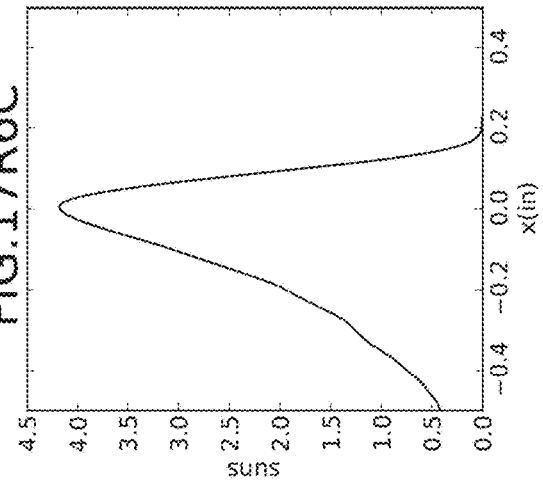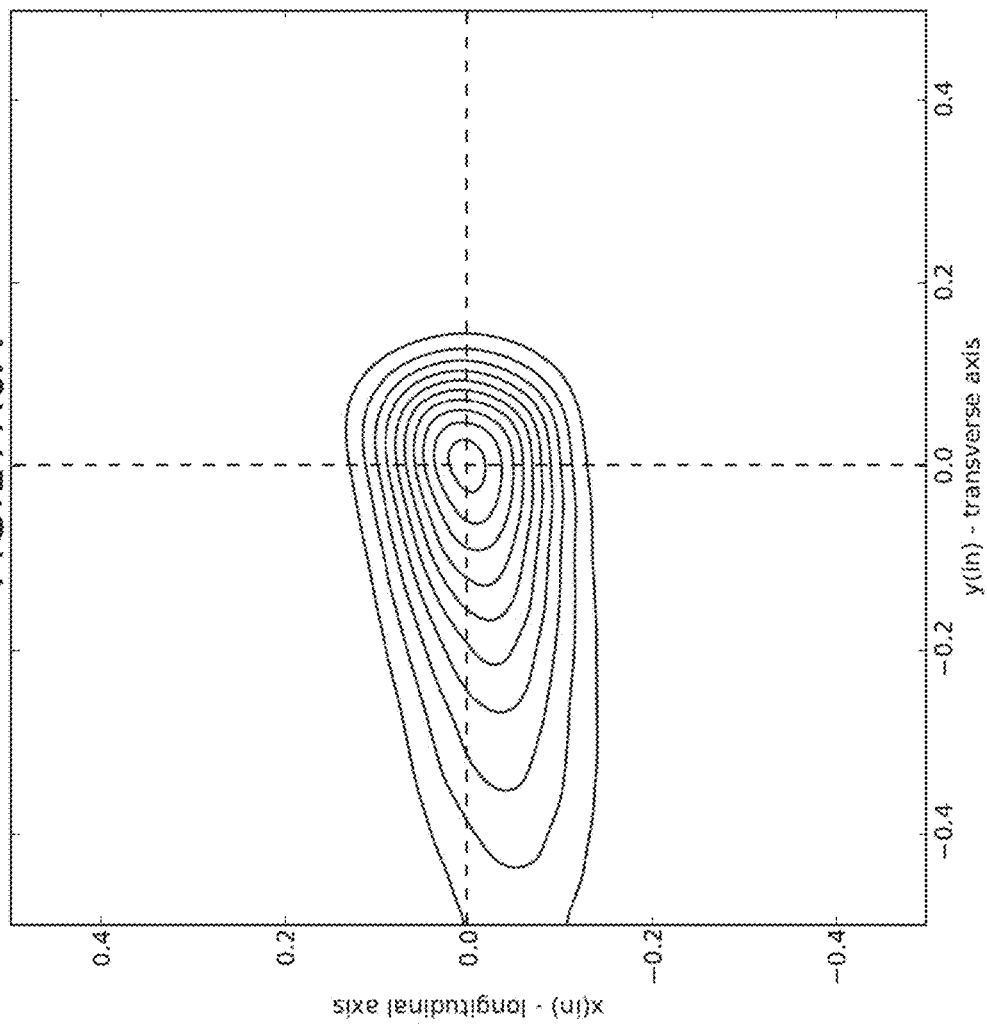

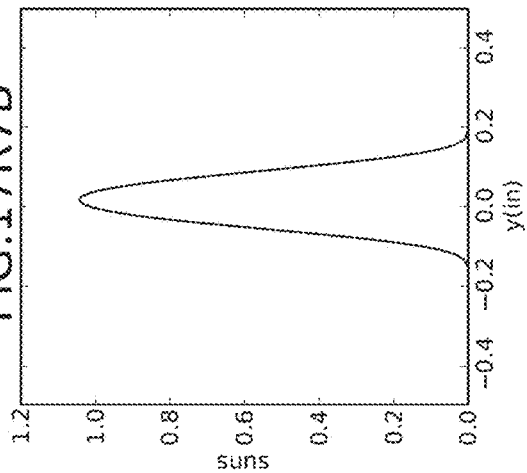
FIG. 17R7B
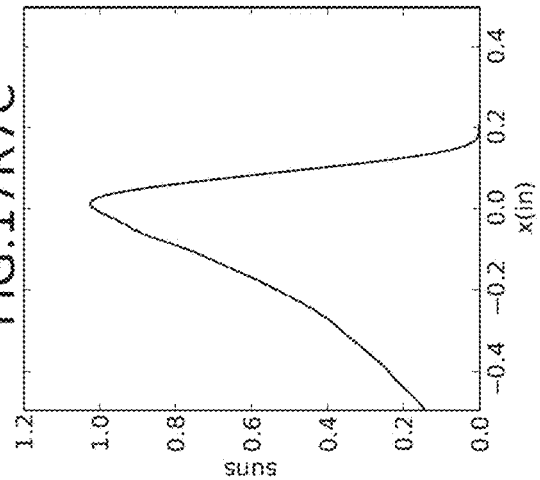
FIG. 17R7C
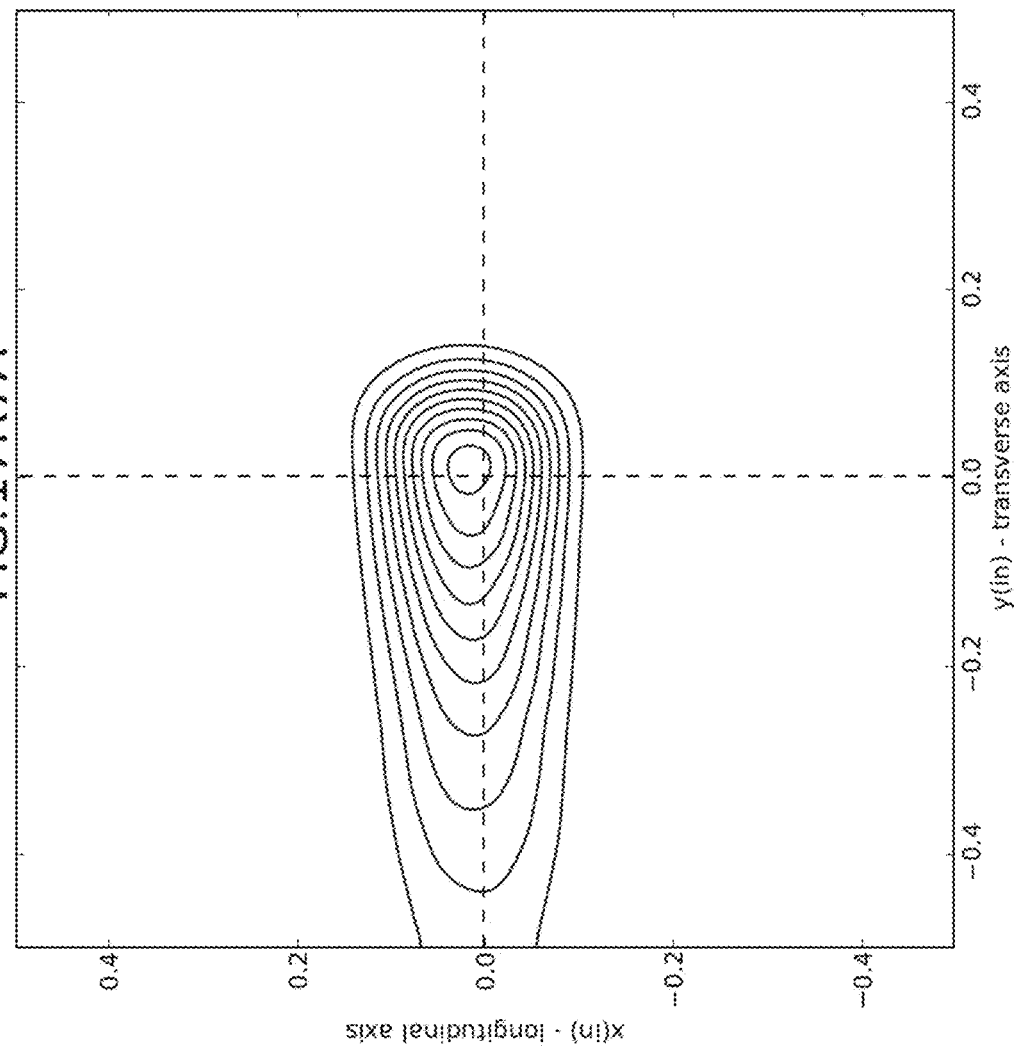
FIG. 17R7A

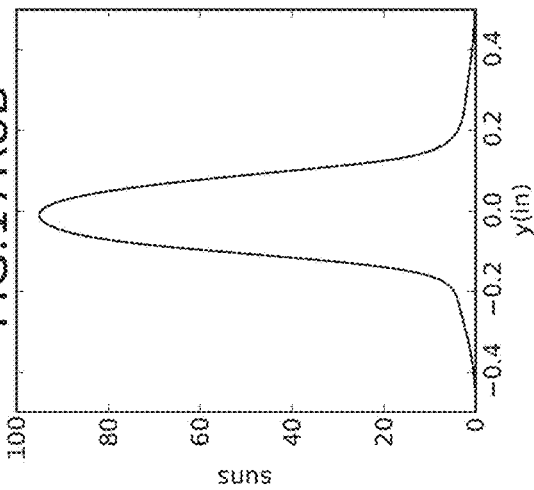
FIG.17R8B
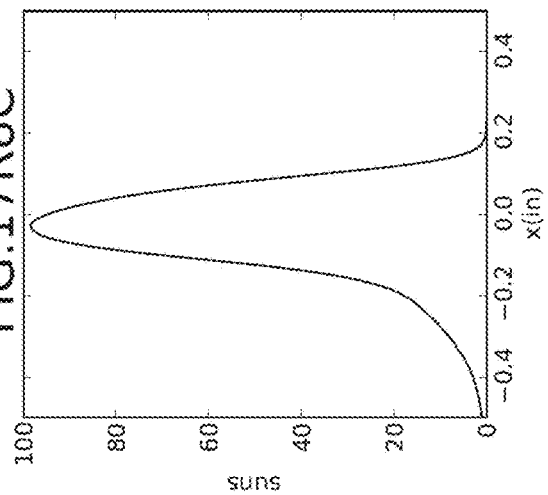
FIG.17R8C
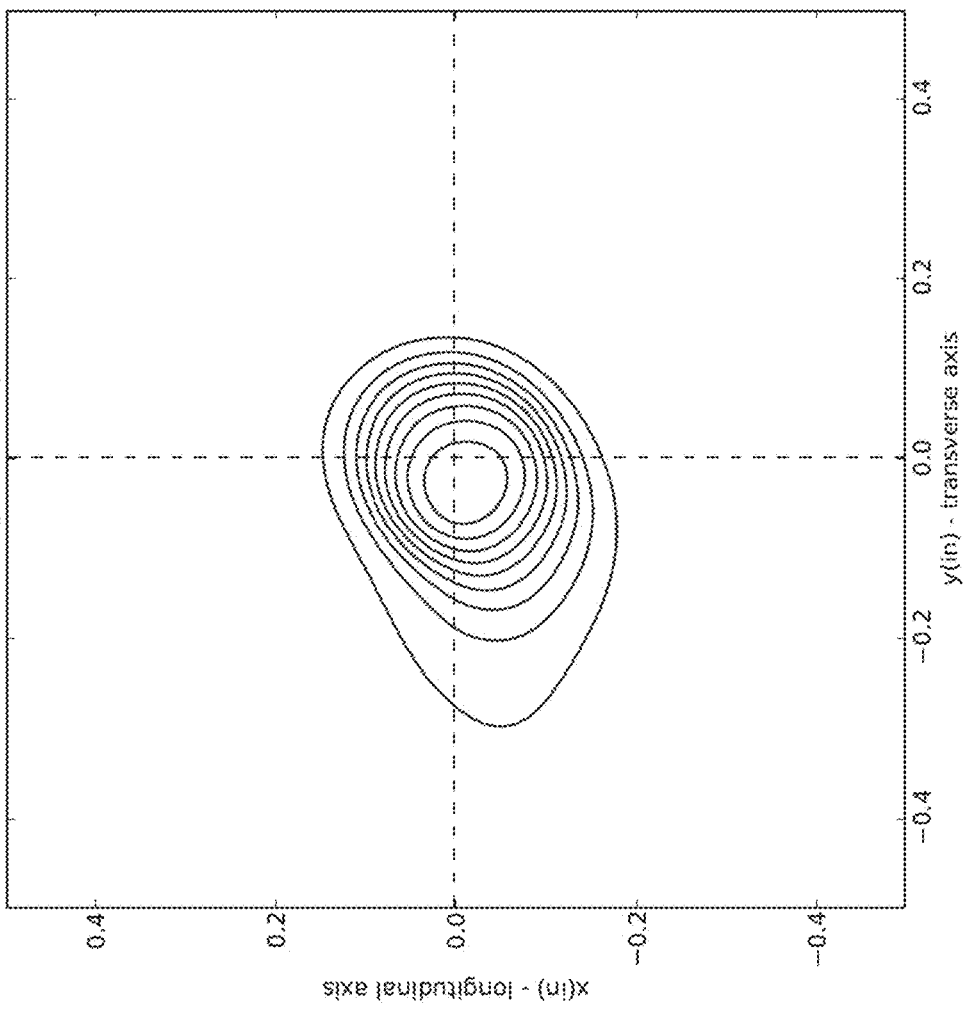
FIG.17R8A

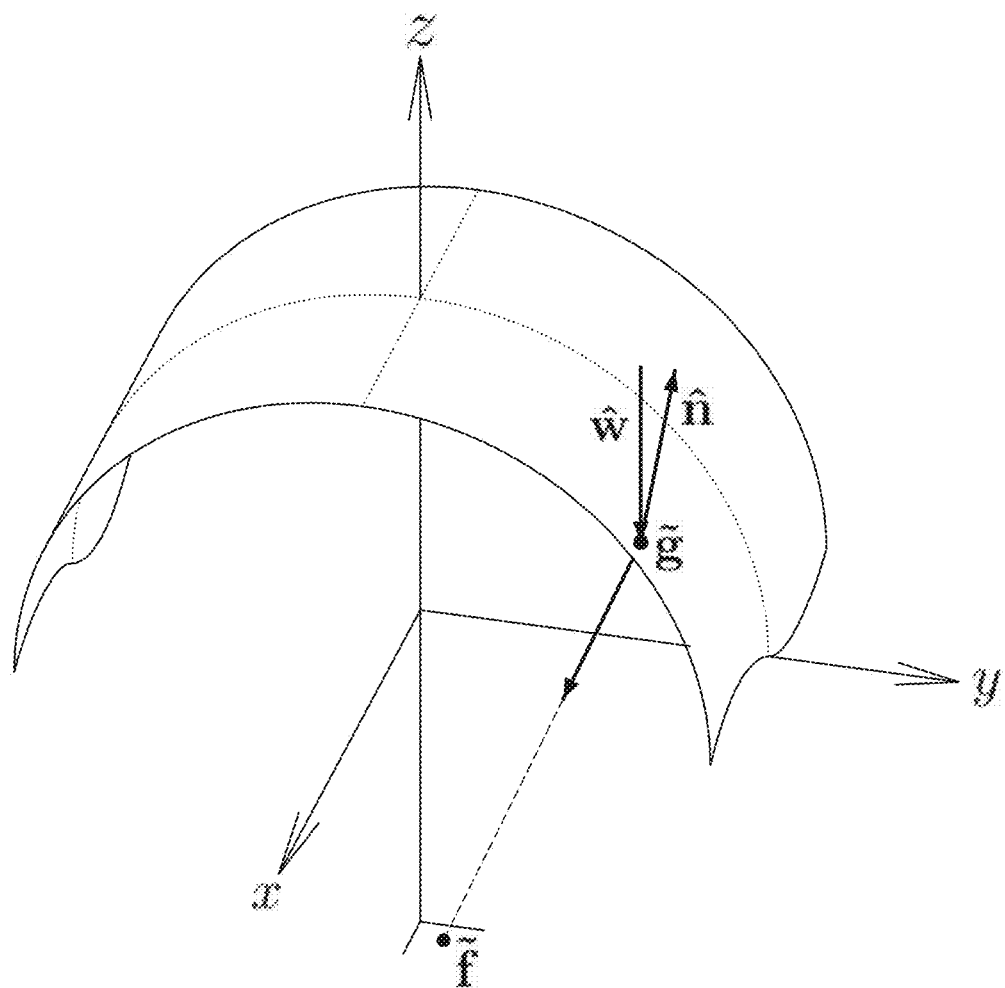
FIG. 17S1

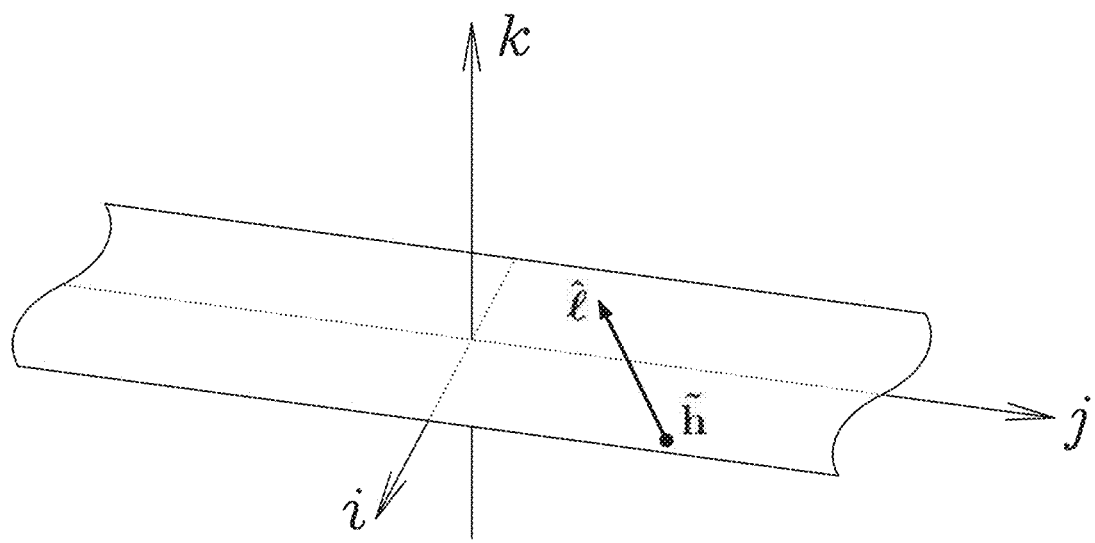
FIG. 17S2
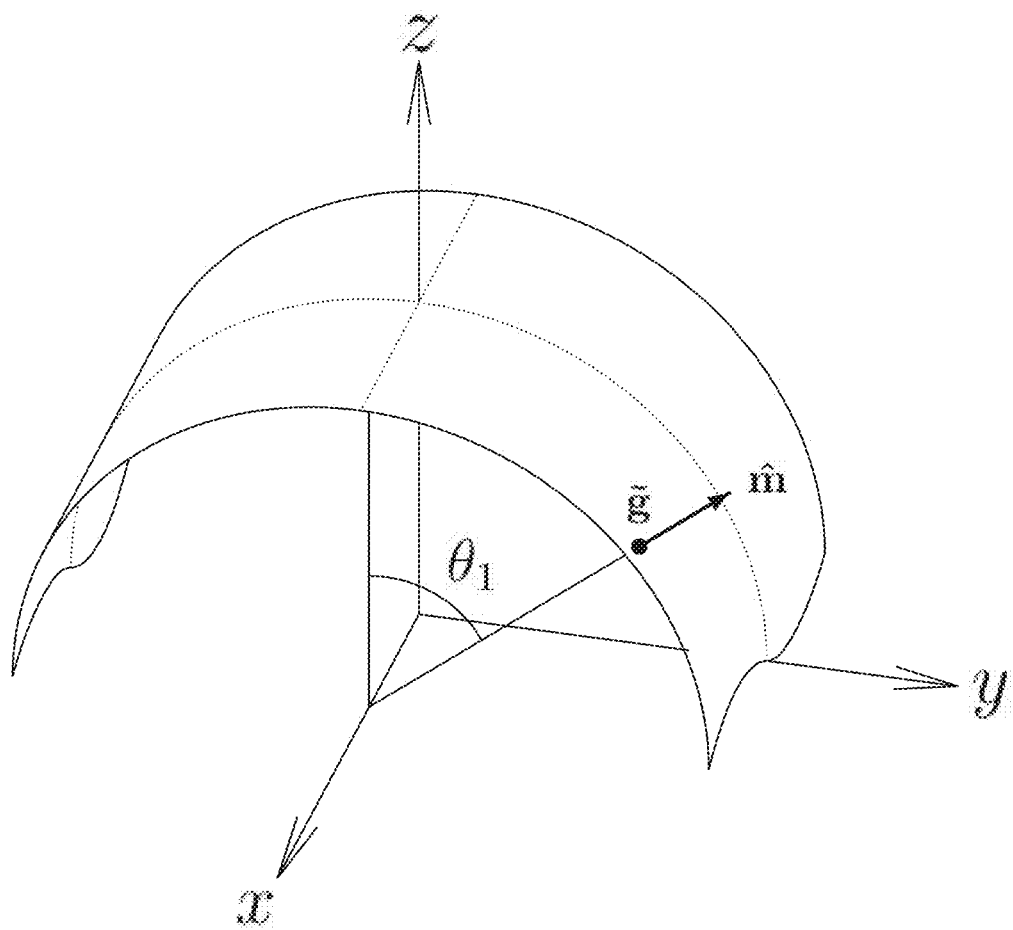
FIG. 17S3

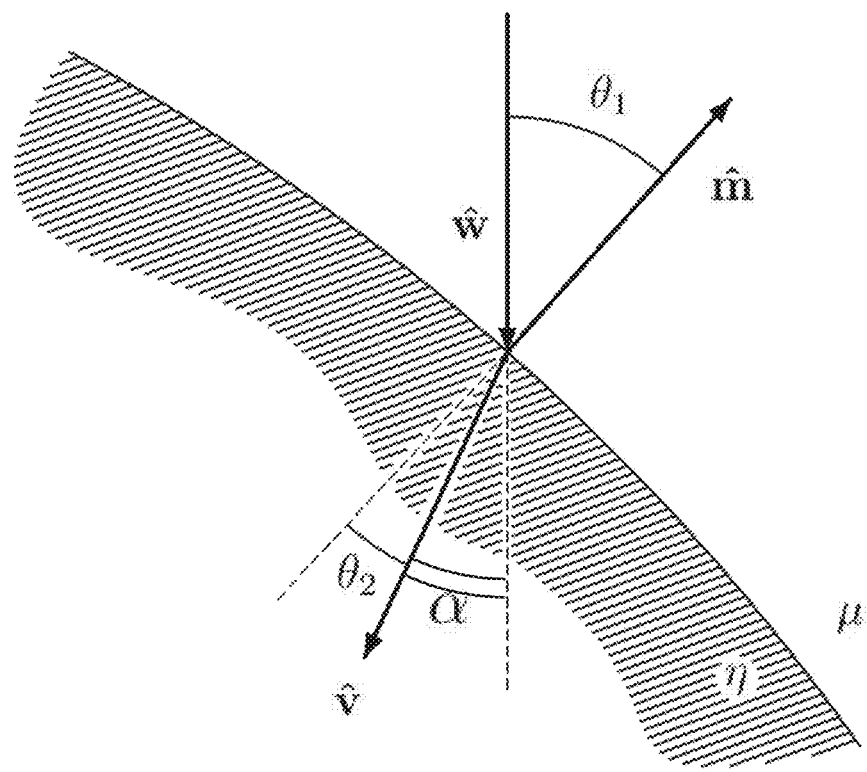
FIG. 17S4
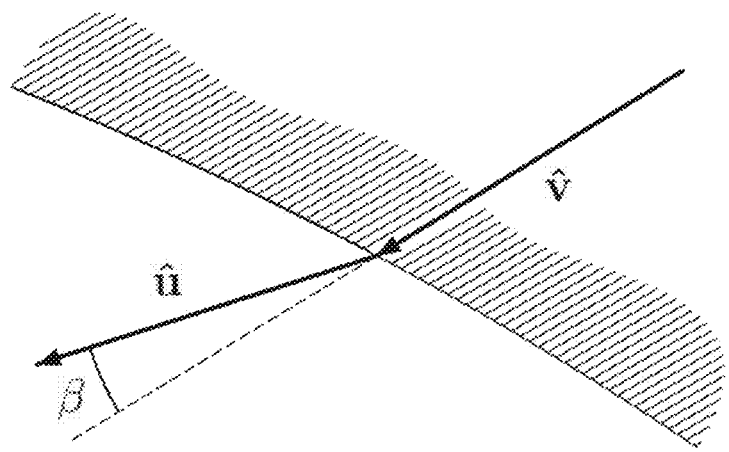
FIG. 17S5

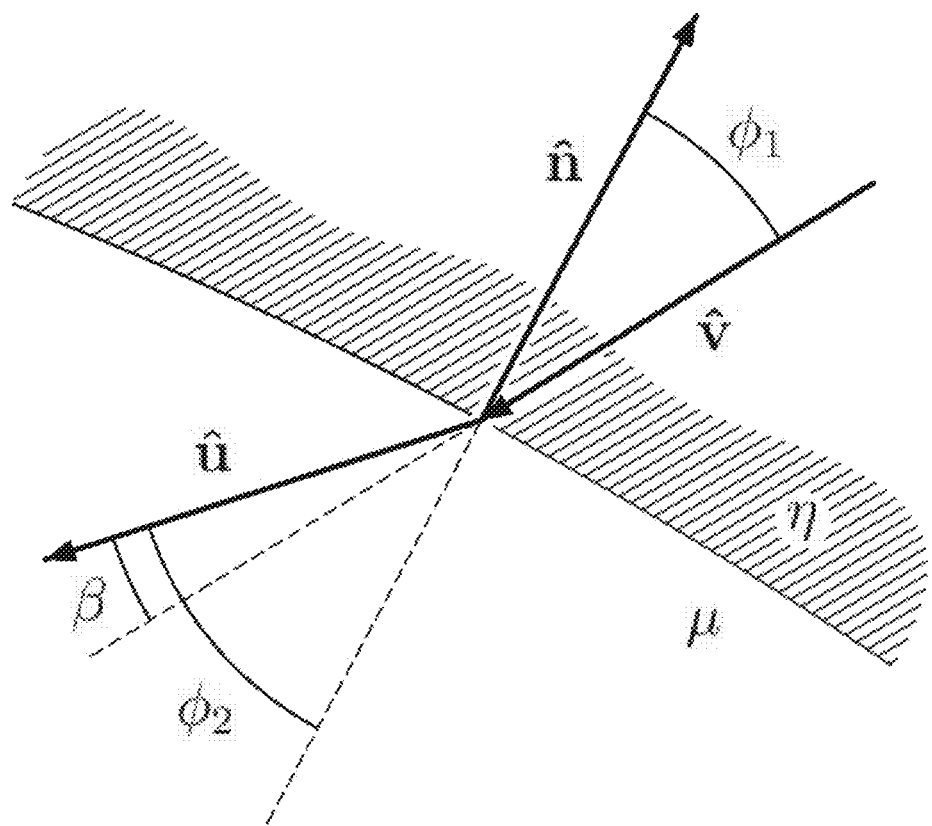
FIG. 17S6
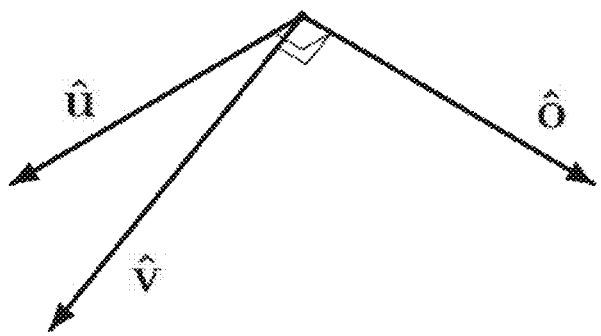
FIG. 17S7

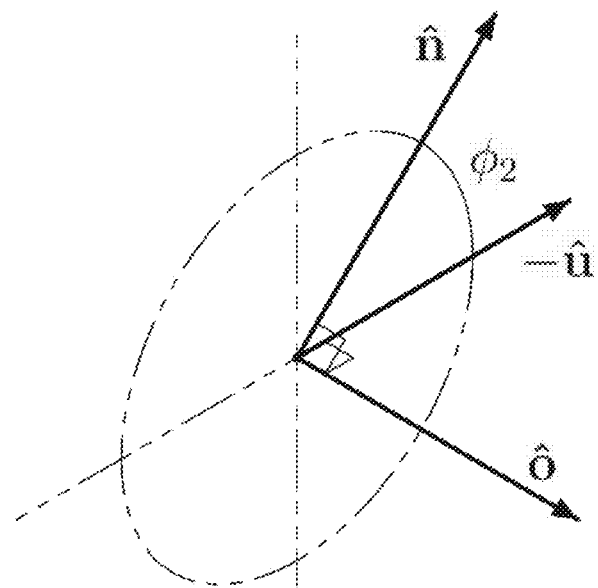
FIG. 17S8
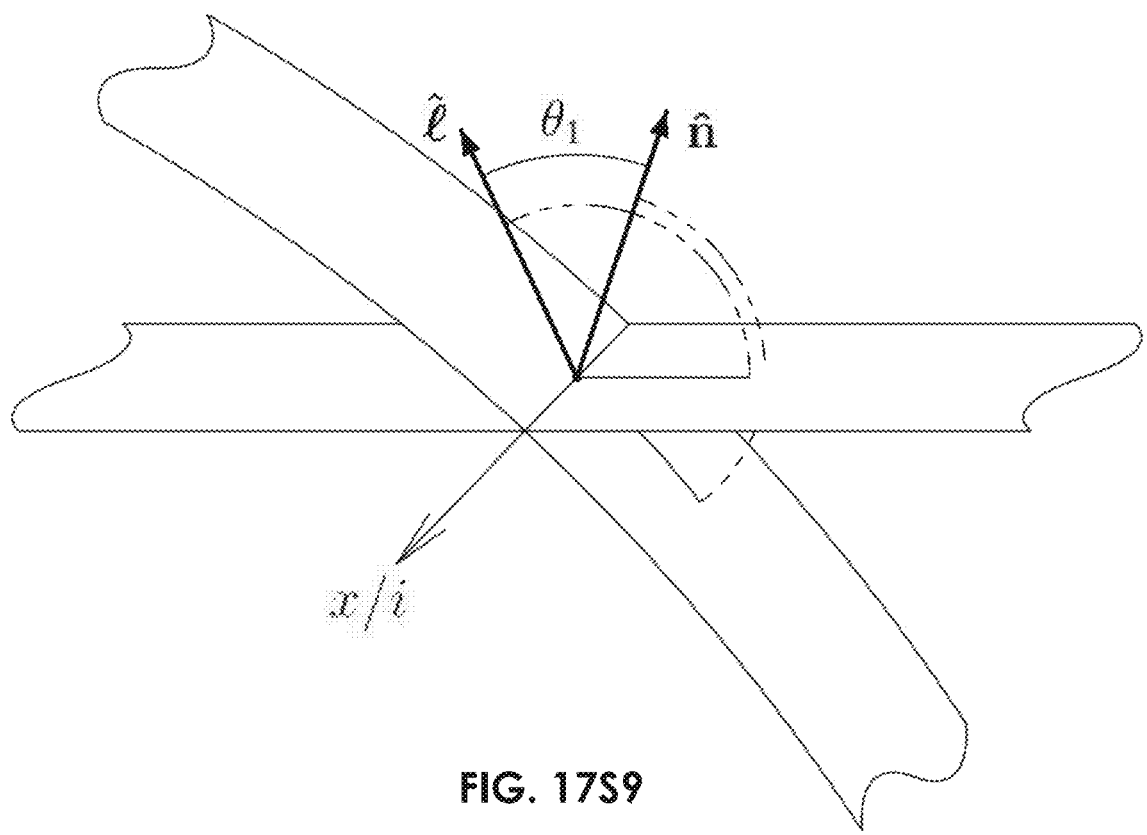
FIG. 17S9

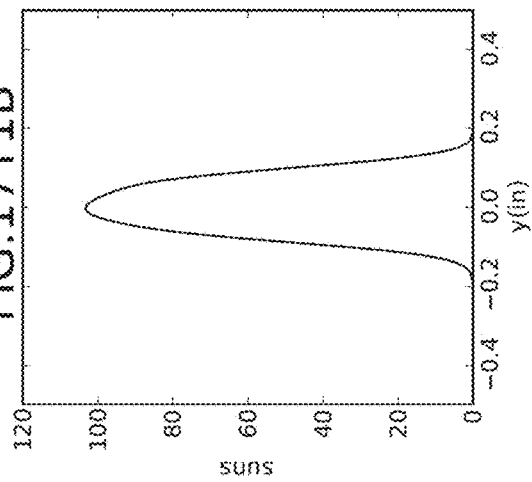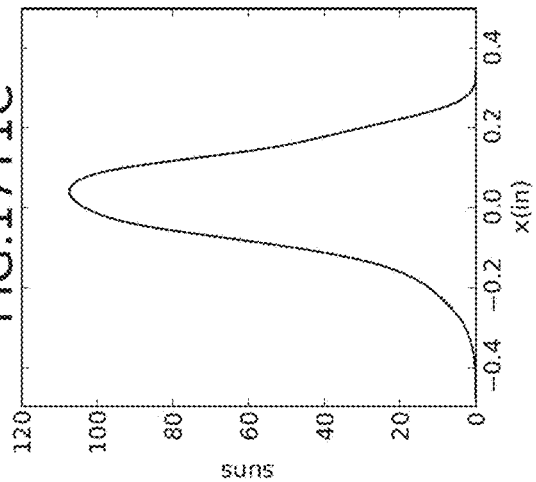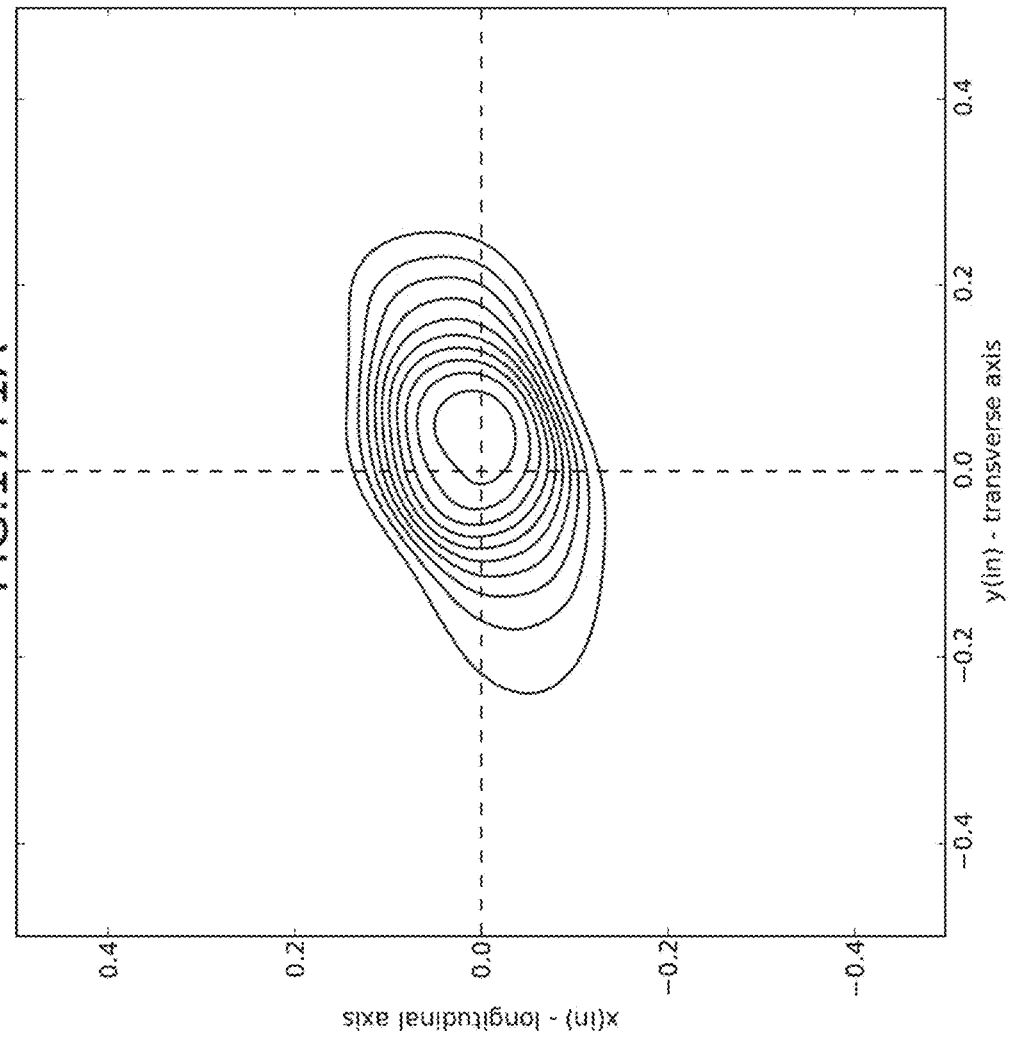

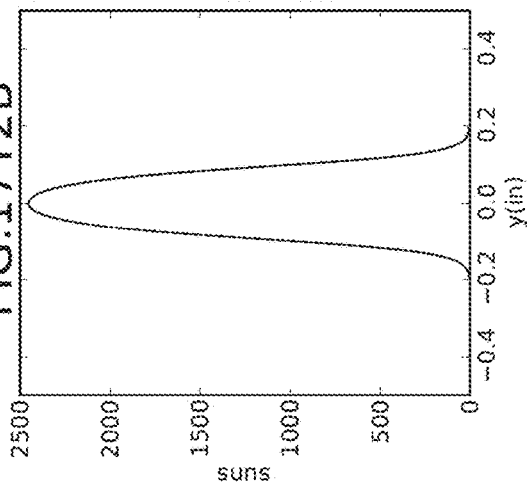
FIG. 17T2B
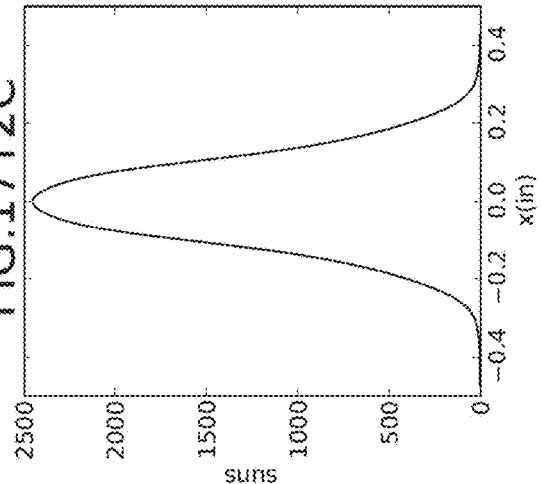
FIG. 17T2C
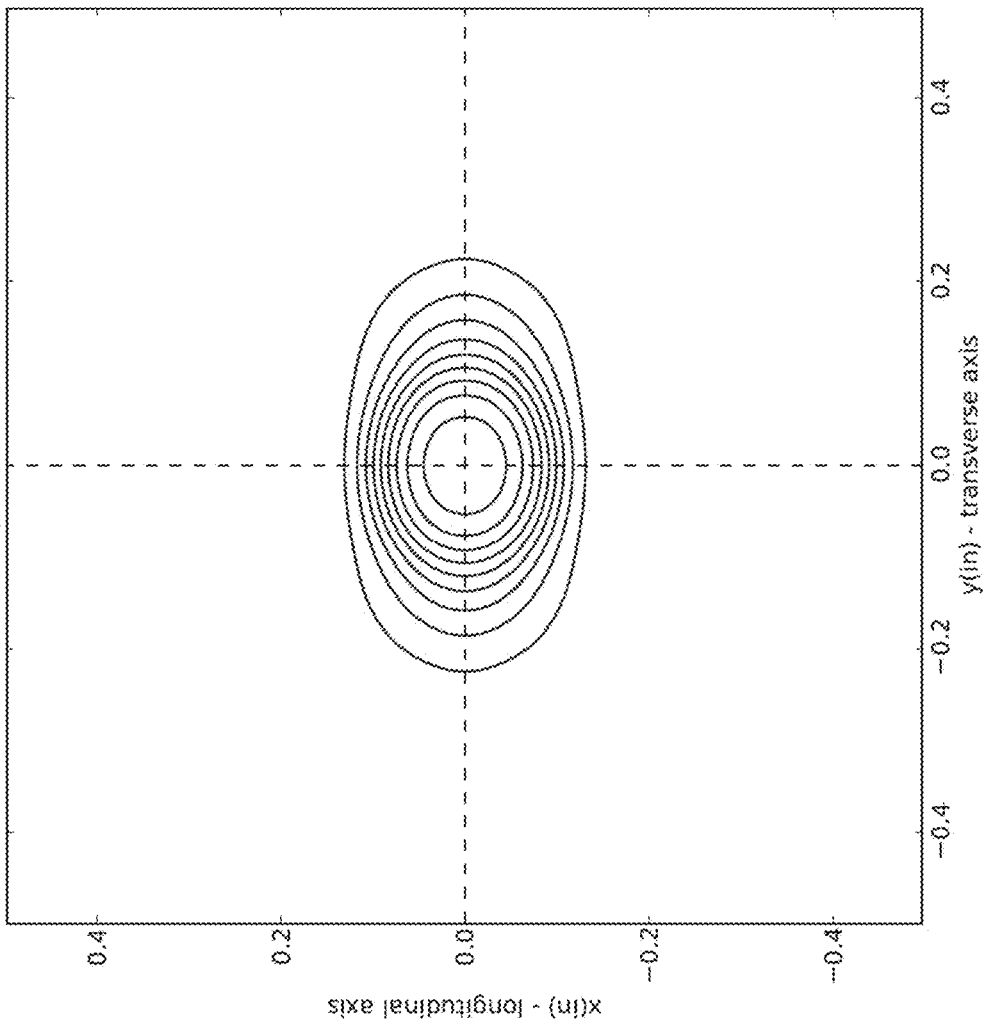
FIG. 17T2A

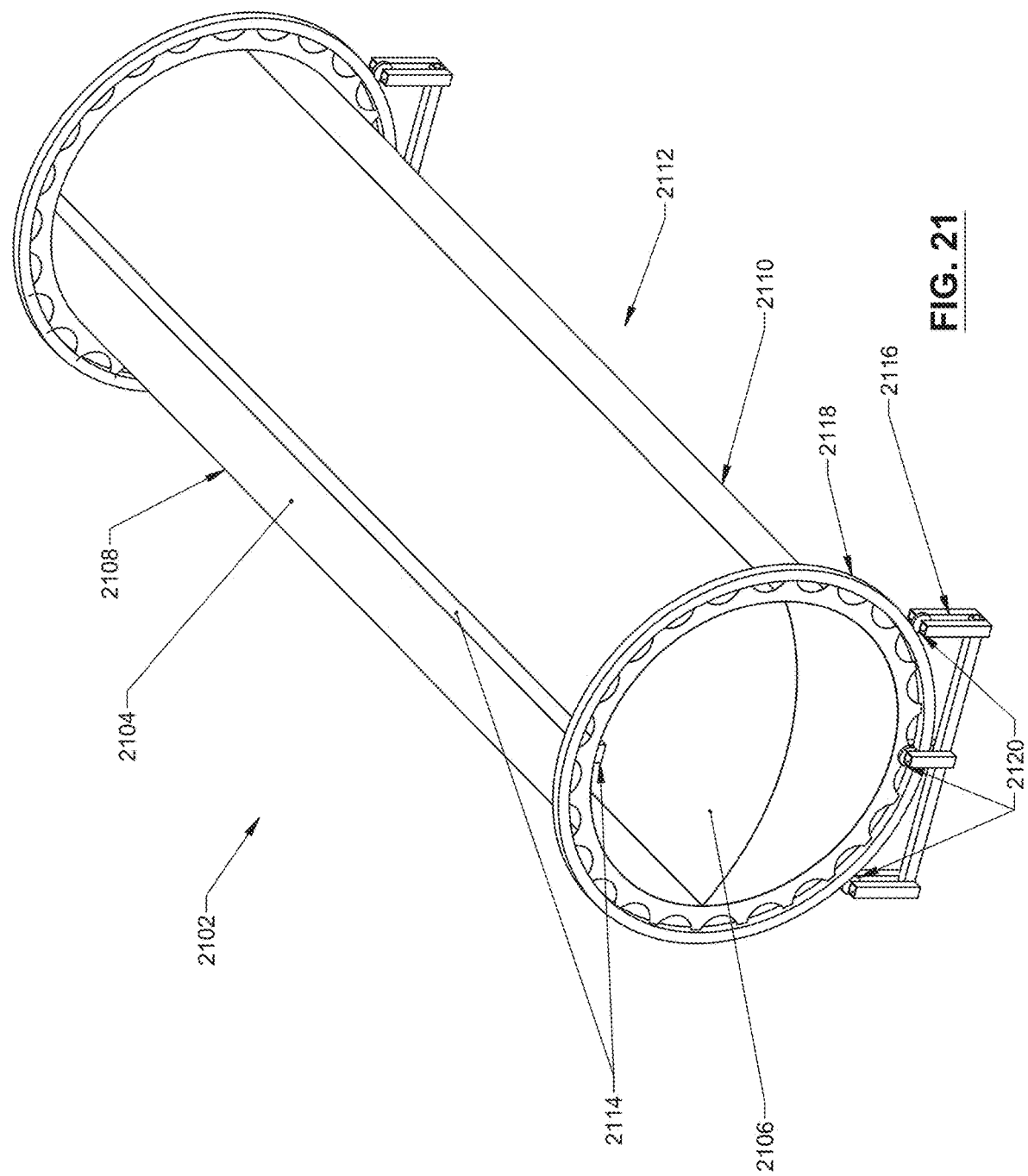

INFLATED TUBULAR SOLAR CONCENTRATORS

CROSS-REFERENCES TO RELATED APPLICATIONS

This application is a National Stage entry of PCT/US2012/065279 filed Nov. 15, 2012, which claims priority under 35 USC § 119(e) to (a) U.S. Provisional Patent Application No. 61/560,547 filed on Nov. 16, 2011 and (b) U.S. Provisional Patent Application No. 61/652,114, filed on May 25, 2012, the disclosures of both these applications are incorporated by reference herein in their entirety for all purposes.

BACKGROUND

Solar radiation is the most abundant energy source on earth. However, attempts to harness solar power on large scales have so far failed to be economically competitive with most fossil-fuel energy sources.

One reason for the lack of adoption of solar energy sources on a large scale is that fossil-fuel energy sources have the advantage of economic externalities, such as low-cost or cost-free pollution and emission. Another reason for the lack of adoption of solar energy sources on a large scale is that the solar flux is not intense enough for direct conversion at one solar flux to be cost effective.

Solar energy concentrator technology has sought to address this issue. For example, solar radiation energy is easily manipulated and concentrated using refraction, diffraction, or reflection to produce solar radiation energy having many thousands of times the initial flux. This can be done using only modest materials such as refractors, diffractors and reflectors.

Specifically, solar radiation is one of the most easy energy forms to manipulate and concentrate. It can be refracted, diffracted, or reflected to many thousands of times the initial flux utilizing only modest materials.

With so many possible approaches, there have been a multitude of previous attempts to implement low cost solar energy concentrators. So far, however, solar concentrator systems cost too much to compete unsubsidized with fossil fuels, in part because of large amounts of material and large areas that that solar collectors occupy. The large amounts of materials used to make solar concentration systems and the large areas that are occupied by solar concentration systems render solar concentration systems unsuitable for large-scale solar farming.

Accordingly, there is a need in the art for improved apparatuses and methods for the collection of solar energy.

SUMMARY

A tubular solar concentrator provides high levels of solar energy concentration/capture with improved conversion efficiency and lower cost. The collector may be assembled from readily-available materials such as clear and metalized polymer films. A thermal receiver or a concentrated photovoltaic receiver may be positioned within, outside of, or at a surface of, a chamber of the concentrator. In some embodiments, the collector may employ single-axis tracking. The solar concentrator includes a film that is configured to refract sunlight. The film forms a tubular shape enclosing a cavity. A first portion of the film may include a refractive region configured to direct the incident sunlight towards one or more focus regions within the cavity. The solar concentrator may further include an inflation gas at least partially fills the cavity and helps to maintain the tubular shape of the film. The solar concentrator may further include a receiver that can capture the energy in the sunlight refracted from the film. The receiver may be located inside the cavity and at one of the one or more focus areas.

In some embodiments, the refractive region comprises a plurality of prisms configured to refract the sunlight. In a particular embodiment, the refractive region is about 30% to 50% of a total surface area of the tube. In some embodiments, the tubular shape has an axis and a diameter and the receiver may include an active element having a width. The active element is disposed perpendicular to the axis and the width of the active element is less than 50% of the diameter of the tubular shape.

Some embodiments of the present invention provide a solar concentrator system that includes one or more tubular solar concentrators that are configured to receive sunlight and direct the sunlight to a receiver located within each of the one or more tubular solar concentrators. The system further includes a support structure configured to hold the one or more tubular solar concentrators. The support structure may further include a base frame configured to rotate about an azimuth rotation axis, an upper frame configured to rotate about an elevation rotation axis, and a tracking mechanism configured to continually track the position of the Sun and may be used to position the base frame and the upper frame to follow a path of the Sun.

Another embodiment of a solar concentrator system provides receivers for capturing concentrated sunlight which maintain optimal position and orientation via a simplified tracking system. In this embodiment, the tracking system has a first rotational motion of the tubular concentrator(s) about a longitudinal rotation axis parallel to the tube axis and a second motion of each receiver relative to its corresponding tubular concentrator, so that each receiver may maintain an appropriate position with respect to the focal region of concentrated light created by the tubular concentrator.

A particular embodiment of the present invention provide a solar concentrator that includes a transparent film that is configured to refract incident sunlight. The transparent film is part of a cylinder structure and the transparent film refracts the incident sunlight to concentrate it in more than one direction. The solar concentrator further includes one or more focal regions that are disposed within the cylinder structure. An average illumination level at the one or more focal regions is about 500 to 2000 times more than an illumination level of the incident sunlight.

Another embodiment of the present invention provides A solar concentrator that includes a film structure that can receive and refract incident light. The film structure may include two or more layers. In some embodiments, a first structural layer in the film structure may include Polyethylene terephthalate (PET). The film structure may be in the shape of a cylinder that encloses an inflation space that may be occupied by a gas. The solar film structure of the solar concentrator may include an inner optical layer disposed below the first layer. The inner optical layer may include acrylic, fluorinated acrylic, ionomer, or other fluorinated polymer. In some embodiments, the thickness of the inner optical layer may range between 0.001 mm and 0.1 mm. In some embodiments, the solar concentrator may also include a plurality of grooves formed in the inner optical layer. In some embodiments, the film structure may further include an outer layer disposed on top of the first layer and the outer layer may include fluorinated polymer or silicone. In some embodiments, the outer layer may further include an ultraviolet (UV) radiation absorbing material, e.g., fluorinated acrylic.

In some embodiments, the solar concentrator film structure may further include an intermediate layer disposed between the outer layer and the first structural layer. The intermediate layer may be designed to block ultraviolet radiation from reaching the first structural layer. In some embodiments the intermediate layer may be configured to prevent the migration of chemical compounds between the adjoining layers. In some embodiments, the film structure may include an outer layer disposed on top of the first structural layer. In this instance, the outer layer may include a material that is resistant (a) temperatures in the range of −40° C. to 80° C., (b) humidity in the range of 0-100% relative humidity, and (c) ultraviolet (UV) exposure. In some embodiments, the PET material of the solar concentrator may include an ultraviolet light absorber material as an additive.

Some embodiments of the present invention provide a solar concentrator that includes a first film that is configured to be exposed to incident sunlight, a second film that is attached to the first film and is configured to provide structural support. The first film and the second film together form a tubular structure that encloses an inflation space. The solar concentrator further includes a receiver detachably connected to the second film which is configured to receive refracted sunlight from the first film. The first film of the solar concentrator refracts incident sunlight to create one or more areas of concentrated solar energy. In some embodiments, the second film may include a metal such as aluminum.

A particular embodiment of the present invention provides a solar concentrator system that includes a film having a tubular shape which is attached to an elongated chassis, and one or more heat sink elements connected to a first surface of the elongated chassis along the length of the elongated chassis. Each of the one or more heat sink elements may include one or more fin structures. The one or more heat sink elements are connected to the first surface using a material having a thermal conductivity between 0.005 W/m-k and 180 W/m-k. The system may further include one or more photovoltaic cells coupled to a second surface of the elongated chassis and one or more optical elements coupled to the elongated chassis and that configured to direct incident sunlight onto the one or more photovoltaic cells. The one or more heat sink elements are designed to dissipate heat generated at the one or more photovoltaic cells. In some embodiments, the film comprises one or more refractive prism elements that are configured to concentrate incident sunlight. The film of the solar concentrator system may enclose an inflation space and the one or more photovoltaic cells may be located within the inflation space. In some embodiments, the inflation space may be filled fully or partially with a gas such as air, helium, carbon dioxide, nitrogen, argon, hydrogen, oxygen, or water vapor.

In some embodiments, the one or more photovoltaic cells may be located at a surface of the tubular structure or may be located outside a perimeter defined by the tubular shape of the film.

These and other embodiments of the present invention, as well as its features and some potential advantages are described in more detail in conjunction with the text below and attached figures.

BRIEF DESCRIPTION OF THE DRAWINGS

FIGS. 1 and 1A illustrate simplified perspective and cross-sectional views respectively, of an inflatable concentrator according to an embodiment of the present invention.

FIGS. 2 and 2A illustrate simplified perspective and cross-sectional views respectively, of an inflatable concentrator according to another embodiment of the present invention.

FIGS. 3 and 3A illustrate simplified perspective and cross-sectional views respectively, of an inflatable concentrator according to still another embodiment of the present invention.

FIGS. 4 and 4A illustrate simplified perspective and cross-sectional views respectively, of an inflatable concentrator according to yet another embodiment of the present invention.

FIG. 9A illustrates a simplified isometric view of a film-based solar collector trough structure according to an embodiment of the present invention.

FIGS. 9B-9E illustrate various other views of the collector structure of FIG. 9A according to an embodiment of the present invention.

FIG. 10F illustrates another view of a frame and a sub-frame according to an embodiment of the present invention.

FIG. 10G illustrates an enlarged detail view of the area A denoted in FIG. 10F according to an embodiment of the present invention.

FIG. 17C1 illustrates another transparent film system with refractive prism shapes on its concave side according to an embodiment of the present invention.

FIG. 17C2 illustrates a partial close-up view of the film and prisms of FIG. 17C1 according to an embodiment of the present invention.

FIGS. 17G1-17G6 show a prism design for a cylindrical optic which creates 2-D concentration according to an embodiment of the present invention.

FIGS. 17I1-17I8 show details of a 2-D concentrating prism design method for cylindrical optic using discretized calculation process according to an embodiment of the present invention.

FIG. 17J1 illustrates a top view of a refractive prism pattern that may be wrapped to form a cylindrical or tubular concentrating optic according to an embodiment of the present invention.

FIG. 17J2 illustrates an isometric view the pattern of FIG. 17J1 as wrapped onto a tubular optic according to an embodiment of the present invention.

FIG. 17K1 illustrates a tiled composite refractive prism pattern that may be wrapped to form a cylindrical or tubular concentrating optic according to an embodiment of the present invention.

FIG. 17K2 illustrates an isometric view the pattern of FIG. 17K1 as wrapped onto a tubular optic according to an embodiment of the present invention.

FIG. 17L1 illustrates a top view of a mapping pattern for a tubular refractive optic and target focus regions according to an embodiment of the present invention.

FIG. 17L2 illustrates an isometric view of the mapping pattern of FIG. 17L1 according to an embodiment of the present invention.

FIG. 17M1 illustrates a top view of another mapping pattern for a tubular refractive optic and target focus regions according to an embodiment of the present invention.

FIG. 17M2 illustrates an isometric view of the mapping pattern of FIG. 17M1 according to an embodiment of the present invention.

FIG. 17N1 Illustrates a top view of another mapping pattern for a tubular refractive optic and target focus regions according to an embodiment of the present invention.

FIG. 17N2 illustrates an isometric view of the mapping pattern of FIG. 17N1 according to an embodiment of the present invention.

FIG. 17O1 Illustrates a top view of another mapping pattern for a tubular refractive optic and target focus regions according to an embodiment of the present invention.

FIG. 17O2 illustrates an isometric view of the mapping pattern of FIG. 17O1 according to an embodiment of the present invention.

FIG. 17P1 Illustrates a top view of another mapping pattern for a tubular refractive optic and target focus regions according to an embodiment of the present invention.

FIG. 17P2 illustrates an isometric view of the mapping pattern of FIG. 17P1 according to an embodiment of the present invention.

FIG. 17Q1 illustrates a top view of another mapping pattern for a tubular refractive optic and target focus regions according to an embodiment of the present invention.

FIG. 17Q2 illustrates an isometric view of the mapping pattern of FIG. 17Q1 according to an embodiment of the present invention.

FIG. 17R1 illustrates a top view of a flattened film with specific tiles of prism patterns according to an embodiment of the present invention.

FIG. 17R2 illustrates the film of FIG. 17R1 as formed into a cylinder shape according to an embodiment of the present invention.

FIGS. 17R3A-17R3C illustrate an irradiance map of the spot of light created by a simulated ray trace through one of the patches of prisms in FIGS. 17R1 and 17R2 according to an embodiment of the present invention.

FIGS. 17R4A-17R4C illustrate an irradiance map of the spot of light created by a simulated ray trace through another one of the patches of prisms in FIGS. 17R1 and 17R2 according to an embodiment of the present invention.

FIGS. 17R5A-17R5C illustrate an irradiance map of the spot of light created by a simulated ray trace through one of the patches of prisms in FIGS. 17R1 and 17R2 according to an embodiment of the present invention.

FIGS. 17R6A-17R6C illustrate an irradiance map of the spot of light created by a simulated ray trace through one of the patches of prisms in FIGS. 17R1 and 17R2 according to an embodiment of the present invention.

FIGS. 17R7A-17R7C illustrate an irradiance map of the spot of light created by a simulated ray trace through one of the patches of prisms in FIGS. 17R1 and 17R2 according to an embodiment of the present invention.

FIGS. 17R8A-17R8C illustrate an irradiance map of the spot of light created by a simulated ray trace through all of the patches of prisms in FIGS. 17R1 and 17R2 simultaneously according to an embodiment of the present invention.

FIGS. 17S1-17S9 illustrate various surfaces, points and vectors used in the mathematical representations and calculations of shapes for 2D concentrating cylindrical Fresnel prisms according to an embodiment of the present invention.

FIGS. 17T1A-17T2C illustrate irradiance maps of the spot of light created by a simulated ray trace through a section of idealized, continuous groove 2D concentrating cylindrical Fresnel lens according to an embodiment of the present invention.

FIG. 21 illustrates a solar concentration trough system that uses inflation air and a membrane to eliminate a need for a rigid frame according to an embodiment of the present invention.

DETAILED DESCRIPTION

Figure 5:
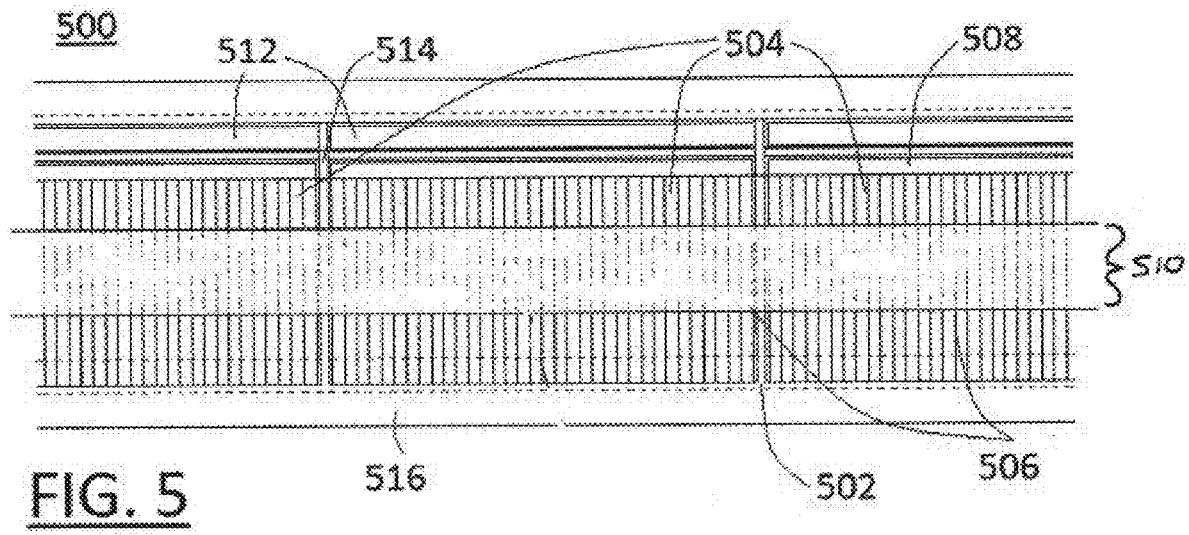
FIGS. 5-5B illustrate simplified views of an embodiment of a concentrated photovoltaic (CPV) receiver according to an embodiment of the present invention.

Solar radiation is a relatively easy form of energy to manipulate and concentrate. It can be refracted, diffracted, or reflected, to achieve concentrations of up to thousands of times the initial flux, utilizing only modest materials.

Conventionally, however, the costs associated with a solar concentrator system has proven prohibitive for competing with unsubsidized with fossil fuels, in part because of excessive material costs and large areas that conventional solar collectors occupy. These excessive materials costs and the large areas that are occupied by solar concentration systems may render them unsuitable for large-scale solar power generation projects.

One possible approach to reducing cost is to reduce the cost associated with manufacturing of major structures of a solar power plant. This may be done by exploiting spontaneous and natural tendencies of materials and by use of more efficient manufacturing techniques.

In one instance the tendency of a thin, flat film to assume a consistent tubular shape when rolled and inflated may be used to create an inexpensive solar concentrator. Specifically in a particular embodiment, small prisms may be formed in a clear film to create a desired focus or foci when the film is inflated in a tubular configuration.

In another instance, the tendency of a flat reflective film to assume a smooth concave shape under the influence of a pressure differential may be used to fabricate a solar concentrator. Specifically, in a particular embodiment, inflation air may be used to impart a curved profile to a reflective component of a concentrator for a solar collector structure.

Such inflatable solar concentrators may offer certain benefits over conventional concentrator designs that employ more common structural elements. For example, an inflatable concentrator uses air as a structural member, and may employ thin plastic membranes (herein referred to as films) as a primary optic. This can yield significant weight advantages in a system deployed in the field. The weight advantages in the concentrator itself can in turn reduce the amount and complexity of the structures of the mounting and tracking systems used with the solar concentrator. This will help to reduce the overall mass and cost of the solar collector system.

According to certain embodiments, a solar collector may utilize an inflated refractive concentrator having a tube-like shape and including refractive prism elements in order to achieve one or more focus areas of concentrated refracted light on a receiver. The collector may be assembled from inexpensive, lightweight, and readily-available materials such as polymer films. As described below, depending upon the particular embodiment, a thermal or concentrated photovoltaic (CPV) receiver may be disposed within, outside of, or at a surface of, the inflated concentrator.

According to certain other embodiments, a solar collector may utilize an inflated reflecting concentrator having a tube-like shape in order to achieve focus of concentrated reflected light along a line on a receiver. The collector may be assembled from inexpensive, lightweight, and readily-available materials such as aluminized polymer film (exhibiting reflecting properties) and polyester film (exhibiting optically transparent properties). As described below, depending upon the particular embodiment, a thermal or concentrated photovoltaic (CPV) receiver may be disposed within, outside of, or at a surface of, the inflated concentrator. In addition as described herein (for example in connection with FIGS. 7-8), by virtue of its operation to gather and focus light in one dimension, single-axis tracking of such a trough-type collector may be sufficient.

Certain embodiments may seek to reduce the levelized cost of energy of a solar power plant, and to maximize the scale at which such plants can be deployed. Embodiments of solar collector devices and methods may be utilized in conjunction with power plants having one or more of the attributes described in that patent application.

The objectives of reduced levelized cost and maximized scale of a solar power plant, can be achieved through the use of elements employing minimal materials and low-cost materials that are able to be mass produced. Potentially desirable attributes of various elements of such a solar power plant, include simple, rapid, and accurate installation and assembly, ease of maintenance, robustness, favorable performance at and/or below certain environmental conditions such as a design wind speed, and survivability at and below a higher maximum wind speed.

In particular embodiments, inflation air may be used to impart a concave profile to a reflective component of a concentrator for a solar collector structure. Specifically, a reflective surface in the form a metalized film shaped by inflation pressure, may be used to create an elongated inflated tubular concentrator defining a reflective trough for communicating concentrated solar energy to a receiver, such as a thermal or photovoltaic receiver.

FIGS. 1 and 1A show simplified perspective and cross-sectional views, respectively, of one embodiment of an inflated concentrator. Concentrator 100 comprises a clear film 102 joined to a reflective film 104 (here Aluminized) by a film seal 106. According to certain embodiments, the films may be directly sealed to each other. According to other embodiments, the film seal can be formed by having the films attached to separate sealing member(s).

In certain embodiments, the films may define a tubular shape in which the cross-section of the concave reflective film is half-circular. The inclusion of circular end pieces 108, may define an internal inflation space 110 having a substantially circular profile. Alternately, in certain embodiments end(s) of the films may be self-sealed, pinched like a sausage, or sealed together in the same plane as the other linear edge seals. Such approaches may allow for lower cost manufacturing. While some light from the ends may be lost, or the "spot" may not extend all the way along the tube, the resulting cost benefit could be favorable.

In certain embodiments clear film 102 may comprise a polymer. Many different types of polymers are candidates for clear film 102. One form of polymer which may be suitable is a polyester, examples of which include but are not limited to polyethylene terephthalate (PET) and similar or derivative polyesters such as polyethylene napthalate (PEN), or polyesters made from isophthalic acid, or other diols such as but not limited to butyl, 2,2,4,4 tetramethylcyclobutyl or cyclohexane.

According to certain embodiments clear film 102 may be formed from poly(meth methacrylate) (PMMA) and co-, ter-, tetra-, or other multimonomeric polymers of methacrylates or acrylates including but not limited to monomers of ethyl, propyl and butyl acrylate and methacrylates. Other examples of polymers forming the upper transparent film include but are not limited to polycarbonate (PC), polymethylpentane (TPX), cyclic olefin derived polymers such as Cyclic olefin co-polymers (COC), cyclic olefin polymer (COP), ionomer, fluorinated polymers such as polyvinilidene fluoride and difluoride (PVF and PVDF), ethylene tetrafluoroethylene (ETFE), ethylene chlorotrifluoroethylene (ECTFE), fluorinated ethylene propylene (FEP), THV and derivatives of fluorinated polymers, and co-extruded, coated, adhered, or laminated species of the above. Examples of thicknesses of layers of such materials may include from about 0.012 mm to 20 mm, depending on the strength of the material and the size of the collector. In some embodiments, film 102 may comprise two or more layers. Each layer can be chosen from any of the materials listed above.

Incident optical energy 111 may pass through the clear film 102, and be reflected by reflective film 104 to concentrate light along an elongated focus region 112. Provision of a receiver in this elongated focus region, may allow conversion of the reflected solar energy into other forms (including but not limited to thermal energy or electrical energy).

In some embodiments, a full half circle cross section for a reflector (half-cylinder) reflects only a portion of the incident rays 111 back in a direction where they can be captured by a receiver. Another portion of the incident rays 111 may reflect in a direction such that they bounce off the reflective surface again, from a different location, sometimes multiple times, without converging at a feasible receiver location 112.

FIGS. 2 and 2A show simplified perspective and cross-sectional views, respectively, of an alternative embodiment of an inflated concentrator. Concentrator 200 comprises a clear film 202 joined to a reflective film 204 by a film seal 206.

In this particular embodiment, the concentrator 200 further comprises a batten structure 220. If films 200 and 202 do not form a substantially circular cross section, battens 220 may apply force(s) to films 200 and 202 to maintain their boundary locations under the influence of a pressure differential. If, however, films 200 and 202 together form a substantially circular cross section, then batten(s) 220 may not be necessary or may have minimal weight and strength. This is because the battens may not need to apply forces to films 200 and 202 to maintain their boundary locations. In that case, battens 220 may need only apply forces to maintain the concentrator position under the influence of gravity, wind and other environmental loads.

In certain embodiments, batten 220 may provide for film attachment and/or film sealing. For example batten 220 may comprise a solid or hollow member such as a rod, to which one or more of the films may be attached as part of the film seal. A detailed discussion of film sealing is found in the U.S. patent application Ser. No. 13/015,339 filed on Jan. 27, 2011, which is incorporated by reference herein for all purposes.

While the particular embodiment of FIG. 2 shows batten 220 as forming part of the film seal allowing for the creation of an internal inflation space 210, this is not required. According to alternative embodiments, batten 220 may be separate from the film seal.

According to certain embodiments, trough-type concentrators may be aligned with the sun utilizing single-axis tracking. In some embodiments, the single-axis tracking may be achieved by rotation about the long axis of the concentrators. Single-axis tracking is possible for any angle of the long axis relative to horizontal, including vertical.

The nature of the tracking can depend upon the orientation of the trough-type concentrator. For a North-South trough orientation, single-axis tracking may involve nearly a 180° range of motion. An East-West trough orientation may involve tracking through a wide range of motion every day, but the motion may be slow in the middle of the day and fast at the beginning and end of the day.

Trough-type collectors according to embodiments of the present invention may be oriented East-West, North-South, or at any angle that maximizes power output. The orientation can thus depend upon factors such as the site location, time of day, etc.

FIGS. 3 and 3A show simplified perspective and cross-sectional views, respectively, of an alternative embodiment of an inflated concentrator. Concentrator 300 comprises a clear film 302 joined to a reflective film 304 by a film seal 306. This embodiment comprises two separate battens, a lower batten 320, and an upper batten 322.

Lower batten 320 functions in a similar manner as batten 220 of FIG. 2 to define the shape of reflective film 304 and hence the location of the elongated concentrated focus. Upper batten 322 functions to define the shape of clear film 302, for example to determine whether a particular location (e.g. the position of the receiver) lies inside or outside of the inflation space.

FIGS. 4 and 4A show simplified perspective and cross-sectional views, respectively, of an alternative embodiment of an inflated concentrator. Concentrator 400 comprises a clear film 402 joined to a reflective film 404 by a hoop structure 406 having a thickness, with the material composition of the hoop imparting stiffness to the concentrator and collector structure.

Various techniques may be employed alone or in conjunction, to enhance the effectiveness of harvesting of solar energy by a solar collector comprising an inflatable concentrator. One such technique is modification of the profile offered by the reflective surface of the primary reflective optical element.

U.S. Non-provisional patent application Ser. No. 13/338,607 filed on Dec. 28, 2011 describes the use of embossing to control the optical performance of films. Embodiments of solar collectors employing inflatable concentrators may employ one or more techniques described in that patent application.

One possible approach utilizing embossing, employs a linear embossing pattern made by a linear (possibly roll-to-roll) process. The result would be a film with a cross section centerline that still has a cylindrical shape, but which has small deviations to the active reflective surface. These deviations would ensure that the effective slope of each point on the reflective surface is determined explicitly, to achieve a particular optical result (rather than just being the slope of a cylinder).

Optical results that can be obtained according to this approach, include a spot exhibiting relatively uniform illumination (a "flat" illumination profile), and/or exhibiting higher concentrations than can be created with a cylindrical reflector. A spot similar to that created by a parabolic reflecting profile could be created if desired, although a parabola may not be an optimal reflector shape for some concentrated photovoltaic (CPV) applications. Another possible embossing approach corrects the effective slope of the reflector, allowing off-axis placement. Such an approach could allow unwanted shading from the receiver to be reduced or eliminated.

Secondary Optic

The collection of solar energy from an inflated concentrator structure may also benefit from the use of secondary optical structures. Thus collectors according to various embodiments may employ secondary optical structure(s) in addition to the inflated reflective primary optic. Such a secondary optical structure can perform one or more roles, including but not limited to, reducing sensitivity to tracking error, enhancing uniformity of illumination, steering light away from grout, and helping to define optical boundaries.

U.S. patent application Ser. No. 12/720,429, filed on Mar. 9, 2010 describes certain types of secondary optics. This application is hereby incorporated by reference herein for all purposes. Embodiments of collectors may include secondary optical structures exhibiting one or more characteristics described in these applications.

Receiver

Collectors according to various embodiments are not required to be employed in conjunction with any specific type of receiver. Thus receivers based upon thermal or photovoltaic principles may be used. Other examples of receivers include but are not limited to a chemical process receiver (i.e. use solar heat to drive a chemical process), for example in fuel processing. A particular type of thermal receiver may also create steam for oil extraction.

U.S. Pat. No. 7,866,035 describes various embodiments of receivers. The above US patent is incorporated by reference herein in its entirety for all purposes. Embodiments of collectors may include receivers exhibiting one or more characteristics described in the patent and provisional application.

FIG. 5 shows a simplified plan view of a section of one particular embodiment of a receiver 500 which may be suited for use with an inflated solar concentrator. Specifically, such a device is particularly suited to receiving solar energy concentrated by a factor of about 20×, and up to about 40× or more, in an elongated focus region.

A trough shaped reflective primary optic may create a region of concentrated light by reflecting light rays inward toward each other, so they are no longer parallel. This concentration created by inward reflection or bending may occur about one axis. This is somewhat different from concentration about two axes created by reflective dishes, which typically have a central axis of revolution, so that light concentrates to a point or a circular spot rather than to a line. Certain embodiments described herein concentrate light to a linear shaped region of increased intensity. Receiver 500 includes receiver heat sink or substrate mount 502. In certain embodiments, this heat sink or substrate mount may be made out of aluminum, but this is not required. According to some embodiments, the heat sink or substrate mount may itself comprise a structural element of the receiver.

Arranged on the heat sink or substrate mount in row(s), and aligned with the focused concentrated solar light from an inflatable concentrator, are a plurality of silicon solar cells 504 and bypass diodes. These cells may be of any design, including front-contact cells as described in the U.S. Provisional Patent Application No. 61/475,483. This embodiment shows front contact cells 504 in conjunction with conducting busbars 508 and fingers 506.

Fingers 506 will, in most cases, be electrically connected to busbars 508. An alternate term for fingers 506 is "gridlines." In an alternate embodiment, busbars similar to 508 may be on both edges of each cell such that fingers 506 may connect to busbars at both ends. This configuration can reduce current in the fingers, especially near the busbars and thereby reduce energy lost in the fingers and busbars. In another embodiment, fingers 506 could run parallel to the long axis of the receiver and parallel to busbars 508. In such a configuration, some other electrical connection between fingers 506 and busbars 508 may be used.

Electrical communication is established between cells through a conductor 514. The conductor may comprise wire, foil, mesh, or ribbon. The conductor may comprise, but is not limited to, tinned copper. The conductor may be attached to the busbar and to the diode through solder or an electrically conducting adhesive. As used herein, the term conducting adhesive includes but is not limited to a material selected from epoxy, acrylic, polyimide, polyurethanes, cyanate esters, silicone, and combinations thereof, allowing electrical communication.

As described in detail below in connection with FIG. 5A, a transmissive optical element 516 overlies the active side of the cells. A concentrated line focus 510 of light reflected by the concentrator is shown on the cells.

Various embodiments of receivers may have a particular designs and cell layouts. For example, cells may be arranged within the receiver in any number of ways, including, e.g., as described in the U.S. Provisional Patent Application No. 61/475,483. Solar cell(s) may be arranged on an embodiment of a receiver to achieve one or more of the following goals:

(a) the busbar is not normally illuminated;
(b) the cell gridlines are perpendicular to the light line focus; and
(c) the concentrated light line focus normally illuminates just half of the cell so as to provide more tolerance for tracking errors.

Figure 5A:
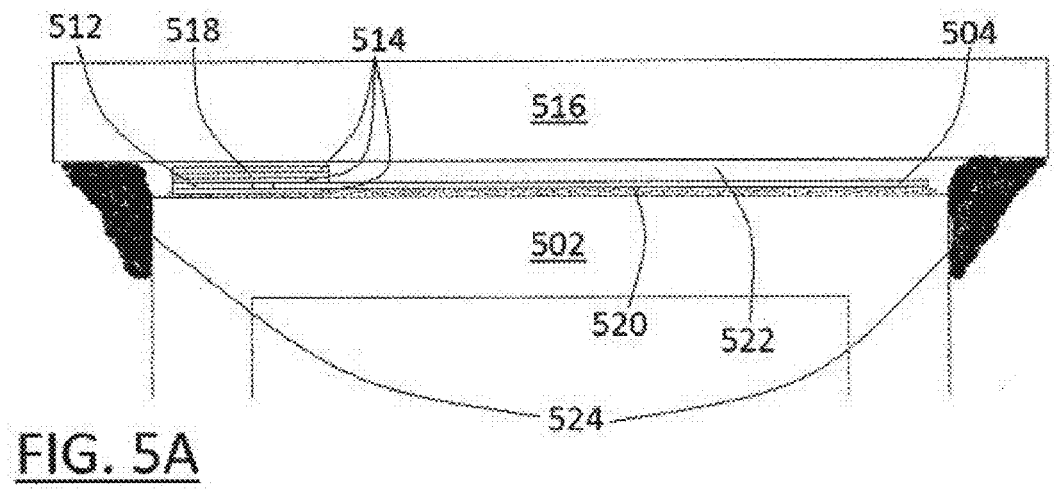

FIG. 5A shows a simplified cross-sectional view of the particular receiver embodiment of FIG. 5. This view shows encapsulant 522 and the transmissive optical element 516. Encapsulant 522 and transmissive optical element 516 serve to seal and weatherize the receiver, as well as provide mechanical protection for the cells. Sealing the cells and interconnects may be important to reduce degradation in performance that can arise from corrosion or electro migration of the solar cell metallization.

The encapsulation material is chosen to match the index of refraction of the transmissive element and minimize reflection. Examples of materials that can be used as encapsulant include but are not limited to, silicones or ethylene vinyl acetate (EVA). Transmissive optical element 516 may be refractive and/or shaped and/or include homogenizing properties. In certain embodiments homogenizing properties can be achieved obtained through the use of coatings or surface treatments, which minimize loss. Examples of materials that can be used in transmissive optical element 516 include but are not limited to, low iron, tempered glass, or TEFLON. Cells may be attached to the heat sink or substrate 502 directly using an insulating adhesive 520. Used herein, the term insulating adhesive includes but is not limited to materials selected from epoxy, acrylic, polyimide, polyurethanes, cyanate esters, silicone, and combinations thereof that do not allow electrical communication there through.

Adhesive 520 may also exhibit particular thermal properties. In some embodiments the adhesive may be highly thermally conductive to draw heat away from the cells to the heat sink. In some embodiments, the thermal conductivity of the material used in the adhesive may be between 0.005 W/m-k and 170 W/m-k. Minimizing the number and thickness of layers between the cell and the heat sink reduces the cell temperature and increase power output. Thermal control over the receiver may be achieved by cooling, which can be accomplished passively, actively, or by some combination of passive and active approaches. In this particular embodiment three conducting layers 514 are shown, separated by an insulating layer 518 which also lies between the cells 504 and the bypass diodes 512. The use of multiple conducting layers in a manner analogous to the interconnect structures of integrated circuits, can allow for internal power routing and reduce need for long external cabling.

The particular embodiment of FIGS. 5-5A utilizes one bypass diode arranged in parallel with each cell. However this is not required. Alternative receiver embodiments may employ bypass diodes in other configurations. A sealant 524 prevents the ingress of moisture from reaching the cells and may also be used to attach the transmissive optical element 516 to heat sink or substrate 502. As used herein, the term sealant includes but is not limited to materials such as epoxy, acrylic, polyimide, polyurethanes, cyanate esters, silicone, and combinations thereof that serve to reduce the transport of water there through.

Figure 5B:
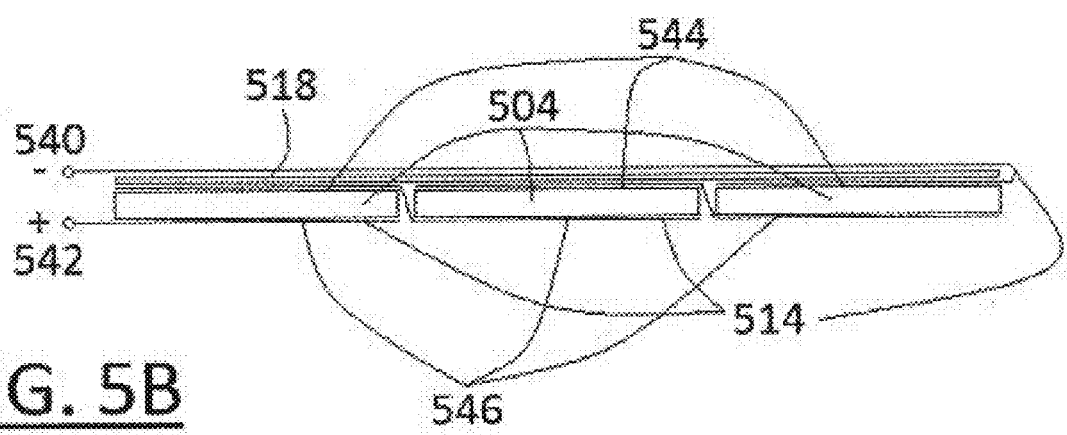

FIG. 5B shows a simplified side view illustrating use of the conductor 514 to connect cells 504 in series, according to one embodiment. Typically, the top contact 544 is negative polarity and the bottom contact 546 is positive polarity. The top of one cell is in electrical communication with the bottom of the adjacent cell via the conducting ribbon. The two end connections provide the positive 542 terminal output and the negative terminal output 540.

Figure 5C:
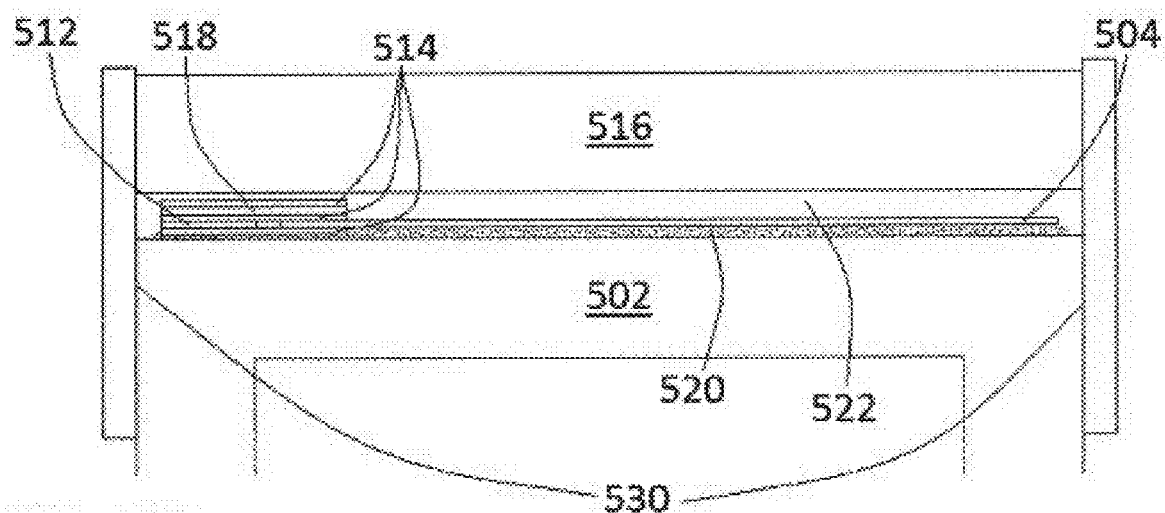
FIG. 5C illustrates a simplified side view illustrating a CPV receiver according to another embodiment of the present invention.
Figure 5D:
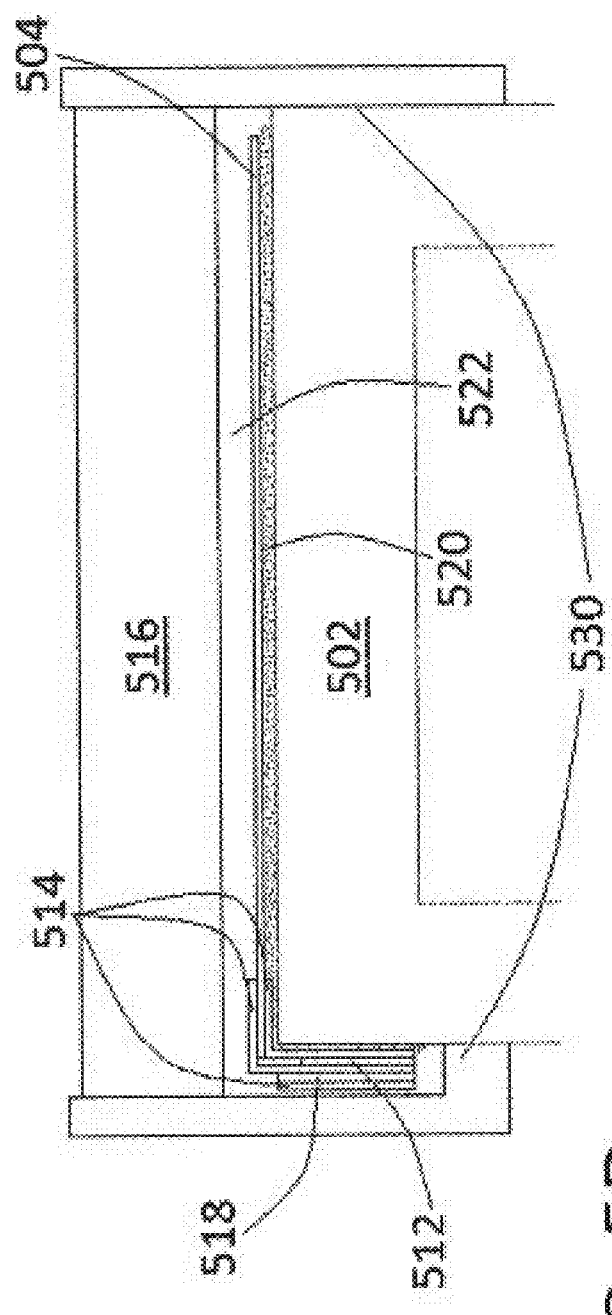
FIG. 5D illustrates a simplified side view illustrating a CPV receiver according to still another embodiment of the present invention.

The insulator 518 prevents shorting between the top cell connections. The insulator also allows the negative terminal output to be routed to the same area as the positive terminal output. In the particular embodiment of FIG. 5B the cells are shown as being connected in series, but this is not required. According to some embodiments the cells may be connected in parallel, or in some combination of series and parallel. FIG. 5C shows a receiver configuration that uses a housing 530 in conjunction with the heat sink or substrate 520 to hold the transmissive optical element 516. FIG. 5D shows a non-planar receiver configuration. Here the bypass diodes 512 are rotated 90 degrees from the cells 504 in order to reduce shading losses. Thermal control over the receiver may be achieved by cooling. Thus, the receiver plate/cell mount structure may also serve as a heat sink. Cooling of the receiver may be accomplished passively, actively, or by some combination of passive and active approaches.

The location of a receiver relative to the concentrator, may vary depending upon the particular collector embodiment. A range of focal ratios can be workable from a minimum of about f/0.2 to a workable maximum of about f/11 with no loss of light at 15× concentration. Focal ratios above f/2 may be less desirable because of increased sensitivity (losses) due to tracking errors and also because the pressure differential required across the film may become unfeasibly low unless large transverse forces are applied to stretch the film tight. Focal ratios below f/0.2 require concentration factors lower than 15× (i.e. larger receivers) to avoid losing light off the receiver. One embodiment at a 15× concentration factor uses f/0.65 which creates a reasonable balance between tracking error tolerance and tightness of focus.

Figure 5F:
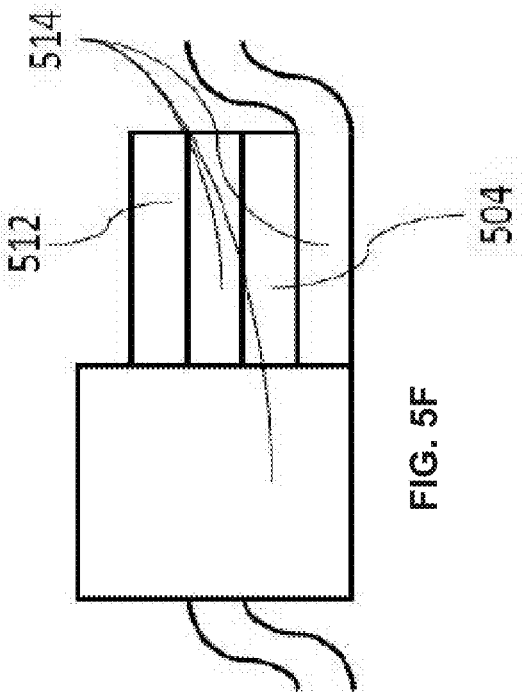
FIGS. 5E-5G illustrate a three dimensional interconnect scheme for a receiver system according to an embodiment of the present invention.
Figure 5E:
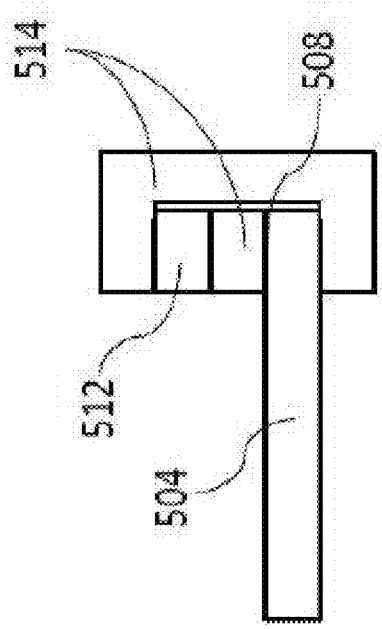
Figure 5G:
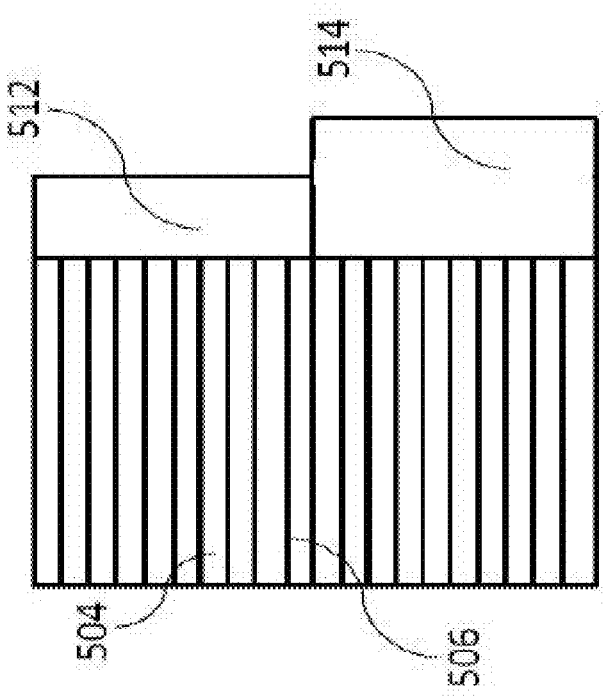

FIGS. 5E-5G illustrate a receiver system according to an embodiment of the present invention. In this embodiment, a three dimensional interconnect can be made to bypass diode 512 using conductors 514. This may help to make the receiver assembly smaller. In some embodiments, this design may help to reduce the receiver width by up to 10% and may increase the power output of the receiver by about 5%. In some embodiments, multiple bypass diodes 512 may be stacked on top of busbar 508 along with conducting layers 514. Such a three dimensional structure may allow for a smaller footprint of the receiver system which may help minimize shading losses.

Many benefits can be realized by coupling the various trough concentration systems disclosed herein with a receiver arrangement such as that in FIGS. 5-5G. In embodiments where solar cells are arranged substantially end-to-end in individual rows where each row corresponds to a concentrator, if a concentrator is partially shaded along its length, the concentrated light that strikes each cell in the receiver may be reduced by the amount of the shading equally for each cell so that no cell receives substantially less light than the others and "bottlenecks" or cells with much lower current are avoided. Unlike most conventional solar panels, and many other CPV systems, trough systems as described herein can be installed so that they shade or partially shade one another at some times of day or year without a disproportionate penalty to power output.

Figure 6A:
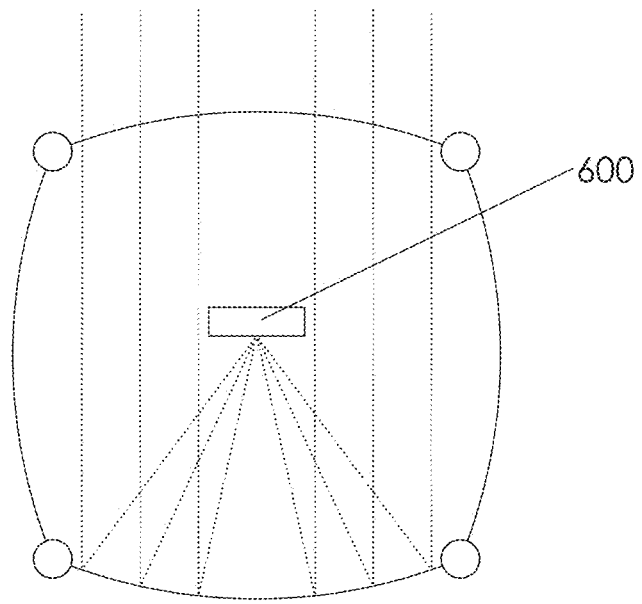
FIGS. 6A-6C illustrate simplified cross-sectional views of various solar collector embodiments.

According to certain embodiments, as shown in FIG. 6A, a receiver 600 may be positioned completely within the inflation space defined by the inflated concentrator. Certain such embodiments may offer enhanced optical performance because the sunlight does not have to pass through the front film twice before striking the receiver. Inflated concentrators having receivers positioned within an inflation space are described in U.S. patent application Ser. No. 11/843,531 filed on Aug. 22, 2007, which is incorporated by reference in its entirety herein for all purposes. Embodiments may share one or more characteristics in common with the apparatuses disclosed in that patent application.

Figure 6B:
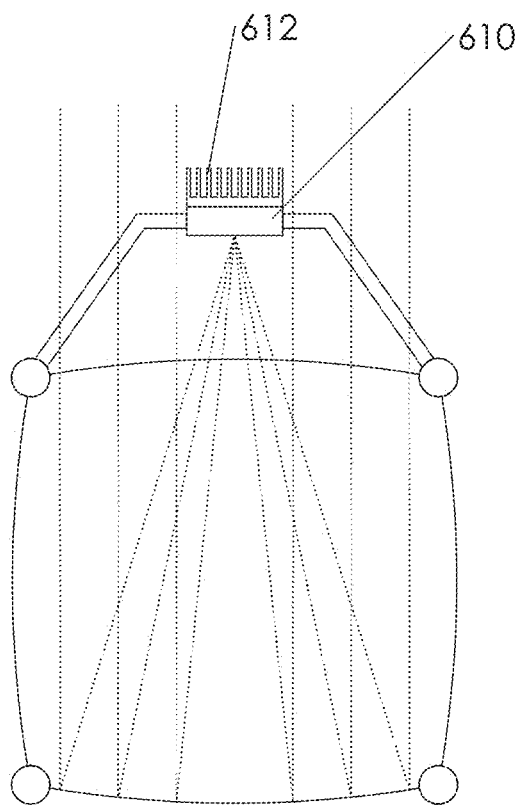

Owing to its location within an enclosed space, such an internally-positioned receiver may be cooled in an active manner, for example by the flow of a liquid such as water. Incorporated by reference herein for all purposes, is the U.S. patent application Ser. No. 11/843,549 filed on Aug. 22, 2007 describing various forms of interconnection structures, including interconnect structures that are configured to carry liquids. Certain embodiments may utilize interconnection structures sharing one or more characteristics described in that published patent application. Alternatively, a receiver 610 may be positioned outside of the inflation space defined by the inflated concentrator, as shown in FIG. 6B. Such a design may offer benefits of improved access for cooling and also for maintenance/replacement. Here, the receiver is shown to be passively cooled utilizing fin structures 612.

U.S. patent application Ser. No. 13/227,093, filed Sep. 7, 2011, discloses a solar collector having a receiver positioned external to an inflation space or volume and is incorporated by reference in its entirety herein for all purposes. Embodiments may share one or more characteristics in common with the apparatuses disclosed in that patent application.

Figure 6C:
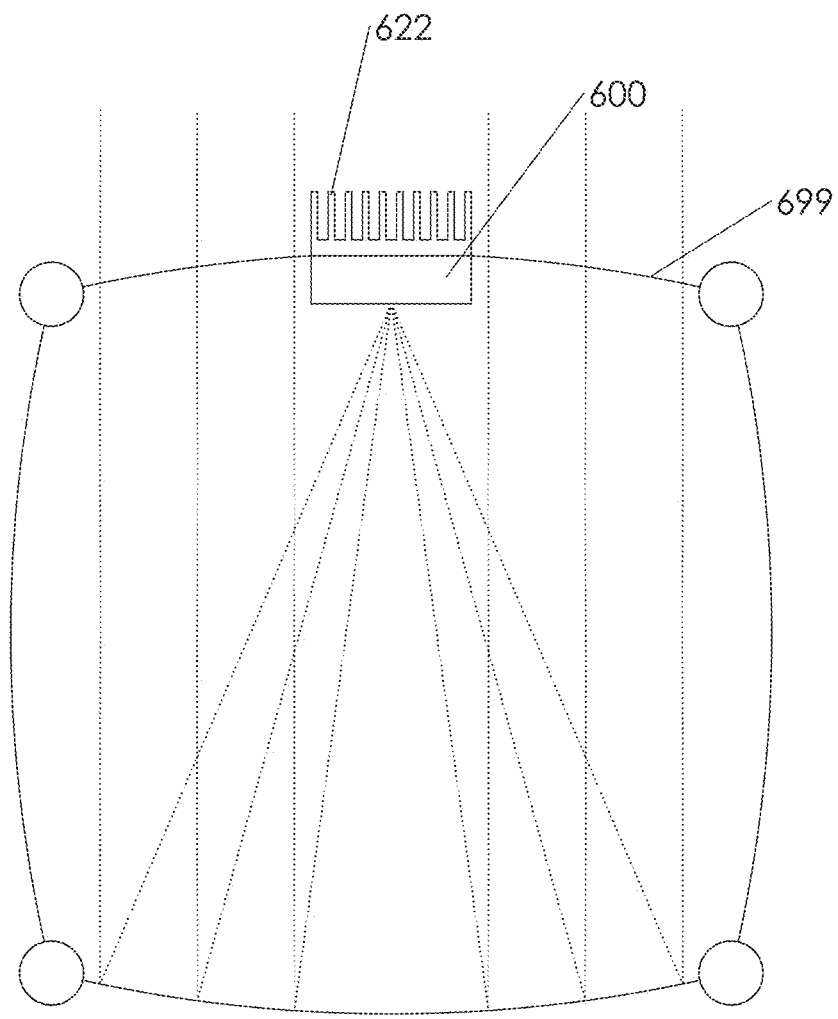

Still further alternatively, hybrid versions are also possible as shown in FIG. 6C. In this embodiment, the receiver 620 is present on both sides of the top clear film of the inflated tubular concentrator. In this embodiment, the heat sink (here including fins 622) is external to the inflation space, thereby facilitating passive cooling. However the cell mount and the solar cells themselves, lie within the inflation space, thereby reducing optical losses. In this embodiment the clear film 699 may pass between the receiver 620 and the heat sink 622 (it may be sandwiched between the receiver and the heat sink). Alternatively, the clear film 699 may have a gap or discontinuity to allow direct contact and communication of heat between receiver 620 and heat sink 622.

Support/Tracking

Embodiments of collectors may utilize pointing and tracking apparatuses to maintain illumination over the path of the sun across the sky. According to certain embodiments, the receiver plate/cell mount may form a part of such a tracking structure.

U.S. patent application Ser. No. 11/844,877 filed on Aug. 24, 2007 describing rigging and pointing structures as well as other concepts, is incorporated by reference in its entirety herein for all purposes. Embodiments may share one or more characteristics in common with the apparatuses disclosed in that published patent application.

Figure 7:
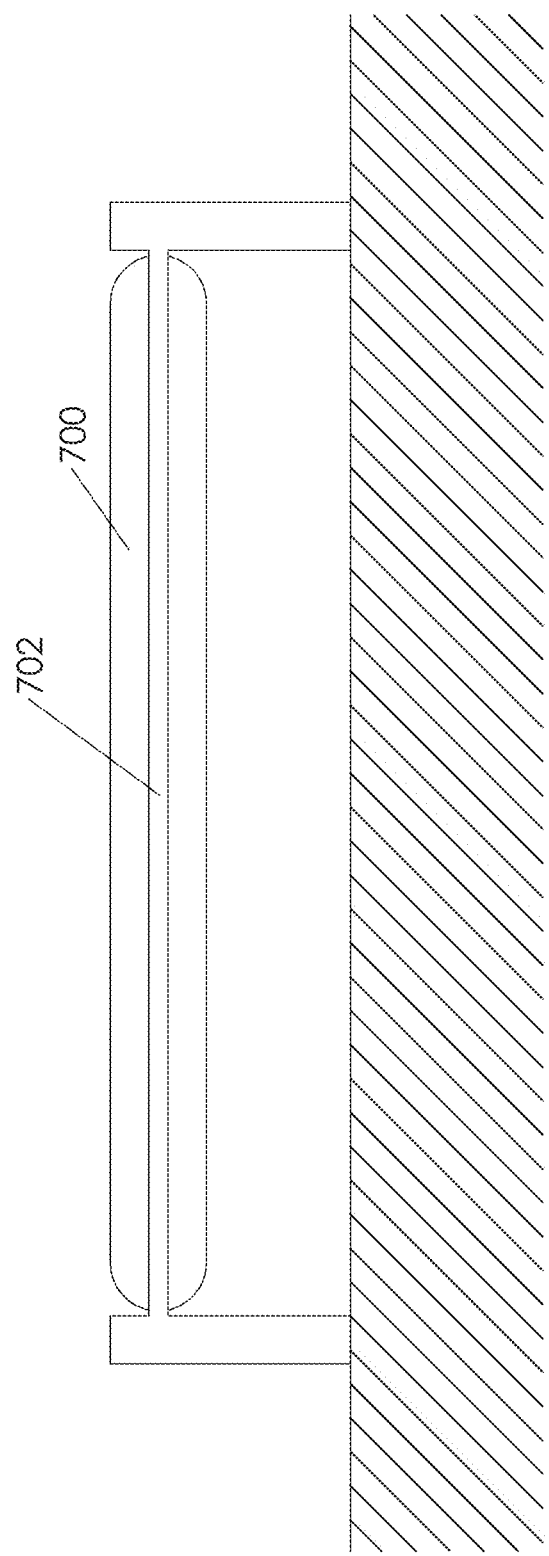
FIG. 7 illustrates a simplified view of a collector together with a tracking apparatus according to an embodiment of the present invention.

The U.S. patent application Ser. No. 13/015,339 filed on Jan. 27, 2011 describes mounting and tracking structures and other concepts. Embodiments may share one or more characteristics in common with the apparatuses described in that patent application. As mentioned above at least in connection with FIG. 2, a collector may comprise an inflatable concentrator whose shape is defined by one or more batten structures. Accordingly, FIG. 7 shows an embodiment comprising an inflated tube 700 wherein the members comprising the batten 702 may be oriented substantially parallel to the ground.

Figure 8:
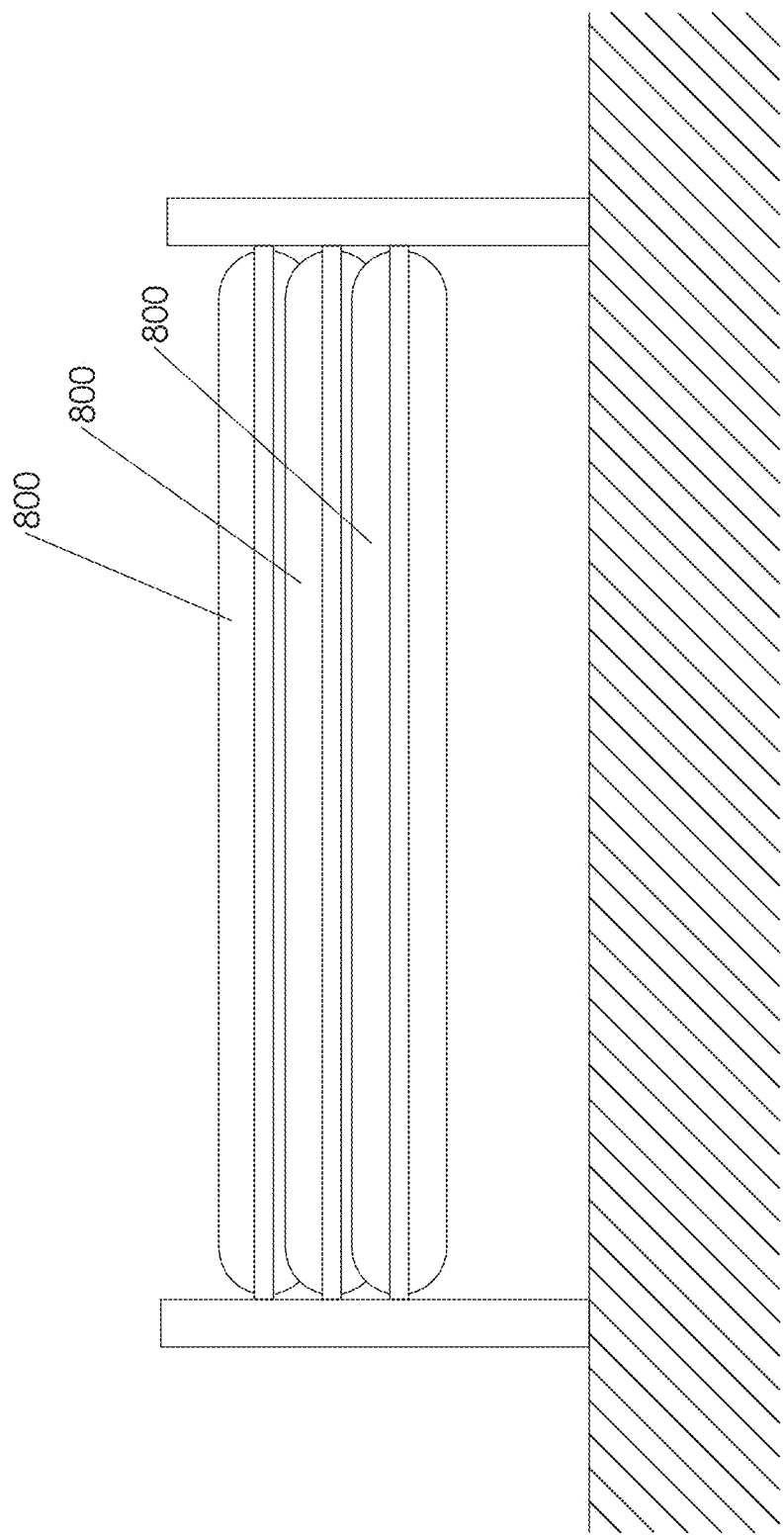
FIG. 8 illustrates a simplified view of plurality of collectors in a stacked configuration according to an embodiment of the present invention.

As shown in FIG. 8, according to certain embodiments multiple tubes 800 of inflated concentrators may be stacked in order to reduce tracking costs. In certain embodiments, these inflated tubes may be stacked according to tube diameter. According to some embodiments, inflated tubes with smaller diameters may be positioned higher than those having larger diameters, in order to reduce possible shading effects.

Figure 10A:
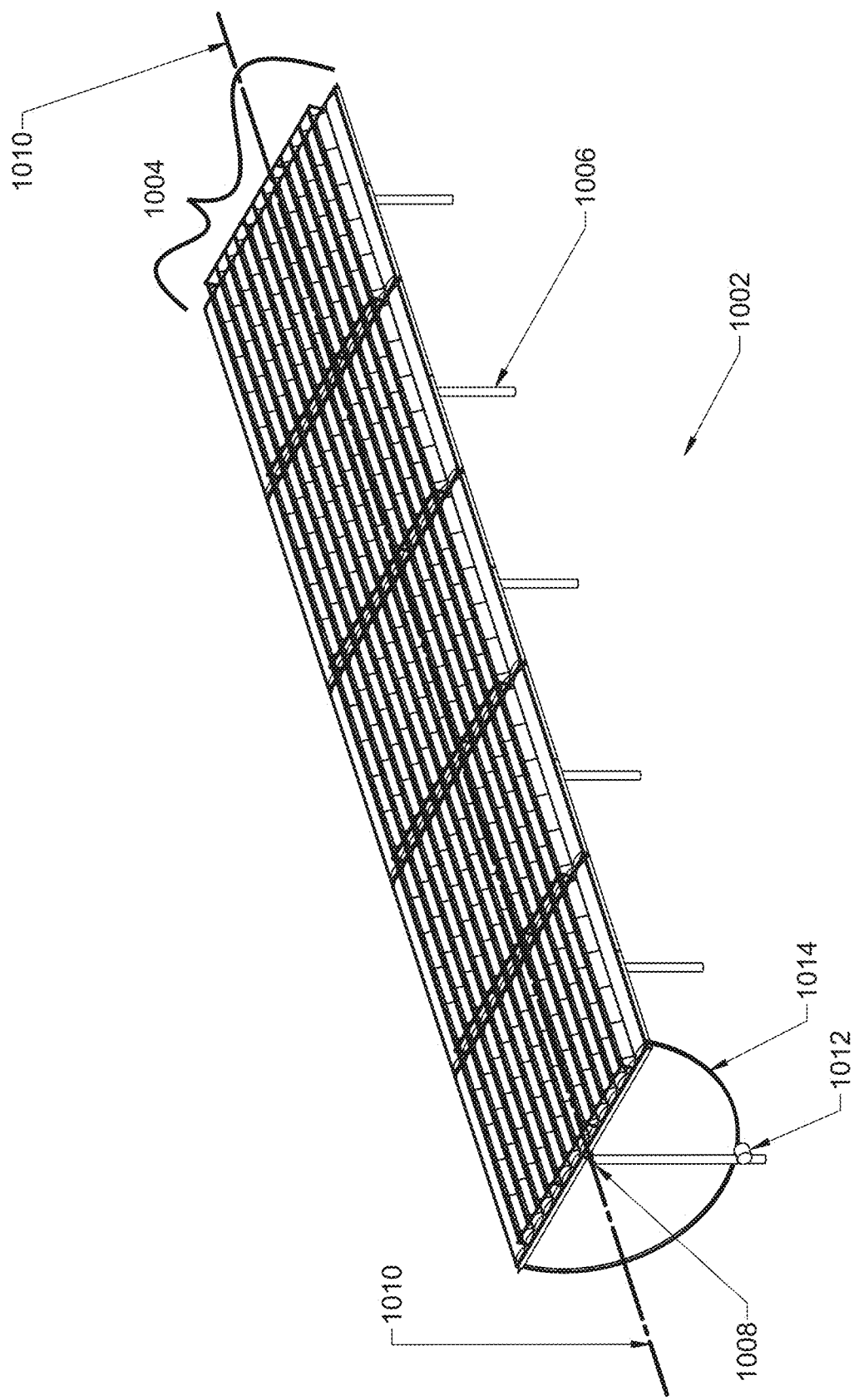
FIG. 10A illustrates an overview of an inflatable trough solar energy collection system according to an embodiment of the present invention.

FIG. 10A shows an overview of an embodiment of an inflatable trough solar energy collection system 1002. System 1002 includes one or more solar collector assemblies 1004 which are attached to base posts 1006 via one or more pivot joints 1008.

Pivot joints 1008 define a tracking axis 1010 about which collectors 1004 can rotate to track the sun in order to maximize the capture of solar energy. Axis 1010 may be oriented North to South, East to West, Northeast to Southwest or some other orientation. A specific orientation of axis 1010 may be chosen so as to maximize power output at a certain time of day and/or a certain time of year. In this particular embodiment, tracking axis 1010 is shown horizontal and parallel to the length of collector assemblies 1004. That is, axis 1010 goes through the long axis of the collector assemblies 1004. However, this is not required and in alternative embodiments a tracking axis may be inclined relative to the ground or inclined relative to the collector assemblies, or both. Other embodiments are possible in which collector assemblies rotate about a vertical tracking axis. According to some embodiments, each collector or collector assembly may have its own axis about which it rotates to track the sun.

Certain embodiments may employ a linkage or other structure which creates tracking motion that is not defined by an axis of rotation. An example of this is a four-bar linkage. Other embodiments are possible that cause the collector assemblies to track the sun about 2 axes. This may allow the normal vector to the plane of the collector assemblies to consistently point directly at the sun, although some tracking error may be present.

Collectors 1004 are controllably actuated by drive system 1012 via a transmission element 1014. In this particular embodiment, transmission element 1014 is shown as a curved gear rack, but other linkages, components or forms of motion transmission are possible. As drive system 1012 rotates, it causes transmission element 1014 to move which in turn creates a rotation of collectors 1004 about axis 1010. Base posts 1006 may be sunk into the ground, or attached to ground screws, or attached to ballast weights, or otherwise anchored to prevent unwanted motion of system 1002.

In some embodiments, it may be possible to link multiple rows of systems such as that shown in FIG. 10A together, so that multiple rows may be actuated by a single actuator. Linked motion may be accomplished via a linkage, belts, drive shafts, pushrods, gears, cables, pulleys, hydraulics and many other types of structures.

Figure 10B:
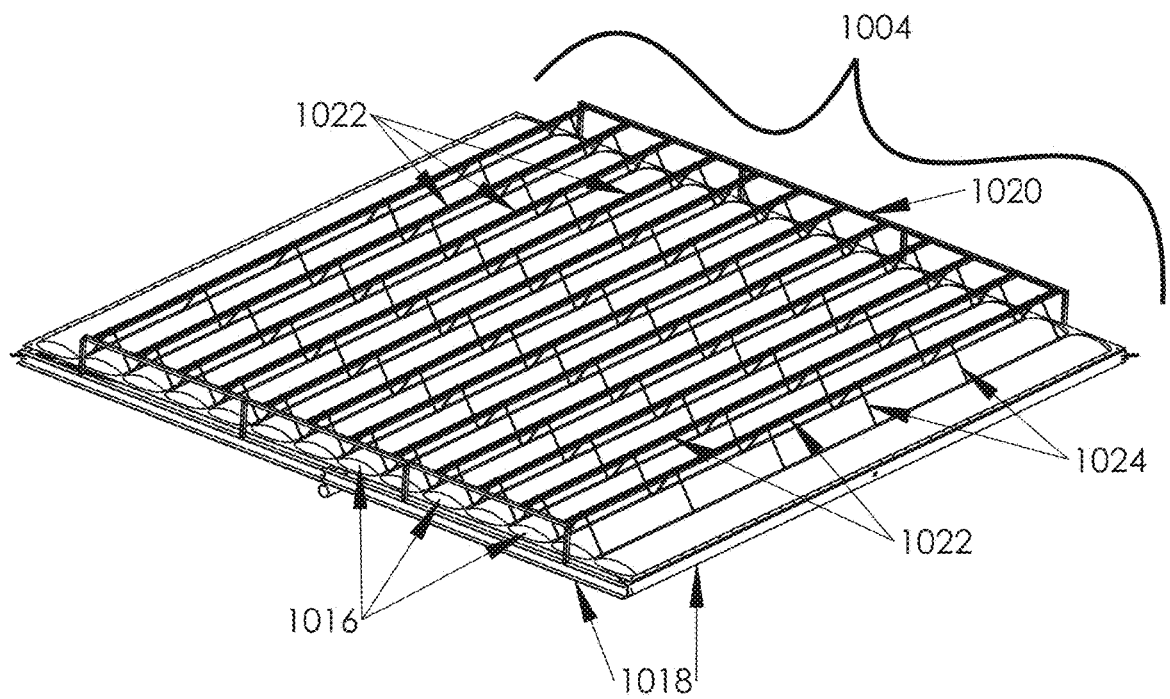
FIG. 10B illustrates a closer isometric view of a solar collector assembly according to an embodiment of the present invention.

FIG. 10B shows a closer isometric view of one of the solar collector assemblies 1004. Collector assembly 1004 includes an inflated trough array 1016 which is supported by a frame 1018. Receiver assemblies 1022 are supported by a receiver sub-frame 1020 which is in turn attached to frame 1018. Receiver assemblies 1022 may be fixed to sub-frame 1020 or they may have some degree of lateral motion. Alignment between inflated trough array 1016 and receivers 1022 is maintained by guides 1024. Guides 1024 may serve to maintain only vertical alignment, or they may cause receivers 1022 to move laterally as necessary to stay centered above their respective trough segments. This may be helpful if different sections of trough array 1016 encounter different temperatures at the same time and experience differential thermal expansion, or it may serve to compensate for manufacturing and assembly tolerances etc. In some embodiments, trough array 1016 may be made of polymer films which can be replaced if they wear out or become damaged. Guides 1024 may be easily removable to enable replacement of trough array 1016.

In some embodiments, the length of the trough arrays may be shorter or longer than the ones shown in FIG. 10B and can be varied as needed. It may be desirable to have long trough arrays in order to minimize end losses or other end effects. Still other embodiments may employ trough arrays in a panel shape with dimensions similar to standard 1-sun solar panels. This may allow such panel-shaped trough arrays to be mounted on a variety of commercially available frames and tracking equipment.

Figure 10C:
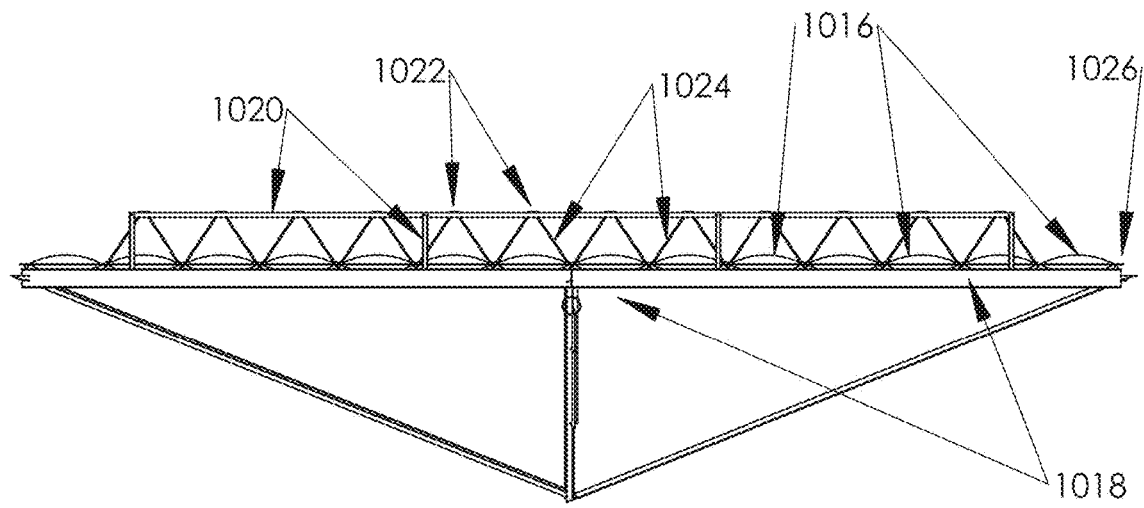
FIG. 10C illustrates a side view of a collector assembly according to an embodiment of the present invention.

FIG. 10C shows a side view of the collector assembly 1004. Frame 1018 may include pins 1026 for easy attachment of trough array 1016. Other approaches to attaching trough array 1016 to frame 1018 are possible. These include but are not limited to clamps, bar clamps, tape, double sided tape, adhesives, pinch rollers, hook and loop fasteners, threaded fasteners, magnets and heat sealing, among others. Retaining caps, fasteners, barbs, or a retaining strip (not shown) may aid trough array 1016 to remain attached to pins 1026.

An inflation system (not shown) creates a pressure differential between the chambers inside trough array 1016 and the surrounding atmosphere. When inflated, trough array 1016 will typically pull inward on frame 1018 if the segments of trough array 1016 are lenticular rather than circular.

Figure 10D:
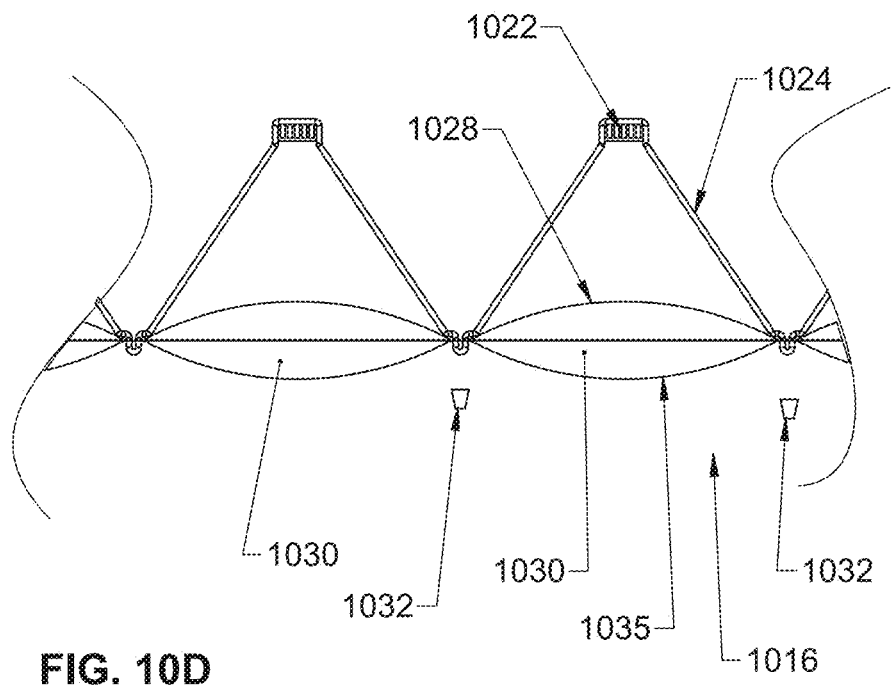
FIG. 10D illustrates an enlarged section view of a collector assembly with a frame and sub-frame removed for clarity according to an embodiment of the present invention.

FIG. 10D shows an enlarged section view of collector assembly 1004 with frame 1018 and sub-frame 1020 removed for clarity. Trough array 1016 can comprise a reflective bottom film 1035 and a transparent top film 1028. Films 1035 and 1028 may be joined at their perimeter and along internal nodes to create individual sections or chambers 1030. Trough array 1016 is retained on guides 1024 via retaining clips 1032. Other possible approaches to attachment include but are not limited to, clamps, bar clamps, tape, double sided tape, adhesives, pinch rollers, hook and loop fasteners, threaded fasteners, magnets and heat sealing, among others.

Figure 10E:
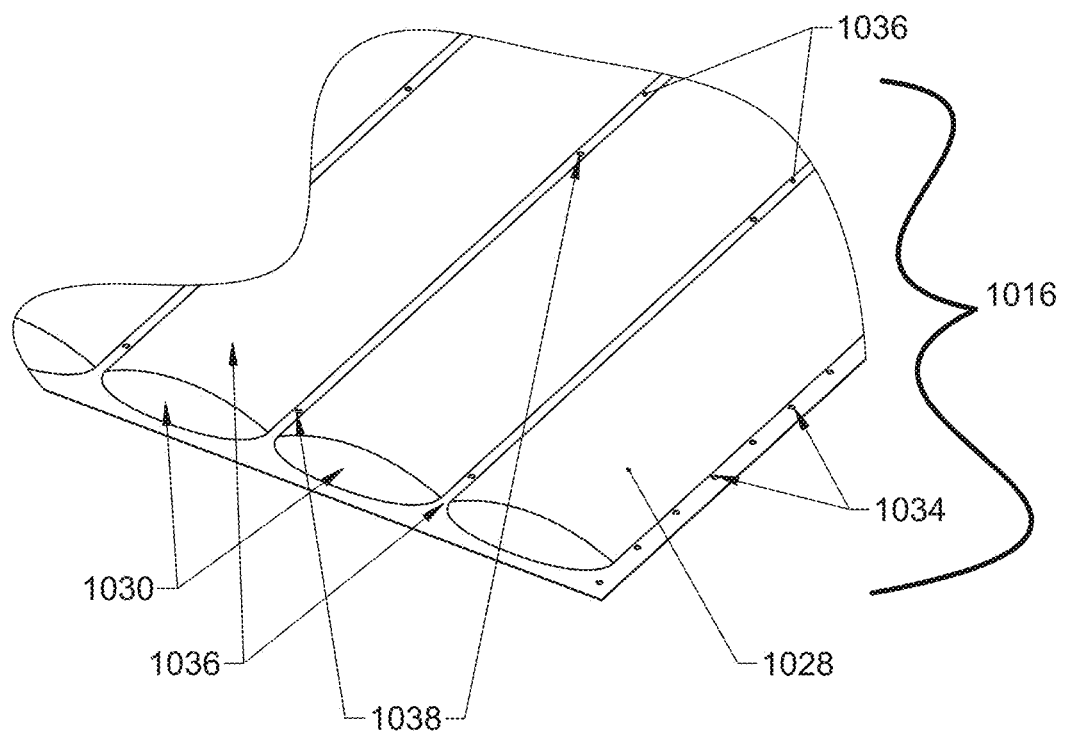
FIG. 10E illustrates a cutaway isometric view of an embodiment of a trough array according to an embodiment of the present invention.

FIG. 10E shows a partial cutaway isometric view of one embodiment of trough array 1016. Edges of trough array 1016 may have holes 1034 for mounting on pins 1026 (see FIGS. 10C and 10G). Inflated chambers 1030 are separated by nodes 1036 which are areas where the film is restrained against the inflation pressure differential. Nodes 1036 may define mounting holes 1038 which align trough array 1016 on guides 1024 (see FIG. 10D). In other embodiments, the films that form trough array 1016 may be longer than the effective length of the trough array, with extra deflated trough stored on a roll system. If the portion of the films in use becomes degraded or damaged, the roll system could advance the films until a fresh section is ready for use.

FIG. 10F shows another view of frame 1018 and sub-frame 1020. Frame 1018 may include or be in the form of a truss structure, which can serve to provide rigidity necessary to limit deflections due to bending and torsion. An area A is circled which is enlarged in the view in FIG. 10G.

Figure 10H:
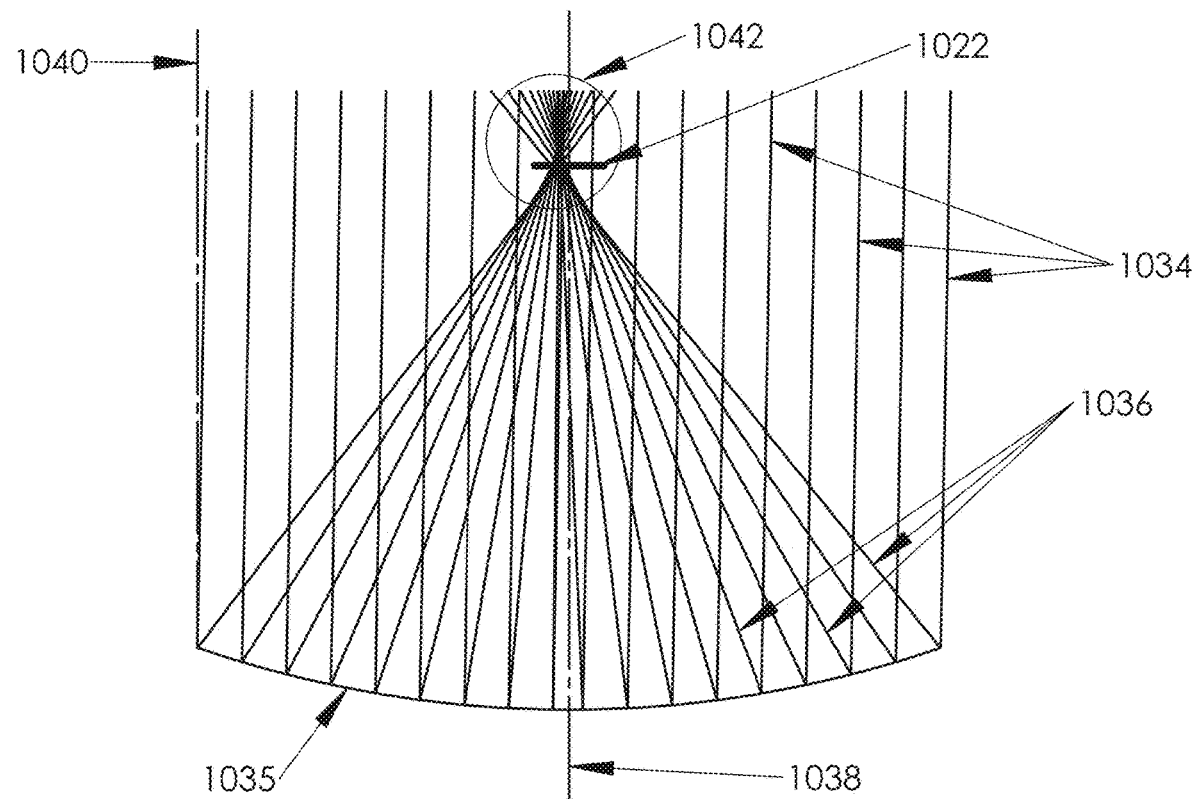
FIG. 10H illustrates a schematic cross section view of the behavior of light for the system in FIGS. 10A-G according to an embodiment of the present invention.
Figure 10I:
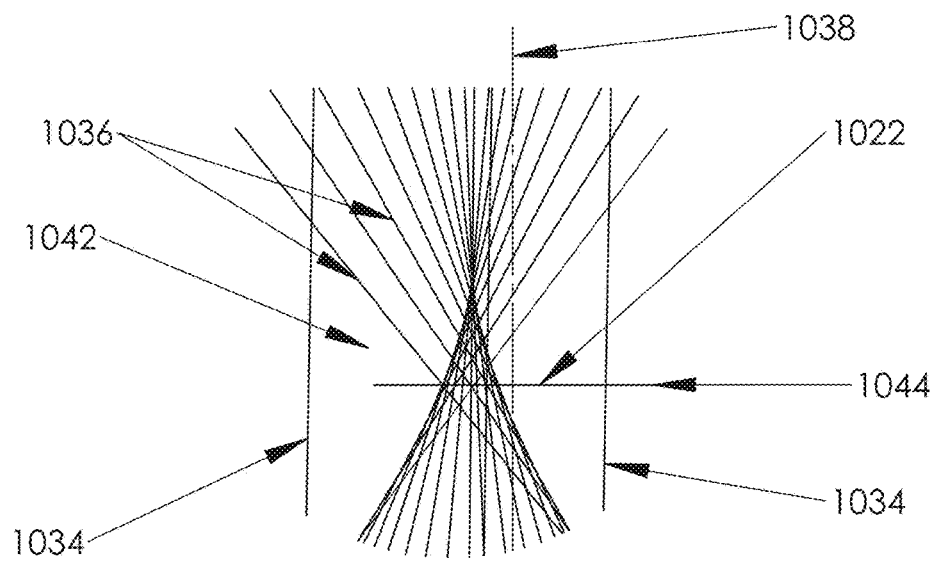
FIG. 10I illustrates an enlarged view of a receiver location and region of focused light according to an embodiment of the present invention.

FIG. 10G is an enlarged detail view of the area A denoted in FIG. 10F. Pins 1026 are visible in this view. FIG. 10H shows a schematic cross section view of the behavior of light for the system in FIGS. 10A-G. Reflective film 1035 is shown being hit by incident rays 1034 and creating reflected rays 1036. An axis of symmetry 1038 of reflective film 1035 is shown. A line 1040 parallel to axis 1038 is shown. Incident rays 1034 are shown at a slight angle to axis 1038 (in this case 1 degree) to illustrate the behavior of light in the system with a small amount of mispointing. Note that both incident rays 1034 and reflected rays 1036 may not be symmetric about axis 1038, when mispointing exists. Therefore, a region of focus 1042 will be also shifted relative to axis 1038 and receiver 1022. FIG. 10I shows an enlarged view of the receiver location and region of focused light circled in FIG. 10H. A plane 1044 is shown which is defined as being the location at which rays 1036 form the narrowest spot which includes all of rays 1036. It may be desirable to locate the active surface of receiver 1022 at or near plane 1044 to maximize the tolerance to tracking errors.

Figure 11:
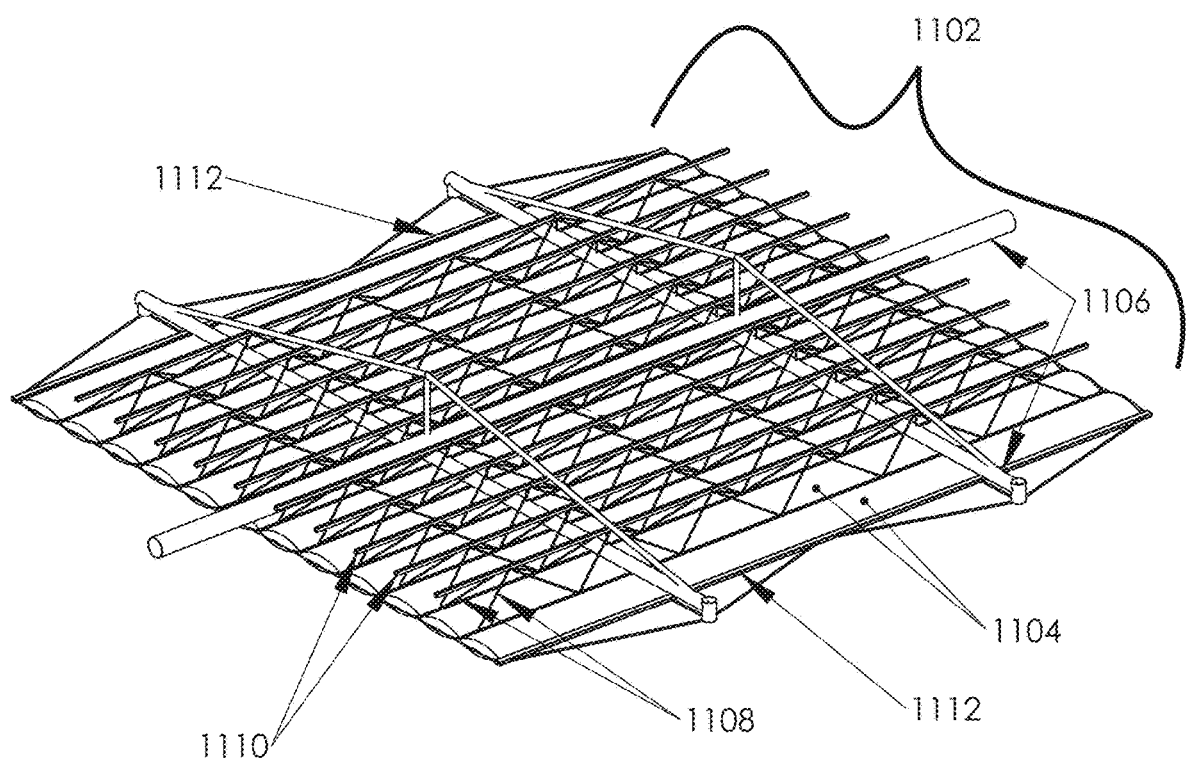
FIG. 11 illustrates an inflated trough solar collection system according to an embodiment of the present invention.

FIG. 11 shows another embodiment of an inflated trough solar collection system 1102. The principal difference between this embodiment and the embodiment illustrated in FIGS. 10A-G, is that a frame 1106 lies above a trough array 1104, facilitating replacement of trough array 1104. In this embodiment, receivers 1110 are aligned to trough array 1104 via guides 1108. Guides 1108 can stay in position during replacement of trough array 1104 because there is no frame or other members (except possibly retaining clips, not shown) below trough array 1104. Trough array 1104 is held in place by retaining bars 1112 which may employ pins (not shown), clamp(s), or other approaches to retaining the film.

Figure 12:
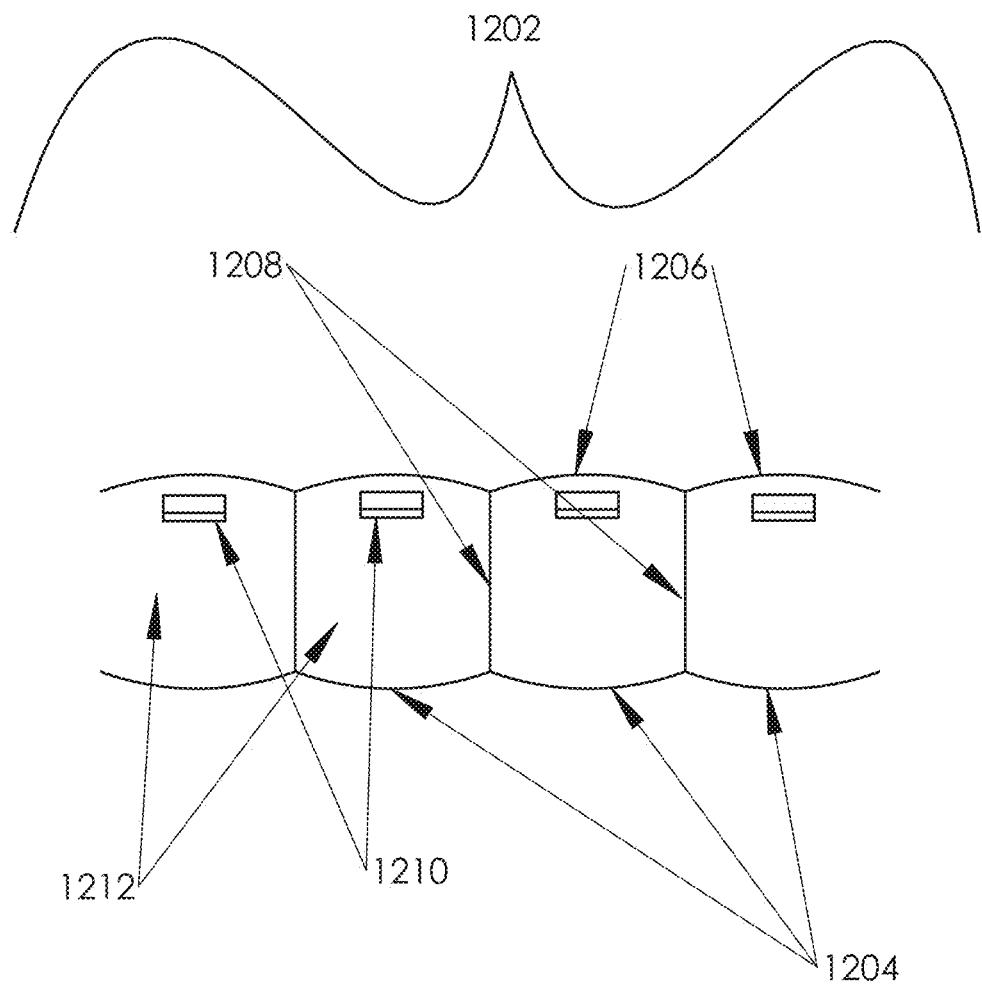
FIG. 12 illustrates an inflated trough solar collection system according to another embodiment of the present invention.

FIG. 12 shows another embodiment of an inflated trough solar collection system 1202. A lower film 1204 is connected to an upper transparent film 1206 via joining material 1208. Receivers 1210 may be inside enclosed chambers 1212 formed by the surrounding films and material or they may be outside.

Figure 13:
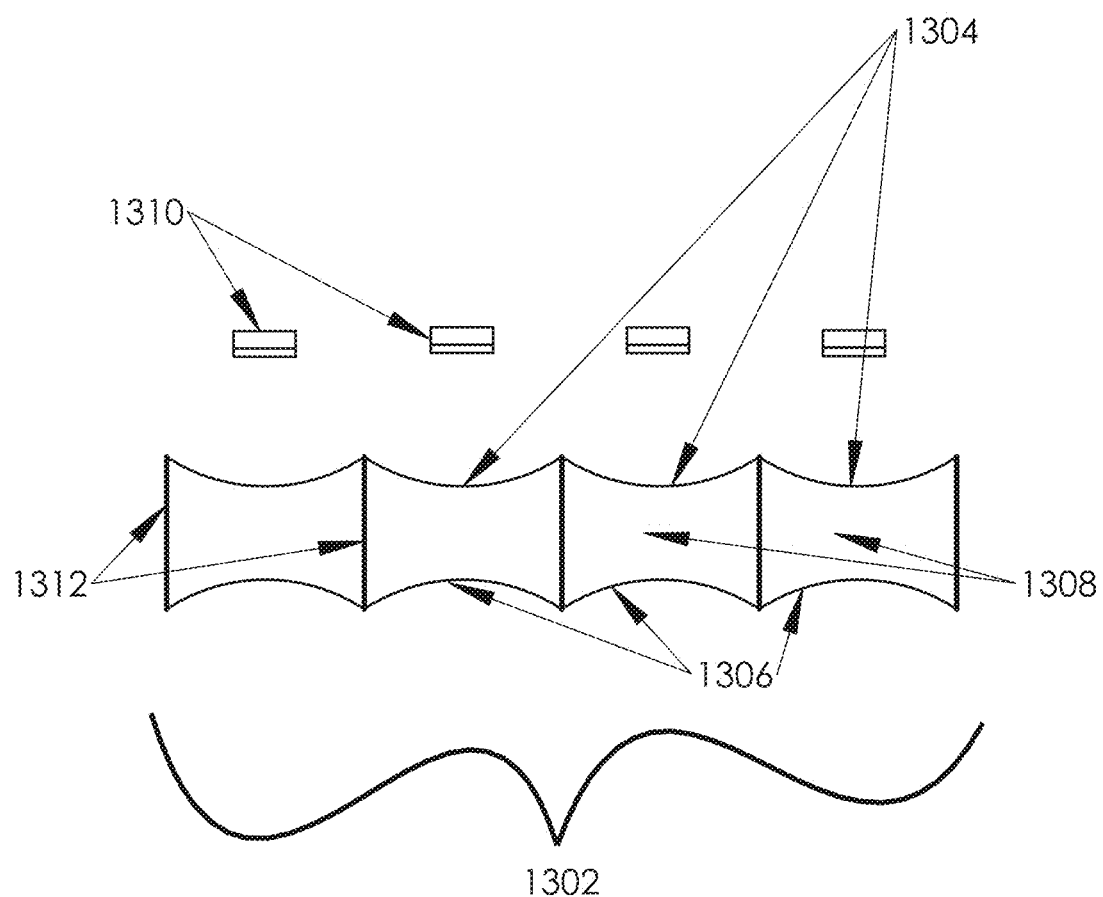
FIG. 13 illustrates an embodiment of a solar collector trough array that is shaped by a negative pressure differential according to an embodiment of the present invention.

FIG. 13 shows an embodiment of a solar collector trough array that is shaped by a negative pressure differential (partial vacuum). Trough array assembly 1302 includes reflective film 1304, enclosing surface 1306, chamber(s) 1308, and receivers 1310. A frame 1312 keeps film 1304 separated from enclosing surface 1306 to create chambers 1308. Film 1304 has one or more concave shapes which are created by a relatively lower air pressure in chambers 1308 as compared to the surrounding environment.

Figure 14A:
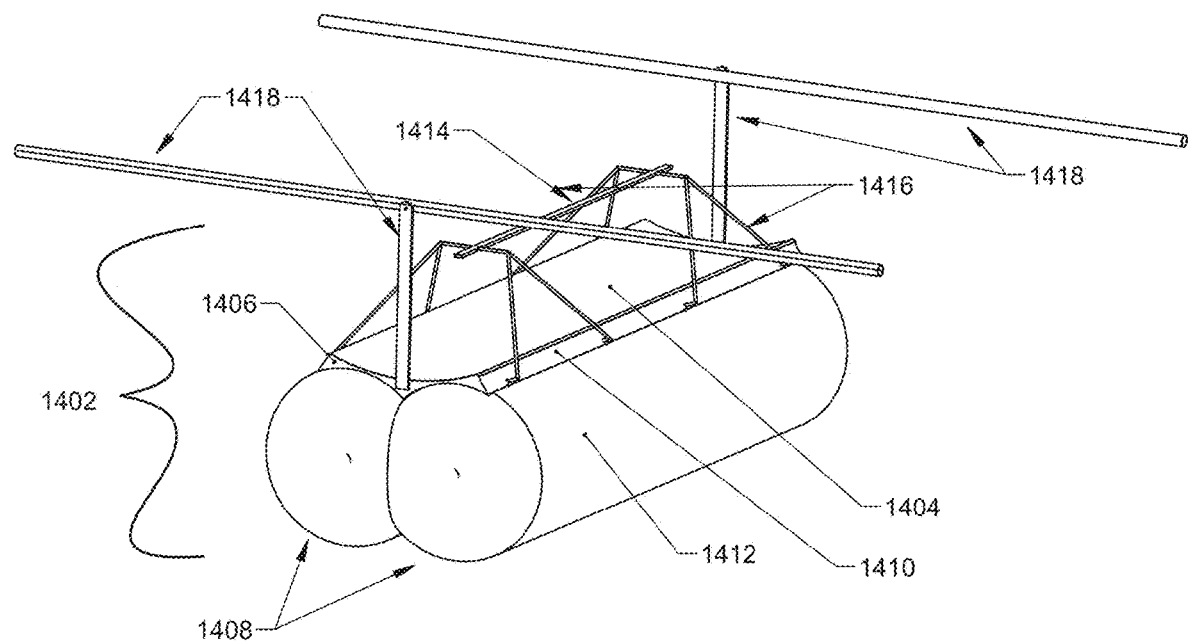
FIGS. 14A and 14B illustrate a solar concentration trough system with a different frame according to an embodiment of the present invention according to an embodiment of the present invention.
Figure 14B:
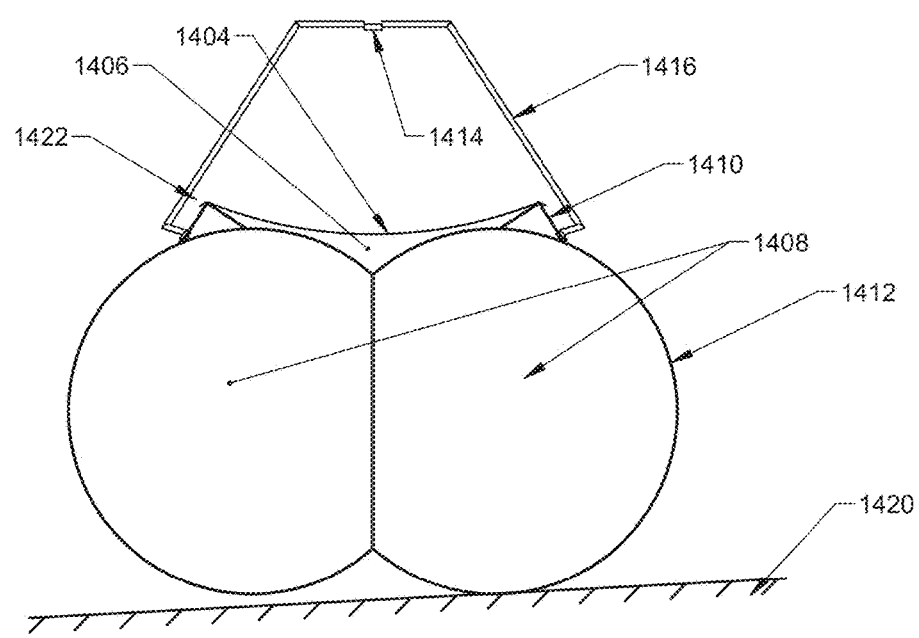

FIGS. 14A and 14B show another embodiment of solar concentration trough system 1402 with a different frame. A reflective film 1404 has a concave shape formed by a negative pressure differential between a first chamber 1406 and the surrounding environment. One or more inflated frame chambers 1408 may provide support for the edges of film 1404. Negative pressure in chamber 1406 would tend to pull the edges of film 1404 together, but this tendency is resisted by positive pressure inside frame chambers 1408.

Optional frame members 1410 may be used to add additional stiffness or to add height to chamber 1406. Chambers 1408 are defined within a material 1412 which may be a film, fabric, polymer sheet or other material and may be flexible, semi-flexible or rigid. A solar receiver 1414 is positioned above film 1404 at a region of light concentration and held in place by a receiver frame 1416. Frame chambers 1408 may rest on the ground 1420 and allow the system to track the sun by rolling on the ground. Forces applied to actuation arms 1418 cause system 1402 to rotate and roll on the ground or some other support. Restraining straps (not shown) may be employed to prevent translation of system 1402 while allowing rotation for tracking FIG. 14B shows a cross section view of system 1402 with actuation arms 1418 removed for clarity. Optional clips 1422 may allow for easy film installation and replacement.

Figure 16A:
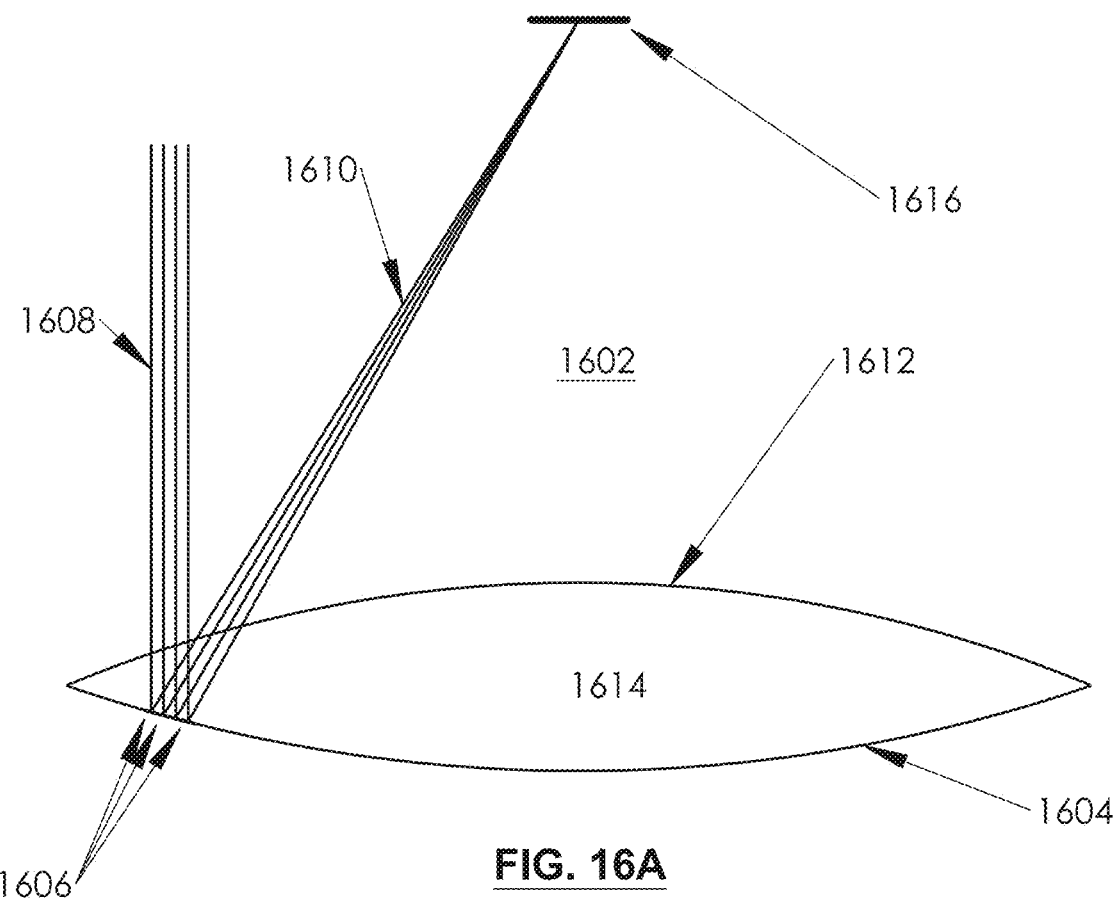
FIG. 16A illustrates a concentrator system with a modified film that can create performance enhancements according to an embodiment of the present invention.

FIG. 16A shows an embodiment of a concentrator system 1602 with a modified film that can create performance enhancements. A reflective film 1604 has modified surface shapes 1606. Incoming light rays 1608 are reflected by surface shapes 1606 to create reflected rays 1610. An optional front film 1612 is shown creating an enclosed volume 1614 which may include a pressurized gas.

Surface shapes 1606 may be designed such that they create a different pattern of reflected light than would be obtained by the shape that would otherwise be formed by film 1604. While many different patterns of reflected light are achievable, FIG. 16 shows a pattern in which a higher concentration of light is created at a receiver 1616 than would be possible with just inflated smooth film. The reflected light by film 1604 converges to form a spot of higher concentration. Different patterns could be achieved with alternative surface shapes (not shown), to affect uniformity of light distribution over receiver 1616 or a portion thereof.

Figure 16B:
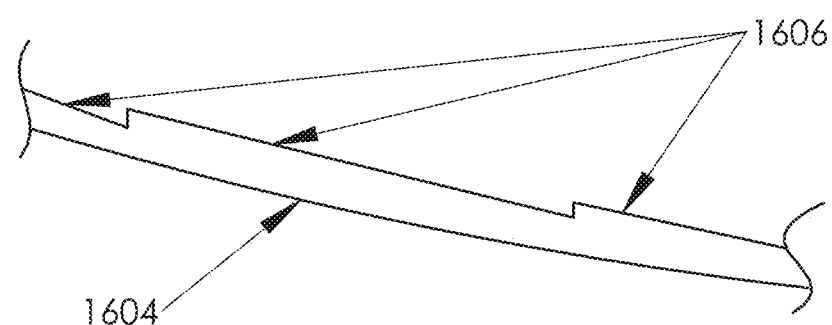
FIG. 16B illustrates an enlarged view of a small portion of a film from FIG. 16A with exaggerated surface shapes according to an embodiment of the present invention.

FIG. 16B shows an enlarged view of a small portion of film 1604, with exaggerated surface shapes 1606 from FIG.

16A. These surface shapes may be formed on film 1604 by processes including but not limited to embossing, roll embossing, stamping, forming, casting, laser machining, screen printing, spray deposition, inkjet printing and photo etching and other photochemical processes, among other methods. Surface shapes 1606 may cover some or all of the surface of film 1604.

According to other embodiments, surface shapes 1606 may be 3-dimensional (rather than having a consistent cross section). Three-dimensional shapes may be chosen so that light may be directed away from inactive areas of a receiver. In some embodiments, receiver 1616 may be placed outside the path of incident sunlight 1608 (i.e. off-axis) so that it does not block incident sunlight. Surface shapes similar to 1606 may have different slopes chosen to reflect light to this off-axis receiver location.

Figure 17A:
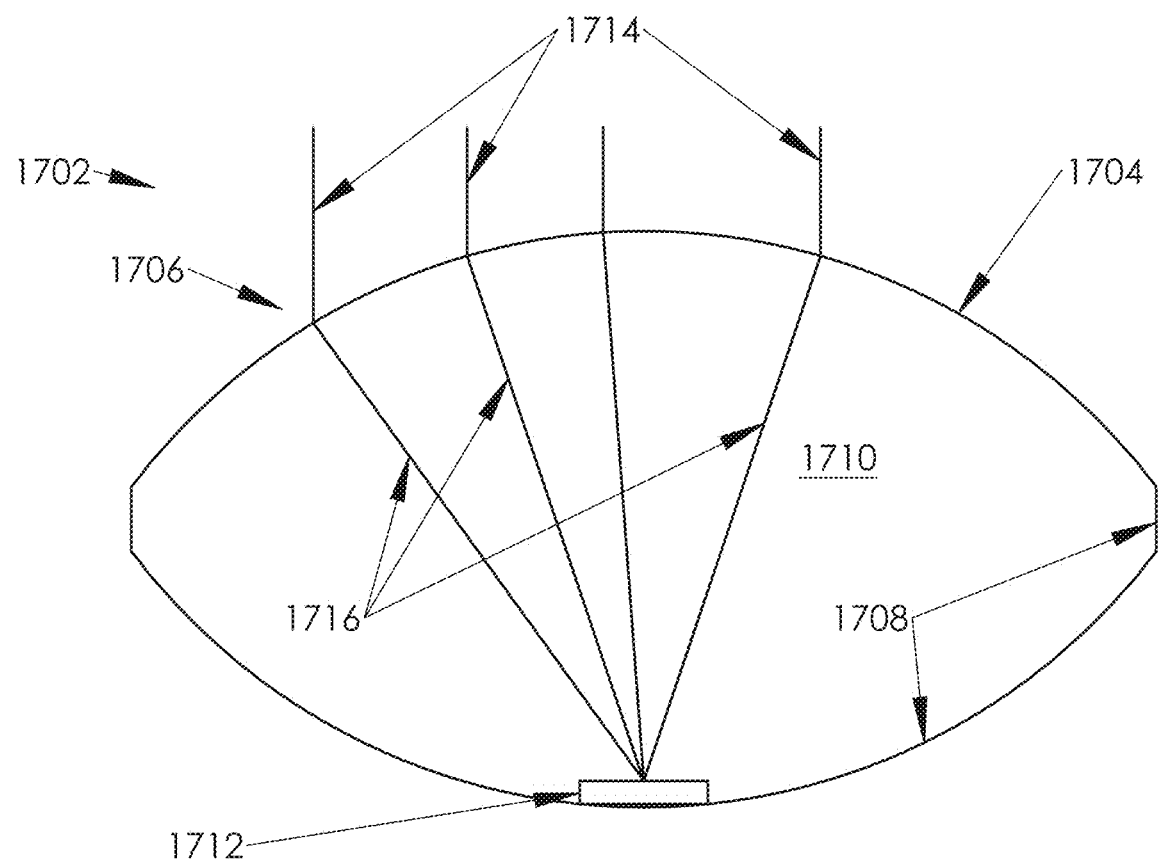
FIG. 17A illustrates a film-based solar concentration system that employs a transparent film with a modified shape according to an embodiment of the present invention.

FIG. 17A shows a film-based solar concentration system 1702 that employs a transparent film 1704 with a modified shape. Transparent film 1704 may be connected to an optional enclosing material 1708 to form a closed chamber 1710, which may include an inflation pressure. Film 1704 has a surface 1706 with a modified shape which serves to refract light and create a desired light pattern at a receiver 1712. Surface 1706 is shown in more detail in FIG. 17B. Receiver 1712 may be inside chamber 1710 or it may be outside or in another location. Incident rays 1714 come from the sun and are nominally parallel with a small possible variation of direction.

Surface 1706 is shaped such that rays arriving at different locations are refracted differently, to create refracted rays 1716 at different angles as they exit film 1704 and travel to receiver 1712. In one embodiment, surface 1706 is designed so that refracted rays 1716 form a region of higher concentration at receiver 1712, than if film 1704 was smooth. A related embodiment (not shown) uses a front film similar to 1704 which is stretched, so that it maintains its shape and does not require inflation pressure or an enclosed chamber.

Figure 17B:
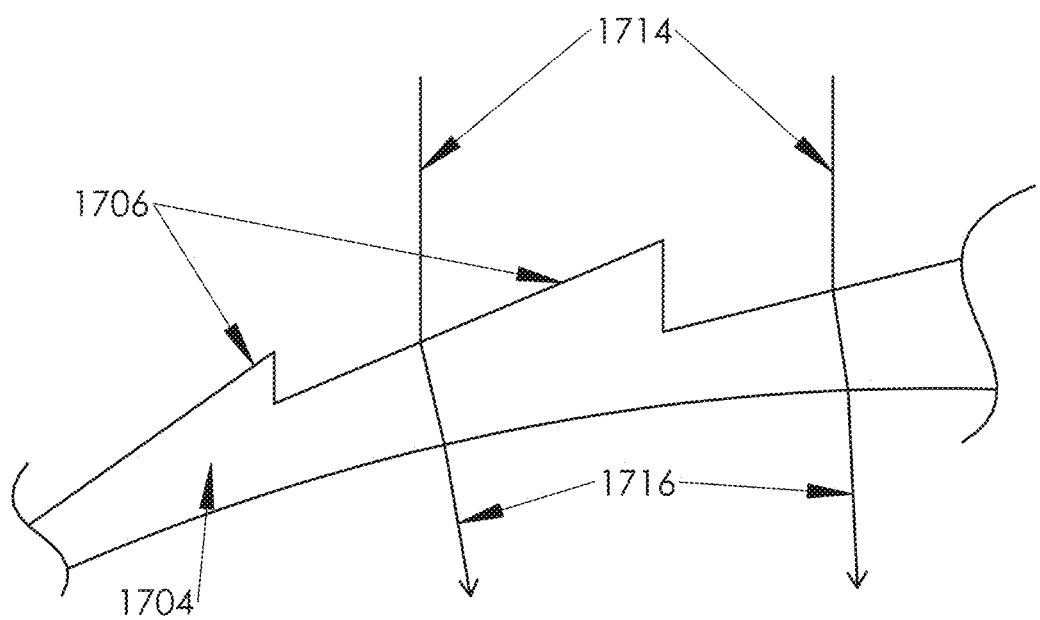
FIG. 17B illustrates details of a surface of the film based concentration system of FIG. 17A according to an embodiment of the present invention.

FIG. 17B shows an exaggerated partial sectional enlarged view of optical shapes for refracting light on a clear front film. Surface 1706 can be made by a variety of manufacturing processes, including but not limited to embossing, roll embossing, stamping, forming, casting, laser machining, screen printing, spray deposition, inkjet printing and photo etching and other photochemical processes among other methods. Film 1704 can have a modified surface shape such as 1706 on either a front surface as shown in FIGS. 17A and 17B, or on a back surface (not shown) or on both front and back surfaces.

In some embodiments, surface shapes 1706 may be three-dimensional (rather than having a consistent cross section). Three-dimensional shapes may be chosen so that light may be directed away from inactive areas of a receiver.

FIGS. 17C1 and 17C2 show a section view and a partial section view, respectively, of another refractive front film 1718. Film 1718 is similar to film 1704 of FIG. 17B, except that prism shapes 1720 are formed on the concave side (inside) of the film. The prism shapes in FIG. 17C2 are shown relatively large and relatively few in number compared with the tube diameter and film thickness. In practice it may be desirable to use a greater number of prisms with smaller prism height relative to film thickness compared to what is shown in this figure. In some embodiments, the prism height can range between 0.2 µm and 200 µm.

Film 1718 may concentrate light in one direction (1D concentration) if prisms 1720 are linear and have a continuous cross section along their length (i.e. in a direction perpendicular to the page). In some embodiments, film 1718 may concentrate light in two directions (2D concentration) if prisms 1720 curve or if their cross section changes along a direction perpendicular to the page.

FIG. 17C1 shows schematically how light rays behave as they are refracted through a 1D concentrating version of film 1718 according to an embodiment of the present invention. Incident rays 1722 are refracted a first time as they pass from the surrounding air, gas, or vacuum into front film surface 1724 and are refracted again as they pass through back surface 1726 of film 1718 and into inside volume 1728 to form refracted rays 1730. Refracted rays 1730 converge to form a region of focus 1732. In an idealized case of 1D concentration, region of focus 1732 is a line parallel to the axis of the tubular film 1718.

FIG. 17C2 illustrates a partial close-up view of the structure of film 1718 and prism shapes 1720 according to an embodiment of the present invention. Incoming light rays 1722 are refracted twice as they pass first through a front surface 1724 into film 1718 and then through a back surface 1726 into the internal volume 1728.

Figure 17D:
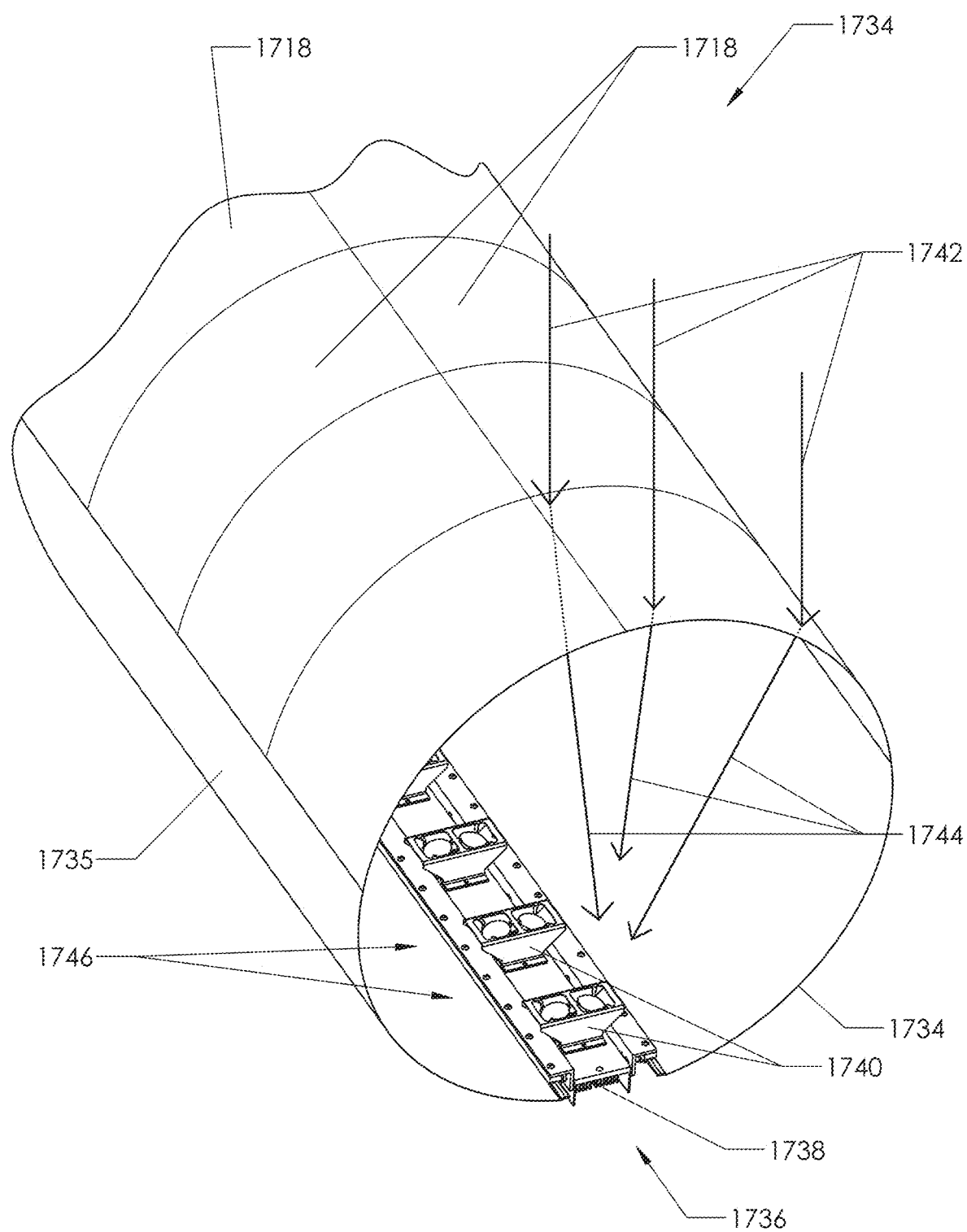
FIG. 17D illustrates an inflated film based tubular refractive concentrator according to an embodiment of the present invention.

FIG. 17D shows an inflated film based tubular refractive concentrator system 1734 employing a 2D concentrating version of an embodiment of a refractive film 1718. Refractive film 1718 is attached to side films 1735 which may be of a different material than film 1718. One reason to have side films 1735 to be of a different material is to achieve cost savings or to take advantage of different mechanical properties.

Films 1718 and 1735 are removably mounted to a receiver assembly 1736. Films 1718 and 1735 may be formed from Polyethylene Terephthalate (PET), poly(meth methacrylate) (PMMA) and co-, ter-, tetra-, or other multimonomeric polymers of methacrylates or acrylates including but not limited to monomers of ethyl, propyl and butyl acrylate and methacrylates. Other examples of polymers forming the upper transparent film include but are not limited to polycarbonate (PC), polymethylpentane (TPX), cyclic olefin derived polymers such as Cyclic olefin co-polymers (COC), cyclic olefin polymer (COP), ionomer, fluorinated polymers such as polyvinilidene fluoride and difluoride (PVF and PVDF), ethylene tetrafluoroethylene (ETFE), ethylene chlorotrifluoroethylene (ECTFE), fluorinated ethylene propylene (FEP), THV and derivatives of fluorinated polymers, and co-extruded, coated, adhered, or laminated species of the above. Examples of thicknesses of layers of such materials may include from about 0.012 mm to 20 mm, depending on the strength of the material and the size of the collector. In some embodiments, films 1718 and 1735 may comprise two or more layers. Each layer can be chosen from any of the materials listed above. Receiver assembly 1736 has a heat sink 1738 to which cell assemblies 1740 are mounted. Incoming rays 1742 are refracted through film 1718 to become refracted rays 1744 which converge and are concentrated at points or tight regions of focus 1746 on cell assemblies 1740.

2D Concentration Via Refractive Cylindrical Optic

Refractive concentrating optics for CPV are typically in the form of flat Fresnel lenses or aspheric solid lenses, but Fresnel lenses can also be formed on a cylindrical surface. There are existing techniques for creating a line focus (1D concentration) by refraction of light through a cylinder. However, there are fundamental limits to the concentration factor that can be achieved with one-axis (or 1D) concentration. There may be economic benefits and other advantages of operating at higher concentrations, which are only achievable by concentrating in two axes (2D concentration). 1D concentration with a cylindrical optic bends light in a plane perpendicular to the axis of the cylinder, creating a "line focus" parallel to the cylinder axis. Described below are techniques that allow cylindrical optics to bend light with precision in another axis as well to create 2D concentration. This makes possible a series of point focuses, various regions of focus, or a series of shortened lines of potentially higher concentration than the line focus of 1D concentration.

Figure 17E:
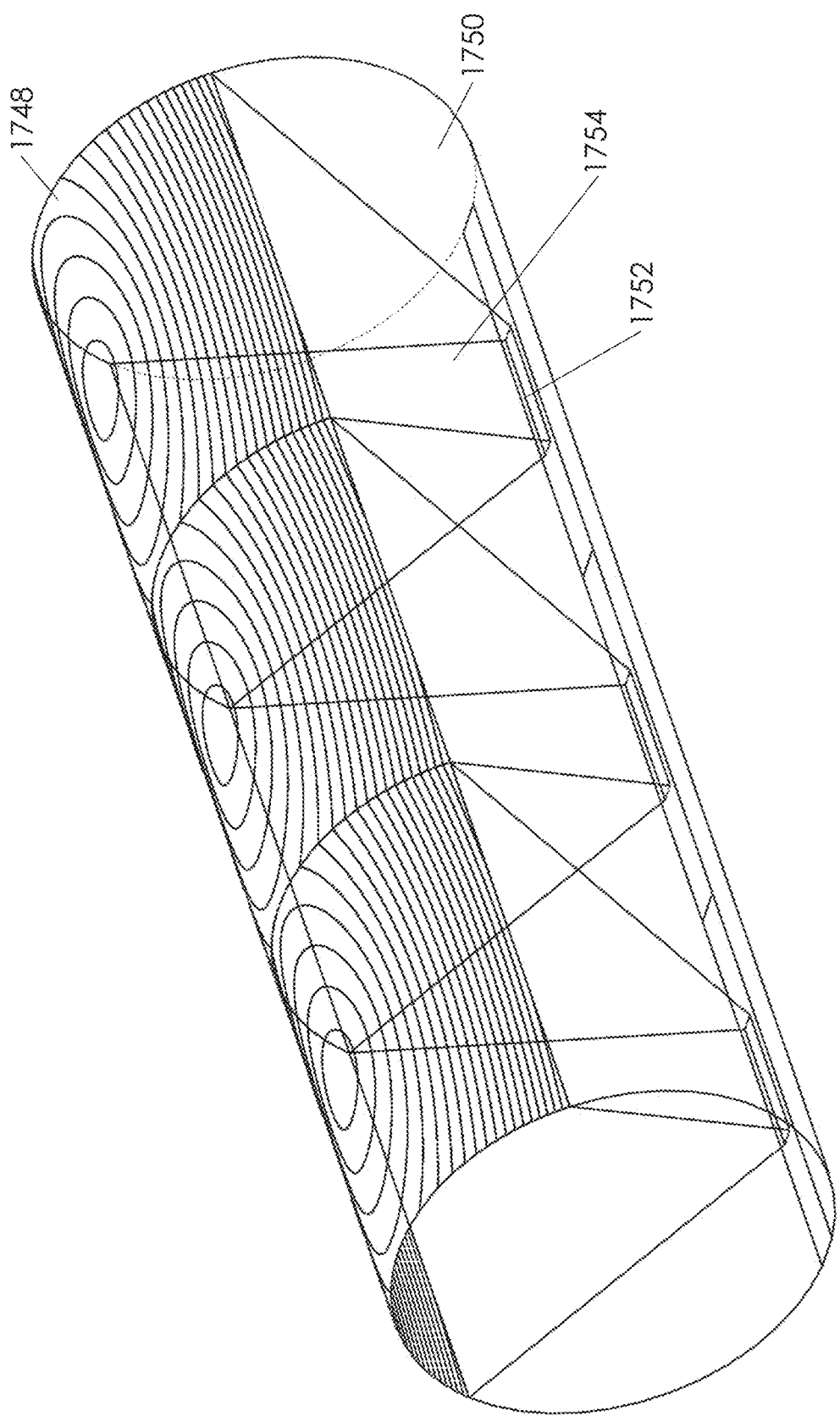
FIG. 17E shows a film optic with a refractive prism pattern that causes incident sunlight to be concentrated in two directions with resulting regions of focus having linear shapes but separated by some distance according to an embodiment of the present invention.

FIG. 17E is a schematic that illustrates a tubular solar concentration system 1750 according to an embodiment of the present invention. Solar concentration system 1750 includes elongated 2D concentrated light focus regions 1752 which can be created using a cylindrical primary optic prism pattern 1748 which causes refracted light to fill and define volumes 1754, which are shown to help visualize the concentration action. Elongated focal regions 1752 are just one example of many possible focal region shapes that can be created using the techniques and refractive elements described below.

Figure 17F:
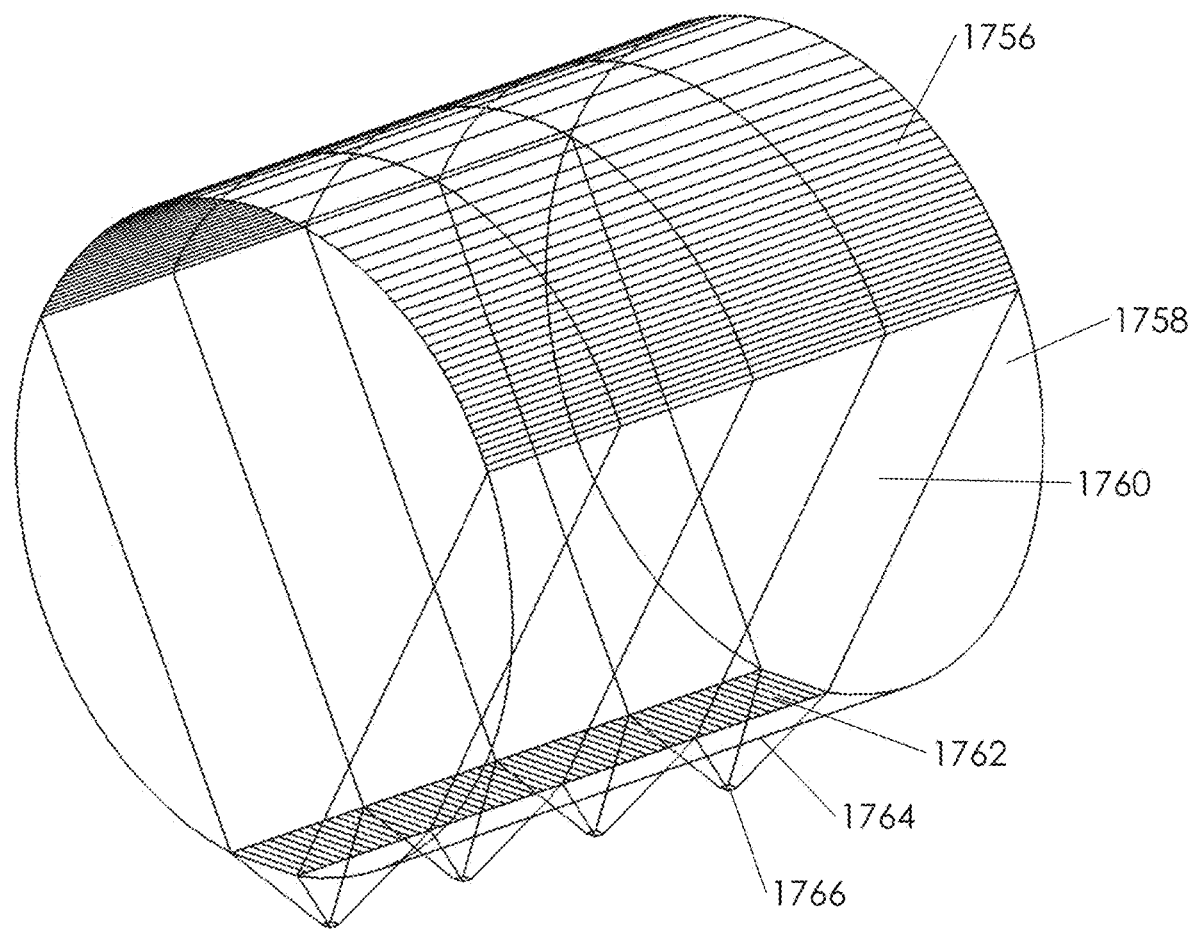
FIG. 17F shows a film optic with a refractive prism pattern that causes incident sunlight to be concentrated in one dimension to form an intermediate continuous linear region of focus, and secondary optical elements that further concentrate light in two dimensions to create discrete spot regions of focus according to an embodiment of the present invention.

FIG. 17F shows another method of achieving higher net concentration than is ordinarily possible with a 1-D refractive film, according to an embodiment of the present invention. A 1-D concentrating Fresnel lens 1756 in the form of a whole or partial cylinder refracts incoming light to define and fill 1-D concentrating volumes 1760, which are shown to help visualize the concentration action. A secondary concentration device 1762 may be used to concentrate light in an additional direction. Refracted light after the secondary concentration device 1762 defines and fills secondary concentration volumes 1764 and results in discrete points or regions of focus 1766.

1D or line focus on a linear Fresnel optic is accomplished with prisms parallel to the axis of the optic which are typically continuous. 1D concentrating Fresnel lenses may be flat, or they may be curved in a circular arc or non-circular curve cross section. If there is a curved cross section, the cross section is kept relatively uniform along the length of the lens system in order to maintain a consistent depth and width of focus on a linear receiver. If the cross section is a circular arc, then the optic forms a partial cylinder. The normals to the prism surfaces are all normal to the cylinder axis (though they will not in general intersect with the cylinder axis). In contrast, the canonical form of 2D concentration uses a primary optic to create a point focus, or a close approximation thereof. The most typical refractive element used as a primary optic for 2-D concentration is a flat Fresnel lens with concentric circular prisms or grooves.

Accomplishing 2D concentration with a tubular primary optic is non-trivial if losses are to be kept to a minimum. Some level of 2D concentration may be achieved if the surface normals of some locations on the prisms are not normal to the axis of the cylinder. However, to achieve a high level of concentration in the additional axis, e.g., the direction along the cylinder, it is beneficial to have the surface normals of the prisms change in a prescribed way so that light is refracted through different locations on the cylinder to arrive at a similar point in space where concentration is desired. In order to minimize the losses, additional geometry constraints can be accommodated to avoid prism self-shading, unwanted refractions and internal reflections. There are several possible approaches to minimize the losses.

If a transparent cylinder has smooth, concentric inner and outer surfaces (as in the case of a plain clear inflated film tube), sunlight striking it will be refracted and its direction as it exits the inside film surface into the inside air will in most cases be changed slightly and shifted slightly, but it will not be concentrated to a useful degree. Concentrating light using a cylindrical optic involves modification of the surface slopes at either the inner surface or the outer surface of the film or both. In the particular case of thin film tubes to be deployed outdoors for solar concentration, it may be advantageous to leave the outer convex surface of the tube smooth and modify the inner surface of the tube. The outer surface of tube then holds less soil and is easier to clean. There are also a greater variety of material choices and coatings and processes that can be employed with the smooth surface. However, in some circumstances it may be desirable to modify the shape of the outer surface or both surfaces.

In the instance where the outer surface is smooth and the inner surface is modified, for any point on the cylinder inner surface that refracts the incident ray to a specified target location (a point in x,y,z space), there is a unique surface normal for that point that will accomplish that goal. Accordingly, there is a closed form solution for the case of surface normals which will refract light to a common target for points on the upper half of the interior surface of a cylinder. A derivation of this solution is described below. When light is refracted through a film, prism or other refractive optical structure, its direction is changed. This change in the direction of the light as it passes through a refractive optic is often referred to as the turning angle. There are limits to the turning angle which depend upon refractive indices of the material and medium contained inside the tube. A similar solution can be found for modifying the surface at points on the exterior of a cylinder.

FIGS. 17S1-17S9 schematically illustrate physical principles relating to creating a curved body with optical elements (prisms or grooves) with the goal of refracting and concentrating light and creating controlled regions of focus according to an embodiment of the present invention. These examples and figures discuss a partial cylinder shape with prisms on an inner surface, but the methods described here can also be generalized and adapted to the design of other optical surface shapes and/or refractive elements (prisms) on the outer surface or on both inner and outer surfaces.

FIG. 17S1 illustrates a cylindrical surface in a first set of Cartesian coordinates x, y, z for purposes of mathematically deriving the surface normals required for a prism pattern superimposed on that cylindrical surface to refract incoming collimated light striking the cylinder at a point $\tilde{g}$ to a target point $\tilde{f}$.

FIG. 17S2 illustrates the transformation of the cylindrical surface to a flattened surface, for example when a cylindrical film is straightened to become planar. A transformed set of Cartesian coordinates i, j, k is shown that are used for referring to points and vectors in the flattened transformation. A point $\tilde{h}$ represents the location where the point $\tilde{g}$ ends up after the transformation to flattened coordinates.

FIG. 17S3 shows the cylindrical surface of FIG. 17S1 with the angle $\theta_1$ from the central axis of the cylinder to any point on the cylinder outer surface and a corresponding normal vector $\hat{m}$ at that point. Since points on the surface lie on a cylinder whose central axis runs along the x-axis, the angle $\theta_1$ can be calculated from the y and z coordinates:

$$\theta_1 = \tan^{-1}(y/z) \qquad (1)$$

FIG. 17S4 illustrates how an incoming ray $\hat{w}$ with an angle $\theta_1$ to the outer surface normal $\hat{m}$ is refracted to become initial refracted ray $\hat{v}$ within the material of the cylinder at a new angle $\theta_2$ from $\hat{m}$. The refraction angle $\theta_2$ can be obtained by using the scalar form of Snell's Law.

$$\mu \sin \theta_1 = \eta \sin \theta_2 \quad (2)$$

$$\theta_2 = \sin^{-1}(\mu/\eta \sin \theta_1) \quad (3)$$

$\mu$ is the refractive index of ambient medium.
$\eta$ is the refractive index of the cylinder medium.
$\theta_1$ is the angle between the incident ray and normal of exterior surface.
$\theta_2$ is the angle between the refracted ray in cylinder medium and normal of exterior surface.

The angle $\alpha$ between the ray $\hat{v}$ and the vertical z axis is used to calculate the components of the ray $\hat{v}$.

$$\alpha = \theta_1 - \theta_2 \quad (4)$$

$$\hat{v} = \begin{bmatrix} v_x \\ v_y \\ v_z \end{bmatrix} = \begin{bmatrix} 0 \\ -\sin\alpha \\ -\cos\alpha \end{bmatrix} \quad (5)$$

FIG. 17S5 illustrates how initial refracted ray $\hat{v}$ is refracted again through the interior cylinder surface (which may have a modified surface slope or shape—not shown) by an angle $\beta$ to become final refracted ray $\hat{u}$. Vector subtraction can be used to find the vector between $\tilde{f}$ and $\tilde{g}$, which then may be scaled to a unit length.

$$\begin{bmatrix} \Delta x \\ \Delta y \\ \Delta z \end{bmatrix} = \tilde{f} - \tilde{g} = \begin{bmatrix} f_x \\ f_y \\ f_z \end{bmatrix} - \begin{bmatrix} g_x \\ g_y \\ g_z \end{bmatrix} \quad (6)$$

$$\hat{u} = \begin{bmatrix} u_x \\ u_y \\ u_z \end{bmatrix} - \begin{bmatrix} \Delta x \\ \Delta y \\ \Delta z \end{bmatrix} \frac{1}{\sqrt{\Delta x^2 + \Delta y^2 + \Delta z^2}} \quad (7)$$

The dot product can be used to find the angle between the two vectors.

$$\cos \beta = \hat{u} \cdot \hat{v} \quad (8)$$

$$\beta = \cos^{-1}(\hat{u} \cdot \hat{v}) \quad (9)$$

Expressing in terms of components:

$$\beta = \cos^{-1}\left( \begin{bmatrix} 0 \\ v_y \\ v_z \end{bmatrix} \cdot \begin{bmatrix} u_x \\ u_y \\ u_z \end{bmatrix} \right) \quad (10)$$

$$\beta = \cos^{-1}(v_y u_y + v_z u_z) \quad (11)$$

FIG. 17S6 shows the relationship between $\hat{v}$, $\hat{u}$, $\phi_1$, $\beta$, and $\phi_2$. Solving for $\phi_2$ $$\mu \sin \phi_2 = \eta \sin \phi_1 \quad (12)$$

$$\phi_1 = \phi_2 - \beta \quad (13)$$

The relationship between the refraction angles (13) can be used to rewrite equation (12) in terms of $\phi_2$ and $\beta$.

$$\mu \sin \phi_2 = \eta \sin(\phi_2 - \beta) \quad (14)$$

Using the angle sum trigonometry identity and substituting to rewrite the right-hand side of equation (14).

$$\sin(a-b) = \sin(a)\cos(b) - \cos(a)\sin(b) \quad (15)$$

$$\mu \sin \phi_2 = \eta(\sin \phi_2 \cos \beta - \cos \phi_2 \sin \beta) \quad (16)$$

Dividing by $\cos \phi_2$ and substituting $\tan \phi_2$:

$$\mu \frac{\sin\phi_2}{\cos\phi_2} = \eta \frac{\sin\phi_2}{\cos phi_2} \cos\beta - \eta\sin\beta \quad (17)$$

$$\mu \tan\phi_2 = \eta \tan\phi_2 \cos\beta - \eta\sin\beta \quad (18)$$

Rearranging and solving for $\phi_2$:

$$\tan \phi_2(\eta \cos \beta - \mu) = \eta \sin \beta \quad (19)$$

$$\phi_2 = \tan^{-1}(\eta \sin \beta/(\eta \cos \beta - \mu)) \quad (20)$$

FIG. 17S7 shows the relationship between $\hat{u}$, $\hat{v}$, and a vector $\hat{o}$ representing a unit vector in the direction of a rotation axis defined by $\hat{u}$ and $\hat{v}$. The axis of the angle $\beta$ between the ray in the cylinder medium and the ray to the focal point is defined by the cross product between the two rays. The formula for the cross product is applied to the ray vectors.

$$\tilde{a} \times \tilde{b} = \begin{bmatrix} a_2 b_3 - a_3 b_2 \\ a_3 b_1 - a_1 b_3 \\ a_1 b_2 - a_2 b_2 \end{bmatrix} \quad (21)$$

$$\tilde{o} = \tilde{v} \times \tilde{u} = \begin{bmatrix} 0 \\ v_y \\ v_z \end{bmatrix} \times \begin{bmatrix} u_x \\ u_y \\ u_z \end{bmatrix} \quad (22)$$

$$\tilde{o} = \begin{bmatrix} o_1 \\ o_2 \\ o_3 \end{bmatrix} = \begin{bmatrix} v_y u_z - v_z u_y \\ v_z u_x \\ -v_y u_x \end{bmatrix} \quad (23)$$

For creating a rotation matrix, the rotation axis can be expressed as a unit vector and the magnitude can be found as:

$$\hat{o} = \begin{bmatrix} o_x \\ o_y \\ o_z \end{bmatrix} = \begin{bmatrix} o_1 \\ o_2 \\ o_3 \end{bmatrix} \frac{1}{\sqrt{o_1^2 + o_2^2 + o_3^2}} \quad (24)$$

The vector $\tilde{u}$ is rotated by angle $\phi_2$ about the axis defined by unit vector $\hat{u}$. The corresponding rotation matrix R is created.

$$R = I \cos \phi_2 + [\hat{o}] \times \sin \phi_2 + \hat{o} \otimes \hat{o}(1 - \cos \phi_2) \quad (25)$$

I is the identity matrix and is given by $$I = \begin{bmatrix} 1 & 0 & 0 \\ 0 & 1 & 0 \\ 0 & 0 & 1 \end{bmatrix} \quad (26)$$

$[\hat{o}]_x$ is the cross product matrix of $\hat{o}$.

$$[\hat{o}]_x = \begin{bmatrix} 0 & -o_z & o_y \\ o_z & 0 & -o_x \\ -o_y & o_x & 0 \end{bmatrix} \quad (27)$$

$\hat{o} \otimes \hat{o}$ is the tensor product of $\hat{o}$ and itself.

$$\hat{o} \otimes \hat{o} = \begin{bmatrix} o_x^2 & o_x o_y & o_x o_z \\ o_x o_y & o_y^2 & o_y o_y \\ o_x o_z & o_y o_z & o_z^2 \end{bmatrix} \quad (28)$$

The components of the rotation matrix R are listed below:

$$R = \begin{bmatrix} R_{1,1} & R_{1,2} & R_{1,3} \\ R_{2,1} & R_{2,2} & R_{2,3} \\ R_{3,1} & R_{3,2} & R_{3,3} \end{bmatrix} \quad (29)$$

$$R_{1,1} = \cos\phi_2 + o_x^2(1 - \cos\phi_2) \quad (30)$$
$$R_{2,2} = \cos\phi_2 + o_y^2(1 - \cos\phi_2)$$
$$R_{3,3} = \cos\phi_2 + o_z^2(1 - \cos\phi_2)$$
$$R_{1,2} = o_x o_y(1 - \cos\phi_2) - o_z\sin\phi_2$$
$$R_{2,1} = o_x o_y(1 - \cos\phi_2) + o_z\sin\phi_2$$
$$R_{1,3} = o_x o_z(1 - \cos\phi_2) + o_y\sin\phi_2$$
$$R_{3,1} = o_x o_z(1 - \cos\phi_2) - o_y\sin\phi_2$$
$$R_{2,3} = o_y o_z(1 - \cos\phi_2) - o_x\sin\phi_2$$
$$R_{3,2} = o_y o_z(1 - \cos\phi_2) + o_x\sin\phi_2$$

FIG. 17S8 shows the relationship between $\hat{u}$, the desired interior surface normal vector $\hat{n}$, $\hat{o}$ and $\phi_2$. The rotation matrix R is multiplied by vector $\hat{u}$ to obtain the unit normal vector $\hat{n}$.

$$\hat{n} = -R\hat{u} = -\begin{bmatrix} R_{1,1} & R_{1,2} & R_{1,3} \\ R_{2,1} & R_{2,2} & R_{2,3} \\ R_{3,1} & R_{3,2} & R_{3,3} \end{bmatrix} \begin{bmatrix} u_x \\ u_y \\ u_z \end{bmatrix} \quad (31)$$

$$\hat{n} = \begin{bmatrix} n_x \\ n_y \\ n_z \end{bmatrix} = -\begin{bmatrix} R_{1,1}u_x + R_{1,2}u_y + R_{1,3}u_z \\ R_{2,1}u_x + R_{2,2}u_y + R_{2,3}u_z \\ R_{3,1}u_x + R_{3,2}u_y + R_{3,3}u_z \end{bmatrix} \quad (32)$$

FIG. 17S9 shows the relationship of the desired interior surface normal vector $\hat{n}$ in the coordinates of the cylindrical surface to that of the corresponding vector $\hat{l}$ in the coordinates of the flattened surface. $\hat{l}$ is $\hat{n}$ rotated about the x axis (which is equivalent to the i-axis in the flattened coordinates) by an angle of $\theta_1$ using a rotation matrix Q. To convert the vector to the flattened film coordinates, it is rotated about the x-axis by rotation matrix Q.

$$\hat{l} = Q\hat{n} = \begin{bmatrix} 1 & 0 & 0 \\ 0 & \cos\theta & -\sin\theta \\ 0 & \sin\theta & \cos\theta \end{bmatrix} \begin{bmatrix} n_x \\ n_y \\ n_z \end{bmatrix} \quad (33)$$

$$\hat{l} = \begin{bmatrix} l_i \\ l_j \\ l_k \end{bmatrix} = \begin{bmatrix} n_x \\ n_y\cos\theta - n_z\sin\theta \\ n_y\sin\theta + n_z\cos\theta \end{bmatrix} \quad (34)$$

The location $\tilde{g}$ on the cylindrical surface is converted to the location h on the flattened surface.

$$\tilde{h} = \begin{bmatrix} h_i \\ h_j \\ h_k \end{bmatrix} = \begin{bmatrix} g_x \\ r\theta_1 \\ \sqrt{g_y^2 + g_z^2} - r \end{bmatrix} \quad (35)$$

The location $\tilde{h}$ on the flattened surface is converted to the location $\tilde{g}$ on the cylindrical surface using:

$$\tilde{g} = \begin{bmatrix} g_x \\ g_y \\ g_z \end{bmatrix} = \begin{bmatrix} h_i \\ (r + h_k)\sin(h_j/r) \\ (r + h_k)\cos(h_j/r) \end{bmatrix} \quad (36)$$

The condensed form of the solution is written as:

$$\theta_1 = \tan^{-1}\left(\frac{g_y}{g_z}\right) \quad (37)$$

$$\alpha = \theta_1 - \sin^{-1}\left(\left(\frac{\mu}{\eta}\right)\sin\theta_1\right) \quad (38)$$

$$\hat{v} = \begin{bmatrix} v_x \\ v_y \\ v_z \end{bmatrix} = \begin{bmatrix} 0 \\ -\sin\alpha \\ -\cos\alpha \end{bmatrix} \quad (39)$$

$$\hat{u} = \frac{\tilde{f} - \tilde{g}}{|\tilde{f} - \tilde{g}|} \quad (40)$$

$$\beta = \cos^{-1}(\hat{u} \cdot \hat{v}) \quad (41)$$

$$\phi_2 = \tan^{-1}\left(\frac{\eta\sin\beta}{\eta\cos\beta - \mu}\right) \quad (42)$$

$$\hat{o} = \frac{\hat{v} \times \hat{u}}{|\hat{v} \times \hat{u}|} \quad (43)$$

$$R = I\cos\phi_2 + [\hat{o}]_x\sin\phi_2 + \hat{o} \otimes \hat{o}(1 - \cos\phi_2) \quad (44)$$

$$\hat{n} = \begin{bmatrix} n_x \\ n_y \\ n_z \end{bmatrix} = -R\hat{u} \quad (45)$$

$$\hat{l} = \begin{bmatrix} l_i \\ l_j \\ l_k \end{bmatrix} = \begin{bmatrix} 1 & 0 & 0 \\ 0 & \cos\theta_1 & -\sin\theta_1 \\ 0 & \sin\theta_1 & \cos\theta_1 \end{bmatrix} \hat{n} \quad (46)$$

A section of cylinder where every point on the surface has a constant target location will create a point focus (for collimated incoming light). Other focal shapes can also be created by making the target location dependent on the location on the cylinder.

In practice, knowing the desired surface normals at points on the cylinder surface is not enough to completely specify the whole surface pattern, particularly if thickness is important. This is because a continuous inner surface with the calculated surface normals would no longer be a cylinder and therefore given that the outer surface still is a cylinder, the material thickness across the surface of the tube would deviate greatly, which is often impractical. If the average material thickness across the surface is to be kept within reasonable bounds (or nearly constant as in the case of embossing of films), the surface being changed to redirect the light (in this case the inner surface of the film) must be in some way divided into active sub-surfaces with in-active joining surfaces in between them. As one moves across an active sub-surface, the material thickness reaches a limit (e.g., a limiting minimum thickness in the case of a valley or a limiting maximum thickness in the case of a peak) and a joining surface may be needed to traverse across the thickness to the other extreme, where another active surface can begin. This is the basis of traditional flat Fresnel lens design but also applies to other approaches, some of which differ substantially from traditional flat Fresnel lenses with axis-symmetric grooves.

Although a closed form solution of a particular prism active face pattern may be possible from the map of surface normals, it is generally more feasible to use discrete approximations.

FIGS. 17G1-17G6 show one approach to discretization of a 2D concentrating refractive film which uses tetragonal faces 1776 on a rectilinear grid, each with a unique surface normal (not shown) that refracts light passing through the face towards the target (not shown), according to an embodiment of the present invention. FIG. 17G1 shows the overall film system with actively refracting region 1778.

FIG. 17G2 shows a top view of part of refractive region 1778. Four regions of prisms 1768, 1770, 1772 and 1774 are labeled and shown in detail in the figures below. FIG. 17G3 shows a detail view of prisms 1776 in region 1768. For embossing processes, the surfaces between the optical faces must have a draft angle. In FIGS. 17G3-17G6 this draft angle can be designed into and manufactured into draft faces 1775 and 1777. For draft faces 1775 which are largely parallel to the longitudinal cylinder axis, the refraction of light through the outer surface of the cylinder makes it possible to use draft faces that do not block the light. However, for faces 1777 that touch the other sides of active faces and which are closer to perpendicular to the cylinder axis, the draft angle will cause some vignetting losses where light is either blocked by or misdirected by a non-optically active face such as face 1777.

FIG. 17G4 shows a detail view of prisms 1776 in region 1770. FIG. 17G5 shows a detail view of prisms 1776 in region 1774, which is the most central region and has the least losses due to the draft faces. FIG. 17G6 shows a detail view of prisms 1776 in region 1772.

Figure 17H:
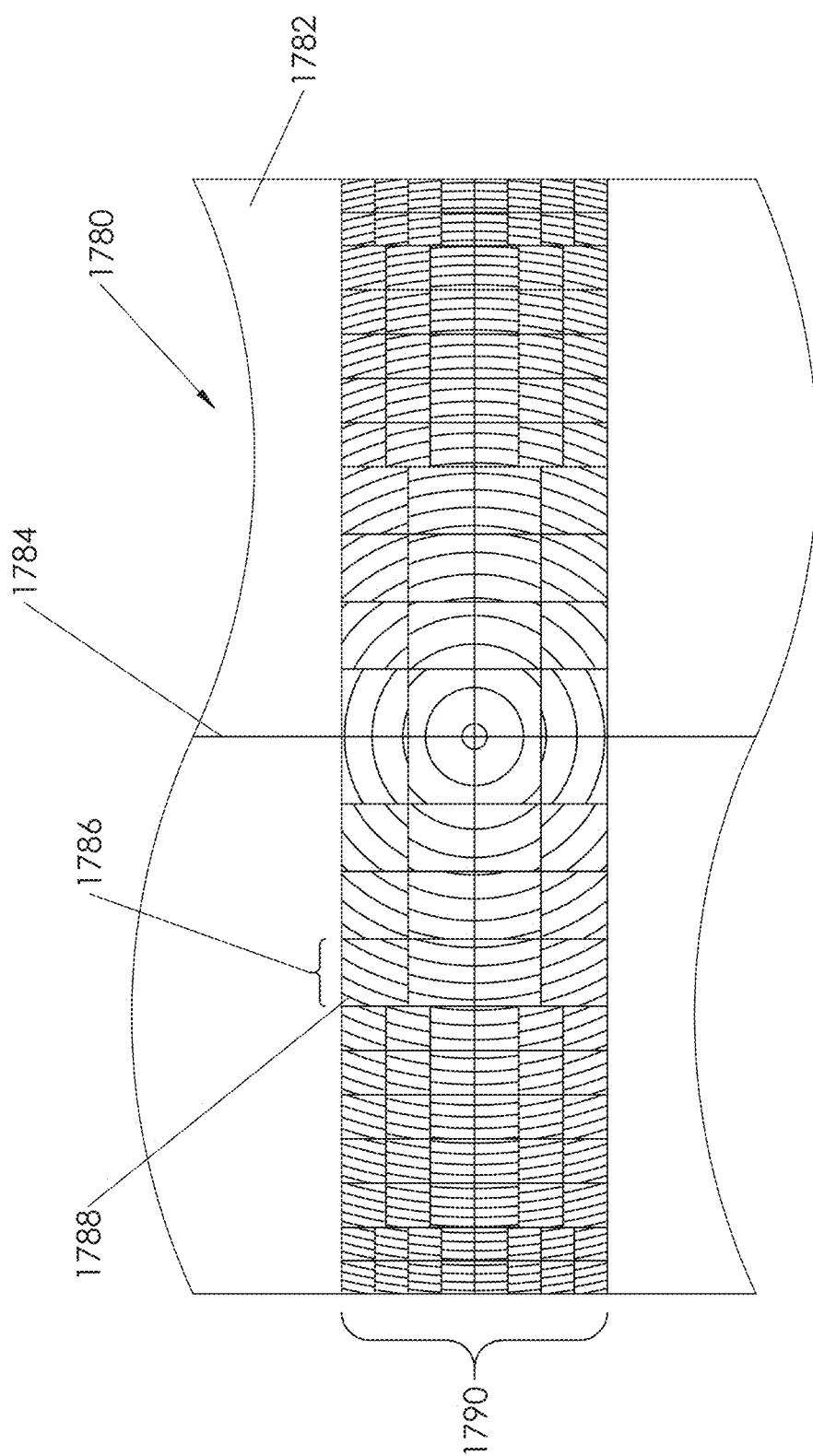
FIG. 17H shows a prism design for a cylindrical optic which creates 2-D concentration with tiles of axisymetric prisms according to an embodiment of the present invention.

FIG. 17H shows another approach which uses axisymmetric curved prisms in groups or "tiles" combined together in an array to create the overall prism pattern according to another embodiment of the present invention. FIG. 17H illustrates a top view of a tubular optic 1780 formed of a film 1782 which has an overall prism pattern 1790 which is repeated along a longitudinal axis 1784. The overall prism pattern 1790 is made up of a variety of individual tiles 1786. Each tile 1786 may have many individual prism grooves 1788. Prism grooves 1788 may be axisymmetric (when the film is flat, before it is turned into a cylinder). Although the surface normals across the entire primary optic region do not match an axisymmetric description, the surface normals across small subsection tiles 1786 can be feasibly approximated by an axisymmetric pattern. This has distinct advantages for manufacturing because it allows for the creation of tools using diamond turning or other processes that require axis-symmetry. In FIG. 17H, the grooves do not necessarily line up with each other from tile to tile. The further a tile is from the center of the pattern, the more the slope of the active faces of prism grooves 1788 deviates from the active groove faces used on a flat Fresnel lens. This means that for a given acceptable error of surface normals within a tile, smaller tiles must be used further from the center or target (the target may or may not be located directly below the cylinder center). Note that in FIG. 17H, tiles near axis 1784 are larger and tiles further from axis 1784 are smaller.

In a different optical design, the Fresnel groove paths may be made as continuous circular arcs wrapped onto the cylindrical surface. If the prism angles are kept constant on these circular arc grooves, then the refracted light would not form a tight region of focus and the results would generally not be useful for HCPV. To correct this problem, the prism angle would need to change along the groove path. However, even with a changing prism angle along the path, for any point on the primary there is a finite band of angles through which the refracted light could be directed. If we assume that the cylindrical optic is correctly pointed at the sun, the direction of any ray refracted through the smooth front surface of the optic lies in a plane perpendicular to the cylinder axis (+/−a portion of sun's angular subtense). Then after refraction through a prism on the inside of the optic surface whose normal must nearly be perpendicular to the groove path, the resulting ray's direction will have been changed in two angular directions relative to the orientation of the principal axes, but the range of resulting ray angles will be limited to a narrow band governed by the plane of the ray directions after the front surface refraction and the plane of possible prism surface normals. This narrow band of possible resultant ray directions will be different for every point on the primary and importantly, each band for each point on the primary will not generally intersect at a consistent location in space. This would still present a significant limitation to the degree of concentration, shape of the region of concentration and distribution of light that could be achieved within the region of concentration. In some embodiments, another degree of freedom in the design may be needed if the optical design is to achieve a common spatial point of intersection of all the rays (or even a narrow region within which a majority of the resultant rays pass).

Prism depth and width may be chosen based on several factors and constraints. The width and depth of the prisms may often be linked because when the depth and angle are specified, the width is determined. The optical performance is determined in largest part by the prism angle (prism width and spacing if too small will generally have a detrimental effect on focus due to diffraction phenomena). Prism depths may be constrained by manufacturing and cost concerns. For example, in the case of embossed film refractive optics, economics are optimized by using small prism depths because less material is required, but some embossing processes may require a minimum feature size. Also losses due to tool radii and diffractive effects may impose limits on how small the prism spacing and widths can be and therefore also on the depths.

If desirable, it may be possible to vary the prism depth from prism to prism. Alternatively, for manufacturing reasons or other reasons, it may be desirable to design the pattern of prisms so that the groove valleys are all at the same depth. Alternatively, prism peaks may be designed to be all at the same height. In other embodiments, the midplane of each prism may be designed to be at a constant depth. The latter principle can enable optimal embossing performance by providing equal volumes of material displaced from the troughs on one side of the mid plane and filled into the peaks on the other side of the mid plane. In this way resin displaced from valleys exactly equals that which flows to form the peaks.

In one particular embodiment, the design for 2-D concentrating light to a point or tight focus with prisms on a cylindrical surface uses a continuous grooved pattern of curving prisms. Because of the unique nature of the desirable surface normals on a cylindrical Fresnel lens, the angle of both the groove's optical and non-optical faces varies along its curve, and the curve is not accurately described by either circular or polynomial descriptions. A collection of grooves can be held to a uniform depth (if desired for manufacturing for example) by determining the spacing between grooves such that the maximum depth in each groove is consistent. In an embodiment, a desired focal point defines a map of ray directions and therefore the desired surface normals over the cylinder surface that refract the light appropriately as described above. The groove pattern is generated based on these surface normals. The focal region can be a point, or it may be a compressed line, or other arbitrary mapping of locations on the cylinder surface to x,y,z locations in space.

It is a challenging problem to design continuous facet grooves on a cylindrical surface that redirect incident light into a point focus. The design methodology is briefly summarized as follows. For a point on the cylinder, calculate the direction of the ray refracted through the exterior surface. In the case of an inflated tube, the surface is a cylinder. Thus, once the cylinder diameter is chosen, the behavior of the light refracting through the outer surface is known. Thereafter calculate the interior surface normal that is needed to refract that ray to its desired target. This gives every point on the cylinder a unique ideal surface normal (as described above in FIG. 17S). This design process creates a pattern of grooves that match these ideal surface normals. In one embodiment where the target lies on a vertical center plane of the cylinder, there are two planes of symmetry. One plane is orthogonal to the cylinder axis and intersects the point focus. The second plane splits the cylinder into two equal halves. These two planes split the cylinder surface into quadrants; only one of them needs to be determined in order to obtain the others due to the symmetry conditions. Note that there are also other, more complex cases that don't have this same symmetry, some of which will be described later.

Unlike the surfaces of a flat Fresnel lens, for a 2-D concentrating cylindrical Fresnel lens, an analytical description of the groove pattern (groove paths and surfaces) is challenging. Therefore, in some embodiments, an irregular 3D mesh of discrete triangular elements can be used to describe the paths of the grooves as well as the local slopes of the active and inactive prism faces. At sufficiently high mesh resolution, this can yield excellent optical results. Once the mesh is solved, 3D curves can be fitted along the nodes to create a set of continuous curves that describe the Fresnel groove pattern including groove paths, optical surfaces and draft surfaces. The draft surfaces created by this methodology are surfaces which are not optically active, and which are created primarily as connectors or segway surfaces between the optically active faces. In general, draft faces and their angles are designed such that they have a minimal effect on the light passing through the optically active surfaces. Minimizing their effect or losses due to draft faces is challenging and is one of the advantages of the design methodology described herein.

Specific steps of this general method are described below. Four triangular elements are grouped into a segment; a chain of segments describes a groove, and the set of grooves describes the Fresnel. Each segment has three edges along the groove direction; two "valley" edges and a "peak" edge. The other edges lay along the optical and draft faces, two on each.

FIG. 17I1 shows an isometric view of a subset of points 1792 that are generated and used by the groove calculation described herein. A smaller subset of points 1794 lie in and define a slice plane 1796. FIG. 17I2 shows how points 1792 are connected to form curves 1798 that define valleys between prisms and curves 17100 that define peaks of prisms. FIG. 17I3 shows how points 1794 may be used as vertices of triangular mesh elements 17102. FIG. 17I4 shows partial prism segments 17104 made using points 1792, and curves 1798 and 17100. FIG. 17I5 shows optical faces 17106 and draft faces 17108 on idealized curved prisms. FIG. 17I8 shows a small segment 17114 which approximates a small length of an idealized curved prism. Optical faces 17106 and draft faces 17108 can be approximated by triangular elements. FIG. 17I7 shows how a single curved prism 17112 can be made up of many approximated segments 17114 which are connected along common edges and vertices. FIG. 17I6 shows how a prism array 17110 can be made up of many curved prisms 17112.

To create a mesh representation of grooves and groove paths that match the ideal mapping of surface normals, each groove starts with points or vertices one "slice", whose properties are used to find the location of the next "slice" in the groove. This process is iterated to populate the full length of the groove. If needed, every "slice" in the groove is then scaled by the same amount to ensure the tallest "slice" in the groove stays within depth restrictions for the Fresnel pattern. Then the first "slice" in the groove is used to predict the first "slice" in the next groove, and the process is repeated until the entire primary optic surface is covered.

A more detailed description of one implementation of this general algorithm according to an embodiment of the present invention is provided below. The very first parameter of a groove is the starting location of the first slice's inner valley vertex. This lies in the plane of transverse symmetry. For the first groove, this is calculated by finding the location on the film that is directly over the target location, then stepping an offset distance away from it. For all following grooves, the first slice's inner valley vertex is determined by the previous groove's outer valley vertex with the same slice number. From this starting point, the step size to the center of the optical face is guessed by using the corresponding distance of the prior groove's first slice. The location at the center of the optical face is used to calculate vectors for the surface normal, ray through refracting medium, and refracted ray. The surface normal vector defines the plane of the slice. The surface normal determines the optical face angle of the slice. The draft face angle is chosen based on the angle of the refracted ray and the angle of the ray in the refracting medium projected onto the slice plane, as well as the minimum draft angle of the manufacturing process. In most locations on the primary surface, it is possible to pick a draft angle that lies between the angle of the projected refracted ray and the angle of the projected internal ray, such that the peak vertex of the slice lies in an optically inactive zone.

The next slice in the groove is found as follows. The vector that defines the slice plane is tangent to the ideal continuous curve of the groove. Although a discrete step could be taken along this vector, it is possible to increase the accuracy of the mesh without increasing the number of points by stepping along a circular path that better approximates the ideal shape. The circular path is found by taking a very small linear step along the plane's vector, then finding a new surface normal at that location. Both surface normals are projected into the surface plane. Their intersection determines the center of the arc. The circular step size is determined by whichever is smaller, a minimum angular step or a minimum path length step. The location of the outer valley vertex of the new slice can then be found by the circular path parameters and the step size. This step is repeated, generating the outer vertex of each slice from the properties of the previous one until the groove leaves the active area of the primary.

Upon completing the propagation of the groove, each slice within the groove can be scaled. A spline function is fit to the outer valley points of the previous groove, using cylindrical coordinates. A simple circle of constant radius is used if there is no previous groove. The angle of each slice vertex in the cylindrical coordinate system is used to find the radius of the inner valley points that lay along the same radii as the outer valley points. The angular difference between the axisymmetric coordinate and the actual curve along the outer valley radii can be used in conjunction with the radial gap in order to find the base dimension of each slice. From this base dimension, the slice optical and draft angles can be used to determine the height of the slice peak. The entire groove can be then scaled by some amount to fit within the maximum depth & width constraints. Scaling is done by using the inner points of the groove and scaling the base width along the slice plane.

The above steps are repeated, filling the primary area with grooves until it is entirely covered. This involves extending the groove start and end locations past the active primary area, such that the corners can be completely filled.

There are many possible prism patterns and associated locations of focal regions. Some possibilities are described here. All of these may be designed using the tubular prism design algorithm described above, with some slight variations to account for changes to symmetry conditions and target locations.

FIG. 17J1 illustrates a top view of a composite prism pattern 17116 made up of tiled refractive prism groups 17118 that may be wrapped to form a cylindrical or tubular concentrating optic. Prism groups 17118 are made up of prisms 17120 which are designed to efficiently concentrate incoming light in two directions. Note that the prisms in this figure and many of the following figures are drawn schematically and that only selected contours are drawn, since in many actual designs the prisms are so tightly spaced and so numerous that it is impractical to depict them all in an overview figure. It is to be noted that the prisms need not be symmetrical despite the symmetry shown in some of the figures. FIGS. 17J1 and 17J2 schematically represent an idealized prism pattern that can create optimal 2-axis light concentration with prisms that are continuous over relatively large areas of the cylindrical optic—i.e. the prisms are not constrained to be axisymmetric arcs and the optic surface does not have to be subdivided into many small tiles to achieve high concentration in a relatively small target region.

FIG. 17J2 illustrates an isometric view of a composite pattern 17116 wrapped to form a tubular optic structure 17122. Prism pattern 17116 may be located on the inner (concave) surface of tubular optic 17122, or it may be located on the outer (convex) surface of tubular optic 17122, or both. Prisms pattern 17116 may be made of prisms with desired optimal shapes. Alternatively the prisms may be circular arc approximations of desired shapes or they may be some other curve that approximates an idealized concentrating prism shape.

FIG. 17K1 illustrates a top view of another composite refractive prism pattern 17124 according to an embodiment of the present invention. The prism pattern shown in FIGS. 17K1 and 17K2 is divided into many small tiles which may be useful to achieve near ideal optical concentration with prisms that are circular arc approximations of the ideal non-circular prism shapes. Tile refractive pattern 17124 includes repeating sections 17126 of tiled refractive prism groups 17130 each of which is in turn made up of prisms 17128. Prism pattern 17124 is designed to be wrapped to form a cylindrical or tubular concentrating optic.

Note that while prism groups shown here are in square sections, other shapes may also be used as the boundary of prism groups. Possible shapes include hexagons, triangles, rectangles, other tessellating shapes, or other shapes. FIG. 17K2 illustrates an isometric view of prism pattern 17124 of FIG. 17K1, as wrapped onto a tubular optic 17122, according to an embodiment of the present invention.

FIG. 17L1 illustrates a top view of a mapping pattern 17132 for a tubular refractive optic which is divided into sections 17134 and respective regions of focus 17140, according to an embodiment of the present invention. Optional cells 17136 are shown to illustrate one possible location of cells with respect to the regions of focus 17140. FIG. 17L2 illustrates an isometric view of the mapping pattern 17132 of FIG. 17L1 according to an embodiment of the present invention. Spatial volumes 17138 enclose light rays refracted through respective sections 17134, and are shown to illustrate how light arriving at the different sections 17134 travels through different spatial volumes 17138 and is therefore mapped to different respective regions of focus 17140. Locations 17142 represent the areas of highest light intensity within regions of focus 17140 and may represent a cell location.

FIG. 17M1 Illustrates a top view of another mapping pattern 17144 for a tubular refractive optic according to another embodiment of the present invention. Mapping pattern 17144 is divided into sections 17146 and respective regions of focus 17152. Optional cells 17148 are shown to illustrate one possible location of cells with respect to the regions of focus 17152. This figure shows how a mapping pattern may be divided into pairs of sections and corresponding regions of focus.

FIG. 17M2 illustrates an isometric view of the mapping pattern 17144 of FIG. 17M1 according to an embodiment of the present invention. Spatial volumes 17150 enclose light rays refracted through respective sections 17146 and are shown to illustrate how light arriving at the different sections 17146 travels through different spatial volumes 17150 and is therefore mapped to different respective regions of focus 17152. Locations 17154 represent the areas of highest light intensity within regions of focus 17152 and may represent a cell location.

FIG. 17N1 Illustrates a top view of another mapping pattern 17156 for a tubular refractive optic which is divided into sections 17158 and respective regions of focus 17164, according to an embodiment of the present invention. Optional cells 17160 are shown to illustrate one possible location of cells with respect to the regions of focus 17164. Pattern 17156 differs from the pattern 17144 of FIGS. 17M1 and 17M2 in that sections are not in aligned pairs, rather they are offset in the longitudinal direction of the tube.

FIG. 17N21 illustrates an isometric view of the mapping pattern 17156 of FIG. 17N1 according to an embodiment of the present invention. Spatial volumes 17162 enclose light rays refracted through respective sections 17158 and are shown to illustrate how light arriving at the different sections 17158 travels through different spatial volumes 17162 and is therefore mapped to different respective regions of focus 17164. Locations 17166 represent the areas of highest light intensity within regions of focus 17164 and may represent a cell location.

FIG. 17O1 Illustrates a top view of another mapping pattern 17168 for a tubular refractive optic which is divided into sections 17170 and respective regions of focus 17176, according to an embodiment of the present invention. Optional cells 17172 are shown to illustrate one possible location of cells with respect to the regions of focus 17176. Pattern 17168 differs from the pattern 17156 of FIGS. 17N1 and 17N2 in that ray directions and therefore regions of focus are shifted in a direction transverse to the longitudinal axis of the tube so that cells may lie in a line rather than being offset from the centerline as in FIGS. 17N1 and 17N2.

FIG. 17O2 illustrates an isometric view of the mapping pattern 17168 of FIG. 17O1 according to an embodiment of the present invention. Spatial volumes 17174 enclose light rays refracted through respective sections 17170 and are shown to illustrate how light arriving at the different sections 17170 travels through different spatial volumes 17174 and is therefore mapped to different respective regions of focus 17176. Locations 17178 represent the areas of highest light intensity within regions of focus 17176 and may represent a cell location.

FIG. 17P1 Illustrates a top view of another mapping pattern 17180 for a tubular refractive optic which is divided into sections 17182 and respective regions of focus 17188 according to an embodiment of the present invention. Cells 17184 are shown to illustrate one possible location of cells with respect to the regions of focus 17188.

Pattern 17180 differs from the pattern 17168 of FIGS. 17O1 and 17O2 in that ray directions and therefore regions of focus are shifted alternately in a direction parallel to the axis of the tube, which allows sections of the optic pattern 17182 to be aligned pairs such that there may be an integer number of sections on a tube and no sections are cut in half while at the same time cells 17184 may still be arranged in a line or other widely spaced pattern to maximize heat transfer effectiveness. This arrangement may offer benefits in heat transfer and cell cooling, and may create freedom in cell placement and spacing useful in receiver design and optimization of an integrated system.

FIG. 17P2 illustrates an isometric view of the mapping pattern 17180 of FIG. 17P1 according to an embodiment of the present invention. Spatial volumes 17186 enclose light rays refracted through respective sections 17182, and are shown to illustrate how light arriving at the different sections 17182 travels through different spatial volumes 17186 and is therefore mapped to different respective regions of focus 17188. Locations 17190 represent the areas of highest light intensity within regions of focus 17188 and may represent a cell location.

FIG. 17Q1 Illustrates a top view of another mapping pattern 17192 for a tubular refractive optic which is divided into sections 17196 and respective regions of focus 17200 according to an embodiment of the present invention. Optional cells 17194 are shown to illustrate one possible location of cells with respect to the regions of focus 17200. Regions of focus 17200 are spaced more widely in this version compared with FIGS. 17P1 and 17P2, which may allow for better heat transfer or larger heat sink elements.

FIG. 17Q2 illustrates an isometric view of the mapping pattern 17192 of FIG. 17Q1 according to an embodiment of the present invention. Spatial volumes 17198 enclose light rays refracted through respective sections 17196, and are shown to illustrate how light arriving at the different sections 17196 travels through different spatial volumes 17198 and is therefore mapped to different respective regions of focus 17200. Locations 17202 represent the areas of highest light intensity within regions of focus 17200 and may represent a cell location.

FIGS. 17R1-17R8C illustrate a refractive 2D concentrating primary optic film for use in a tubular shape with tiles of axis-symmetric grooves similar to that of FIGS. 17K1-17K2. In FIGS. 17R1-17R8C, selected tiles are shown in greater detail and light ray trace results and resulting focal spot shapes and irradiance maps are shown in order to observe and discuss the quality of focus that can be attained with axisymmetric approximations to the ideal continuous grooves. The shapes and locations of tiles shown are for illustration of effects of tile shape and size on spot quality and not necessarily the ideal tile configuration.

FIG. 17R1 shows a top view of an overall refractive film prism pattern 17216 in a flattened configuration. Overall pattern 17216 is divided into symmetrical quadrants 17204 in this embodiment. In other embodiments, pattern 17216 may not have symmetric quadrants. The symmetrical embodiment is discussed below for ease of explanation. However it is to be noted that the description of the symmetrical pattern embodiment below is equally applicable to non-symmetric patterns. In FIG. 17R1 five specific tiles are shown for comparison. Tile 17206 is a large tile near the center of the repeating pattern 17216 and may generally have the widest prisms. Prism grooves within each tile are drawn selectively (not all are shown) for clarity. Tile 17208 is a large tile further from the axis of the tube (not shown, but lies vertically at the center of overall pattern 17216). Prism widths may be smaller in this tile if average height is to be held constant. This is because when in a tubular shape, the slope of the general tube surface would be higher in the region where tile 17208 is located, so the "stair steps" would be narrower if the step height is held fixed. Tile 17210 is a large tile at the extreme corner of pattern 17216. Prism spacing may generally be the narrowest here. Tile 17212 is a medium sized tile located at the center of the extreme lateral edge of pattern 17216. Tile 17214 is a small tile near the extreme lateral edge of pattern 17216 and also next to a lateral axis of symmetry of pattern 17216. In this embodiment the large tiles are shown as approximately 0.95 inches square.

FIG. 17S2 illustrates a refractive film prism pattern 17218 that represents the prism pattern 17216 of FIG. 17R1 when it is wrapped, formed or inflated to become a part of a cylinder or tube. Tiles 17220, 17222, 17224, 17226 and 17228 are correspondingly the cylindrically wrapped versions of tiles 17206, 17208, 17210, 17212 and 17214 respectively. Refracted light rays 17230 are shown passing through the center of the tiles to illustrate the change in direction that is created when sunlight passes through the tiles from above. Refracted rays 17230 converge at a common focal point 17232.

FIG. 17R3A-C illustrate the illumination profile that would be created by, e.g., tile 17220 of FIG. 17R2, on a horizontal plane at the general location of focal point 17232. FIG. 17R3A shows isolines of the illumination profile (the spot of light) from tile 17220. Note that while tile 17220 is 0.95 inches square, the spot of light is only roughly 0.2 inches by 0.05 inches in size. This happens because the prisms within tile 17220, when formed in the correct geometry, concentrate the incoming (nearly parallel) light in two dimensions to create a smaller spot near focal point 17232.

FIG. 17R3B shows a cross section graph of illumination (in "suns" where 1 "sun" represents 1000 w/m$^2$ of irradiation) along the y axis of the spot of FIG. 17R3A. FIG.

17R3C shows a cross section graph of illumination along the x axis of the spot of FIG. 17R3A.

FIGS. 17R4A-C illustrate the illumination profile that would be created, e.g., by tile 17222 of FIG. 17R2, on a horizontal plane at the general location of focal point 17232. FIG. 17R4A shows isolines of the illumination profile (the spot of light) from tile 17222. Note that the spot from tile 17222 is larger than that from tile 17220 even though the tiles themselves are the same size. There are several reasons for this. One reason is that light arriving at focal point 17232 from tile 17222 on a horizontal plane arrives at a larger incident angle than light from tile 17220, so it gets spread out. A second reason is that tiles with axisymmetric prisms farther away from the center of pattern 17218 would need to be smaller to achieve the same approximation accuracy of the refracted light (compared to the ideal continuous prisms), so tiles of the same size that are farther from the center will create less accurate (larger) regions of concentration in general.

FIG. 17R4B shows a cross section graph of illumination in "suns" along the y axis of the spot of FIG. 17R4A. FIG. 17R4C shows a cross section graph of illumination along the x axis of the spot of FIG. 17R4A. FIGS. 17R5A-C illustrate the illumination profile that would be created, e.g., by tile 17224 of FIG. 17R2, on a horizontal plane at the general location of focal point 17232. FIG. 17R5A shows isolines of the illumination profile (the spot of light) from tile 17224. Note that the illumination profile from tile 17224 is larger still than either that from tile 17220 or tile 17222, for the same reasons discussed above. FIG. 17R5B shows a cross section graph of illumination in "suns" along the y axis of the spot of FIG. 17R5A. FIG. 17R5C shows a cross section graph of illumination along the x axis of the spot of FIG. 17R5A.

FIGS. 17R6A-C illustrate the illumination profile that would be created, e.g., by tile 17226 of FIG. 17R2, on a horizontal plane at the general location of focal point 17232. FIG. 17R6A shows isolines of the illumination profile (the spot of light) from tile 17226. Note that tile 17226 is smaller than tile 17224, and has a smaller spot than tile 17224 even though it is in a similar location. This shows how smaller tiles can be used to reduce the "focus errors" out toward the extreme edges of the overall pattern. FIG. 17R6B shows a cross section graph of illumination (in "suns" where 1 "sun" represents 1000 w/m$^2$ of irradiation) along the y axis of the spot of FIG. 17R6A. FIG. 17R6C shows a cross section graph of illumination along the x axis of the spot of FIG. 17R6A.

FIGS. 17R7A-C illustrate the illumination profile that would be created, e.g., by tile 17228 of FIG. 17R2, on a horizontal plane at the general location of focal point 17232. FIG. 17R7A shows isolines of the illumination profile (the spot of light) from tile 17226. Note that tile 17228 is even smaller than tile 17226, and has a resulting spot that is somewhat more "well behaved", but is still relatively spread out because of the location of the tile at the extreme edge of the pattern. The spread effects related to the error of the axisymmetric prism shape approximation (compared to the ideal amorphous continuous groove shapes) can be made arbitrarily small by using arbitrarily small tiles, but the spreading of the light due to the extreme incident angle of the light hitting a horizontal target from the locations near the extreme edge of the optic pattern do not diminish with decreasing tile size. These spread errors would be present even in similar regions in an optic with the ideal continuous grooves.

FIG. 17R7B shows a cross section graph of illumination in "suns" along the y axis of the spot of FIG. 17R7A. FIG. 17R7C shows a cross section graph of illumination along the x axis of the spot of FIG. 17R7A.

FIGS. 17R8A-C show the net illumination profile ("spot") created when illumination profiles due to tiles 17220, 17222, 17224, 17226 and 17228 are combined as they would be in a generally useful system for high concentration. As noted above, only a limited number of tiles are illustrated for ease of explanation. In practice, the entirety of the area of pattern 17218 may be filled with contiguous tiles.

FIG. 17R8A shows isolines of the net illumination profile (the spot of light) from tiles 17220, 17222, 17224, 17226, and 17228. FIG. 17R8B shows a cross section graph of illumination in "suns" along the y axis of the spot of FIG. 17R8A. FIG. 17R8C shows a cross section graph of illumination along the x axis of the spot of FIG. 17R8A.

FIGS. 17T1A-17T1C show an illumination profile ("spot") created by a tubular refractive optic similar to that of FIG. 17R at a similar target location, but with idealized continuous grooves for comparison. The illumination values have been normalized to be comparable to the same primary optic area as in FIG. 17R.

FIG. 17T1A shows isolines of the net illumination profile from a refractive tubular optic with idealized grooves (i.e. grooves that are not constrained to be circular arcs and are not divided into patches) with illumination normalized to the optic of FIG. 17R for ease of comparison. Notice that the scale on the graph is smaller than that of FIG. 17R8A and that the overall spot size is smaller and the peak irradiance value is higher in the center (see also FIGS. 17T1A,B). This is because the idealized grooves create less angular error or spread than the axisymmetric approximation grooves of the large tiles of FIG. 17R. However, if the tiles of axisymmetric grooves similar to those of FIG. 17R are made small enough, the spot of FIGS. 17R8A-C could be made to be substantially similar to the spot of FIG. 17T1A-C.

FIG. 17T1B shows a cross section graph of illumination in "suns" along the y axis of the spot of FIG. 17T1A. FIG. 17T1C shows a cross section graph of illumination along the x axis of the spot of FIG. 17T1A.

FIGS. 17T2A-C show the net illumination profile created when all four quadrants of a completely populated tubular refractive primary optic prism pattern are combined as they might be on a commercial CPV system described herein. These illumination profiles are generated using a prism pattern that is the same total size as in FIGS. 17R and 17T, but with a completely populated surface—i.e. all the available aperture area is covered by the continuous curved ideal prisms. These figures illustrate the very high concentration possible with such a design. In a commercial system, secondary optics may be used to further homogenize or otherwise reshape the illumination profile and eliminate hot spots and/or create improvements to spectral distribution.

FIG. 17T2A shows isolines of an illumination profile created when all four quadrants of a complete tubular refractive primary optic prism pattern are combined. FIG. 17T2B shows a cross section graph of illumination in "suns" along the y axis of the spot of FIG. 17T2A. FIG. 17T2C shows a cross section graph of illumination along the x axis of the spot of FIG. 17T2A.

Figure 18:
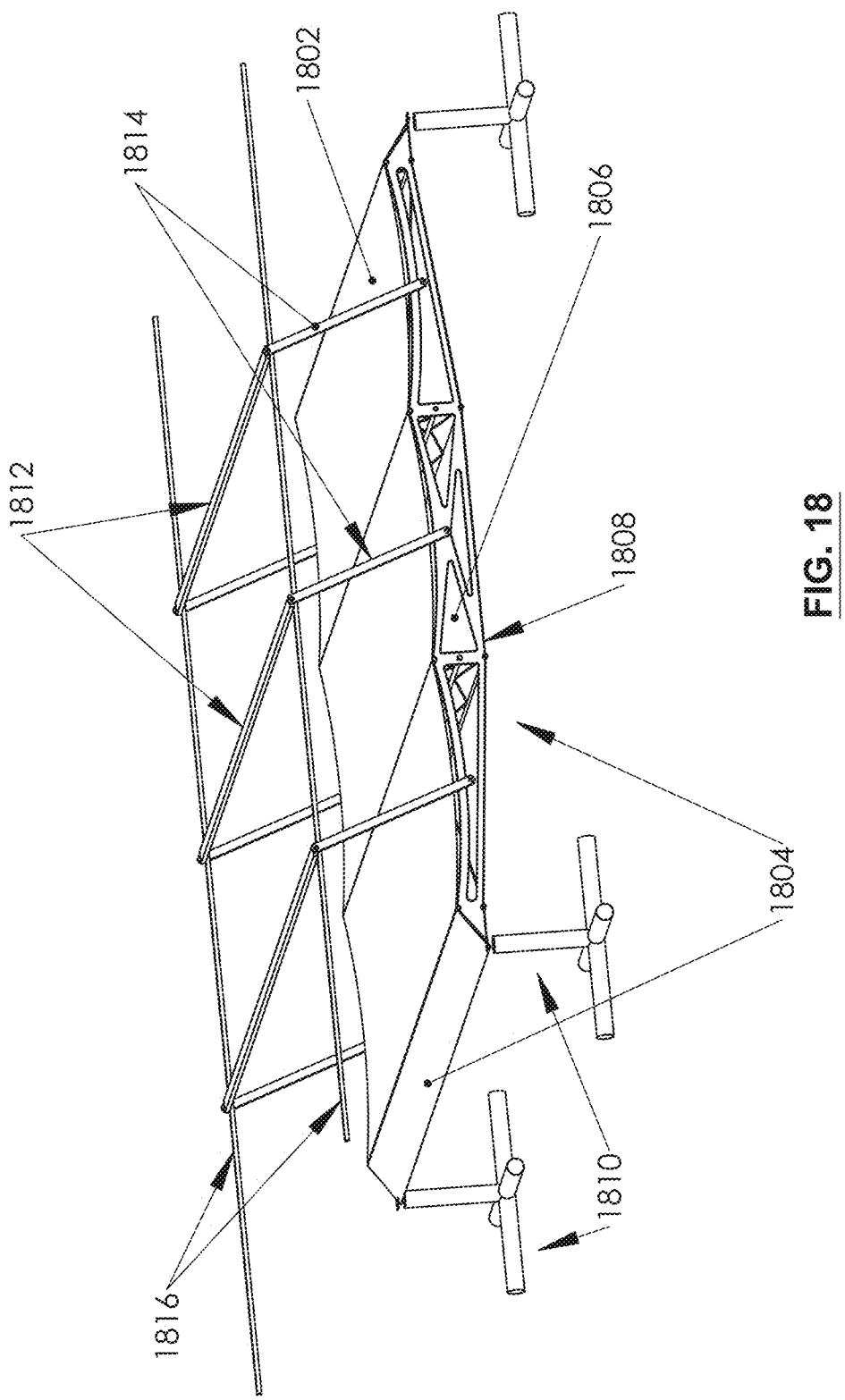
FIG. 18 illustrates a film based solar concentration trough system with a stationary trough array and moveable receivers according to an embodiment of the present invention.
Figure 18A:
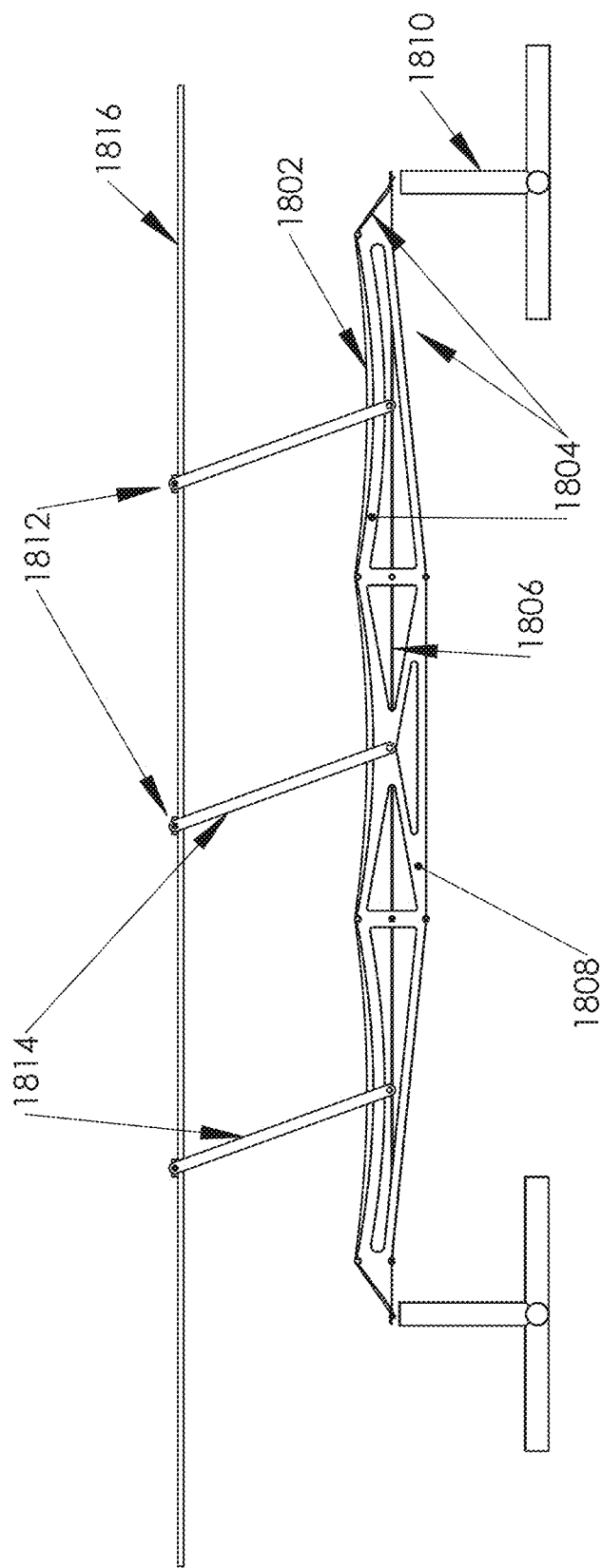
FIG. 18A illustrates a side view of the embodiment of the system of FIG. 18 according to an embodiment of the present invention.

FIG. 18 shows a film based solar concentration trough system with stationary trough array and moveable receivers according to an embodiment of the present invention. FIG. 18A shows a side view of the embodiment of the system of FIG. 18.

In this embodiment, a reflective film 1802 and enclosing material 1804 define a chamber 1806. A negative pressure differential is maintained between chamber 1806 and the surrounding environment. A frame 1808 keeps reflective film 1802 separated from enclosing material 1804. Optional base frame members or legs 1810 may be used to anchor, locate or support the system. Receivers 1812 are supported above reflective film 1802 by support arms 1814. Support arms 1814 rotate to allow receivers 1812 to move. One or more actuation members 1816 are linked to receivers 1812 and cause receivers 1812 and support arms 1814 to move when a force is applied. Other embodiments are possible that use different support for the receivers.

In this particular embodiment, receivers 1812 follow a rotational path but have a fixed orientation. In other words, their active face stays parallel to actuation arms 1816. In alternative embodiments, receivers 1812 may move in a different way. Their orientation may change; they may move in a linear fashion, and/or they may move with according to some other predetermined motion. Film 1802 may be made to change shape by varying the pressure or vacuum in chamber 1806. Aside from this (slight) shape change, the troughs formed by film 1802 may otherwise remain mainly stationary.

As the sun moves over the course of time, rays of sunlight are reflected off of film 1802 at different angles. With a correctly chosen pressure or vacuum in chamber 1806 and the correct movement of receivers 1812, a region of concentrated reflected sunlight from each trough made be made to coincide with its respective receiver for most times of day or year. A system employing moveable receivers may be simpler and less expensive than a system where the troughs move to follow the sun. Generally, this is because the receivers are more compact, offer less wind resistance, and are geometrically easier to be coupled together for actuation.

The embodiment of FIG. 18A employs a negative pressure differential. However, other embodiments having a moveable receiver may employ a positive pressure differential and/or a clear front film. Still other embodiments may not require a pressure differential or enclosed chambers. A reflective film similar to 1802 may be stretched over a frame similar to 1808 to create deterministic reflective shapes.

Figure 19:
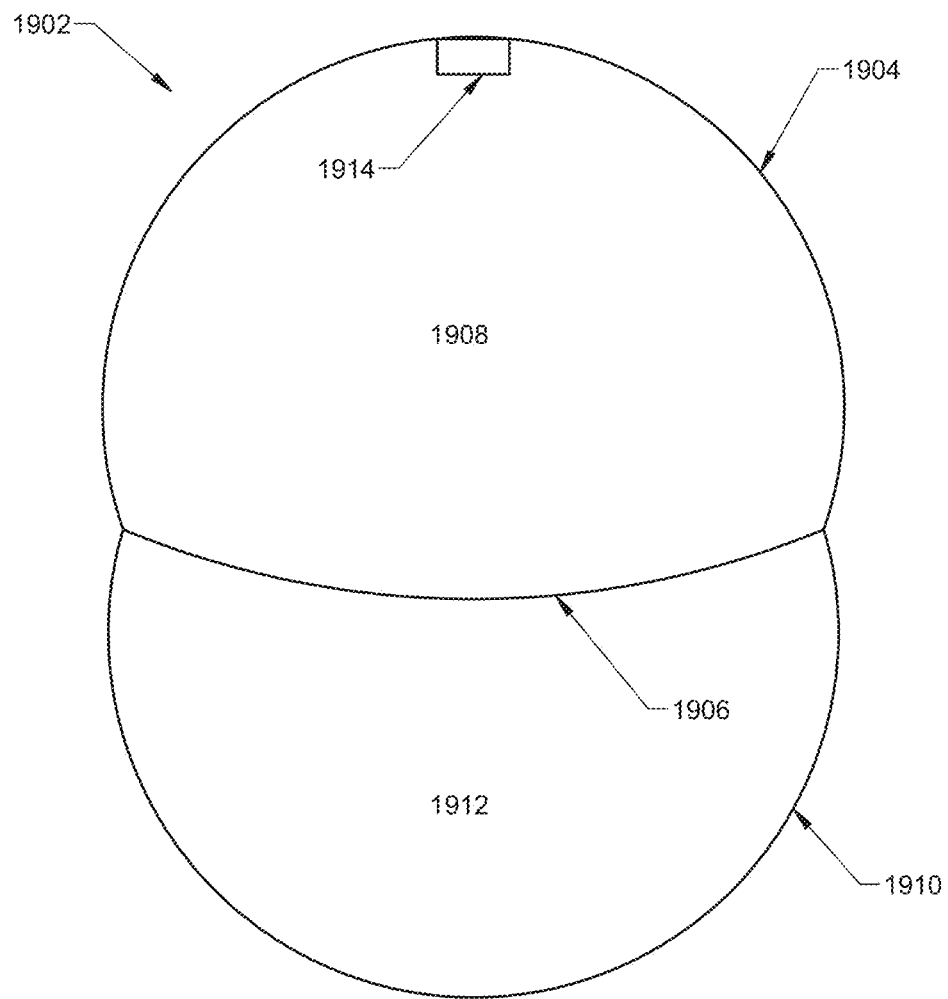
FIG. 19 illustrates a solar concentration trough system that uses inflation air and a membrane to eliminate the need for a rigid frame according to an embodiment of the present invention.

FIG. 19 shows an embodiment of a solar concentration trough system 1902 that uses inflation air and a membrane to eliminate the need for a rigid frame according to an embodiment of the present invention. A clear front film 1904 is connected to a reflective film 1906 to form a first enclosed chamber 1908. A rear enclosing material 1910 is connected to film 1904 or film 1906 to form a second enclosed chamber 1912. Material 1910 may be a ruggedized fabric or film or it may be another material.

Reflective film 1906 takes on an arc shaped cross section under the influence of a pressure differential between chamber 1908 and chamber 1912. Film 1904, film 1906 and enclosing material 1910, may all be used in tension without the need for additional frame members if both chamber 1908 and chamber 1912 include a fluid with a greater pressure than the pressure of the surrounding environment. This condition can be achieved, with the desired arc shape of film 1906 formed, with different positive pressures in chambers 1908 and 1912.

A receiver 1914 can be positioned inside chamber 1908 or it may be positioned outside of chamber 1908. Receiver 1914 may be attached to front film 1904 if desired. Film 1904 may have cutout(s) or may be in multiple parts to allow an inner surface of receiver 1914 to face reflective film 1906 while an outer surface of receiver 1914 is in direct communication with the surrounding environment (not shown). Solar power costs may be reduced by creating such a system that utilized primarily inexpensive films and fabrics rather than expensive rigid frames. System 1902 may articulate to track the sun by rolling directly on the ground, or it may be articulated in some other way.

Figure 19A:
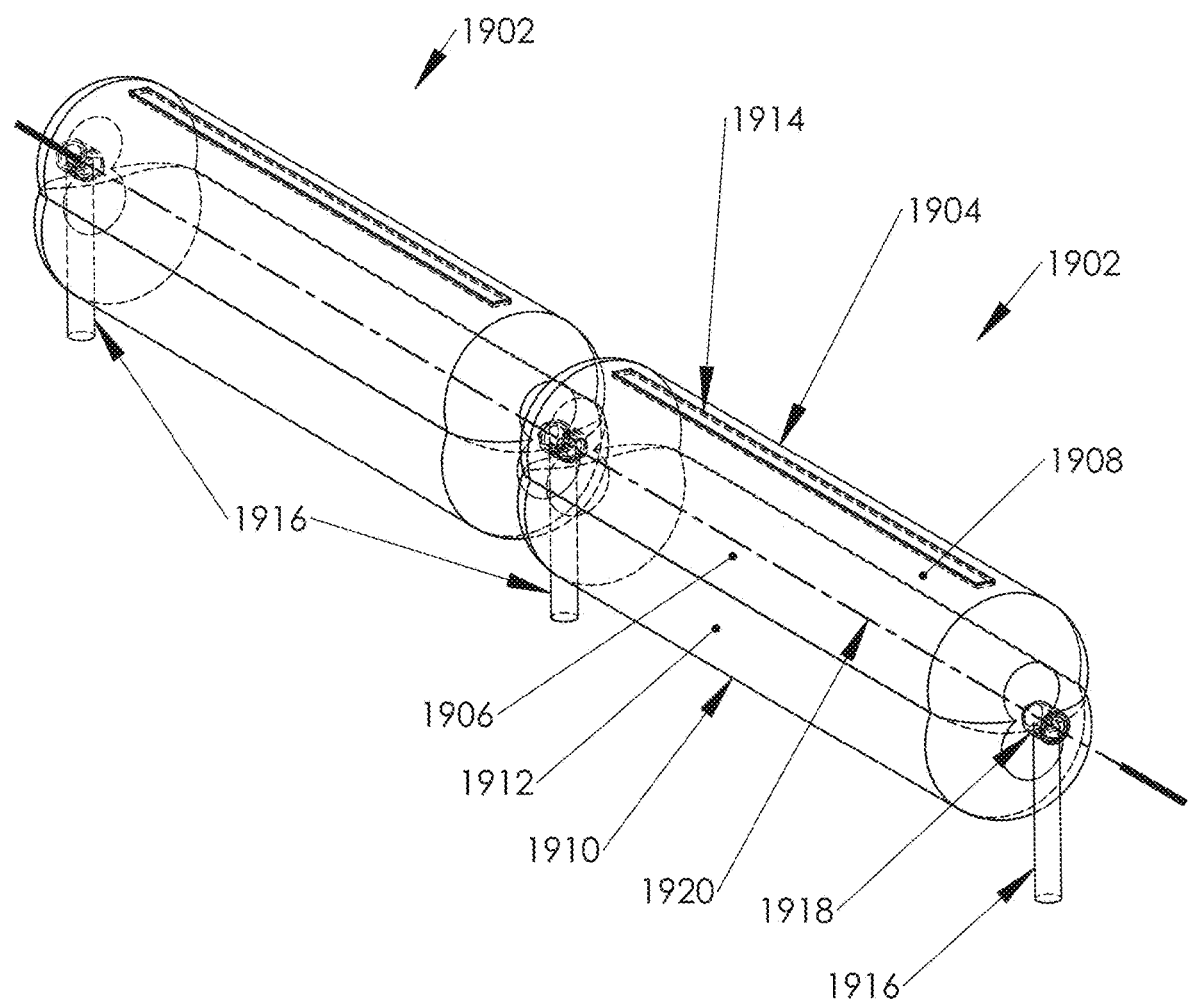
FIG. 19A illustrates multiple systems of FIG. 19 configured to track the sun together according to an embodiment of the present invention.

FIG. 19A shows an isometric view of the system of FIG. 19 with additional components. FIG. 19A shows multiple systems 1902 configured to track the sun together. Systems 1902 are supported by support frames 1916. Systems 1902 may rotate about one or more pivot joints 1918, and may be moved to track the sun by an actuating apparatus such as a motor, hydraulic system, cables, linkage or other actuator (not shown). Pivot joints 1918 may define a tracking axis 1920 about which systems may be rotated to track the sun.

Some embodiments of the present invention may employ shorter or longer trough segments. Long trough segments may be desirable to minimize end effects. Other embodiments may employ multiple troughs per post. Troughs may be disposed next to one another, above/below one another, or in a diagonal arrangement. Troughs may be linked to rotate together about their respective tracking axes.

In still other embodiments, the films and membrane forming the trough segment may be much longer than the effective length of the trough segment, with extra deflated trough stored on a roll system. If the portion of the films in use becomes degraded or damaged, the roll system could advance the films until a fresh section is ready for use.

Figure 20A:
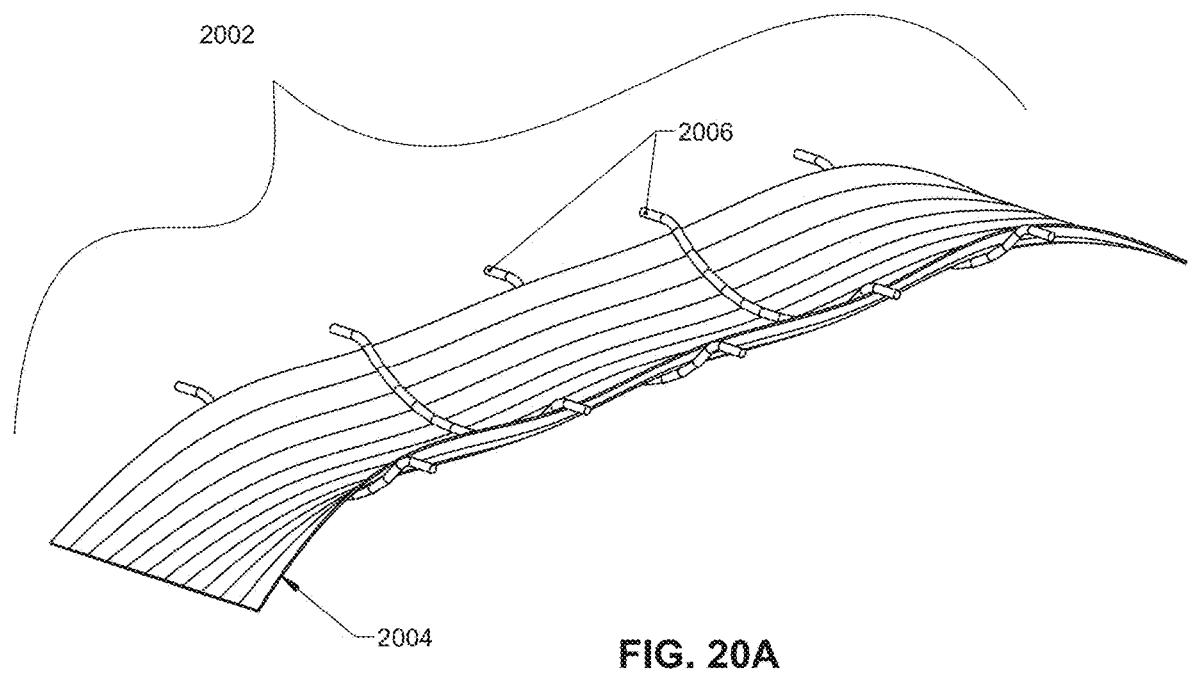
FIGS. 20A and 20B illustrate a solar concentration system that uses a film without inflation pressure according to an embodiment of the present invention.
Figure 20B:
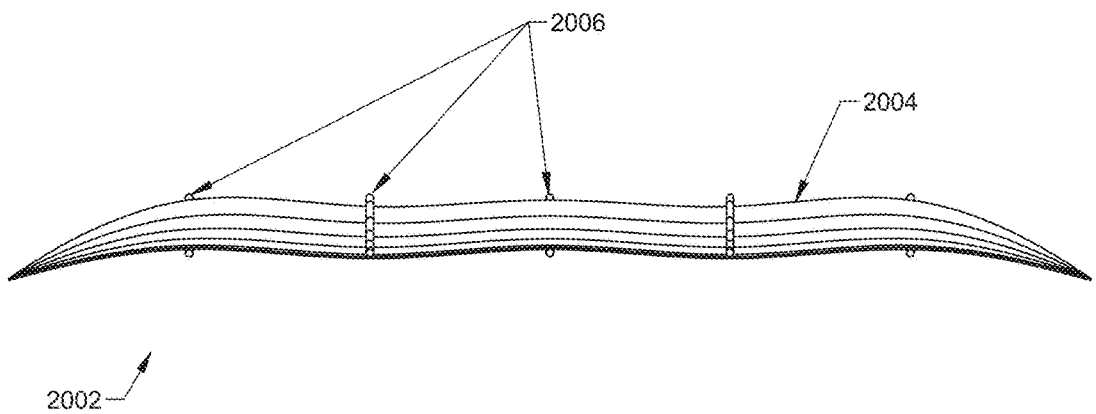

FIGS. 20A and 20B show a solar concentration system 2002 that uses a film without inflation pressure according to an embodiment of the present invention. FIG. 20A shows an isometric view and FIG. 20B shows a cross section view from the front. Receivers are not shown for clarity. Film 2004 is stretched over one or more guide bar(s) 2006. Guide bars 2006 are formed with a shape chosen to create a desired pattern of reflected light. FIG. 20B shows an embodiment in which film 2004 passes alternately over and under bars 2006. This creates transverse force between film 2004 and bars 2006 sufficient to keep film 2004 pressed against bars 2006 so that it takes the shape of bars 2004.

Figure 20C:
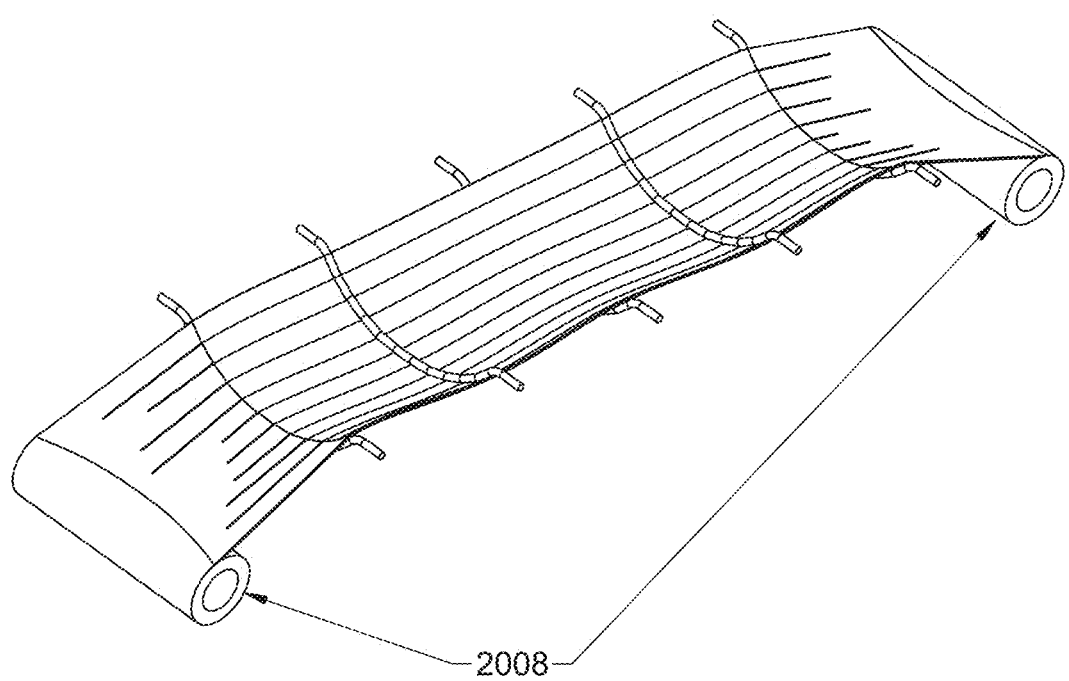
FIG. 20C illustrates a system of FIG. 20A including a roll-to-roll film replacement system according to an embodiment of the present invention.

FIG. 20C shows a solar collection system similar to the system 2002, but with the addition of a roll-to-roll film replacement system 2008. Roll fill replacement system 2008 turns in order to advance or replace the film, for example when the currently exposed film loses some of its reflectivity or other functional properties. Roll film replacement system 2008 may also provide the desired tension on the film. Roll system 2008 may operate manually or automatically or it may be indexed by or otherwise linked to a sun tracking system (not shown).

In another embodiment, film 2004 on roll to roll system 2008 may be stretched over a rigid trough shape (not shown) rather than guide bars. The film may take the shape of the rigid trough because of film tension, and/or a vacuum may be applied through holes in the rigid trough shape to temporarily secure the film to the rigid trough. The vacuum may be released to allow the film to be advanced or replaced.

FIG. 21 shows an alternative embodiment of a solar concentration trough system 2102 that is similar to the system of FIGS. 19 and 19A. System 2102 uses inflation air and a membrane to eliminate the need for a rigid frame. A clear front film 2104 is connected to a reflective film 2106 to form a first enclosed chamber 2108. A rear enclosing material 2110 is connected to film 2104 or film 2106 to form a second enclosed chamber 2112. Material 2110 may be a ruggedized fabric or film or it may be another material.

Reflective film 2106 assumes an arc shaped cross-section under the influence of a pressure differential arising between chamber 2108 and chamber 2112. Film 2104, film 2106, and enclosing material 2110, may all be used in tension without the need for additional frame members if both chamber 2108 and chamber 2112 include a fluid with a greater pressure than a pressure of the surrounding environment. This condition can be achieved (and the desired arc shape of film 2106 formed), utilizing different positive pressures in chambers 2108 and 2112.

A receiver 2114 can be positioned completely inside chamber 2108. Alternatively, the receiver may be positioned completely or partially outside of chamber 2108.

Receiver 2114 may be attached to front film 2104 if desired. Film 2104 may have cutout(s) or may be in multiple parts to allow an inner surface of receiver 2114 to face reflective film 2106, while an outer surface of receiver 2114 is in direct communication with the surrounding environment (not shown). Frame members 2116 support system 2102 via ring 2118 and rollers 2120. The films and chambers can be rotated to track the sun when ring 2118 rolls on rollers 2120. Rollers 2120 may also be driven by an actuator to create tracking motion for the system. Chambers 2108 and 2112 may be sealed at the ends to allow pressure differentials to be maintained. Seals or additional enclosing members are omitted here for clarity. Additional films or material covering the ends could be used for this purpose. Also, multiple systems such as that shown in FIG. 21 may be joined end-to-end and may be actuated together. In this instance, enclosing material between each of the intermediate systems may not be needed.

FIG. 9A shows an isometric view of another embodiment of a film-based solar collector trough structure 902. FIG. 9B shows a top view of the solar collector trough of FIG. 9A. FIG. 9C shows a side view of the solar collector trough of FIG. 9A. FIG. 9D shows a close-up detail view of a region circled in FIG. 9B. FIG. 9E shows a close-up detail view of a region circled in FIG. 9C.

Trough array 902 has multiple trough segments 904. Communication of inflation fluid between each segment 904 may be accomplished via transverse chambers 906 on each end, which connect to each trough segment 904. This geometry may reduce the length of the deformed or unusable portion of inflated trough segments. Seams 908 divide the trough segments. Seams may be made by joining the front and rear films together. This may be accomplished via a number of possible methods, including but not limited to heat sealing, RF welding, sonic welding, adhesives, mechanical attachment, and/or other methods.

Figure 15A:
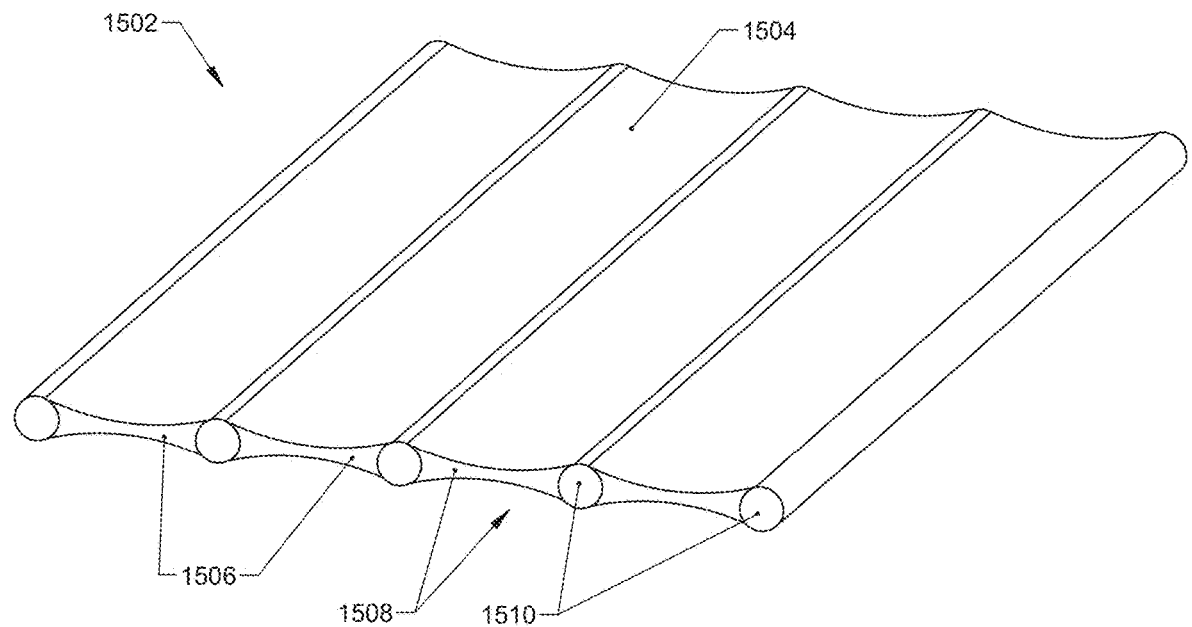
FIG. 15A illustrates an isometric view of an embodiment of a film-based solar collector trough according to an embodiment of the present invention.
Figure 15B:
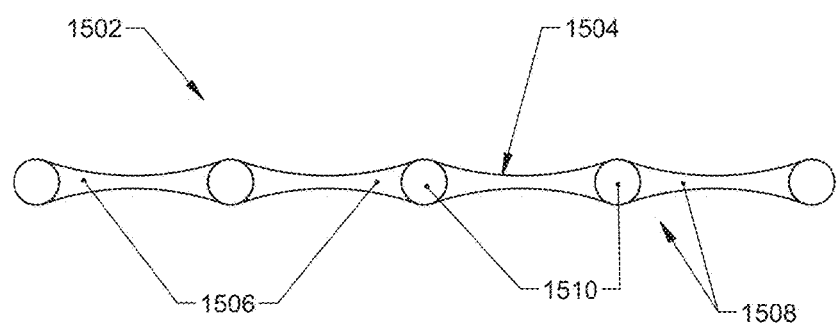
FIG. 15B illustrates an end view of the structure of FIG. 15A according to an embodiment of the present invention.

FIG. 15A shows a simplified isometric view of another embodiment 1502 of a film-based solar collector trough structure. FIG. 15B shows a simplified end view of the structure of FIG. 15A.

This system has a reflective film 1504 which faces outward. Chambers 1506 behind reflective film 1504 may contain a negative pressure differential (for example a partial vacuum) to the surrounding environment. A containing material 1508 prevents fluid leakage along the back and sides of chambers 1506. Reflective film 1504 is held apart from containing material 1508 by a second set of chambers 1510, which contain a positive pressure differential to the surrounding environment. The pressure in chambers 1510 creates outward force resisting inward forces created by the negative pressure differential in chambers 1506.

The embodiment of a system shown in FIGS. 15A-B can potentially avoid the need for, or reduce the number and/or mass of, rigid frame members. This could in turn reduce the mass and/or cost of the system as a whole.

FIGS. 22A-22D illustrate different secondary optic possibilities for use with a receiver similar to that of FIG. 5 according to an embodiment of the present invention.

Figure 22A:
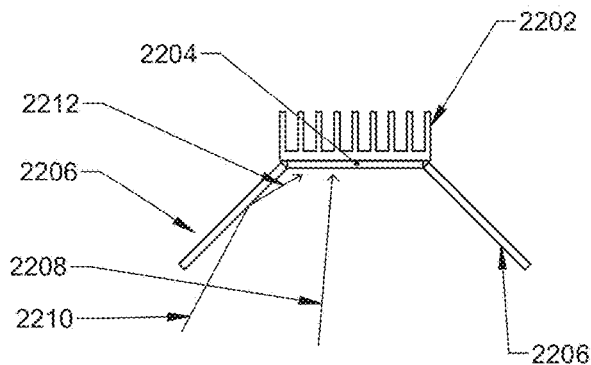
FIGS. 22A-22D illustrate different secondary optics for use with a receiver according to an embodiment of the present invention according to an embodiment of the present invention.

FIG. 22A illustrates a receiver system with straight reflective secondary optic components according to an embodiment of the present invention. A heat sink 2202 is attached to a solar cell 2204. Reflective elements 2206 are positioned on either side of cell 2204. An incoming ray of sunlight 2208 is shown striking cell 2204 directly. Another incoming ray 2210 is shown striking reflective element 2206 and creating reflected ray 2212. Reflected ray 2212 hits cell 2204. Thus, reflective element 2206 helps capture ray 2210 and direct it towards cell 2204. Without reflective element 2206, ray 2210 would have missed cell 2204. Reflective elements 2206 may be silvered glass mirrors, coated aluminum mirrors, other polished metal, metalized film, multi-layer reflective polymers or other reflective material.

Figure 22B:
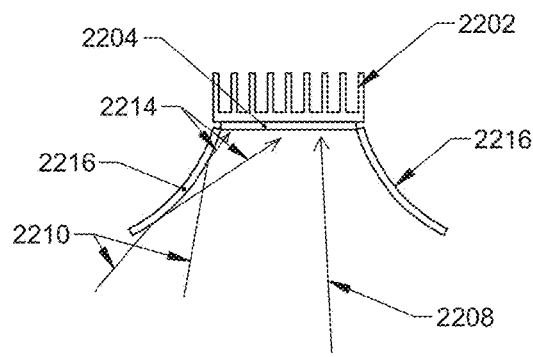

FIG. 22B illustrates a receiver system with curved reflective secondary optic components according to another embodiment of the present invention. A heat sink 2202 is attached to a solar cell 2204. Curved reflective elements 2216 are positioned on either side of cell 2204. An incoming ray of sunlight 2208 is shown striking cell 2204 directly. Other incoming rays 2210 are shown striking reflective element 2216 and creating reflected rays 2214. Reflected rays 2214 hit cell 2204. Without reflective element 2216 rays 2210 would have missed cell 2204. Reflective elements 2216 help capture these rays 2210 to increase the amount of usable sunlight thus increasing the efficiency of the receiver system. In some embodiments, reflective elements 2216 may have an arc shape or other shape. In some embodiments, reflective elements 2216 may be shaped so that reflected rays 2214 generated by typical incoming rays 2210 will be distributed over the width of cell 2204. In other embodiments, reflective elements 2216 may be designed to create another predetermined distribution of light on cell 2204. Reflective elements 2216 may include silvered glass mirrors, coated aluminum mirrors, other polished metal, metalized film, multi-layer reflective polymers or other reflective material.

Figure 22C:
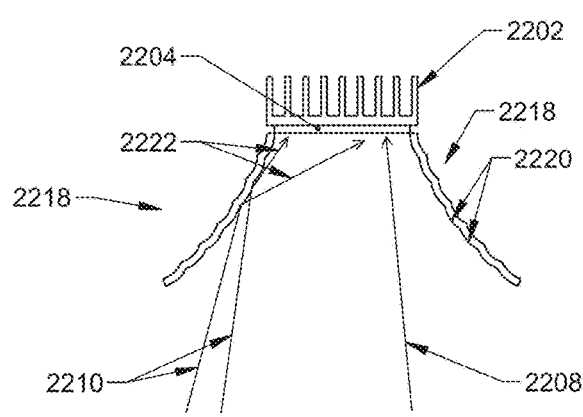

FIG. 22C illustrates a receiver system with multi-segmented shaped reflective secondary optic components according to yet another embodiment of the present invention. A heat sink 2202 is attached to a solar cell 2204. Multi-segmented shaped reflective elements 2218 are positioned on either side of cell 2204. Each reflective element 2218 can have multiple shape segments 2220. An incoming ray of sunlight 2208 is shown striking cell 2204 directly. Other incoming rays 2210 are shown striking different positions on one segment 2220 of an reflective element 2218 and creating reflected rays 2222. Reflected rays 2222 hit cell 2204. Without reflective element 2218, rays 2210 would have missed cell 2204. Reflective elements 2218 may be shaped so that reflected rays 2222 reaching each segment 2220 will be distributed over the width of cell 2204, so that hotspots may be avoided. In some embodiments, segments 2220 may be designed to create another predetermined distribution of light on cell 2204. Reflective elements 2218 may be silvered glass mirrors, coated aluminum mirrors, other polished metal, metalized film, multi-layer reflective polymers or other reflective material.

Figure 22D:
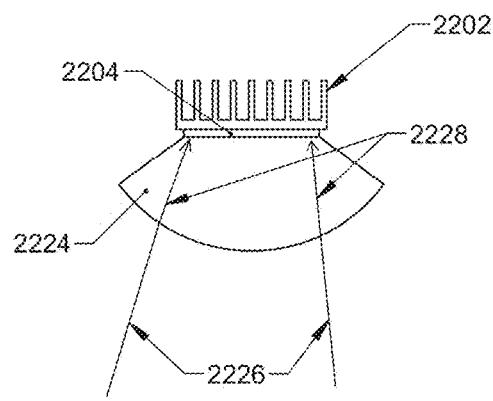

FIG. 22D illustrates a receiver system with a transparent refractive secondary optic component according to still another embodiment of the present invention. A heat sink 2202 is attached to a solar cell 2204. A refractive secondary optic 2224 is positioned so that it is in optical communication with cell 2204. Incoming rays 2226 are refracted as they pass into optic 2224 to create refracted rays 2228 which may have a different direction than rays 2226. Optic 2224 may be designed to redirect rays that would have normally missed cell 2204 so that they strike cell 2204. FIG. 22D illustrates one embodiment of a secondary optic with a particular shape. One skilled in the art will realize that many other optic shapes are possible to create a wide variety of light distributions on the cell or to direct light away from in-active areas of the cell.

Certain embodiments of the present invention provide tubular or cylindrical solar concentrators. These tubular/cylindrical solar concentrators may be either 1-dimensional or 2-dimensional.

There are existing techniques for creating a line focus by refraction of light through a cylindrical surface. However, there are fundamental limits to the concentration factor that can be achieved with one-axis concentration while maintaining high net optical efficiency. There are economic benefits and other advantages of operating at higher concentrations, which are only possible by concentrating in two axes. A line focus is created by concentrating the light in the transverse axis of the cylindrical primary; it is possible to also concentrate in the longitudinal axis of the tube. By adding this second axis, a string or array of point-like-focuses can be generated that can achieve very high concentrations.

2D concentration for Concentrating Photovoltaic (CPV) systems with refractive elements may be typically accomplished using flat Fresnel lenses or aspherical solid lenses. However with the embodiments described herein it is also possible to concentrate light in 2 axes using an optic with an overall cylindrical shape, such as a tube. Some embodiments of the present invention provide inflated thin film tubes, but the methods and geometries described herein are equally applicable with non-inflated and/or thicker cylindrical optics.

1D or line focus on a cylindrical Fresnel optic is accomplished with prisms parallel to the axis of the cylinder which are usually continuous. The normals to the prism surfaces are all normal to the cylinder axis (though they will not in general intersect with the Cylinder axis). 2D concentration usually involves the primary optic creating a point focus. When the primary optic for 2D concentration is a refractive element, it may be a flat Fresnel lens with concentric circular prisms or grooves.

Accomplishing 2D concentration with a tubular primary optic is non-trivial if losses are to be kept to a minimum. One of the requirements to achieve 2D concentration is that the surface normals of some locations on the prisms be not normal to the axis of the cylinder. To achieve a high level of concentration in the additional axis, e.g., the direction along the cylinder, requires that the surface normals of the prisms change in a prescribed way across the cylinder's active optical surface(s) so that light is refracted through different locations on the cylinder to arrive at a similar point in space where concentration is desired. There are several possible approaches to do this.

One approach is to use discrete prisms with planar surfaces as shown in FIG. 17G. In this approach, each prism has normal vectors chosen such that the light passing through each prism refracts in a different, specific direction so that it reaches a common target or region. A challenge with this approach is that discrete prisms have end faces that are almost certain to either block or misdirect light that passes through them, unlike an optic with prism faces formed as continuous grooves which by definition have no end faces.

One approach uses non circular prisms designed such that the angle of the active face of the prism (and potentially draft angle) and the prism width and depth varies along the prism. This approach is shown in FIGS. 17J1 and 17J2. In some embodiments, the angle of the draft (non-active) face may also vary along the prism. In some embodiments, prism angles vary from one groove or prism to the next, but depth may be constant. The overall trend of the groove paths may resemble a thumbprint when the cylinder is flattened out. The specific curved paths that the grooves must follow depend on the location and nature of the region of concentration and whether it is to be a point focus, a region of focus or a specific shaped region of concentrated light. If a point focus is desired, the slopes of the prism faces that lie on the cylinder are deterministic and can be represented by a set of equations or closed-form solution. Other distributions and shapes of concentrated light may be represented as variations of this solution or specific deviations from this solution. In some embodiments, the complex optimization problem of creating perfectly matched primary optic prism design plus secondary optic location and design to minimize optical losses for given tracking errors and other design tolerances may be accomplished through automated iterative optimization routines. In this embodiment, most of the prism draft faces generally lie in optical "shadow" regions, meaning that light refracting through the smooth front surface of the film almost always reaches the active prism faces on the back (inside surface) of the film and almost never passes through the draft faces of the prisms. This approach minimizes losses from misdirection of light. The degree to which this is true depends upon the specific draft angles required in the embossing process. No light passes through any draft faces if the draft angle is zero (i.e. draft faces are perpendicular to the nominal film surface when the film is flat) if the refractive index of the cylinder medium is greater than that of the medium that the incident rays were travelling in (e.g. air) This is because rays travelling in air that are refracted by a material with higher refractive index will always have a refraction angle that is less than the angle between the refracting surface and the plane normal to the initial ray direction. The draft angles for typical flat Fresnel lenses must generally be non-zero due to manufacturing concerns and result in real optical losses for almost all cases of practical flat Fresnel designs. In contrast, cylindrical Fresnel optics made from films may have lower losses. This is because draft angles that are positive when the film is flat can become zero or even negative when wrapped to form a cylinder, thereby avoiding some or all of the losses that would have been incurred in the flat case. In this way, cylindrical Fresnel optics can generally be made to have lower losses than flat Fresnel optics. For the case of 2D concentration, prism paths and optic and draft faces must be designed according to certain constraints to maintain minimal losses.

In some embodiments, the Fresnel groove paths may be made as continuous circular arcs wrapped onto the cylindrical surface. If the prism angles were kept constant on these circular arc grooves, then the refracted light would not form a tight region of focus and the results would generally not be useful for HCPV. To correct this problem, the prism angle would need to change along the groove path. Even with a changing prism angle along the path, for any point on the primary there is a finite band of angles through which the refracted light could be directed. If we assume that the cylindrical optic is correctly pointed at the sun, the direction any ray refracted through the smooth front surface of the optic lies in a plane perpendicular to the cylinder axis (+/− a portion of sun's angular subtense). Then after refraction through a prism on the inside of the optic surface whose normal must nearly be perpendicular to the groove path, the resulting ray's direction will have been changed in two angular directions relative to the orientation of the principal axes, but the range of resulting angles will be limited to a narrow band governed by the plane of the ray directions after the front surface refraction and the plane of possible prism surface normals. This narrow band of possible resultant ray directions will be different for every point on the primary and importantly, each band for each point on the primary will not generally intersect at a consistent location in space. Continuous circular arc prism paths with constant prism angles would therefore present a significant limitation to the degree of concentration, shape of the region of concentration and distribution of light that could be achieved within the region of concentration. Put another way, another degree of freedom in the design may be needed if the optical design is to achieve a common spatial point of intersection of all the rays (or even a narrow region within which a majority of the resultant rays pass). One way to attain the needed additional degree of freedom is to use paths that are not circular arcs. Another way is to use non-continuous prisms, for example prism paths could be arcs that are kept very short so as to approximate the ideal, non-circular arc path to within a chosen error limit. In order to employ the latter approach effectively, it is helpful to first understand both a method for finding the ideal non-circular arc prism paths and also the additional design variables.

Prism depth and width may be chosen based on several factors and constraints. The width and depth of the prisms will often be linked because when the depth and angle are specified, the width is determined. The optical performance is determined in part by the prism angle (prism width and spacing if too small will generally have a detrimental effect on focus due to diffraction phenomena). Prism depths may be constrained by manufacturing and cost concerns. For example, in the case of embossed film refractive optics, economics are optimized by using small prism depths because less material is required, but some embossing processes may require a minimum feature size. Also losses due to tool radii and diffractive effects may impose limits on how small the prism spacing and widths can be and therefore also on the depths.

In some embodiments, it may be possible to vary the prism depth from prism to prism. Alternatively, for manufacturing reasons or other reasons, it may be desirable to design the pattern of prisms so that the groove valleys are all at the same depth. Alternatively, prism peaks may be designed to be all at the same height. Alternatively, the mid-plane of each prism may be designed to be at a constant depth. The latter can enable optimal embossing performance by providing equal volumes of material displaced from the troughs on one side of the mid plane and filled into the peaks on the other side of the mid plane. In this way resin displaced from valleys exactly equals that which flows to form the peaks.

To design continuous facet grooves on a cylindrical surface that redirect incident light into a point focus, the following methodology may be used. For a point on the cylinder, it is straightforward to calculate the direction of the ray refracted through the exterior surface. From there it is possible to calculate the interior surface normal that will refract that ray to its desired target. This gives every point on the cylinder a unique surface normal. The goal of the Fresnel design is to create a pattern of grooves that match these ideal surface normals. There are two planes of symmetry. One is orthogonal to the cylinder axis and intersects the point focus. The second splits the cylinder into two equal halves. These two planes split the cylinder surface into quadrants; only one of them needs to be solved in order to obtain the others from the symmetry conditions.

At sufficiently high resolution, an irregular 3D mesh of triangular elements can be used to accurately describe the Fresnel pattern. Four triangular elements are grouped into a segment; a chain of segments describes a groove, and the set of grooves describes the Fresnel. Each segment may include up to four triangular elements, with two vertices along the "peak." Each trapezoidal element may be on a plane and has two vertices along the "peak" and two along the "valley" of its groove. A groove is described by a series of trapezoidal elements joined end-to-end.

Some optical systems described herein include a large primary optic with specific discrete zones that concentrate light to a particular point or small area. Light from each zone of the primary is further concentrated by secondary optics that in turn illuminates the PV cells. Variations for the optical systems may include: (1) A single primary zone, a single secondary optic, and a single cell, (2) Multiple primary zones, multiple secondary optics, each coupled to individual cells in a cell array (3) Multiple primary zones, and a compound secondary optic that overlays the power from the individual primary zones onto the same cell. In some embodiments, secondary optics can be: internally-reflecting reflective optics, truncated cone or pyramid, or with curved surfaces. In other embodiments, the secondary optics can be pyramidal, conical, or compound parabolic concentrator (CPC) and made of glass or plastic. Secondary optics may have planar entrance faces, or have spherical or aspherical curved entrance faces. In some embodiments, they may be Kohler-type concentrators for optimal irradiance uniformity from multiple primary zones illuminating a single cell.

The above-mentioned design maximizes system efficiency and therefore power output by minimizing losses in and between components. The design also avoids excessive non-uniformity of cell irradiance.

In some embodiments, a cylindrical primary concentrator of a given diameter with a specified spacing between the primary and the cell plane can be created. Optionally, the lateral location of the cells of a given size, and a specified length/area for the primary zone(s) such that the desired concentration factor and hence total power on each cell can be achieved. Then iteratively, the parameters that define the different components and their geometry can be adjusted to achieve maximum power output. The rays that are traced fully sample the entrance aperture of the relevant concentrator primary zone or zones, and include the extremes in incident wavelength that the cell can convert into usable power, as well as the extremes in incident angle expected given the finite angular subtense of the sun and the expected range in angular errors due to combined tracking errors and fabrication and assembly alignment tolerances.

Once the optical design is completed, an embossing pattern that is a close approximation to the design surface and can be fabricated onto the primary concentrator using available techniques. Material usage considerations and, in some instances, embossing techniques employed might tend toward smaller embossing depths, perhaps as small as several microns. In certain embodiments, depths may be as small as 0.1 to 10 microns. However, smaller depths correlate with tighter groove spacing, which increases the angular extent of diffraction from the periodic structure of the embossed film, to the extent that the as-fabricated embossed film disperses light into the different diffraction orders. Consequently, depending on the fabrication quality, the embossing depth may need to be held in a range such that the minimum groove spacing is at least some tens of microns.

Many advantages may be realized using the embodiments described herein. One of the great benefits of cylindrical refractive optics is that they can be made in long lengths, which minimizes various significant costs related to end effects. This also takes advantage of lowest-cost continuous manufacturing processes (which tend to produce linear features) in several areas of the design to create additional cost savings. Examples of manufacturing processes include continuous embossing, extrusion, roll forming, web based operations, Heat sealing, impulse welding, sonic welding, RF welding, adhesive application and other film converting applications.

If 2D concentration is accomplished with cylindrical refractive optics of long length, it may be desirable to have the primary optic divided into regions, each of which directs light to a separate focus region, secondary optic and/or solar cell. For example, if the desired optical concentration at the cell is 1000× nominal sunlight irradiance, and each cell is 1 cm$^2$, and the whole cylindrical primary optic has an area of 5 m$^2$ (=50,000 cm$^2$), and the net optical efficiency including primary, secondary, and any other optical losses is 88%, then the primary would need to be divided into 44 regions, each of which would direct light to a different cell. In some embodiments, it would also be possible to arrange prisms in a given region to direct light to multiple cells or multiple focus regions. In some embodiments, the mapping may include dividing the primary into separate areas with division lines or planes perpendicular to the cylinder axis at equally spaced intervals along the length of the cylinder. In this scheme, cells may be spaced at even intervals along the length of the concentrator assembly. Primary divisions and/or cells may of course also be at un-even intervals if desired.

In another embodiment, the primary to cell mapping and corresponding primary division can be accomplished as follows. In this embodiment, cells are arranged in pairs at even intervals along the length of the concentrator assembly. This may be desirable, for example, if the acceptance angle of cells or secondary optics is too limited to accommodate the range of ray angles from the full film breadth (direction transverse to tube axis) without incurring losses. In this case, the primary is divided into corresponding pairs of regions along its length and the light entering each individual primary region is directed toward the corresponding cell.

In yet another embodiment, the cells are offset from the centerline of the receiver and staggered from one side of the centerline to the other along the length of the concentrator. Corresponding areas of primary optic are also staggered along the length of optic. This arrangement may be advantageous because it preserves the narrower angular range of rays of the paired arrangement of one of the previously described embodiments, but puts the cells farther apart which can enable better heat spreading into heat sink and therefore lower cell temperatures.

In a particular embodiment, cells are spaced in a similar staggered fashion as described above, and the lower cell temperature and small angular range of rays are preserved. In this embodiment, a primary is divided into pairs of regions where each pair has a common transverse boundary. Each primary region must be designed to refract light in a manner such that a region of focus is created which is offset away from the center of the patch. Each cell and/or secondary is arranged to be optimally positioned with respect to the region of focus. The benefit created by this arrangement is that there is no in-active area of the primary optic at the ends of each assembly. This is important because a significant fraction of the cost of any CPV system is driven by the area of the primary, so best performance is attained with the highest possible fraction of that area actively able to illuminate a receiver.

There are many other possible ways to divide cylindrical refractive primary optics and to map sections of the primary to cells or secondary optics. For example, as shown in the figures, a primary may be divided into sets of 3 regions evenly spaced along the length of the primary. The primary may also be divided into groups of regions of 4, 5 or any other number spaced along the primary. Individual regions of prisms on the primary may be aligned, or they may be staggered. Regions on the primary may also be designed to direct light to more than one cell or to distribute light which may mitigate potential detrimental effects of partial shading of the primary.

A prism structure for 2D concentration by prisms on a cylindrical surface may be approximated by a different pattern in some cases for ease of manufacturing. FIGS. 17K1 and 17K2 show one such approximation pattern. The "thumbprint" paths of the grooves in the ideal case may be continuous and have continuous first and second derivatives. As such, a given curved path may be approximated with predictable errors by a circular arc or a straight line or any other path which is easier to manufacture as shown in FIGS. 17K1 and 17K2. For example, grooves may be cut into tooling plates with a lathe, which is most capable of cutting circular arcs with best surface finish. The ideal case "thumbprint" non-axisymmetric pattern may be arbitrarily divided into regions of any size or shape and circular arcs substituted within each region in the place of the more difficult to manufacture "thumbprint" curved grooves. The curvature of each arc segment may be chosen to match the curvature of the "thumbprint" groove it is replacing at any desired point on the curve being replaced—often the midpoint. Or the average curvature of the "thumbprint" grooves may be taken in the patch region and the curvature of the substituted arcs may vary based on distance from the middle point of the region. The center point of the substituted arcs may be chosen to minimize the differences in curvature of the arcs from the original groove paths over the patch area. Other schemes for choosing arc parameters are also possible, for example averages of curvature might be weighted, etc.

In a similar way, active prism angles for the grooves that follow the new circular arc path approximations may be chosen such that they match the prism angle of the ideal case at a specified point. At other locations along the groove path, the prism angles and the path itself may not match the ideal design, but will be close enough to small errors in the refracted light. Angles of each approximated prism may be chosen to match the angle of the specific ideal prism they are approximating, or one prism in a patch may be designed with the others varying from that in a prescribed manner. Using this approximation technique, it is possible to design tooling that can be manufactured using typical machine tools in the optics industry. This tooling may be used to emboss a set of grooves into the surface of a film which when used as prisms to refract light with the film in the form of a cylinder (inflated for example), will concentrate light in two directions or dimensions so that concentrations of 50 to over 1000 times are possible. Some embodiments may concentrate light in two directions or dimension to concentrations of greater than 1000 times. According to some embodiments, the tools may be used to form the grooves by techniques other than embossing.

Under some circumstances it may be desirable to use straight line groove paths as approximations rather than arcs. In this case, the curvature is zero, and while the prism angles may still be matched similarly closely, either the resulting errors in refracted light direction will be larger for a patch of a given size, or patches may be made arbitrarily smaller to achieve a given desired maximum error in the direction of the refracted light.

In some embodiments, light arriving at the entry aperture of the secondary may be specifically guided by the primary to arrive at different locations on the secondary depending on where it is coming from. This would create a region of concentrated light rather than a point focus. The potential benefit is that greater optical efficiency may be possible if the secondary is able to direct light arriving at different angles from different distances in more specific ways.

The accompanying figures illustrate some methods for manufacturing the solar concentrator. In one embodiment, a film attachment system shows elements that attach a straight edge of a film to a straight edge of a receiver. A film is attached to a retaining element via a bond. The bond may be a heat seal, RF weld, adhesive, tape or other joining element. The Film may also wrap around the retaining element to increase either the area of bond or friction between the film and the retaining element or both. The retaining bracket has a channel into which the film and the retaining element fit. The Channel has a narrow area through which the film can pass. When a force is applied to a free are of the film, forces are in turn applied by the film to the retaining element which ensure that the element maintains an orientation in which it will stay seated in the channel without becoming disengaged. In this way, the film can be removably attached to the bracket.

An optic may be made of custom plastic film and inflated to shape. Using air and thin plastic film may reduce the cost of both the primary optic and balance of system (BOS) tracking structures. Embodiments of a Concentrated Photovoltaic (CPV) system concentrate sunlight using inflation air as a structural element, reducing expensive materials and improving system efficiency. Embodiments focus on the integration of low-cost inflated CPV optics and a tracking structure coupled with high efficiency multi junction (MJ) cells.

Embodiments thus leverage a baseline low-concentration design, and address hardware upgrades to achieve an overall module efficiency of 30% for greater energy yield, while maintaining a low system cost. An objective is to integrate the high efficiency photovoltaics into a baseline tubular concentrator and system architecture, while maintaining low costs similar to the low concentration (1D) baseline system. After taking baseline tracking and system efficiency measurements, a prototype two-dimensional (2D) concentrating sub-scale refractive optic may be created. A full-scale, 2D primary optic film may be designed adaptable to high volume, low cost roll-to-roll volume manufacturing.

A tracking system may mate to the tubular inflated concentrator balloons incorporating the new 2D concentrating optic film. Receiver components may be built and qualified through baseline IEC testing. When the primary film and secondary optics assembly are finalized, laboratory testing may commence to qualify the primary and secondary optic components. Finally, the receivers, secondaries, and 2D inflated concentrators can be assembled onto the structure. The final, integrated system may achieve the overall project objective of 30% optical system efficiency, and accelerate the development of high efficiency PV technology while maintaining a low cost structure, and meet a LCOE target when manufactured in high volumes.

Certain specific system areas may either lead to cost and performance, or may be targeted for upgrading. The frame and tracking system may create cost advantages and will have incremental design refinements as part of the integration work. The receiver may be upgraded to a multi junction (MJ) cell and secondary optic assembly from LCPV Si. The MJ receiver technology may be similar to some conventional HCPV systems. The inflated primary optic design may offer certain benefits. For example, this approach may maintaining low system cost while moving from 1D to 2D.

The tubular inflated refractive optic may be commercially manufactured and produces approximately 89% specular transmission. This particular embodiment of an optic is made of relatively thick (0.012-in.) acrylic, and it concentrates only in one dimension. This may affect its economic feasibility for use with expensive, 3J cells. Accordingly, some embodiments may use inexpensive PET as the basis of its optical materials, and may replace the film several times over the system lifetime. There are at least four reasons for using PET materials. First, PET film has the highest modulus to price ratio of all commodity polymers. Second, its microcrystalline nature makes it tough: it is able to withstand IEC hail testing with as little as 0.002-in. thick films, where acrylics need at least 15× that thickness. Third, PET films are amongst the most dimensionally stable polymers known. The modulus and crystalline nature of PET make it one of the most heat and creep resistant commodity polymers. The creep is within tolerable limits for a 2D concentrating optic. The coefficient of thermal expansion is low at approximately 17 ppm or close to that of Aluminum or at least a factor of 4 lower than any other commodity polymer film material making its overall dimensional stability very good. The water absorption and swell are unusually low, about half of acrylics. Fourth, PET has good heat resistance within typical atmospheric conditions, even in the hottest regions of the world. Hence, PET offers an inexpensive weatherizable and dimensionally stable material. Fifth, the energy to break for PET is well over an order of magnitude higher than any other commodity polymer (with the possible exception of ionomer), thus resulting in hail resistance that is orders of magnitude better than acrylics.

PET may offer challenges in that its index of refraction may makes for higher reflection losses, and it is subject to some level of hydrolysis and photolysis. However, the hydrolysis issue is largely historical, due to older manufacturing methods and formulations. Modern materials made for PV backsheets in one-sun applications are less susceptible to this phenomenon. If films are replaced at regular intervals and deployed in dry climates, this should not be a problem. Photolysis is a more stringent issue, but may be subverted to the point that systems can operate effectively. It is also known that the result of PET photolysis is a drop in elongation to break and yellowing of the material with exposure to UV.

The designs according to certain embodiments may also be migrating from a 1D concentrating embossing pattern, to a 2D embossed concentration pattern on its primary optic films, as is discussed below. Such high precision, 2D refractive optics can not only be mapped to a tube, but may seamlessly integrate industry standard film processing practices to allow the manufacture of this optic film at scale.

Embodiments of the present invention may offer a baseline, reliable receiver for integration into the system. A conservative approach to MJ receiver fabrication utilizes commercial triple junction (3J) cell packages. Such cell packages already qualified for use in HCPV, are available from several manufacturers. Embodiments may utilize a typical adhesive to the heat sink, and a custom-shaped glass secondary optically coupled to the cell via silicone. One success factor is that the cell package pass the standard IEC testing while configured for the system.

An embodiment of an integrated system may be produced that achieves greater than 30% overall conversion efficiency, pre-inverter. An embodiment of the system may be based on refractive, inflated tube technology mounted on a ground contact tracker with an in-house Supervisory Control and Data Acquisition (SCADA) system.

In some embodiments, certain patterns may be embossed into film surfaces in order to better concentrate and focus the incident sunlight onto defined focus areas for greater efficiency. The basic functionality of the primary optic can be provided by forming a pattern of facets of millimeter or smaller spacing, such that the facets refract sunlight and direct it to the receivers or PV cells. In one embodiment, the refractive grooves might be the only pattern present on the film surface. The refractive primary optic or primary film functionality can also be enhanced by applying additional patterns to the other surface.

One pattern that may be applied may include sub-wavelength features that modify the effective index of refraction with depth of the surface of the film. For example, applying a "moth's-eye" pattern to the outer surface of the primary optic/film to reduce Fresnel reflection losses can increase the system efficiency by a significant amount. It may also be possible to use a smaller scale pattern superimposed on the facet structure on the same side or surface of the primary film.

In another embodiment, the polymer materials in which the embossed refractive facets are made may have indices of refraction that vary with wavelength. The resulting chromatic aberration increases the lateral spread of sunlight at the receiver, thereby effectively reducing the amount of angular error due to mis-alignment or tracking offsets that can be tolerated without losing some power output. With refraction, blue light is deflected more strongly than red light. However, diffraction disperses red light through greater angles than blue. Hence, applying the appropriate diffractive groove pattern on the outer face of a refractive film to make a hybrid optic can correct the intrinsic chromatic aberration of the purely refractive film.

In yet another embodiment, an optic can be used that focuses light by diffraction. The diffraction can be achieved with a regularly spaced surface relief profile, with a gradient-index material whose index of refraction varies in a repeating pattern, or by etching sub-wavelength features of a variety of shapes that similarly vary in shape or spacing to produce a laterally-changing effective index of refraction. However, a standard diffractive optic will provide high efficiency (i.e., close to unity) only for one particular wavelength in one particular diffraction order. Solar power generation, however, requires achieving nearly unity efficiency over the very broad wavelength of about 400 nm to 1600 nm. Achieving high efficiency over a wide wavelength range, in addition to the regular surface height or effective index of refraction lateral variation, requires inclusion of a variation of effective index of refraction with depth. The vertical variation can be achieved by: (a) making surface relief profile structures with different dispersion characteristics that are co-aligned and separated by an air gap, (b) laminating two gradient-index materials, with coincident boundaries for the zones of varying gradient, but with their gradients running in opposite directions such that a high index part of the lower layer lies directly below a low index part of the upper layer, and conversely, or (c) using a single layer consisting of strips of alternating materials in sub-wavelength structures with the appropriate effective index variation and spacing to provide high efficiency over the specified wavelength range.

Figure 23A:
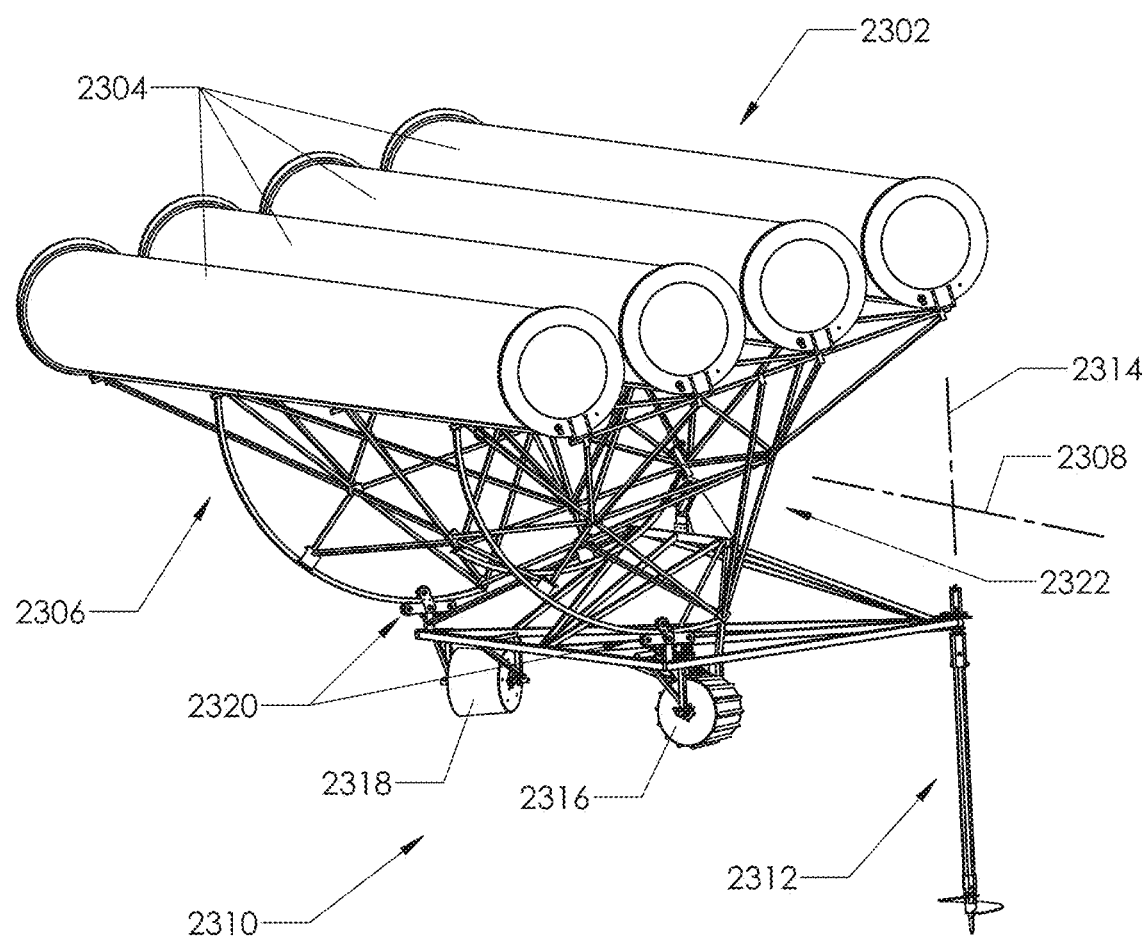
FIGS. 23A-23C show a different embodiment of inflated concentrators mounted on a tracking system according to an embodiment of the present invention.

Embodiments may feature one or more elements or characteristics as are now described. FIG. 23A shows an isometric view of one version of an integrated CPV system 2302 according to an embodiment of the present invention. Four inflated film tubular solar concentrators 2304 are configured to track the sun in elevation and azimuth. Concentrators 2304 are mounted to an upper structure 2306 which pivots on rollers 2320 about a virtual elevation axis 2308 with respect to a lower structure 2310. Lower structure 2310 is rotatably connected to the ground via ground anchor 2312. Ground anchor 2312 defines an azimuth axis 2314. System 2302 rotates with respect to the ground about azimuth axis 2314 and is driven by a drive wheel 2316. A follower wheel 2318 provides additional ground support for system 2302. Together, ground anchor 2312 and the two wheels 2316 and 2318 create 3 points of ground contact at or near the maximum spatial extents of the system for greatest system stiffness and stability. Azimuth actuation through wheel 2318 happens at or near the largest distance from azimuth axis 2314 which reduces the actuation forces required, increases stiffness and reduces the cost and complexity of actuator transmission components by allowing less gear reduction for a given amount of torque to be applied to system 2302. Similarly, an elevation actuator 2322 acts to apply actuation torque to upper structure 2306 at or near the largest possible distance from elevation axis 2308 in order to reduce forces and elevation actuator transmission cost and complexity. Wheels 2316 and 2318 are configured to operate directly on unprepared ground or soil which reduces system costs and installation costs. System 2302 is able to track the sun's position despite ground irregularities, bumps, holes or obstacles. As wheels 2316 and 2318 travel to create azimuth motion and pass over an obstacle. Elevation actuator 2322 can adjust the position of upper structure 2306 so that a desired elevation orientation is maintained despite the ground irregularities.

One advantage of the virtual pivot axis frame geometry of this system is that the elevation axis is able to run through the center of gravity of upper structure 2306 and concentrator assembly, even if the center of gravity is inside the volume of the concentrators or even if it conflicts with the frame members. Another advantage is that the concentrators can be made very long, but still can be rotationally supported mid-span. Without the virtual pivot axis, the concentrator and upper frame assembly would have to be rotationally supported at the ends which could result in large deformations in the middle of the concentrators, or alternately the need for more frame material to prevent large deformations. With the virtual pivot axis, the upper structure 2306 can be supported at any point or points along its length without interfering with the rotational operation.

Figure 23B:
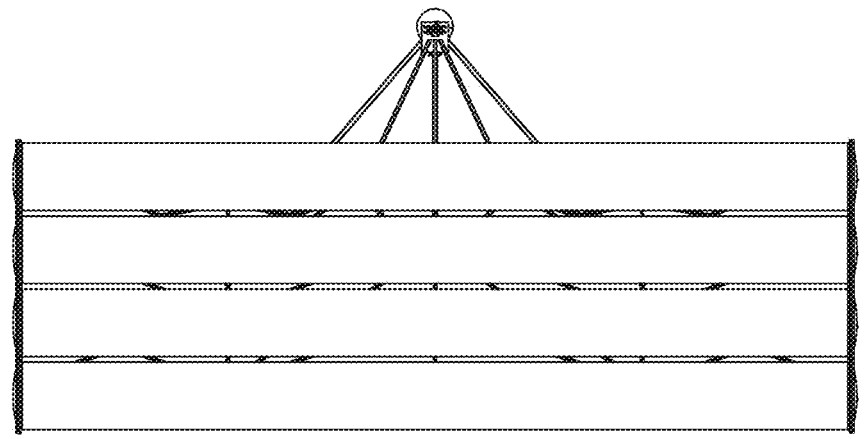
Figure 23C:
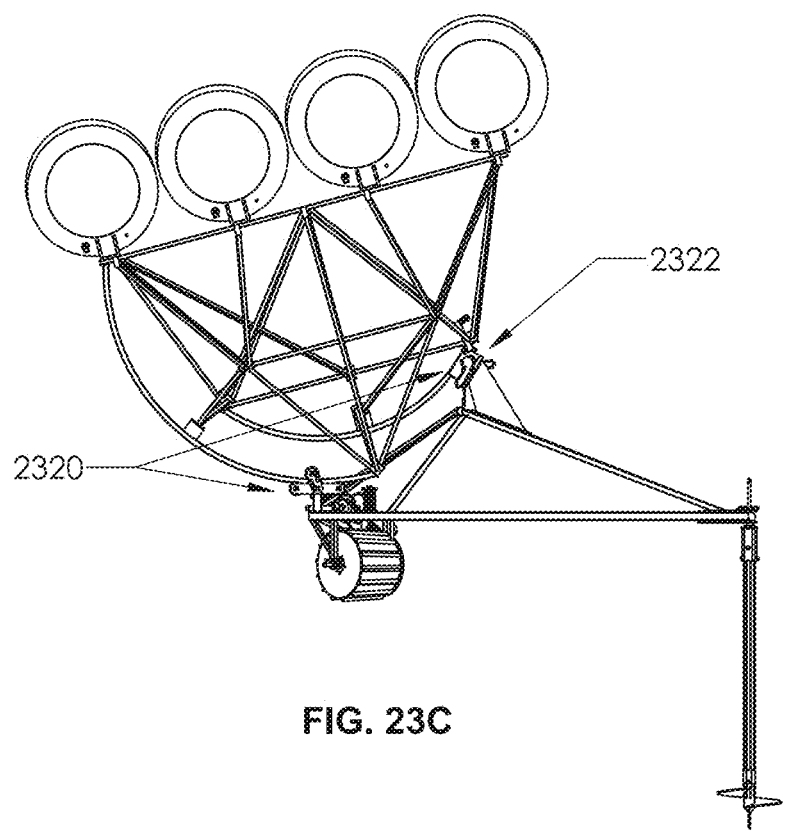

FIG. 23B shows a top view of the system of FIG. 23A. FIG. 23C shows a side view of the system of FIG. 23A.

Figure 24A:
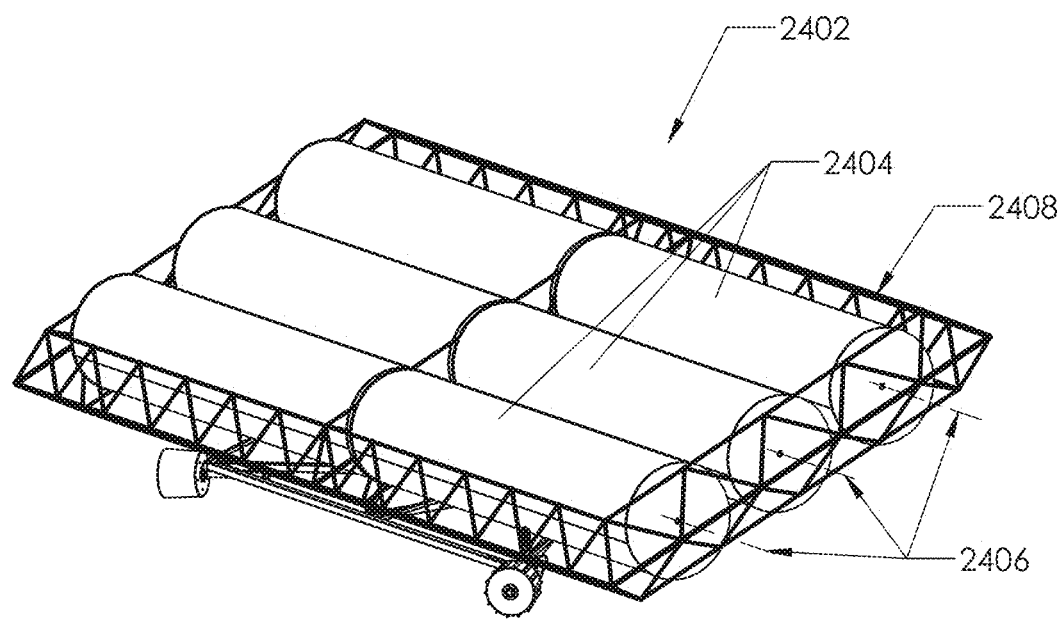
FIGS. 24A and 24B show a different embodiment of inflated concentrators mounted on a different tracking system according to another embodiment of the present invention.
Figure 24B:
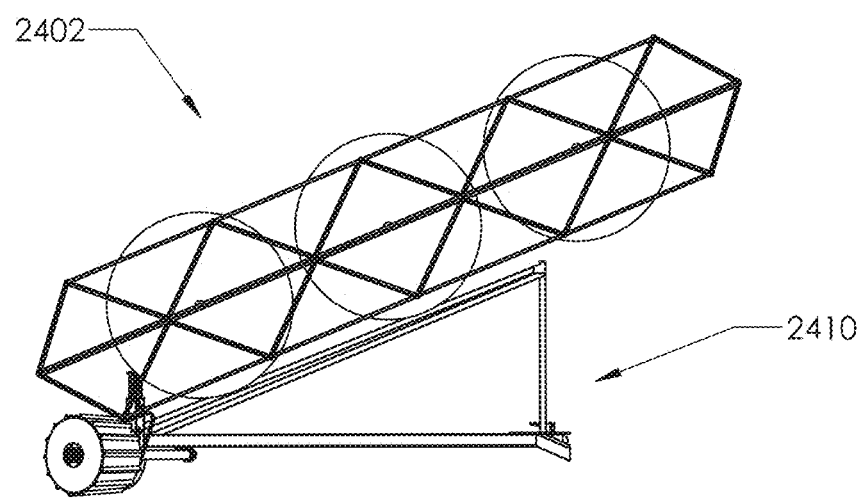

FIGS. 24A and 24B show views of another system 2402 configured with inflated tubular solar concentrators 2404 according to an embodiment of the present invention. FIG. 24A shows an isometric view. The tracking system 2410 is similar to that of FIG. 23A except that inflated concentrators 2404 each rotate about their own respective elevation axes

2406 so that the rest of tracking system 2410 can move as a rigid unit. FIG. 24B shows a side view of the system 2402 of FIG. 24A.

Figure 25:
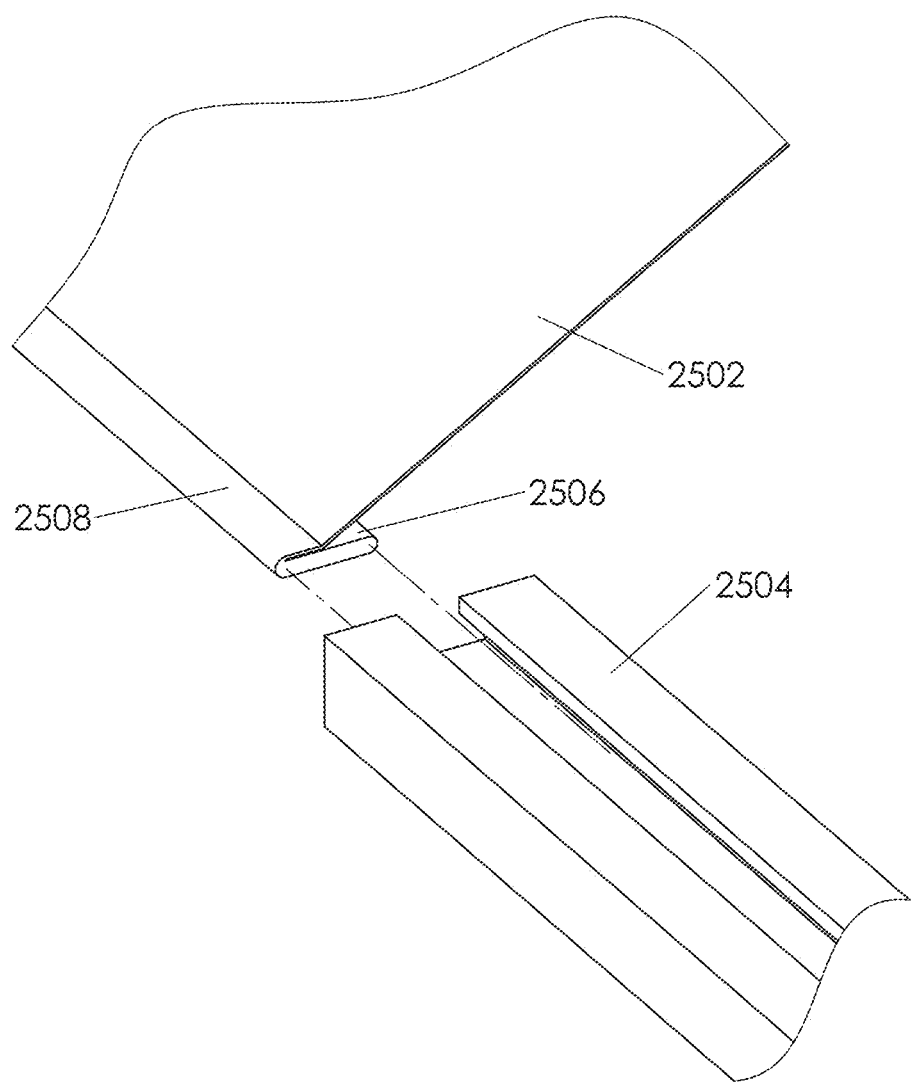
FIG. 25 shows a method of attaching and removing a film from a film holder which may be employed to allow changing of film-based inflated optics according to an embodiment of the present invention.
Figure 26A:
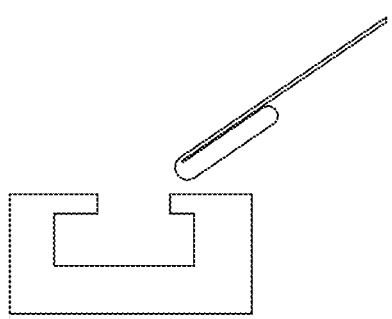
FIGS. 26A-26D show another method of attaching and removing a film from a film holder which may be employed to allow changing of film-based inflated optics according to an embodiment of the present invention.
Figure 26B:
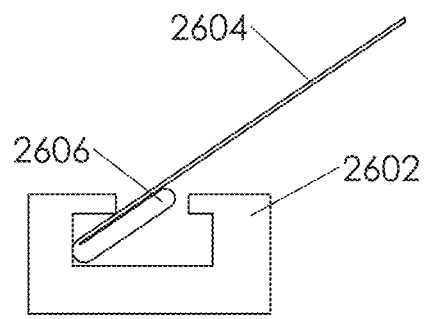
Figure 26C:
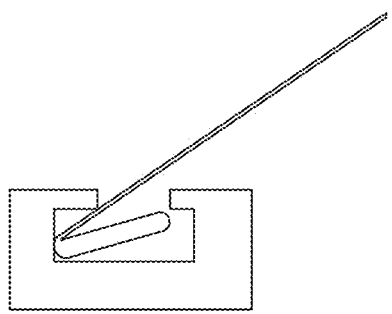
Figure 26D:
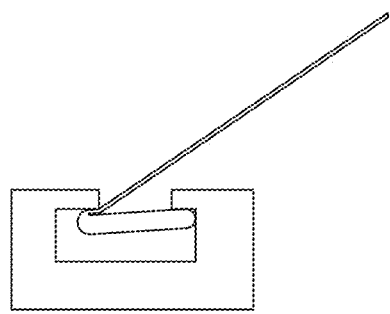

FIG. 25 shows a method of attaching and removing a film from a film holder which may be employed to allow changing of film-based inflated optics or other applications where that benefit from an easily changeable film with or without air seal, according to an embodiment of the present invention. Film 2502 wraps around one or more corners of an anchoring strip 2506. An optional attachment zone 2508 prevents film 2502 from slipping off anchor 2506. Attachment zone 2508 may be a heat seal, dielectric weld, RF weld, ultrasonic weld, adhesive bond, tape joint or other form of joining or friction enhancement. Anchor 2506 has a shape designed to fit into a film holder 2504 that has a slot or other retaining feature. Film 2502 and anchor 2506 are designed to slide into film holder 2504. When forces are applied perpendicular to the direction of the insertion sliding motion (for example forces related to film inflation), anchor 2506 holds film 2502 securely in film holder 2504. If forces on film 2502 are going to be very high, additional wraps around anchor 2506 may be made so that capstan friction can be increased to enhance film retention.

FIGS. 26A-26D show another method of attaching and removing a film from a film holder which may be employed to allow changing of film-based inflated optics, according to an embodiment of the present invention. A film 2604 is joined to an anchor strip 2606 which can snap into a film holder 2602. The film installation in FIGS. 26A-D is accomplished by snapping the film and anchor in from the side rather than sliding in from the end as in the film retention system of FIG. 25. FIGS. 26A-D show end views of sequential installation steps. Film removal can be accomplished either by reversing the actions of installation or by sliding the film and anchor out in a direction parallel to the length of the film holder or by using a specially designed tool (not shown).

Figure 27A:
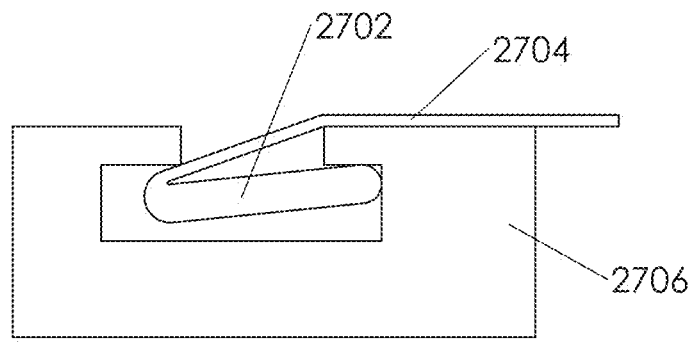
FIGS. 27A-27C show variations of film anchor features and sealing materials according to an embodiment of the present invention.
Figure 27B:
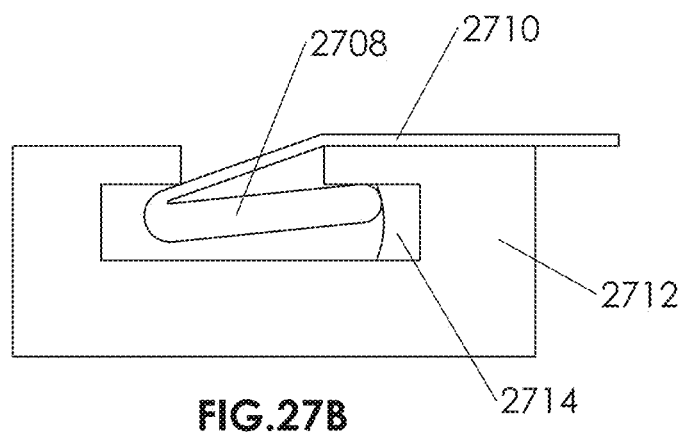
Figure 27C:
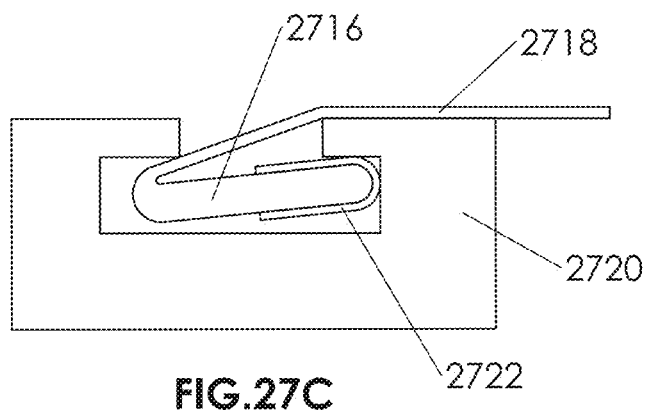

FIGS. 27A-27C show variations of film anchor features and sealing materials which can be used in conjunction with the film retaining and sealing methods of FIGS. 25 and 26, according to an embodiment of the present invention.

FIG. 27A shows an end view of a film 2704 attached to an anchor 2702 which is retained in a film holder 2706. Sealing, e.g., to prevent pressurized gas or liquid from passing from one side of film 2704 to the other side of the film by going between film 2704 and anchor 2706, can be accomplished by taking advantage of the 3 tight junctions that are created when film 2704 is tensioned or force is applied. The first sealing junction is formed between film 2704 and film holder 2706. The second is between film 2704 and a different edge of film holder 2706. The third is between anchor 2702 and film holder 2706. The sealing function of all three junctions is improved as tension in the film increases. Sealing function can be compromised by imperfections of shape or surface finish in the surfaces of the components forming the junctions, or by particles that prevent perfect surface contact. When sealing function is compromised, the leak rate increases. One way to mitigate leaks is to design compliance into one or both of the sealing surfaces at a junction. For example film holder 2706 may be made in part or in whole out of a compliant elastomeric material. Another mitigation technique is to use a sealing agent (not shown) such as a thick liquid, gel or grease in between film 2704 and holder 2706 and/or in between anchor 2702 and holder 2706.

FIG. 27B shows another way to improve the sealing function of a film holder. Film 2710, anchor 2708, and film holder 2712 are configured similarly to the analogous components in FIG. 27A. An additional component, sealing agent 2714 is attached to film holder 2712. Sealing agent 2714 may be an elastomer, rubber, polymer, wax or other compliant material. Tension in film 2710 will cause anchor 2708 to press into and deform sealing agent 2714. If sealing agent 2714 is compliant enough it can conform to any irregularities in the surface of anchor 2708.

FIG. 27C shows another way to improve the sealing function of a film holder. Film 2718 anchor 2716, and film holder 2720 are configured similarly to the analogous components of FIG. 27A. To improve the sealing function a sealing agent 2722 is attached to anchor 2716. This is very similar to FIG. 27B except that sealing agent 2722 can be removed with the film. This can be useful because whenever the film is replaced, the sealing agent can be renewed.

Figure 28A:
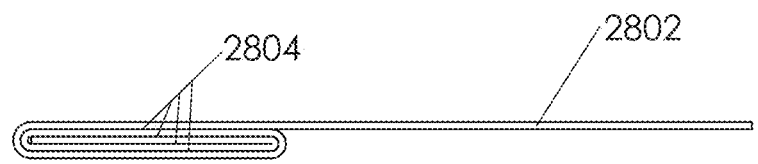
FIGS. 28A-28D show variations of film anchor construction according to an embodiment of the present invention.
Figure 28B:
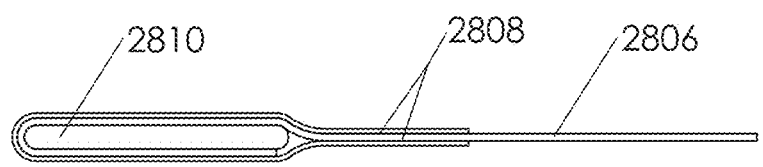
Figure 28C:
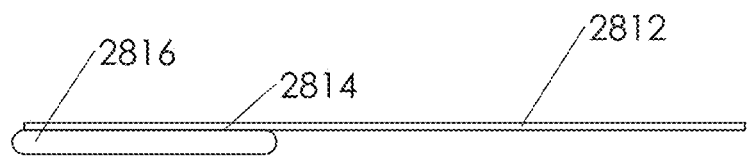
Figure 28D:
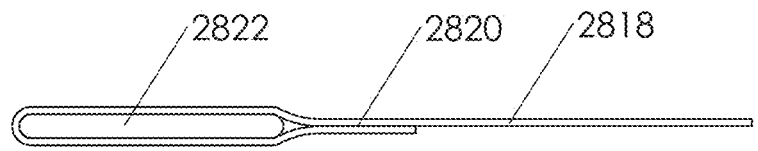

FIGS. 28A-28D show variations of film anchor construction. FIG. 28A shows an anchor that is formed out of several or many folds of a film 2802 itself. If film 2802 is folded over enough times it may form a body that is rigid enough to perform the anchor function. It may be helpful to use an adhesive or tape (not shown) in between the folds that form anchor 2804. FIG. 28B shows another anchor construction variation. Film 2806 wraps around anchor 2810 with an optional adhesive, heat seal or tape between them. An outer layer of tape, film or other thin material 2808 is wrapped around anchor 2810 outside of film 2806. If 2808 is an adhesive tape, then it can be adhered to both sides of film 2806 and it may be sufficient to keep the anchor intact. FIG. 28C shows another anchor construction. Film 2812 is adhered, glued, bonded, heat sealed, mechanically attached or welded to anchor 2814 without needing to wrap around it. FIG. 28D shows another anchor construction. Film 2818 wraps around an anchor 2822 and is adhered, glued, bonded, welded, heat sealed or mechanically attached to itself at bond area 2820.

Figure 29A:
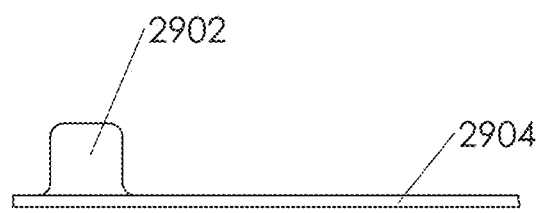
FIGS. 29A-29C show additional variations of film anchor and seal materials according to an embodiment of the present invention.
Figure 29B:
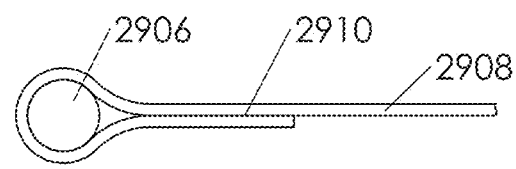
Figure 29C:
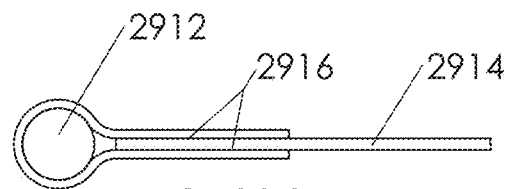

FIGS. 29A-29C show additional variations of film anchor and seal materials. FIG. 29A shows an anchor 2902 adhered directly to a film 2904. Anchor 2902 may be molded onto film 2904 or it may be made by a co-extrusion process with the film or it may be adhered onto the film via an adhesive, heat seal, or weld. FIG. 29B shows an anchor construction with a film 2908 wrapping around a bead 2906 and then adhered, taped, heat sealed, glued or welded to itself at bond area 2910. FIG. 29C shows an anchor constructed from a film 2914 which is joined to a round bead 2912 by a joining material 2916. Joining material may itself be an adhesive tape, or it may be joined to film 2914 by an adhesive, glue, weld or heat seal.

Figure 30A:
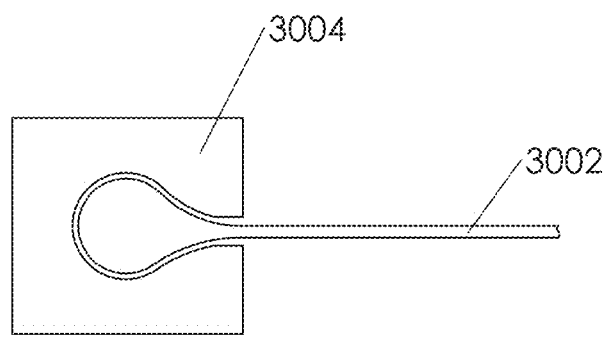
FIGS. 30A and 30B show variations of film anchors and related structures to which film is secured according to an embodiment of the present invention.
Figure 30B:
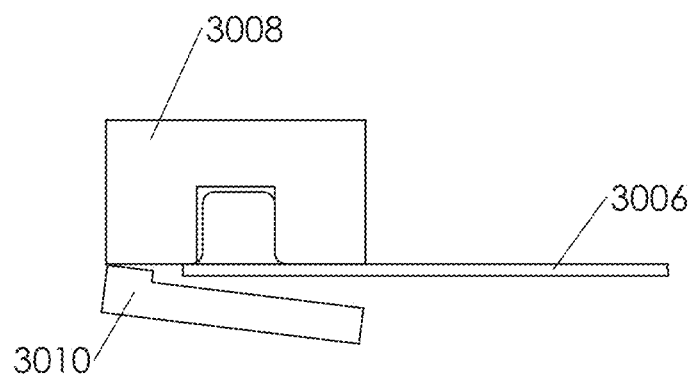

FIGS. 30A and 30B show variations of film anchors and related structures to which film is secured. FIG. 30A shows a film anchor 3002 that slides into a holder 3004. The teardrop or wedge shape of anchor 3002 is useful in creating a seal with low leak rate because the gradual slope of the sides creates mechanical advantage and a wedging action which increases the sealing forces between anchor 3002 and holder 3004. FIG. 30B shows an anchor 3006 which gets trapped in a holder 3008 by a retainer 3010.

Figure 31A:
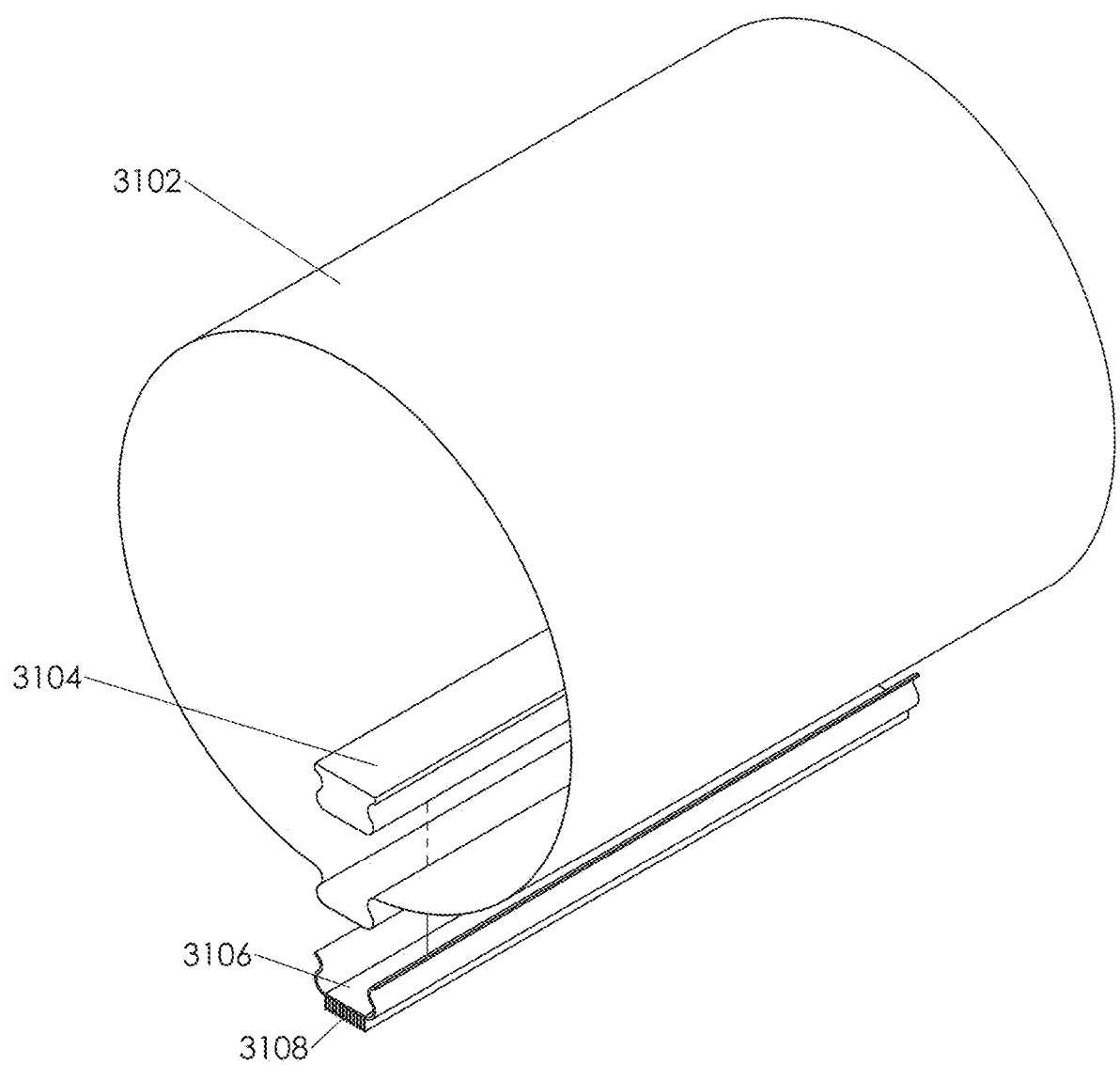
FIG. 31A shows a view of another method of attaching a film to a solar receiver or heat sink according to an embodiment of the present invention.

FIG. 31A shows another method of attaching a film to a solar receiver or heat sink. Film 3102 can be sandwiched between a first retainer 3104 and a second retainer 3106. Retainer 3104 may serve as a structural base of a solar receiver and also may be made of a material with high thermal conductivity in order to facilitate heat transfer through film 3102 to retainer 3106. Retainer 3106 may be attached to or may be an integral part of a heat sink 3108.

Figure 31B:
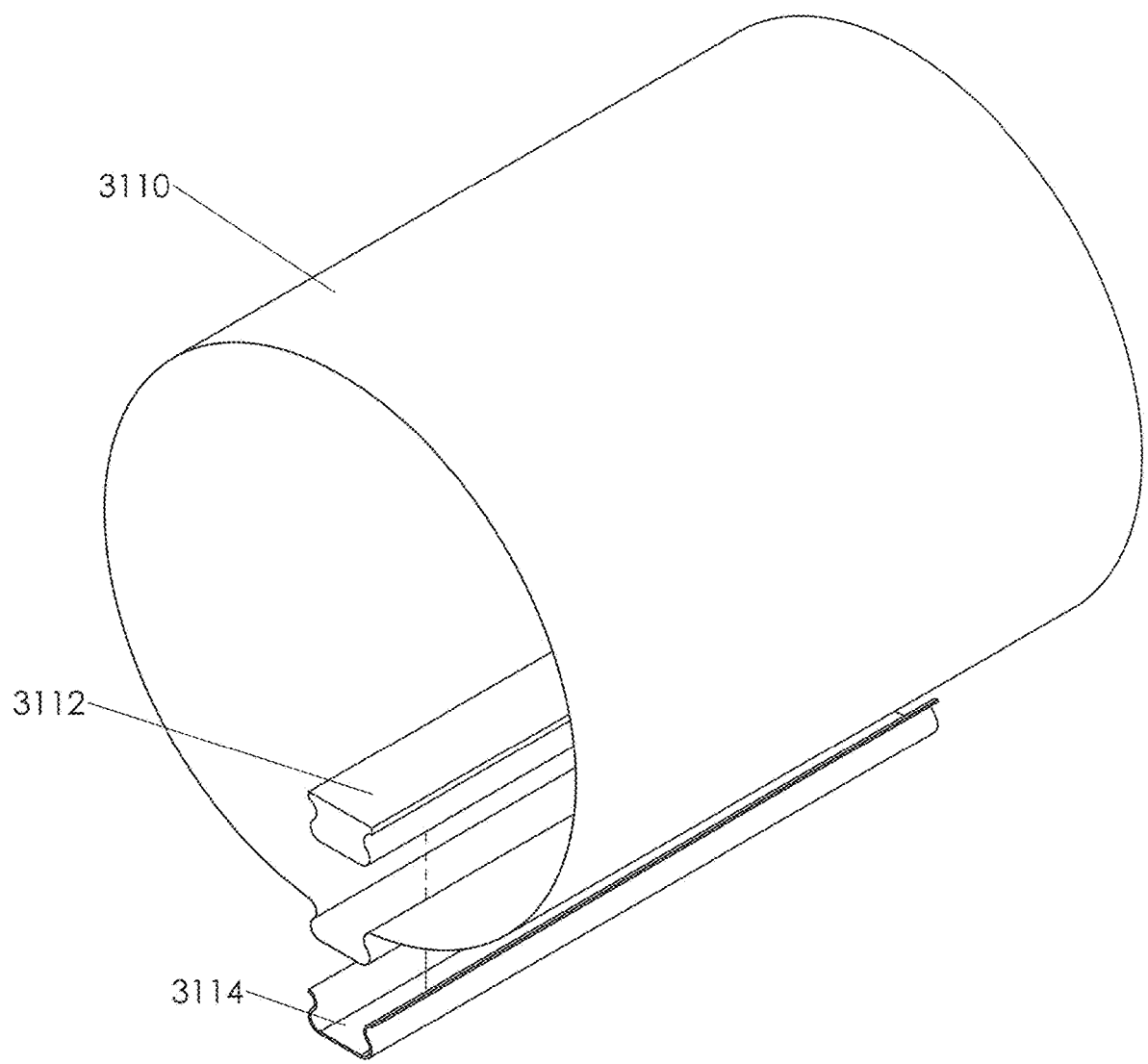
FIG. 31B shows a view of another method of attaching a film to a solar receiver or heat sink according to an embodiment of the present invention.

FIG. 31B shows another method of attaching a film to a solar receiver or heat sink. Film 3110 can be sandwiched between a first retainer 3112 and a second retainer 3114.

Figure 32A:
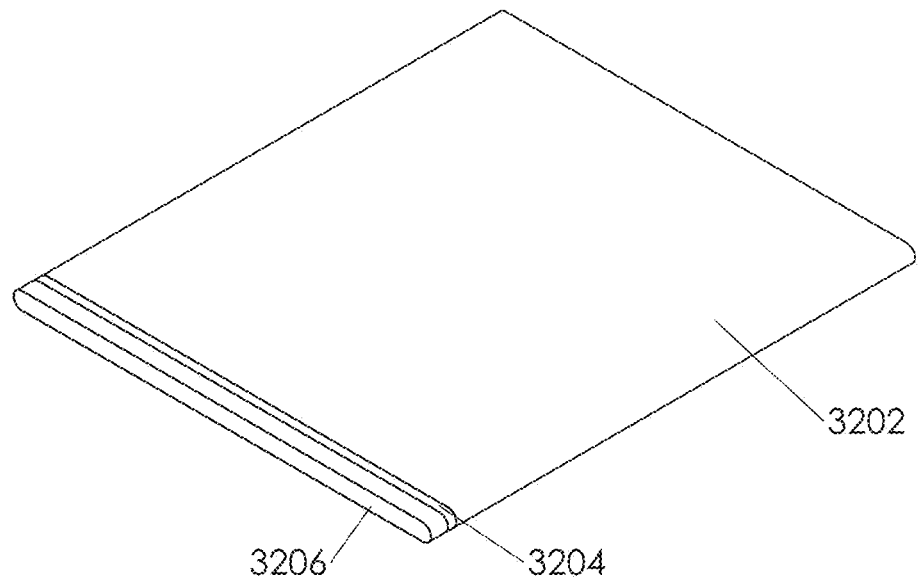
FIGS. 32A and 32B show a method of sealing the end of a tubular inflated solar concentrator according to an embodiment of the present invention.
Figure 32B:
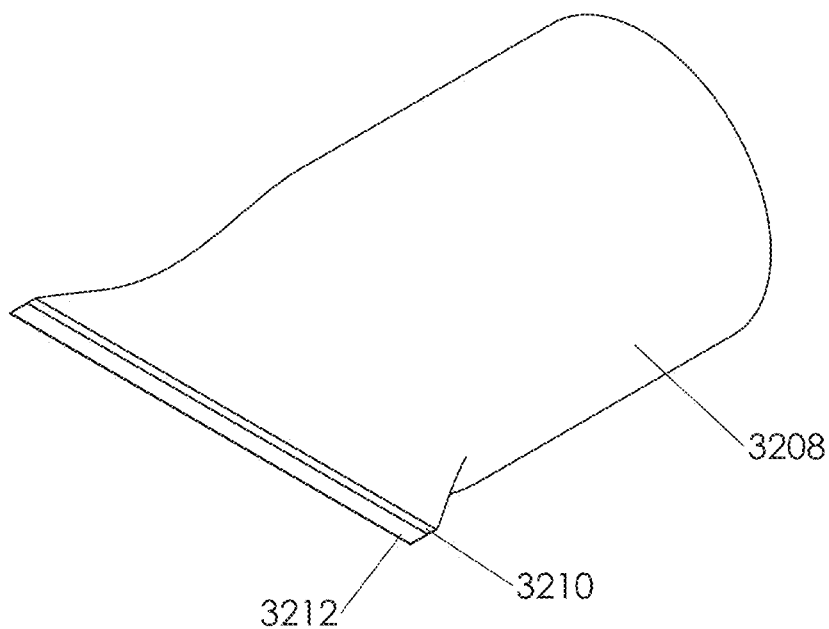

FIGS. 32A and 32B show a method of sealing the end of a tubular inflated solar concentrator according to an embodiment of the present invention. FIG. 32A shows the concentrator prior to inflation in a flat form. Film 3202 forms a closed tube with an end 3206. A seal 3204 closes the end so that gas cannot escape. Seal 3204 may be in the form of a heat seal, a mechanical clamp, glue, adhesive tape, an ultrasonic weld or other bond. FIG. 32B shows an inflated configuration of the sealed film of FIG. 32A. Film 3208, end 3212 and seal 3210 correspond to the film, end and seal of FIG. 32A.

Figure 33A:
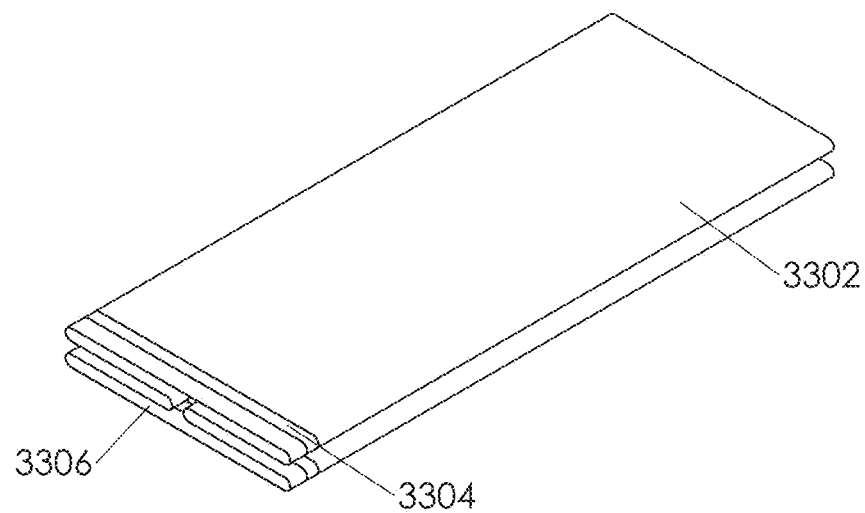
FIGS. 33A and 33B show another method of sealing the end of a tubular inflated solar concentrator according to an embodiment of the present invention.
Figure 33B:
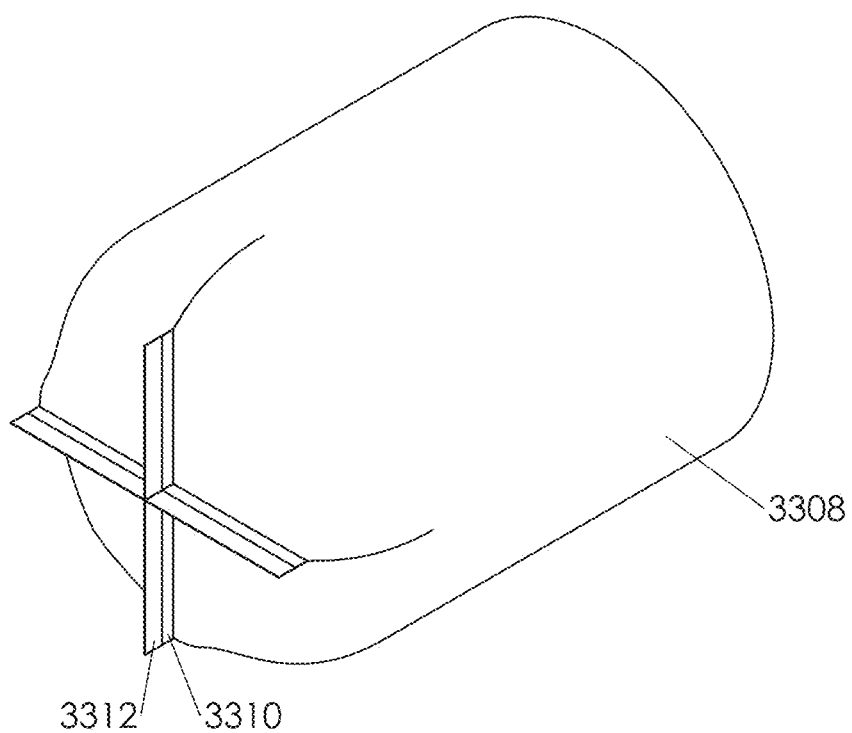

FIGS. 33A and 33B show another method of sealing the end of a tubular inflated solar concentrator according to an embodiment of the present invention. FIG. 33A shows a flat configuration of a film 3302 which forms a continuous tube but is folded flat with pleats on opposite sides. An end 3306 is closed with a seal 3304 which joins adjoining pieces of film 3302 across each pleat. Seal 3304 may be heat seal, a mechanical clamp, glue, adhesive tape, an ultrasonic weld or other bond. FIG. 33B shows an inflated version of the film of FIG. 33A. Film 3308, end 3312 and seal 3310 correspond to the analogous items in FIG. 33A.

Figure 34A:
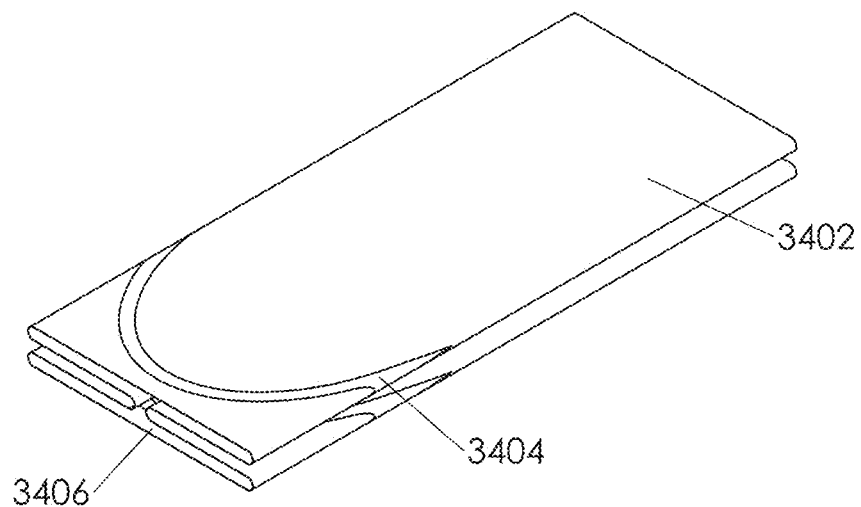
FIGS. 34A and 34B show another method of sealing the end of a tubular inflated solar concentrator according to an embodiment of the present invention.
Figure 34B:
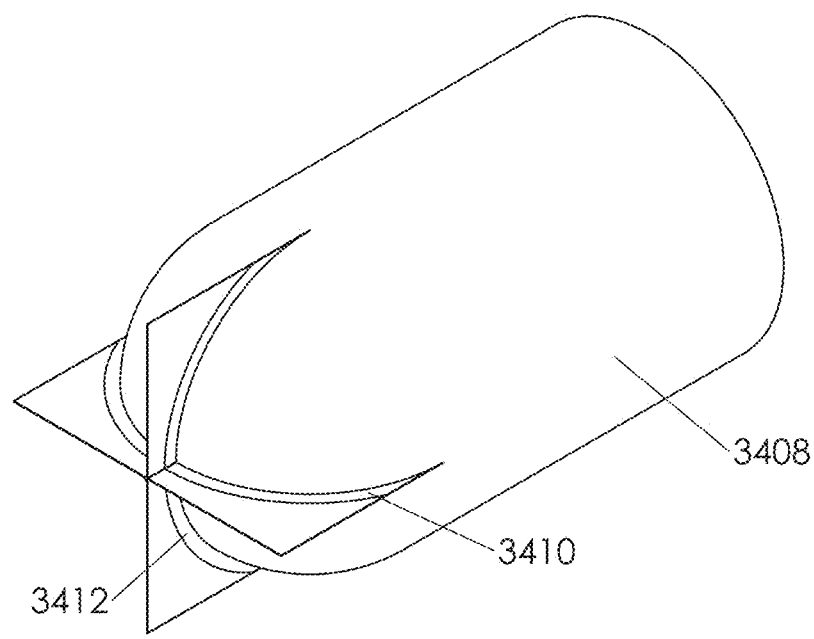

FIGS. 34A and 34B show another method of sealing the end of a tubular inflated solar concentrator according to an embodiment of the present invention. Film 3402, end 3406 and seal 3404 are similar to the analogous items in FIGS. 33A and 33B except that seal 3404 is curved which promotes a more round shape when inflated as shown in FIG. 34B. Film 3408, end 3412, and seal 3410 in FIG. 34B are shown in the inflated shape of the analogous items in FIG. 34A.

Figure 35:
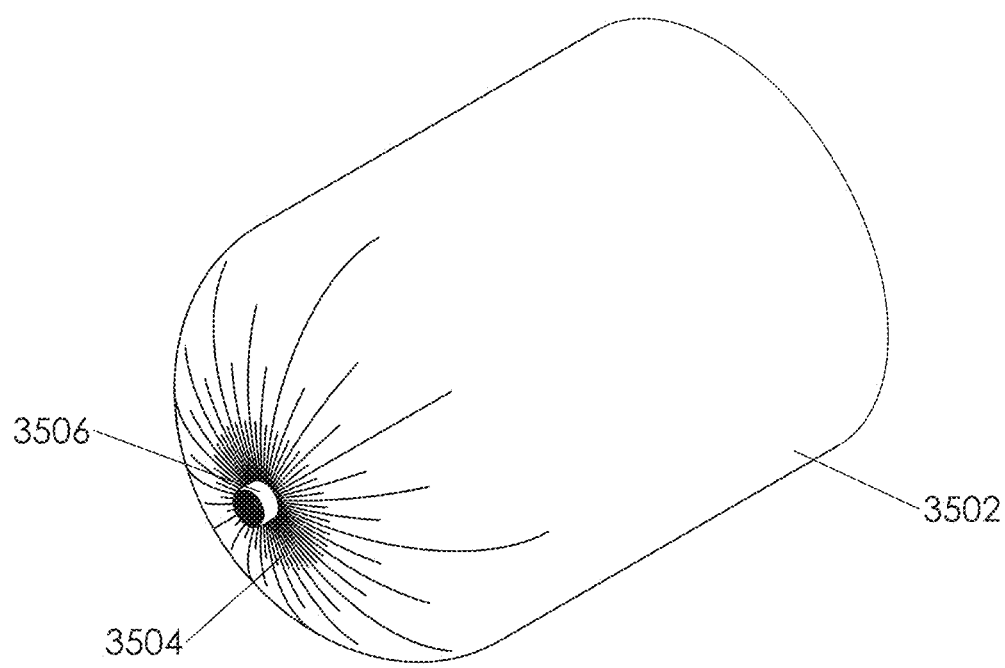
FIG. 35 shows another method of sealing the end of a tubular inflated solar concentrator according to an embodiment of the present invention.

FIG. 35 shows another method of sealing the end of a tubular inflated solar concentrator according to an embodiment of the present invention. A film 3502 has a bunched end 3506. As a result of bunching the end, pleats 3504 are formed. Bunched end 3506 may be held in place by a mechanical clip, glue, zip-tie, string, wire, fiber, heat seal, weld or other joint.

Figure 36A:
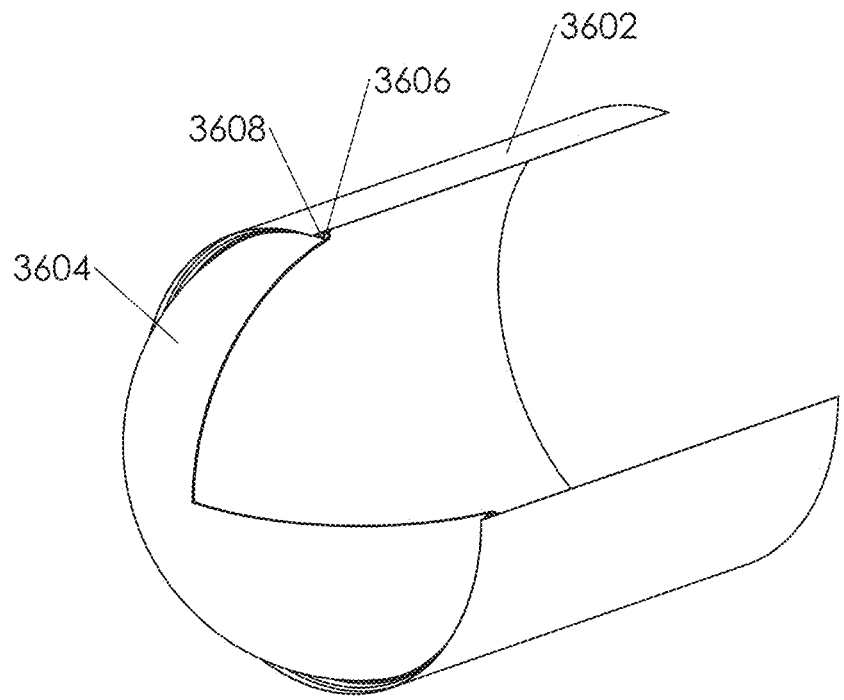
FIGS. 36A and 36B show isometric cutaway and partial section views respectively of another method of sealing the end of a tubular inflated solar concentrator according to an embodiment of the present invention.
Figure 36B:
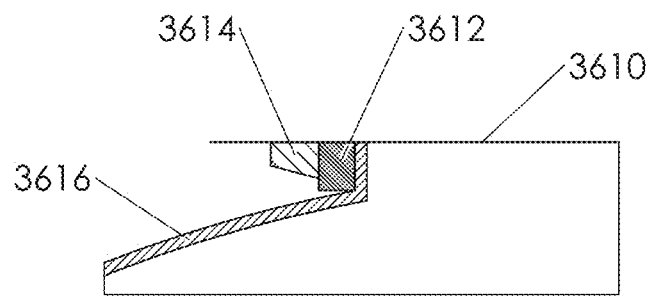

FIGS. 36A-B show isometric cutaway and partial section views respectively of another method of sealing the end of a tubular inflated solar concentrator according to an embodiment of the present invention. FIG. 36A shows an inflated tubular film 3602 and a removable endcap 3604. A stop ring 3614 is attached to film 3602 as shown in FIG. 36B. A seal ring 3606 fits between the edge of endcap 3604 and stop ring 3608 and is made of a compliant material which is squeezed to form a seal and prevents air from escaping. When inflation pressure is removed, endcap 3604 is easily removed so that the film can be replaced. When inflation pressure is added, it creates forces on endcap 3604 which keep it in place. FIG. 36B shows a partial section view of components analogous to those of FIG. 36A including tubular inflated film 3610, endcap 3616, stop ring 3614, and seal ring 3612.

Figure 37A:
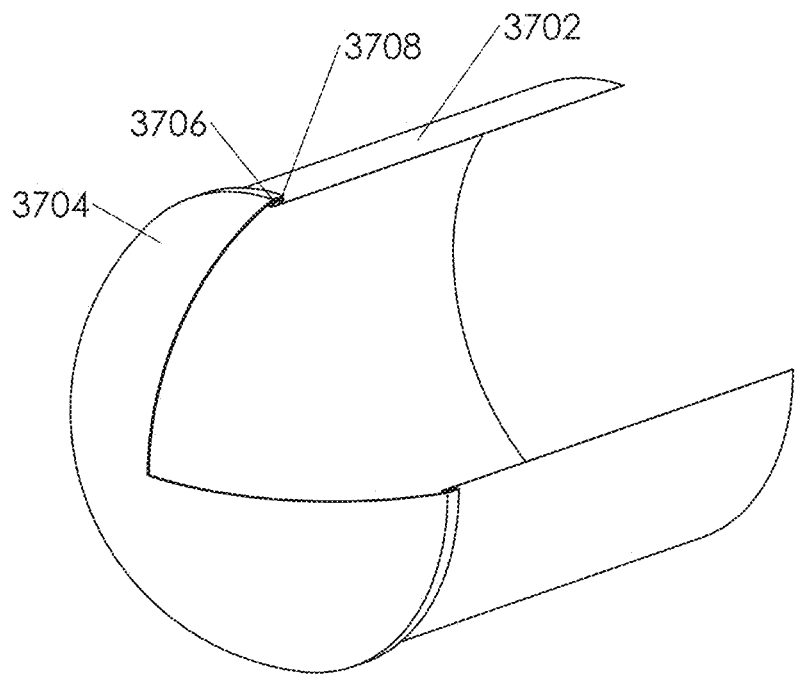
FIGS. 37A and 37B show isometric cutaway and partial section views respectively of yet another method of sealing the end of a tubular inflated solar concentrator according to an embodiment of the present invention.
Figure 37B:
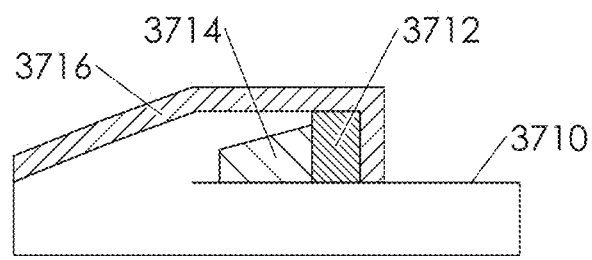

FIGS. 37A-37B show isometric cutaway and partial section views respectively of another method of sealing the end of a tubular inflated solar concentrator according to an embodiment of the present invention. FIG. 37A shows an inflated tubular film 3702 which is connected to a removable endcap 3704 by a stop ring 3706 which is attached to the outside surface of film 3702. A seal ring 3708 is made of a compliant material and creates a seal between film 3702 and endcap 3704 so that air does not leak out. The geometry of these components differs from that of FIG. 36A in that stop ring 3706 and seal ring 3708 are on the outside of film 3702 so that a flange on endcap 3704 can fit around the outside of the end of film 3702. FIG. 37B shows a partial section view of components analogous to those of FIG. 37A including film 3710, endcap 3716, stop ring 3714 and seal ring 3712.

Figure 38A:
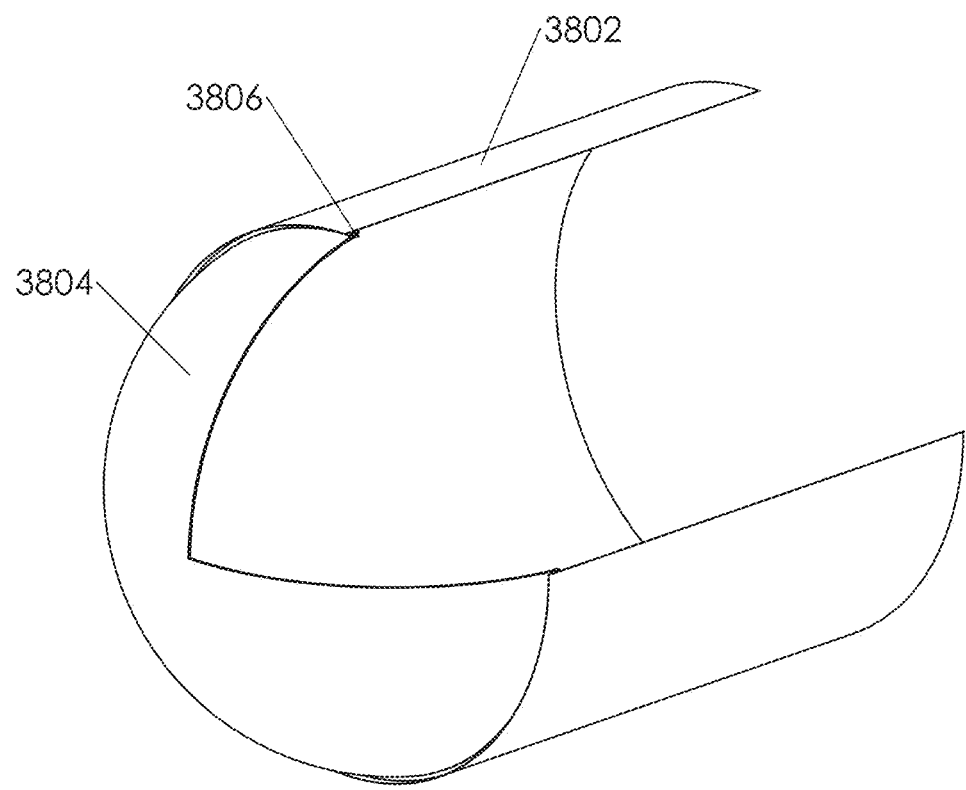
FIGS. 38A and 38B show isometric cutaway and partial section views respectively of another method of sealing the end of a tubular inflated solar concentrator according to an embodiment of the present invention.
Figure 38B:
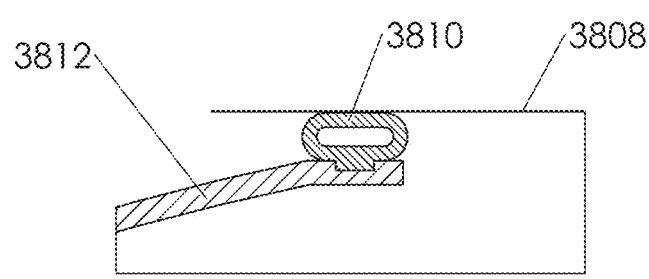

FIGS. 38A and 38B show isometric cutaway and partial section views respectively of another method of sealing the end of a tubular inflated solar concentrator according to an embodiment of the present invention. FIG. 38A shows a tubular inflated film 3802 and a removable endcap 3804. A compliant seal and stop ring 3806 is attached to film 3802 and prevents endcap 3802 from separating from the film and resists forces created by inflation pressure. FIG. 38B shows a partial section view of components analogous to those of FIG. 38A including film 3808, endcap 3812 and stop and seal ring 3810. Stop and seal ring 3810 has a flange which fits into a groove on endcap 3812.

Figure 39A:
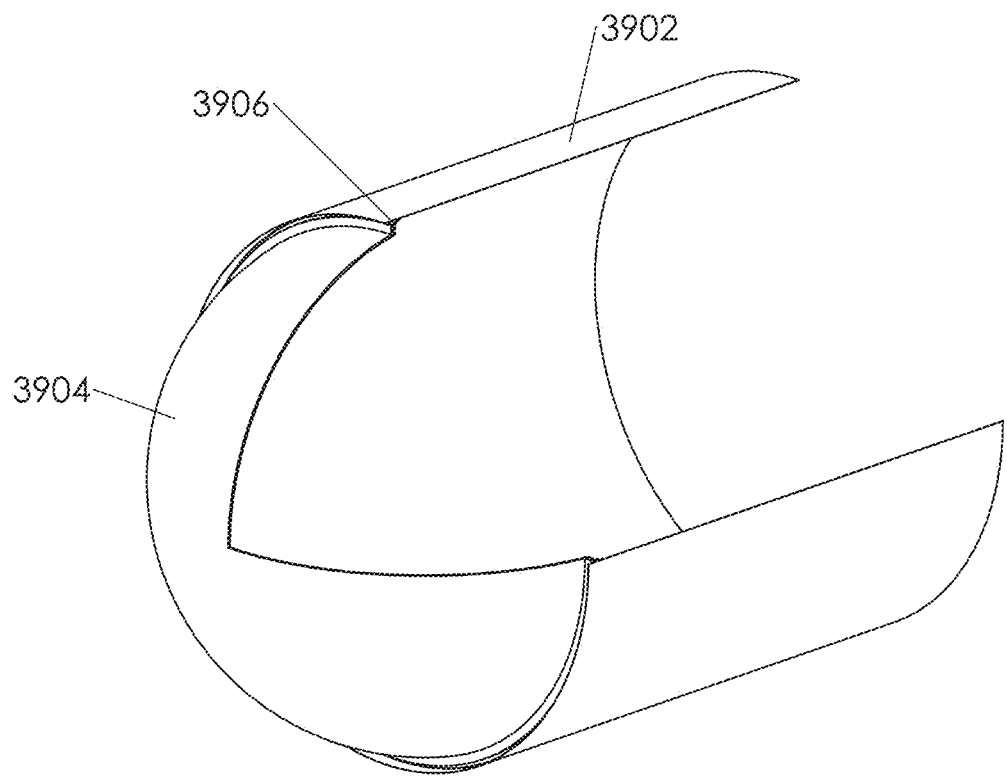
FIGS. 39A and 39B show isometric cutaway and partial section views respectively of another method of sealing the end of a tubular inflated solar concentrator according to an embodiment of the present invention.
Figure 39B:
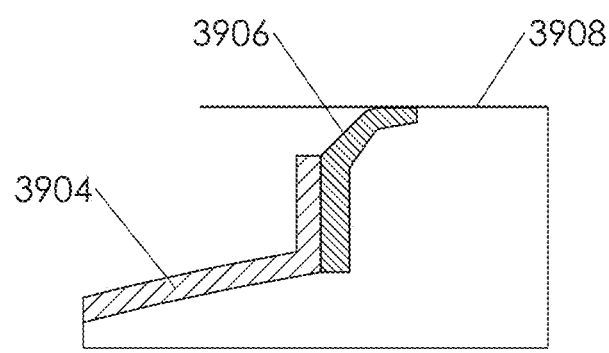

FIGS. 39A and 39B show isometric cutaway and partial section views respectively of another method of sealing the end of a tubular inflated solar concentrator. FIG. 39A shows an inflated tubular film 3902 and an endcap 3904 which are connected and sealed by a seal ring 3906 which is attached to endcap 3904. FIG. 39B shows a partial section view of components analogous to those in FIG. 39A including film 3908, endcap 3904 and seal ring 3906.

Figure 40A:
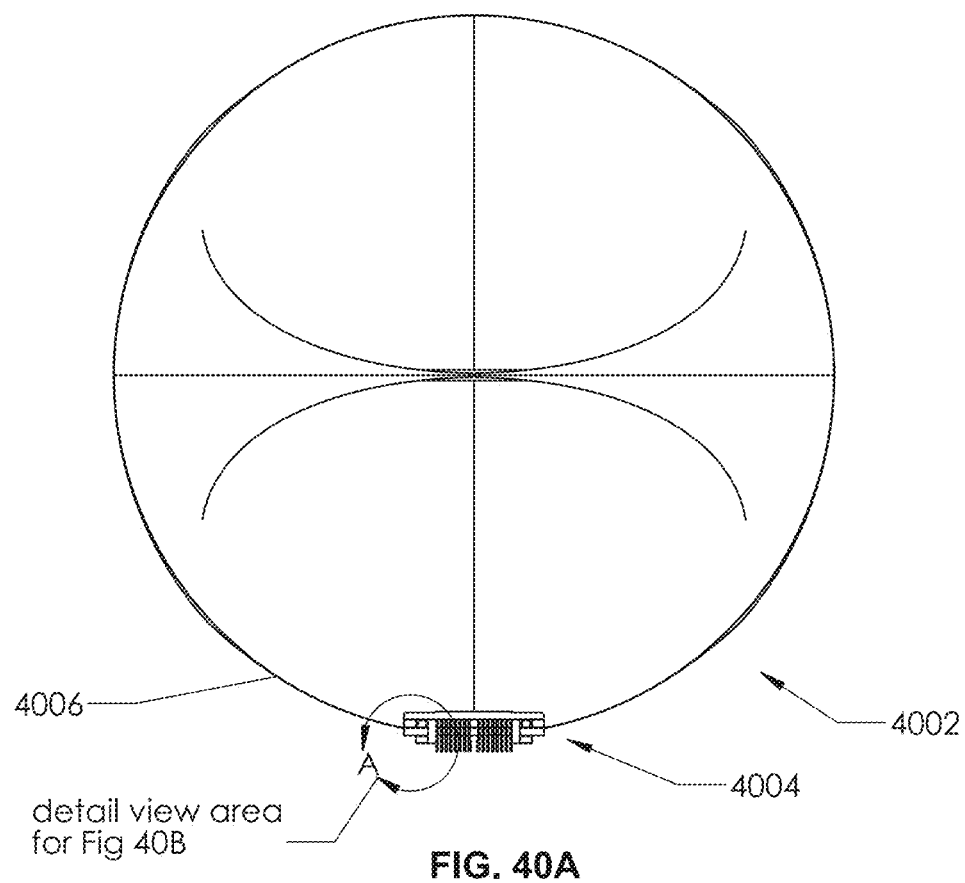
FIGS. 40A-40E show various views of a method of sealing a tubular solar inflated concentrator to a receiver and sealing its ends, according to an embodiment of the present invention.
Figure 40B:
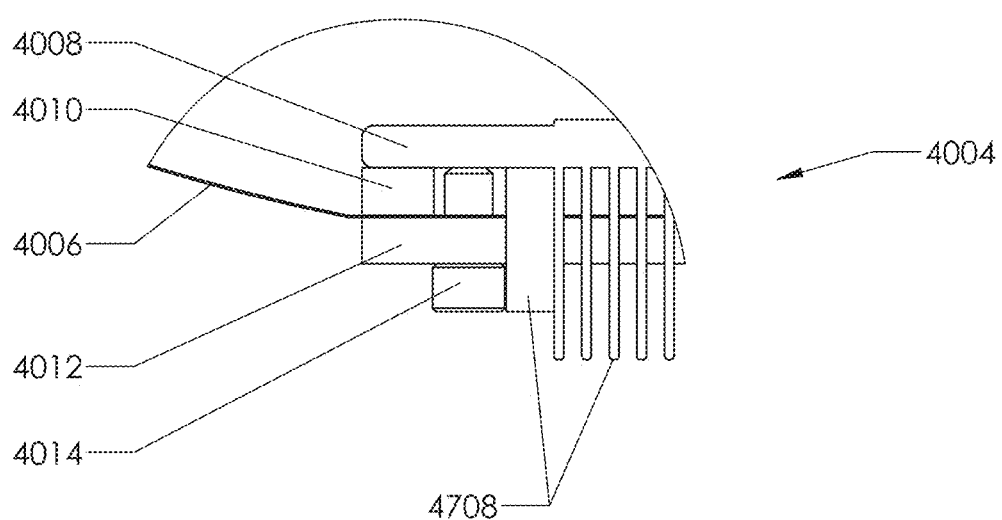
Figure 40C:
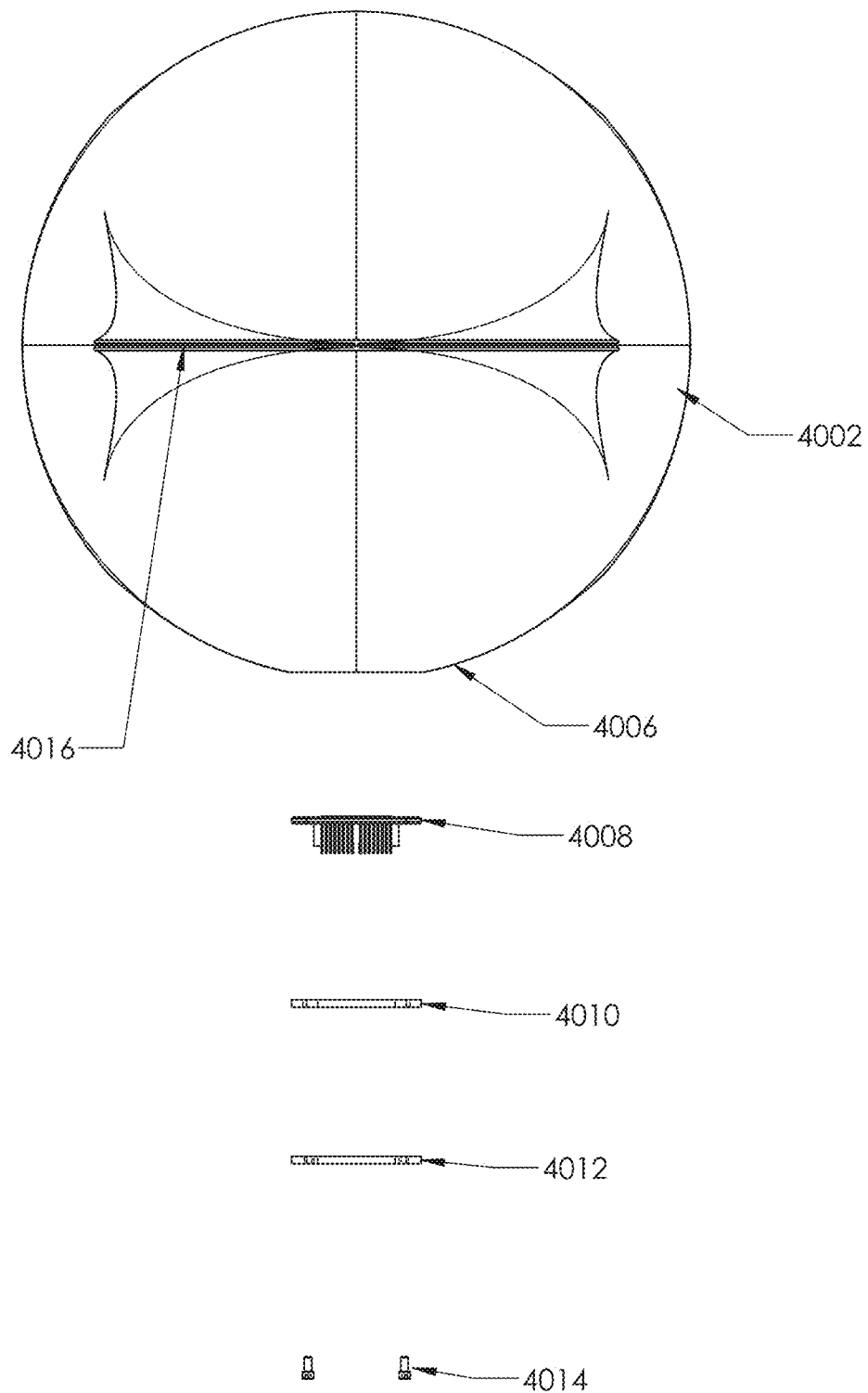
Figure 40D:
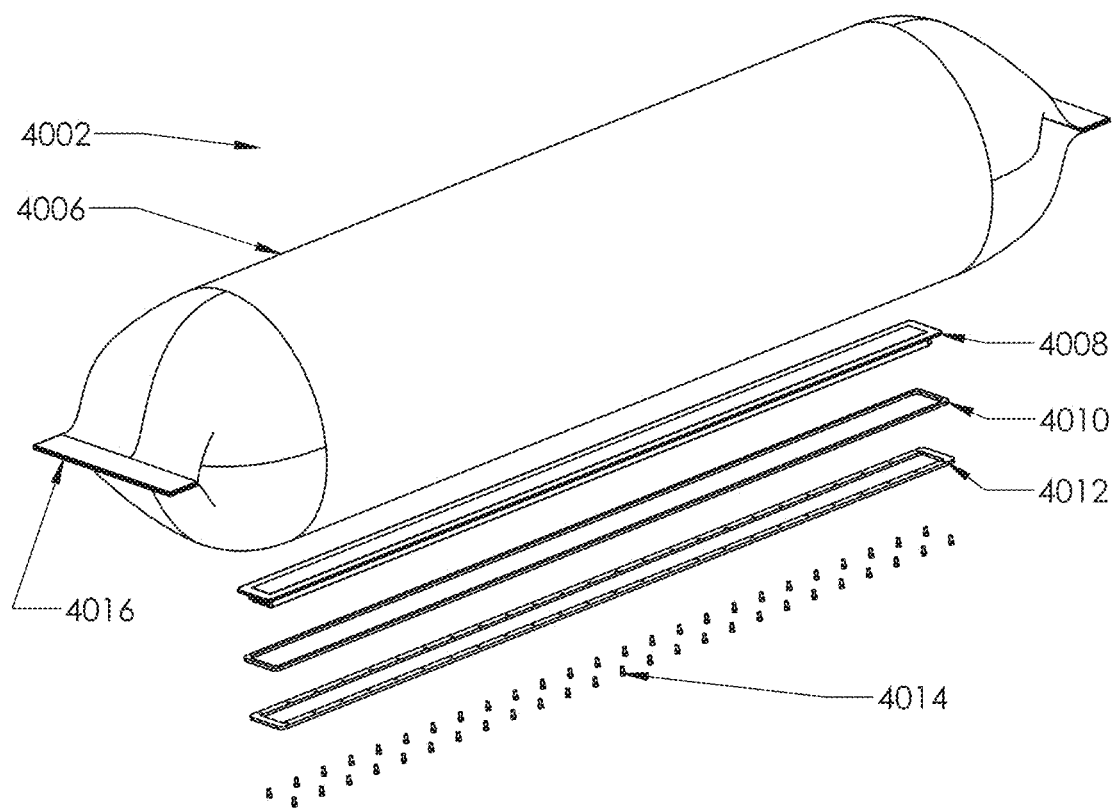
Figure 40E:
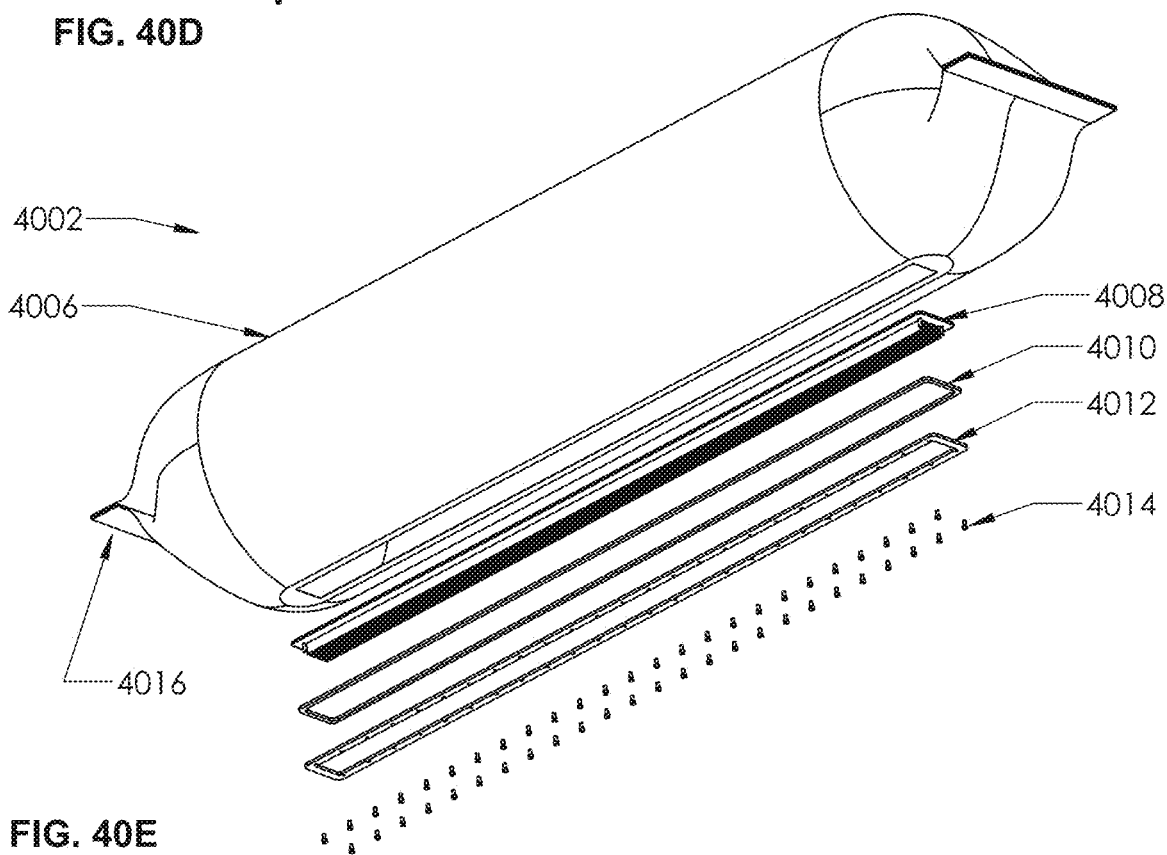

FIGS. 40A-40E show another method of attaching an inflatable tubular concentrator to a receiver heat sink and sealing its ends. FIG. 40A shows a cross section view of a tubular inflated solar concentrator system 4002 which includes a receiver assembly 4004 and inflated film 4006. FIG. 40B shows a partial detail view of an area indicated in FIG. 40A. Film 4006 has a cutout which enables it to fit onto receiver assembly 4004. Film 4006 is clamped between flange 4012 and gasket 4010. These components are held onto a heat sink 4008 and clamping pressure is created by screws 4014 which are tightened into heat sink 4008 to create clamping forces required to hold and seal to film 4006. Gasket 4010 may be made of thermally insulating materials if desired to minimize the temperature that film 4006 is subjected to even if heat sink 4008 reaches a high temperature. FIG. 40C shows an exploded end view of the solar concentrator system 4002 of FIGS. 40A and 40B. To assemble system 4002, gasket 4010 fits around the edge of heat sink 4008. Then film 4006 slips over heat sink 4008 until it meets gasket 4010. Then flange 4012 fits on to hold film 4006 securely up against gasket 4010. Then bolts 4014 are screwed in to secure the components together. This view also shows the end seal 4016 which joins and closes the end of film 4006. Film 4006 may have pleats that fold inward in order to reduce the width of end seal 4016 (similar to a typical candy bar wrapper). Seal 4016 may be a mechanical clamp, or it may be a heat seal or an adhesive tape, glue, weld or other form of joining which prevents air from escaping out the end of film 4002. FIG. 40D shows an isometric exploded view of system 4002. The pleats in film 4006 are more clearly visible here as is seal 4016. FIG. 40E shows a bottom isometric exploded view of concentrator system 4002. Film 4006 has a cutout to allow it to fit over heat sink 4008 which is more clearly visible in this view.

The film attachment and sealing features shown in FIGS. 40A-40E provide a workable film replacement, attachment and sealing system for an inflatable solar concentrator. Another variation of system 4002 provides features which allow the film to slide onto the receiver assembly and snap in place without the need for additional mechanical fasteners. Another variation facilitates creating a seal between the film and the receiver assembly by having the film slide over a taper on the receiver assembly. Other variations are possible.

Figure 41A:
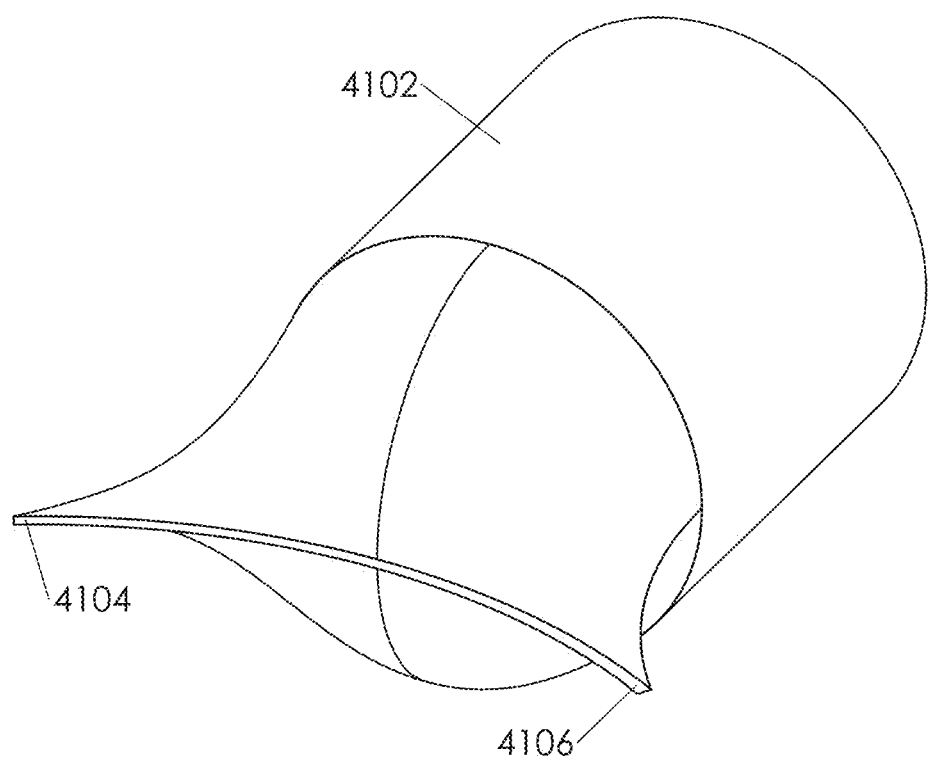
FIGS. 41A and 41B show another method of sealing the ends of an inflatable concentrator according to an embodiment of the present invention.
Figure 41B:
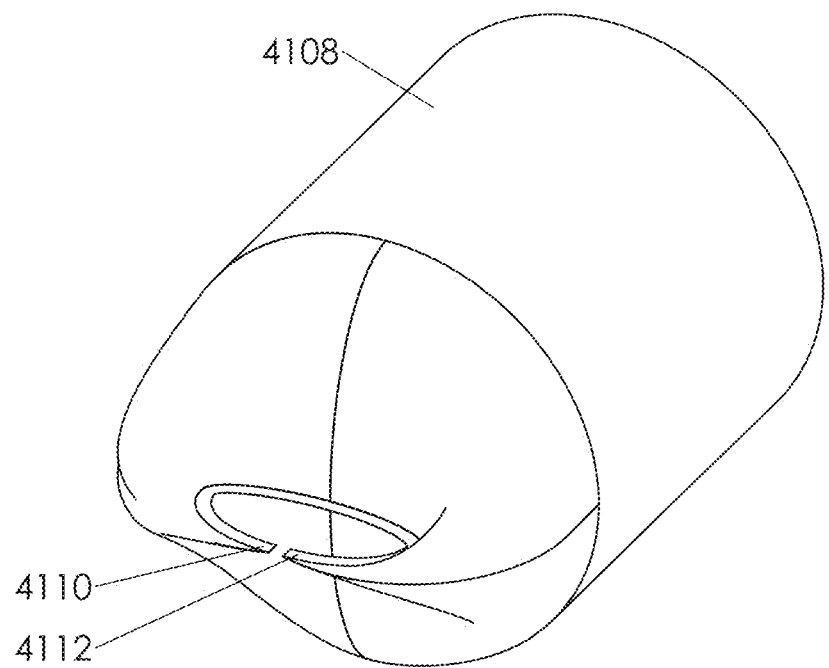

FIGS. 41A and 41B show another method of sealing the ends of an inflatable tube such as an inflatable tubular solar concentrator. FIG. 41A shows an inflatable film tube 4102 with an end seal across the tube width. One side of the seal is labeled 4104 and the other side of the seal is labeled 4106. Because this seal flattens film tube 4102, it becomes wider than the diameter of film tube 4102 which may or may not be acceptable. FIG. 41B shows an alternate version of an end seal configuration for an inflatable film tube 4108. In this case, the sides of the end seal are labeled 4110 and 4112. Seal sides 4110 and 4112 are wrapped inward toward each other and joined together which significantly reduces the effective width of the seal and the end of the tubular concentrator.

Figure 42A:
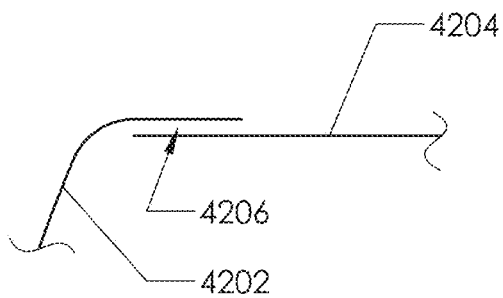
FIGS. 42A-42D show another method of sealing the ends of an inflatable solar concentrator according to an embodiment of the present invention.
Figure 42B:
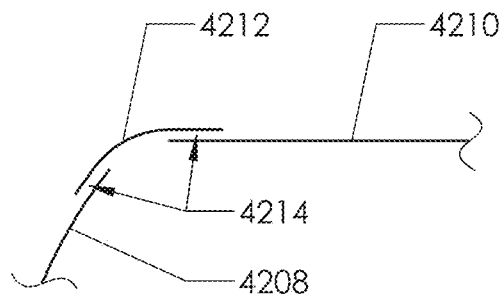

FIGS. 42A-42D show partial cross section views of variations of another end seal for an inflated tubular solar concentrator according to an embodiment of the present invention. FIGS. 42A-42D all represent geometries that are substantially axisymmetric about horizontal axes (not shown). FIG. 42A shows a tubular film 4204 which is joined to an end film at bond 4206. bond 4206 may be a heat seal, RF weld, sonic weld, glue, adhesive tape, chemical bond, mechanical bond, clamped joint, or other form of joining Film 4202 is shown overlapping film 4204 on the outside, but it could also overlap on the inside of film 4204. The overlap order depends upon the particular film materials being used and the type of bond being created. For example it is possible to use laminated films that have a PET layer for the benefit of its strength and modulus plus a polyolefin layer which can be more easily heat-sealed. One arrangement with these films would be to use an overlap order as shown in this figure with end film 4202 having the polyolefin layer on the inside and tubular film 4204 having the polyolefin layer on the outside so that the two may be heat sealed together, polyolefin to polyolefin to form bond 4206. Many other types of films, film layers, materials and bond geometries are also possible. FIG. 42B shows a tubular film 4210 which is joined to an end film 4208 via a joint film 4212 and bonds 4214. Bonds 4214 may be any of the types described in FIG. 42A. Using a separate joint film 4212 would allow films 4208 and 4210 to have the same side facing out. Joint film 4212 may or may not be the same material as films 4208 and 4210. It may be advantageous to make joint film a different material specifically tailored for joints since it need not cover larger areas.

Figure 42C:
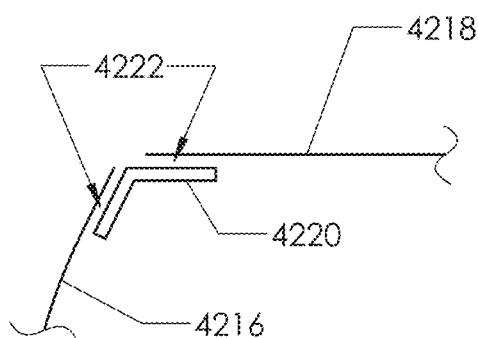
Figure 42D:
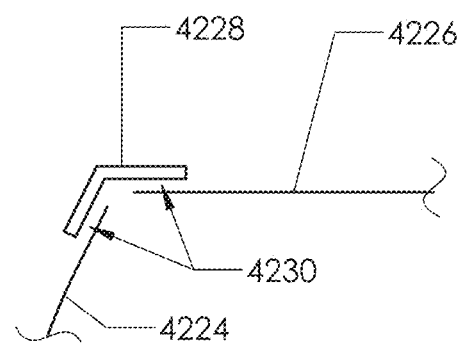

FIG. 42C shows a tubular film 4218 which is joined to an end film 4216 via a joint element 4220 and bonds 4222. Joint element 4220 is shown having an angled cross section which may be facilitate creation of bonds 4222. However, joint element 4220 may be made in a variety of other shapes and configurations. Joint element 4220 may have a cross section that is rectangular, circular, tubular, flexible, rigid, open, or closed. Bonds 4222 may be any of the bond types described in FIG. 42A. FIG. 42D shows a tubular film 4226 joined to an end film 4224 via joint element 4228 and bonds 4230. FIG. 42D is similar to FIG. 42C except that joint element 4228 is shown on the outside of the films rather than on the inside of the films. The particular configuration used will depend upon the specific film materials and orientations, the environment and processing parameter considerations.

FIGS. 43A-J show aspects of another method of attaching an inflatable tubular concentrator to a receiver heat sink and sealing its ends according to an embodiment of the present invention.

Figure 43A:
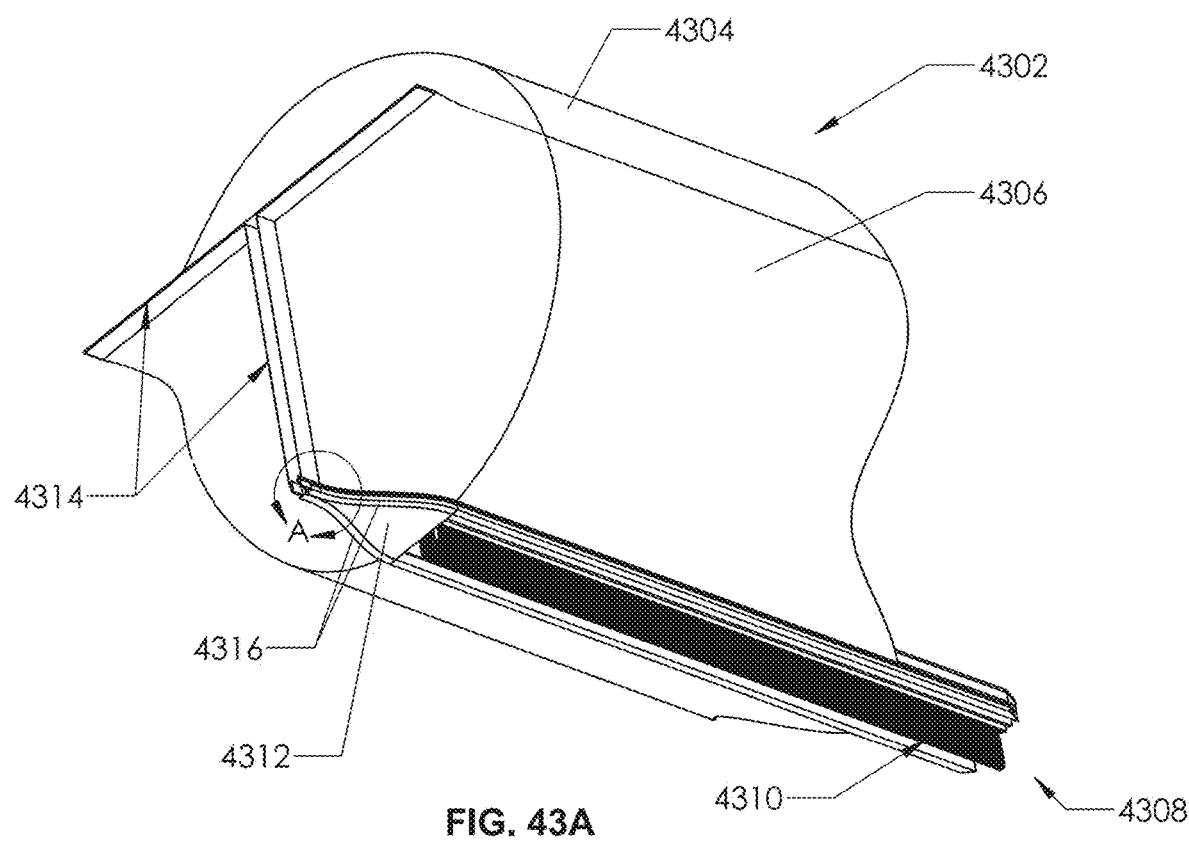
FIGS. 43A-43F show another method of attaching an inflatable tubular concentrator to a receiver heat sink and sealing its ends according to an embodiment of the present invention.

FIG. 43A shows a bottom isometric view of a tubular inflatable film solar concentrator system 4302. An upper film 4304 is joined to side films 4306 (one film 4306 on each side). Film 4304 may be a refractive concentrating film with embossed prisms (not shown). Side films 4306 may have different characteristics than film 4304. Films 4306 are joined to a receiver assembly 4308 which includes a heat sink 4310. Film holders 4316 are joined to and run the length of receiver assembly 4308. An end transition flange 4312 is attached to an end of receiver assembly 4308 and also attached to film holders 4316. End transition flange 4312 has a curved and tapered shape so that film holders 4316 may come together at one end while still being separated along the length of receiver assembly 4308. End transition flange 4312 may be sealed to receiver assembly 4308 and to film holders 4316 so that no air escapes between these components. Films 4306 are held on and sealed to film holders 4316 (see FIG. 43B). The end of the tube formed by films 4304 and 4306 is shown sealed in a different way than described in some of the previous figures. In some cases, refractive films such as 4304 may be damaged by folding or bending beyond a certain limit, but side films such as 4306 may be more flexible. FIG. 43A shows a T-seal 4314 that seals the end of system 4302 in a space equal to or narrower than the diameter of tube system 4302 without requiring refractive film 4304 to be tightly folded. T-seal 4314 may be a mechanical clamp system or it may be an adhesive bond, tape, weld, or other type of joint which prevents air from escaping out the end of system 4302. The circled area labeled "A" is shown enlarged in FIG. 43B.

Figure 43B:
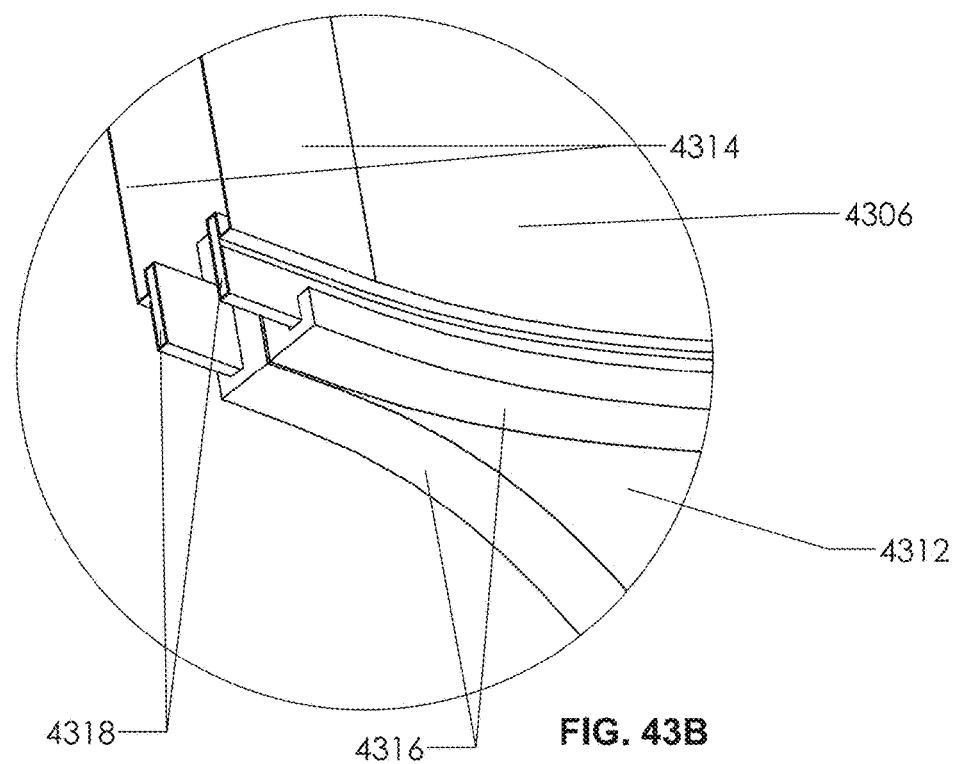

FIG. 43B shows a detail view of the circled area labeled "A" in FIG. 43A. In this view anchors 4318 can be seen. Anchors 4318 are joined to films 4306 and fit into slots on film holders 4316. The film installation procedure for system 4312 involves 1) sliding films 4306 and 4304 with anchors 4318 into film holders 4316 from one end and then 2) applying seals 4314 to each end of system 4302.

Figure 43C:
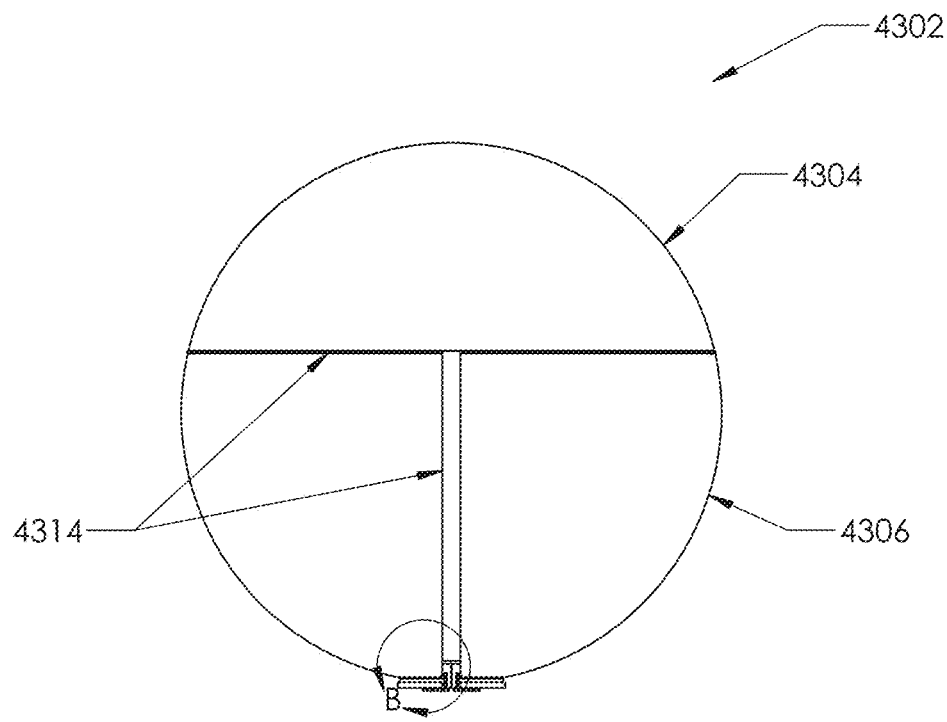
Figure 43D:
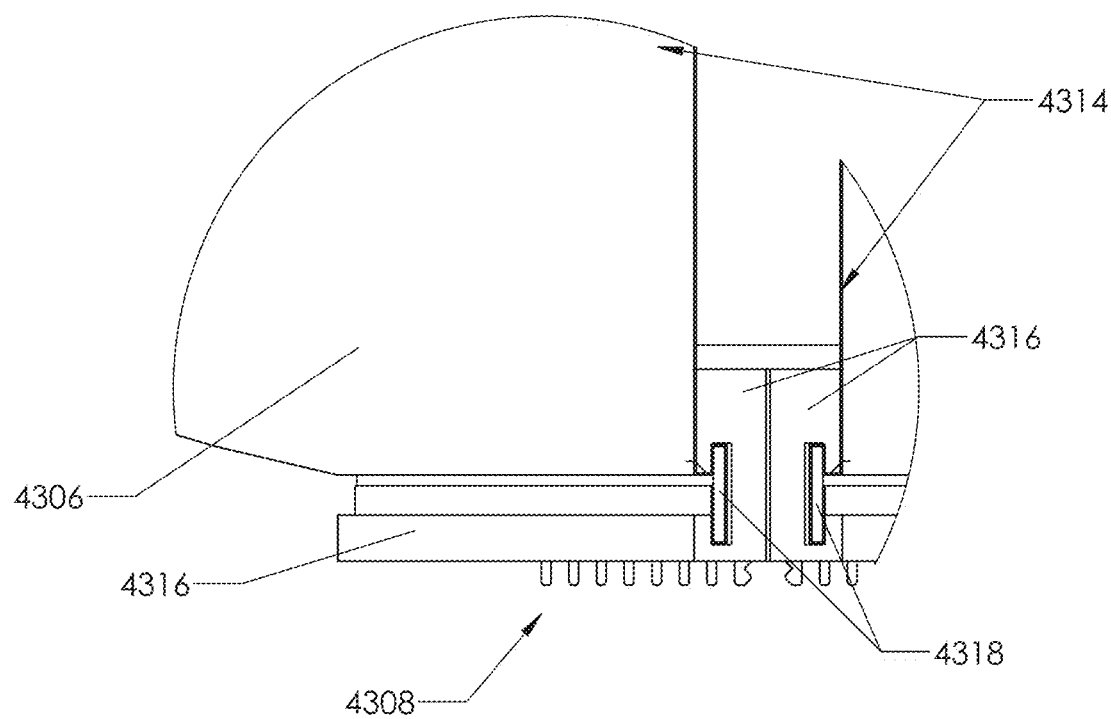
Figure 43E:
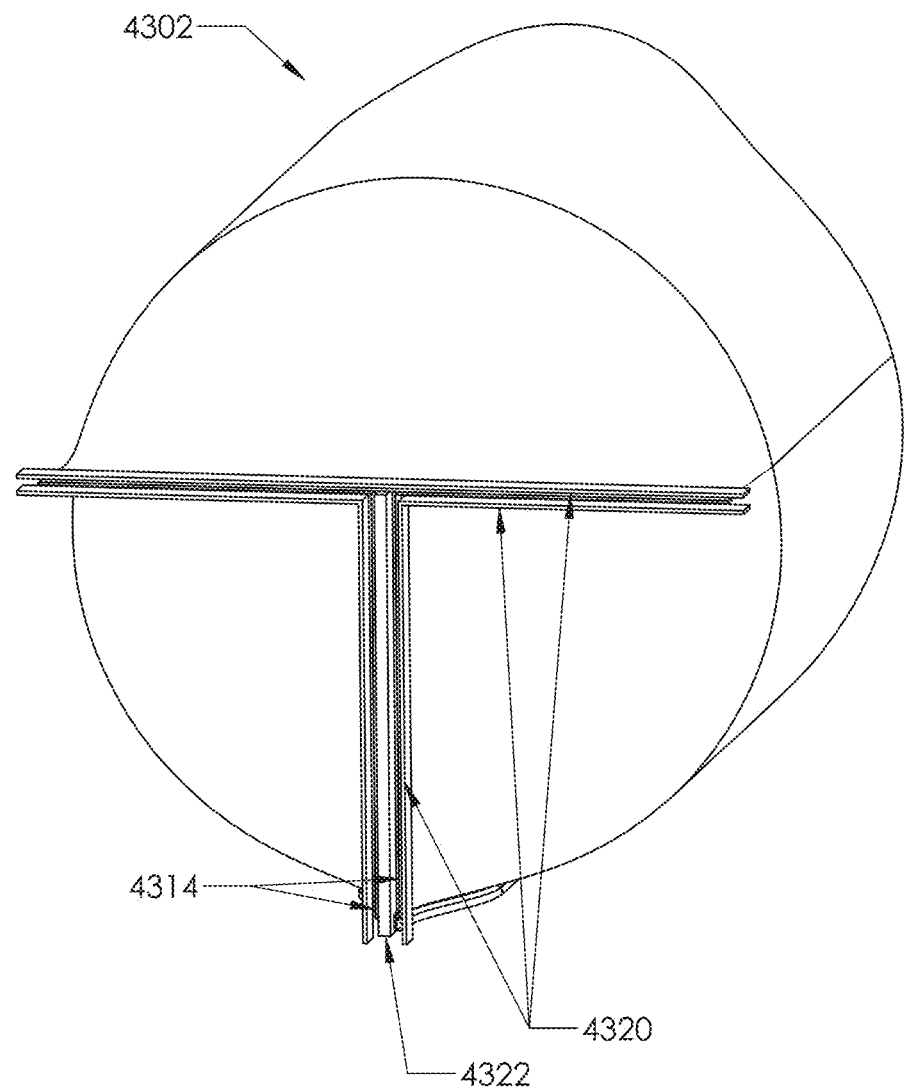
Figure 43F:
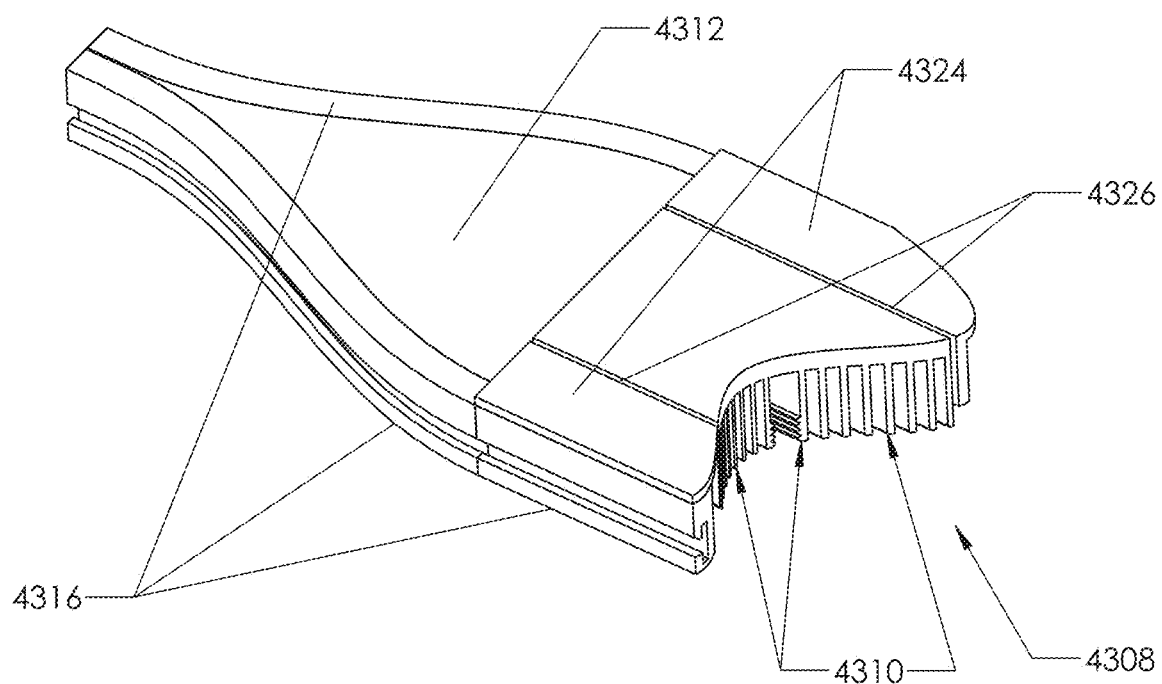

FIG. 43C shows an end view of system 4302. A detail circle labeled "B" is shown enlarged in FIG. 43D. FIG. 43D shows an enlarged view of the region labeled "B" in FIG. 43C. This view more clearly shows how films 4306 wrap around anchors 4318 and how anchors 4318 fit into channels in film holders 4316. FIG. 43E shows another view of the end of system 4302. This view shows optional seal clamping flanges 4320 and also an optional gasket member 4322 that may be useful in adding compliance and making a better seal. Seal 4314 is made in between flanges 4320 and around gasket 4322 (if present). FIG. 43F shows a partial cutaway 3D view of just receiver assembly 4308 without the films installed. This view more clearly shows channels in film holders 4316. This view also shows an insulating material 4326 between heat sink 4310 and film holders 4316 which limits heat transfer from heat sink 4310 to film holders 4316.

Figure 43G:
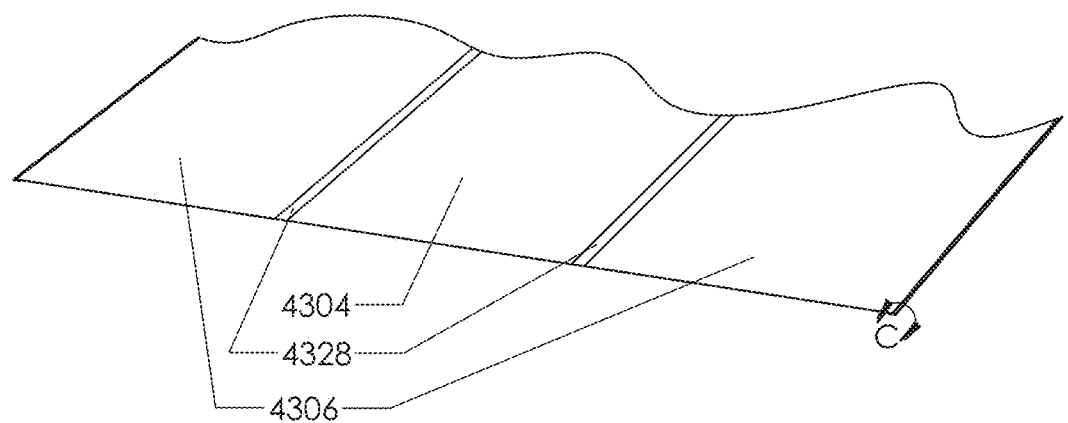
FIG. 43G shows construction of a film in flat form related to the method of FIGS. 43A-43F according to an embodiment of the present invention.
Figure 43H:
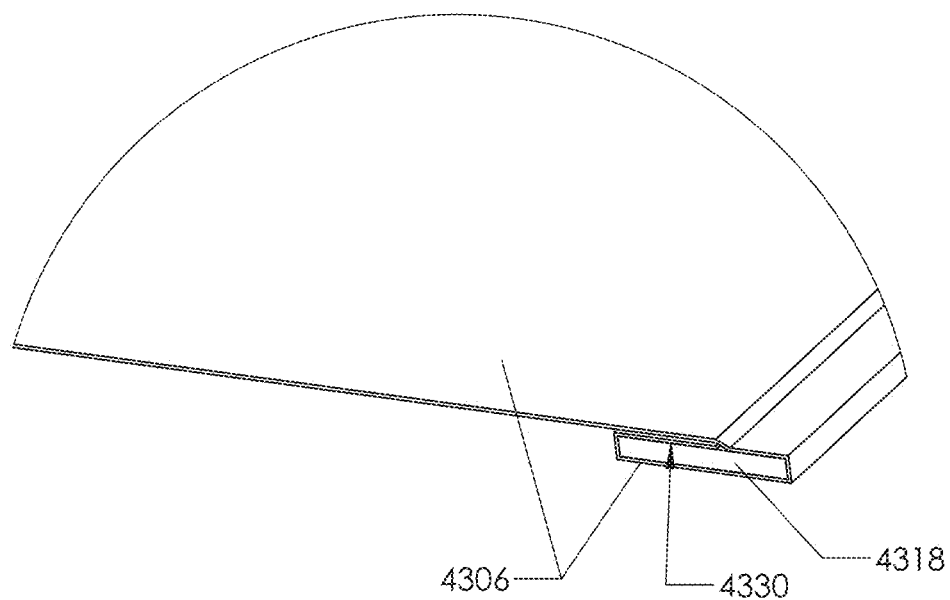
FIG. 43H shows a close-up view of the construction of an anchor feature for the film and attachment method of FIGS. 43A-43G according to an embodiment of the present invention.
Figure 43I:
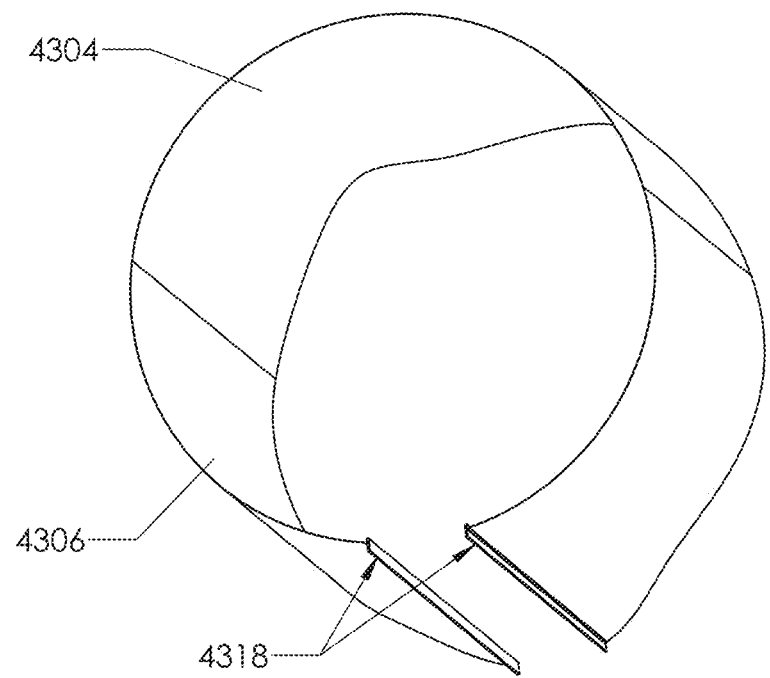
FIG. 43I shows the film of FIG. 43H when curved into a tubular configuration and before installation according to an embodiment of the present invention.
Figure 43J:
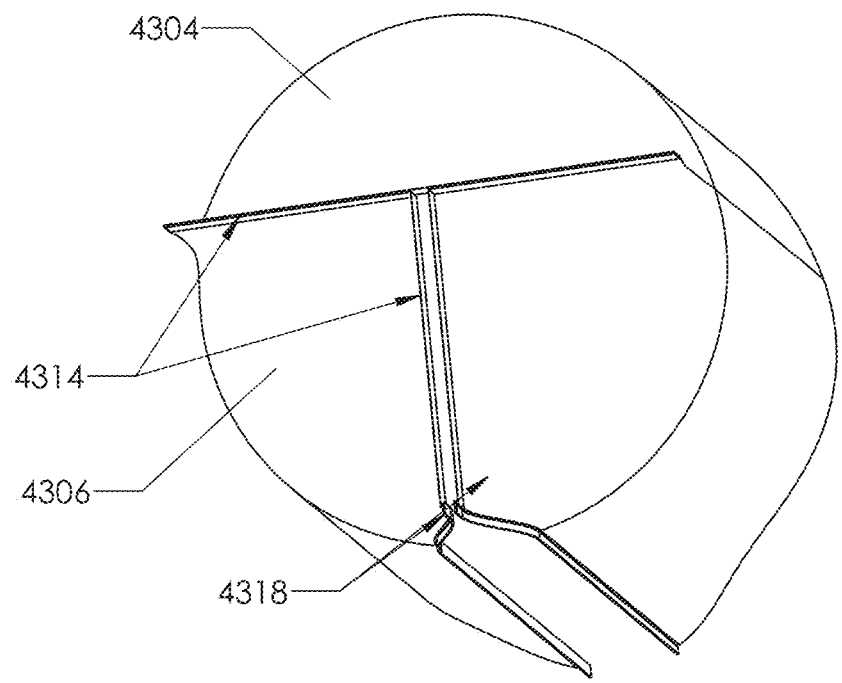
FIG. 43J shows the shape that the film of FIGS. 43H-43I takes when it is installed according to an embodiment of the present invention.

FIG. 43G shows construction of a film in flat form related to the method of FIGS. 43A-F. Films 4304 and 4306 are joined at 2 joint areas 4328 which may be heat seals, dielectric welds, ultrasonic welds, tape joints, chemical bonds, mechanical bonds or some other form of joints. FIG. 43H shows a close-up view of the construction of an anchor feature for the film and attachment method of FIGS. 43A-G. Side film 4306 is connected to anchor 4318 by wrapping around it, with an optional bond 4330 between film 4306 and anchor 4318. Bond 4330 may be a heat seal, adhesive bond, tape, RF weld, ultrasonic weld, glue or other form of bond. FIG. 43I shows the film of FIG. 43H when curved into a tubular configuration just before installation. FIG. 43J shows the shape that the film of FIGS. 43H-I takes when it is installed. Film holders 4316 and receiver assembly 4308 are not shown for clarity.

FIGS. 44A-44E show embodiments of solar concentrators that employ flexible cells mounted directly on the inflated concentrator film and/or receivers with minimal structure.

Figure 44A:
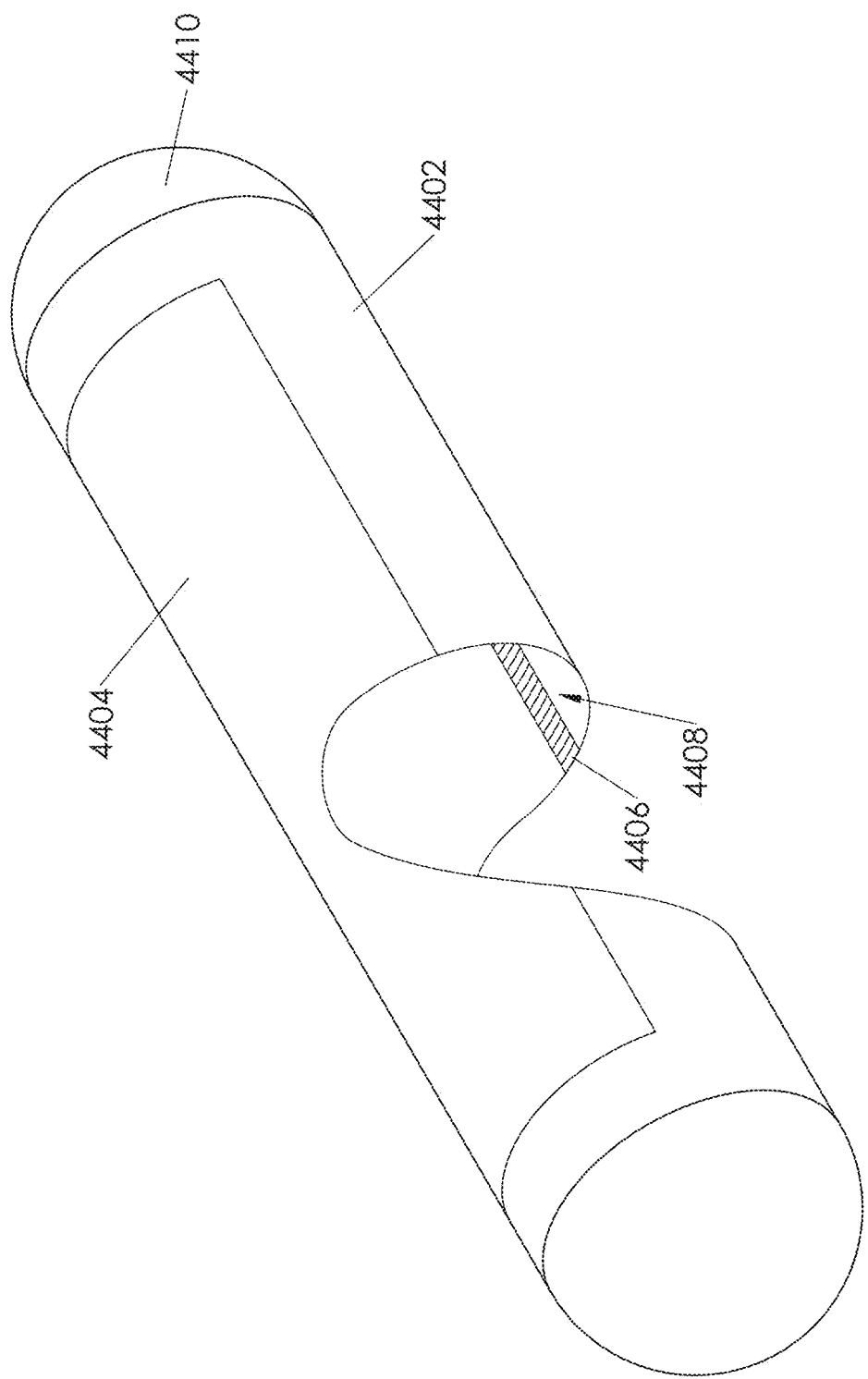
FIGS. 44A-44E show another method of inflatable tubular concentrator construction according to an embodiment of the present invention.

FIG. 44A shows a solar concentrator with an optically active film 4404, side film 4402, ends 4410, and a receiver 4408 made up of cells 4406. In this version, cells 4406 are mounted directly to film 4402. Cells 4406 may be mounted to film 4402 via a lamination process, using an adhesive, by heat sealing, sonic welding, RF welding or via a different bonding process or agent. Cells 4406 may or may not be coated with an encapsulant material such as ethyl vinyl alcohol (EVA), silicone or other encapsulant. Cells 4406 may be flexible so that they conform to the circular cross section that film 4402 naturally tends to assume, or they may be rigid and flat and film 4402 may conform to the shape of the cells.

Figure 44B:
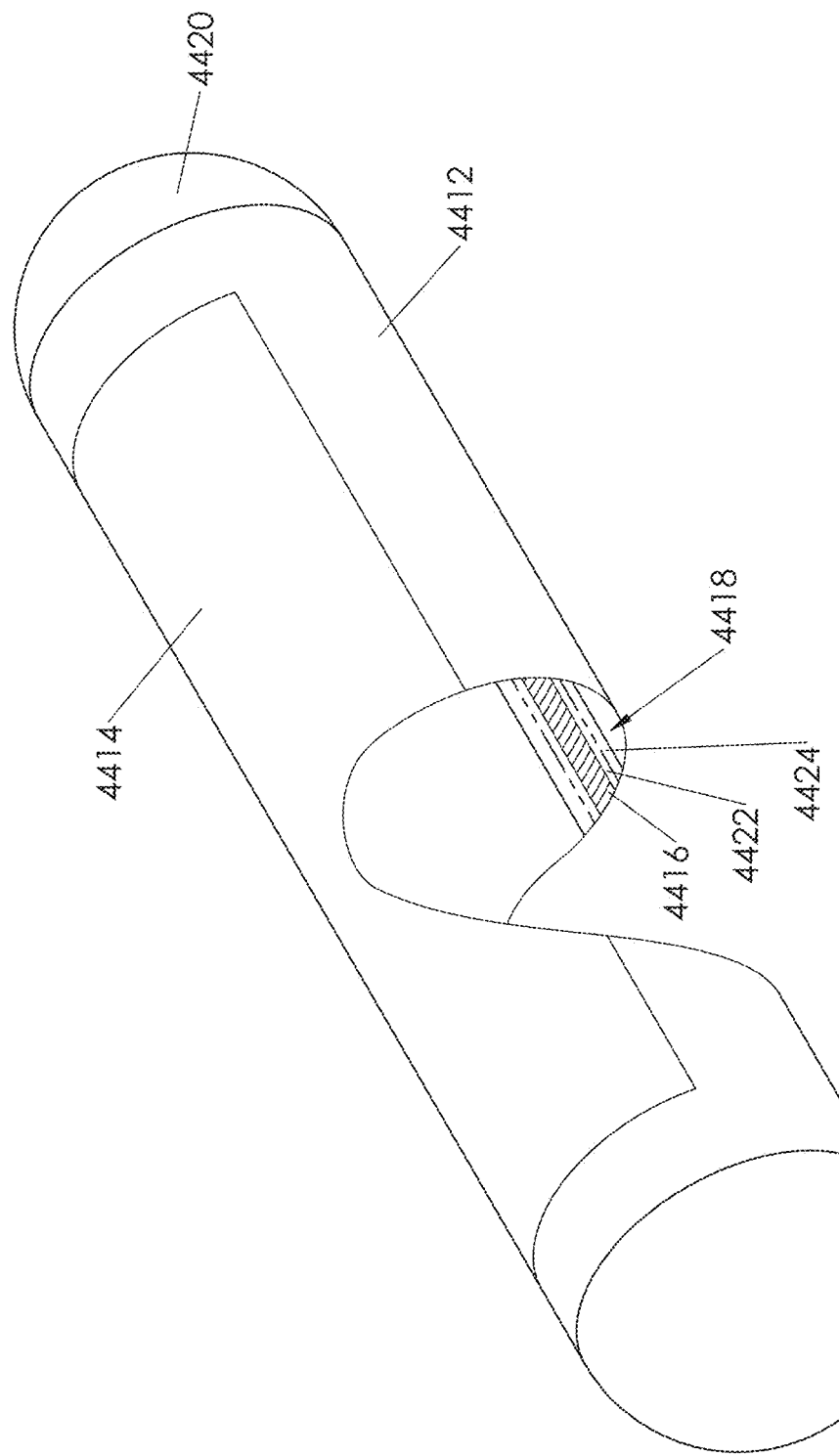

FIG. 44B shows another version of an inflated solar concentrator with a front optical film 4414, a side film 4412, ends 4420 and a receiver 4418 made up of cells 4416 and a carrier sheet 4422. In this case carrier sheet 4422 is attached to side film 4412 along a bond area 4424. Bond area 4424 may be an adhesive seal, heat seal, RF weld, tape joint, mechanical joint, clamped joint or other form of bond. Receiver 4418 may be removable from side film 4412 so that the concentrator films may be removed and replaced and the receiver 4418 may be reused. Carrier sheet 4422 may be a polymer film such as PET or PET laminate or another polymer, or it may be another material. Carrier sheet 4422 may also function as a heat sink. Carrier sheet 4422 may for example be made of aluminum and have fins (not shown) that protrude from the bottom in order to better transfer heat from the receiver to air outside the solar concentrator. It may also serve as a structural member in which case it could be made of steel or composite material. It may have ridges, corrugations or other features which enhance its strength or stiffness. Carrier sheet 4422 may have channels (not shown) in which fluid for active cooling could flow.

Figure 44C:
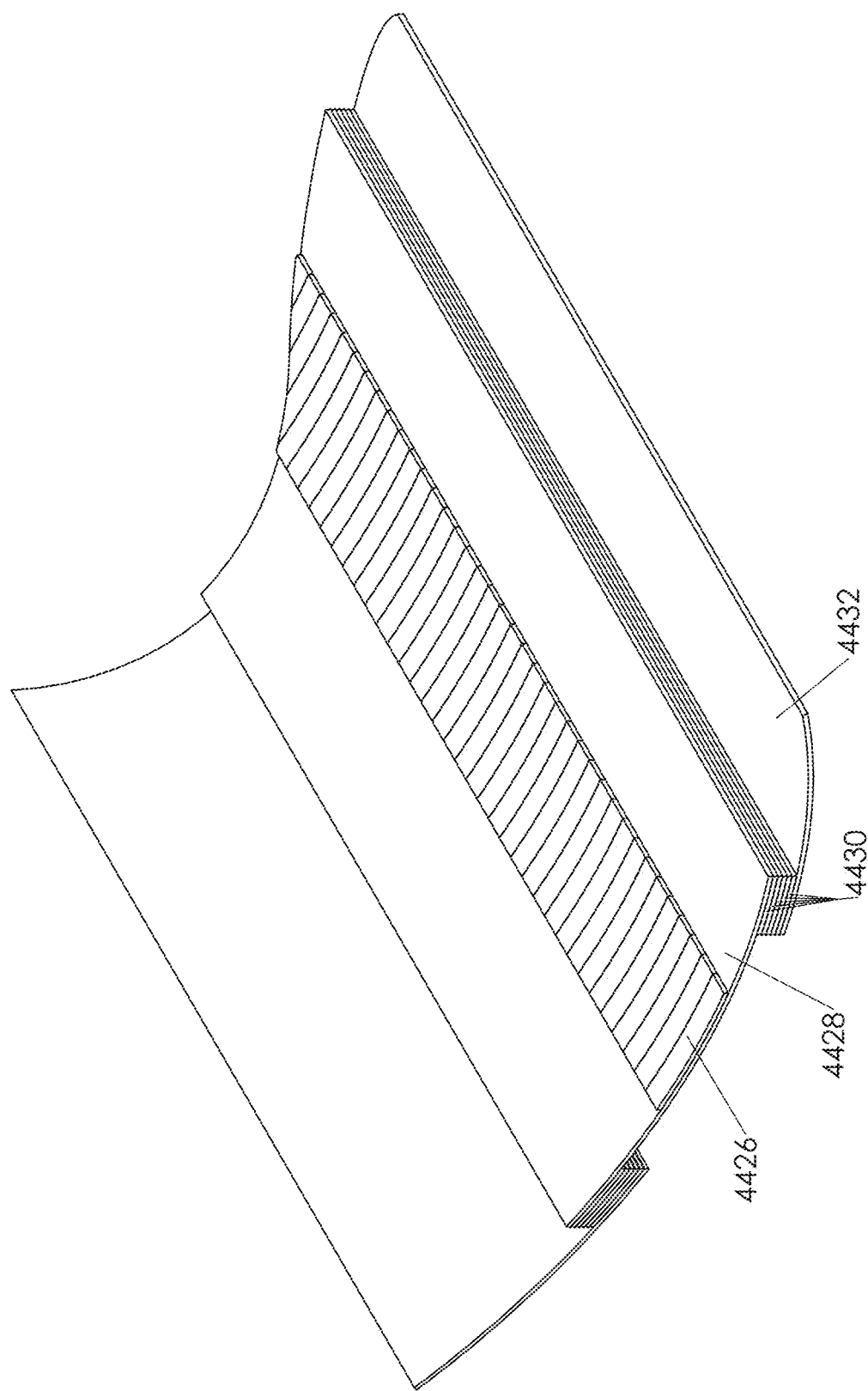

FIG. 44C shows a detail cutaway view of a version of a receiver and film for a solar concentrator after the film has been replaced several times. Cells 4426 and carrier sheet 4428 are attached to layers of old film 4430 that may remain after a film change. Old film layers 4430 are in turn attached to current side film 4432. During the next film change, side film 4432 would be cut away and would turn into another layer 4430 and another side film similar to 4432 would be attached. Carrier sheet 4428 may be a polymer or it may be a more traditional heat sink material such as a metal like aluminum or copper. It may have fins (not shown) to better transfer heat from the receiver to the air outside the concentrator. It may also serve as a structural member in which case it may be made of steel. It may have ridges, corrugations or other features which enhance its strength or stiffness. Carrier sheet 4428 may have channels (not shown) in which fluid for active cooling could flow.

Figure 44D:
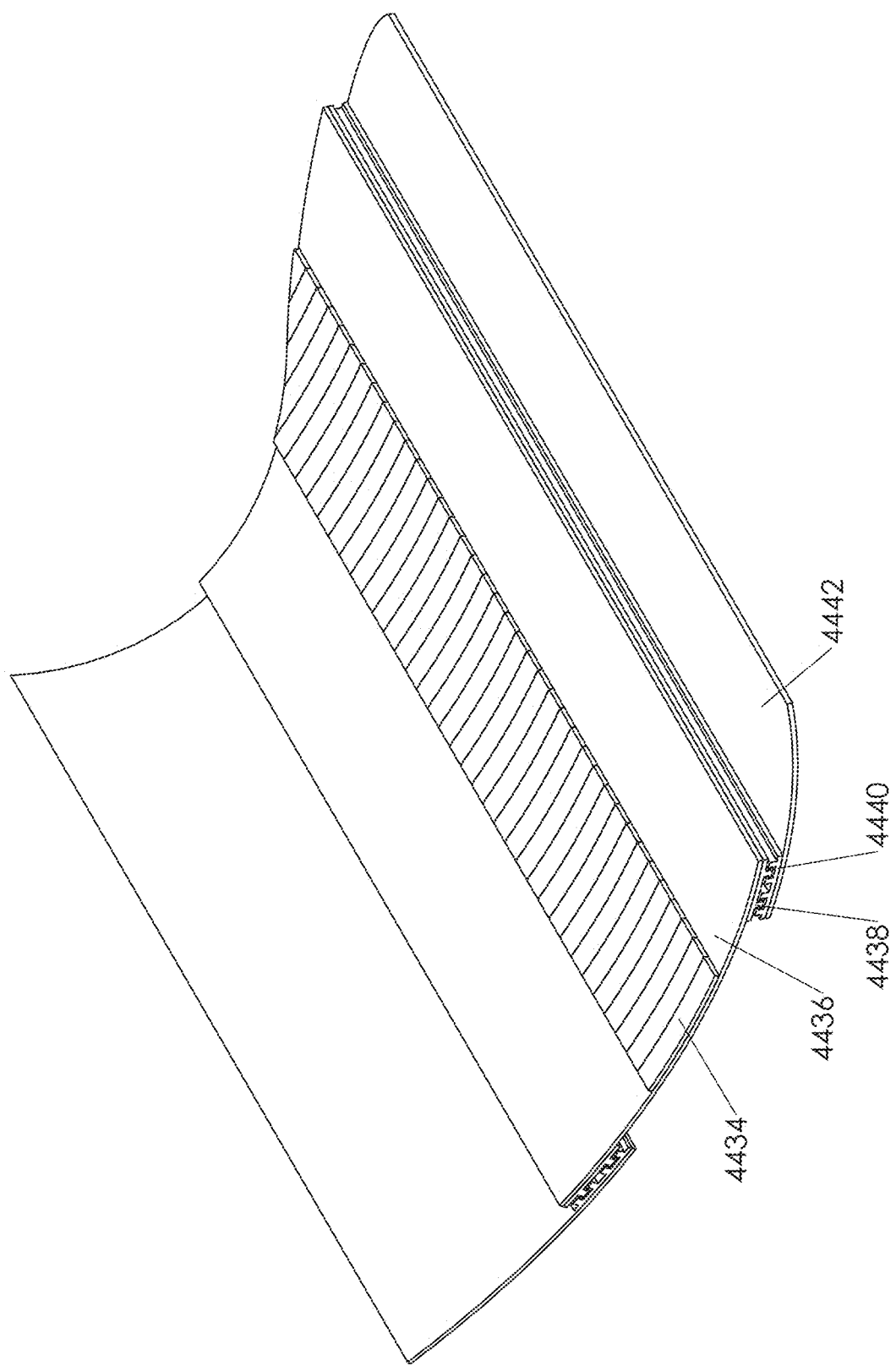

FIG. 44D shows a detail cutaway view of another version of a receiver and film arrangement for a solar concentrator. Cells 4434 are mounted to a carrier sheet 4436 which is in turn mounted to a side film or member 4442 via interlock connectors 4438 and 4440. Carrier sheet 4436 is bonded to interlock connectors 4438 and side film 4442 is bonded to interlock connectors 4440. Interlock connectors 4438 and 4440 have features which allow them to lock together to create a releasable mechanical connection and also optionally and air-tight seal (if the concentrator is to be inflated for example). With this arrangement, the side film 4442 (and the entire film construction including optical film which is not shown here) may be replaced as needed and the receiver and particularly cells 4434 may continue to be used for the extent of their lifetime (which may be greater than that of the films). Note that there are many possible types of interlock connectors 4438 and 4440. FIG. 44D shows schematic interlocking ridges that may be used to form both a mechanical connection and an air seal, but there are many other geometries or components that could be used. These include, but are not limited to zip-Loc® style features, plastic ridges and grooves, metal interlocking fingers, snaps, hook and loop fasteners, mechanical fasteners, screws, removable adhesives, strips of nano-scale interlocking features, zippers, interlocking hooks, and other bonds or interlocks. Carrier sheet 4436 may be a simple polymer sheet such as PET or a laminate of different polymers, or it may be a high-temperature polymer such as Kapton®, or it may be another material. In some embodiments, carrier sheet 4436 may also serve as a heat sink and may be made of a material with a high thermal conductivity such as aluminum alloy, magnesium alloy or copper. Carrier sheet 4436 may have longitudinal or transverse fins, pins or other features designed to enhance heat transfer from cells 4434 to the air outside the concentrator. Carrier sheet 4436 could also be made of steel or stainless steel, and could be made very thin so as to be flexible, or it could be made thicker or with ribs, corrugations or other features so that it enhances the stiffness of the concentrator structure.

Figure 44E:
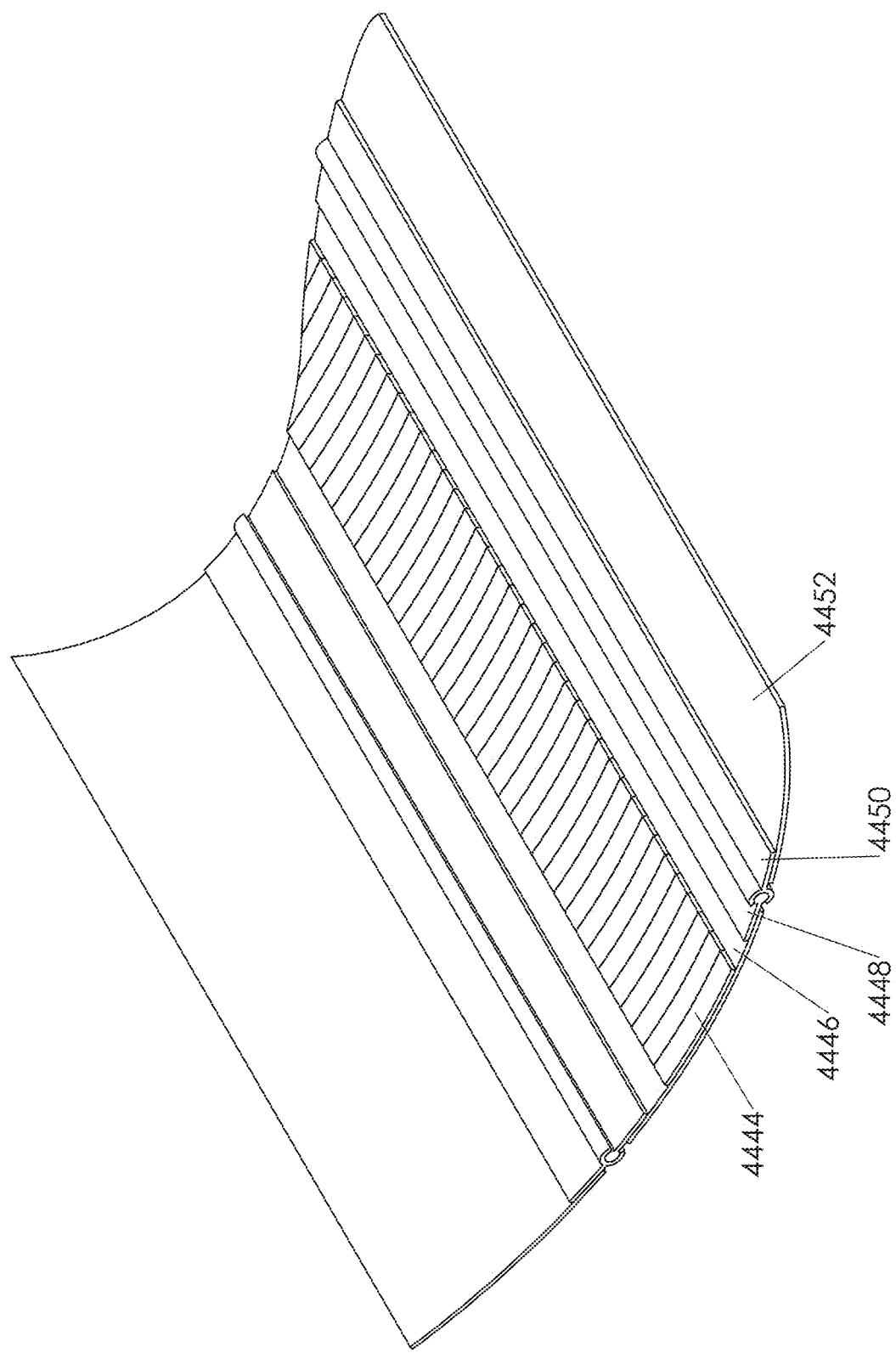

FIG. 44E shows a detail cutaway view of another version of a receiver and film arrangement for a solar concentrator. Cells 4444 are mounted to a carrier sheet 4446 which is in turn mounted to a side film or member 4452 via interlock connectors 4448 and 4450. Carrier sheet 4446 is bonded to interlock connectors 4448 and side film 4452 is bonded to interlock connectors 4450. Interlock connectors 4448 and 4450 have features which allow them to lock together to create a releasable mechanical connection and also optionally and air-tight seal (if the concentrator is to be inflated for example). Connectors 4448 have a circular cross section bead shape which slides into or snaps into a mating female "C" channel cross section shape of connector 4450. With this arrangement, the side film 4452 (and the entire film construction including optical film which is not shown here) may be replaced as needed and the receiver and particularly cells 4444 may continue to be used for the extent of their lifetime (which may be greater than that of the films). Carrier sheet 4446 may be a simple polymer sheet such as PET or a laminate of different polymers, or it may be a high-temperature polymer such as Kapton®, or it may be another material. In some embodiments, carrier sheet 4446 may also serve as a heat sink and may be made of a material with a high thermal conductivity such as aluminum alloy, magnesium alloy or copper. Carrier sheet 4446 may have longitudinal or transverse fins, pins or other features designed to enhance heat transfer from cells 4444 to the air outside the concentrator. Carrier 4446 could also be made of steel or stainless steel, and could be made very thin so as to be flexible, or it could be made thicker or with ribs, corrugations or other features so that it enhances the stiffness of the concentrator structure.

Figure 45:
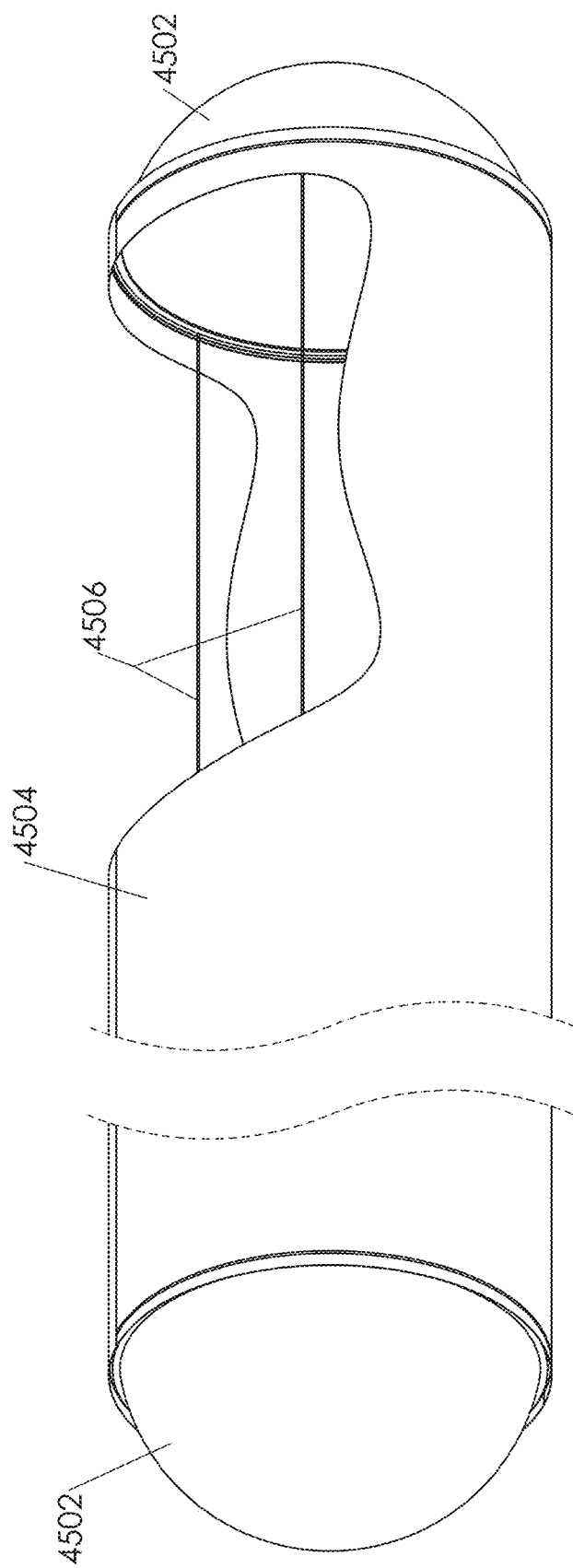
FIG. 45 shows an inflated tubular solar concentrator with endcap seals and internal cables according to an embodiment of the present invention.

FIG. 45 shows another variation of an inflated tubular solar concentrator construction. Endcaps 4502 may be removable from film 4504, so that film 4504 may be replaced. A partial cutaway of film 4504 is shown so that internal cables or rods 4506 are visible. Cables 4506 connect to endcaps 4502 and resist forces created by gas pressure inside the concentrator system which would tend to push endcaps 4502 apart and out of the concentrator.

Figure 46A:
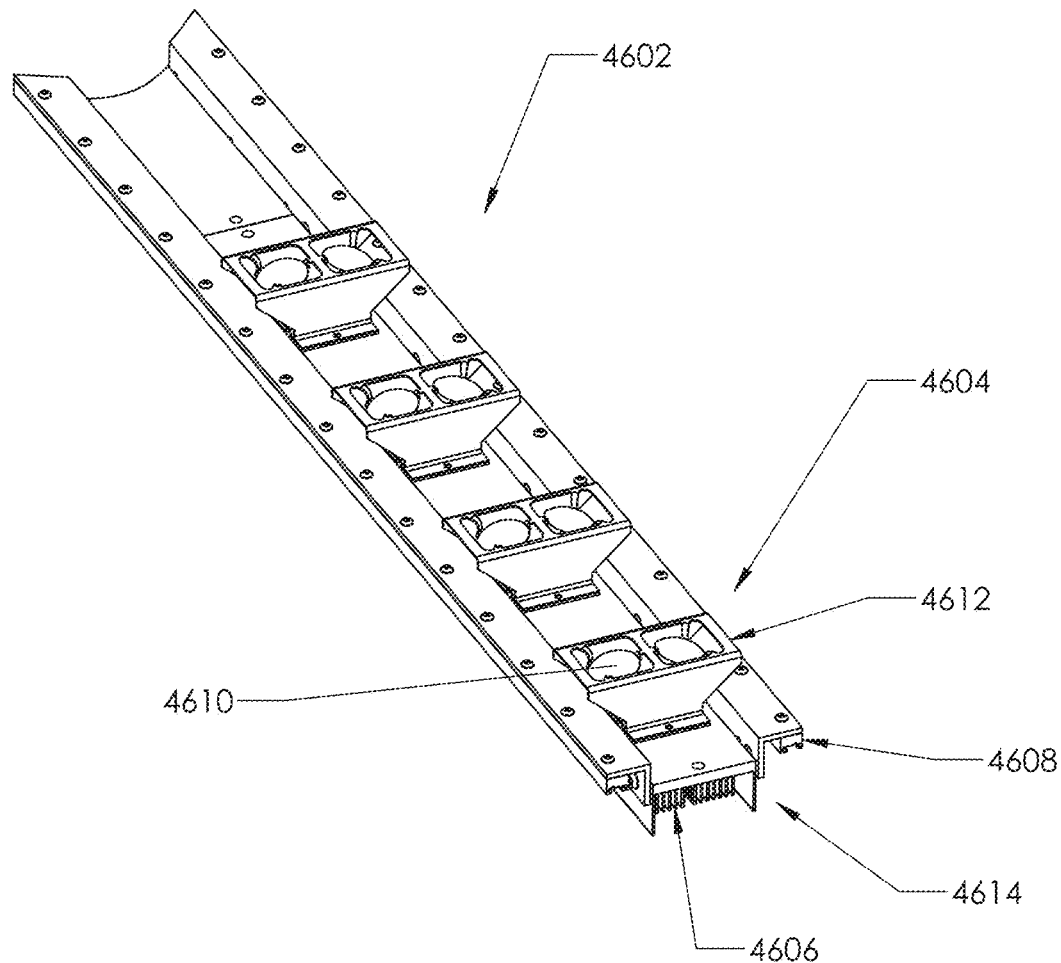
FIG. 46A shows a solar receiver with heat sink and secondary optics according to an embodiment of the present invention.
Figure 46B:
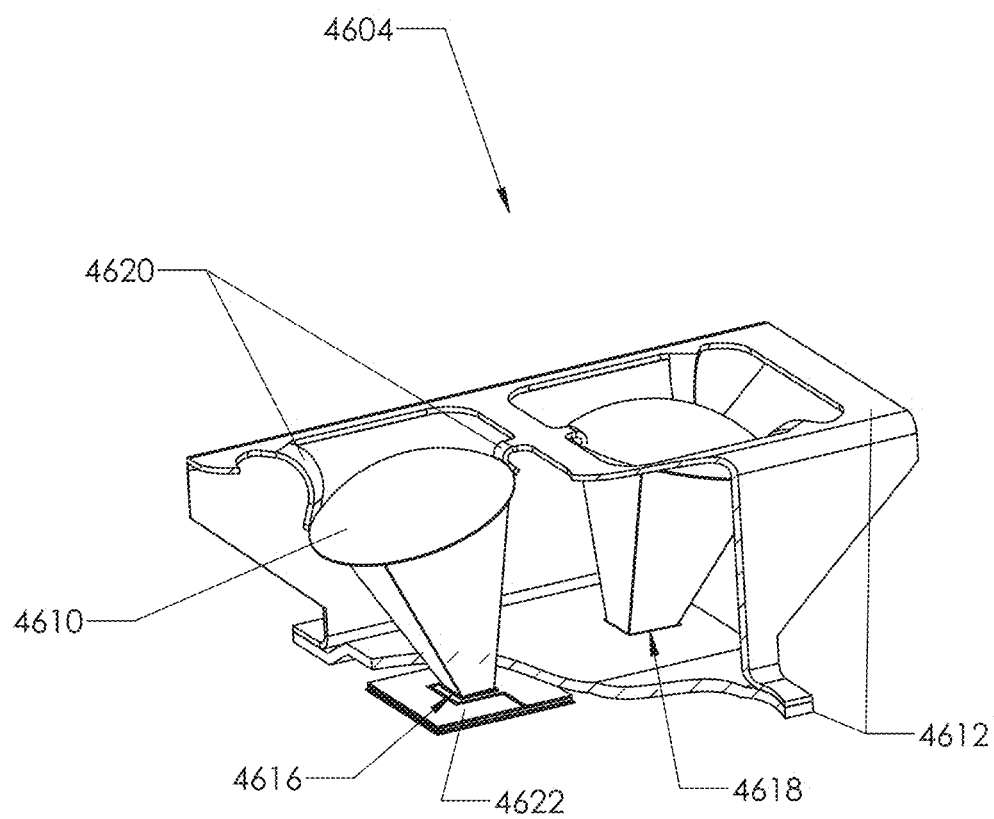
FIG. 46B shows a close-up cutaway view of a secondary optic, holder, and cell for the receiver of FIG. 46A.

FIGS. 46A and 46B shows a solar receiver with secondary optics and heat sinks according to an embodiment of the present invention.

FIG. 46A shows receiver assembly 4602 truncated for clarity. Receiver assembly 4602 includes a heat sink 4606 which may also serve as a primary structural element for receiver assembly 4602. A number of cell assemblies 4604 are attached to heat sink 4606. The parts of the cell assemblies visible in this figure are secondary optics holders 4612 and secondary optics 4610. Secondary optics 4610 are made from optical glass, quartz, silicone or other transparent optical material capable of handling highly concentrated sunlight. Secondary optics 4610 may typically have an entrance aperture at which reflection is generally minimized and also a total internal reflection (TIR) section which serves to create additional concentration as well as to homogenize the light on the cell (not shown) and change its direction if necessary so that it will hit the cell. Holder 4612 serves to align secondary optics 4610 to the cells and also to the incoming patches of concentrated sunlight created by the primary (not shown). Film holders 4608 are attached to receiver assembly 4602, with an optional insulating material 4614 between them and heat sink 4606 to limit heat transfer to film holder 4608.

FIG. 46B is a partial cutaway view of a cell assembly 4604. Cell assembly 4604 includes secondary optics 4610, secondary optic holder 4612, substrate 4622 and cell 4616. Substrate 4622 has mechanical and electrical connections for cell 4616. Secondary optic holder 4612 may have a lower opening 4618 which aligns the base of a secondary optic 4610 with its respective cell 4616. Secondary optic holder 4612 may also have spring tabs 4620 which serve to align the entrance aperture of a secondary optic 4610 and also to mechanically restrain it while compensating for variations in part tolerances. Cell assembly 4604 is shown here with two secondary optics 4610 and two cells 4616, however in other in other variations it may only have one or it may have more than two of both secondaries and cells.

Figure 47A:
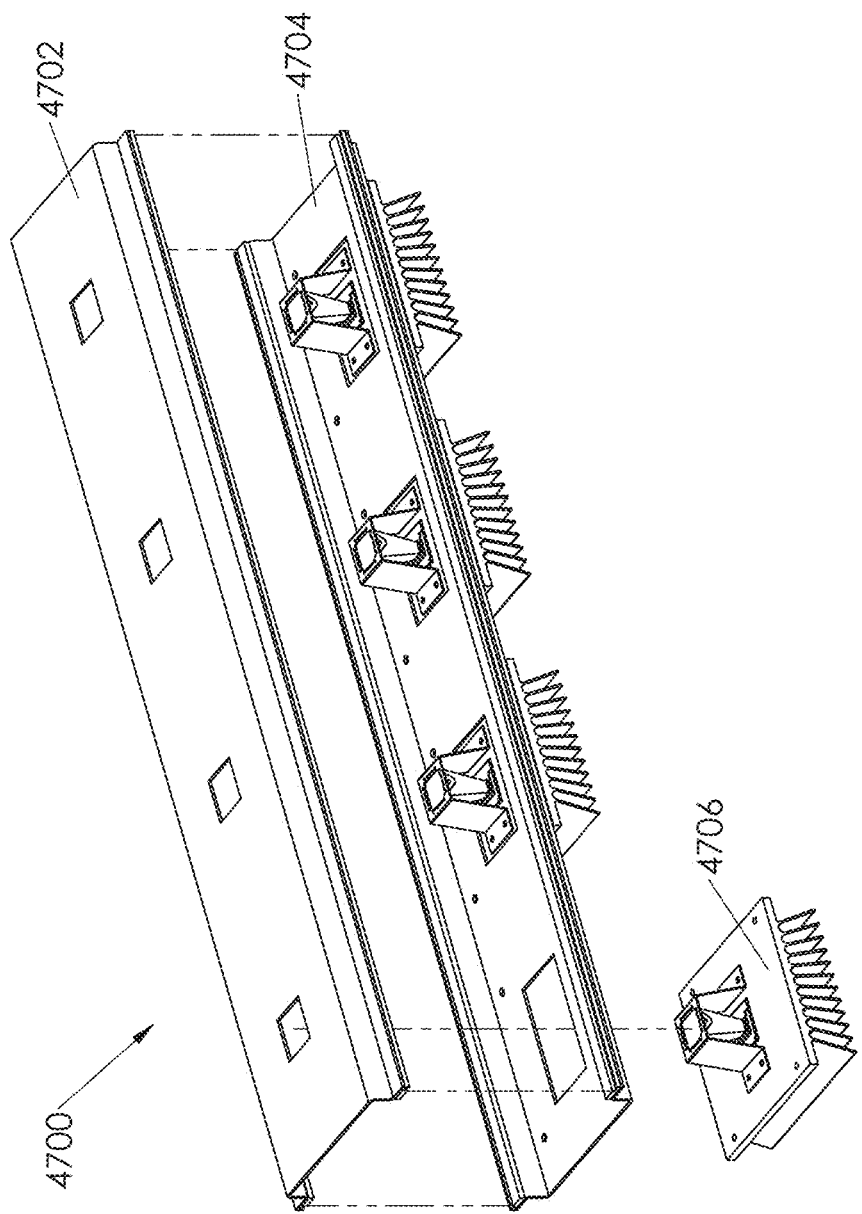
FIGS. 47A-47C show another embodiment of a solar receiver with secondary optics and heat sinks according to an embodiment of the present invention.
Figure 47B:
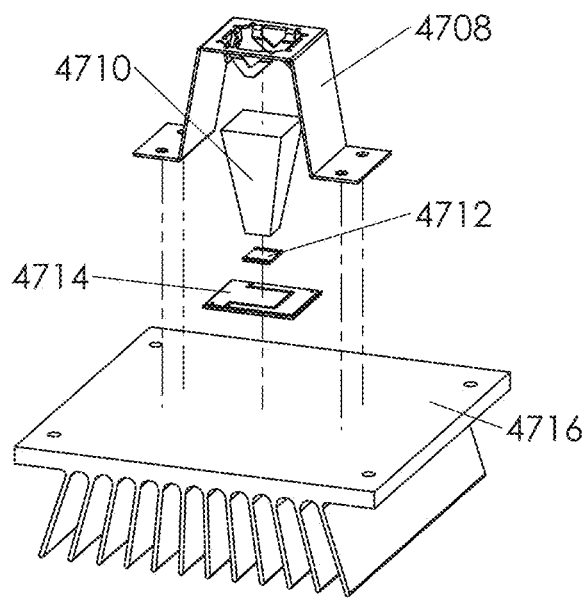
Figure 47C:
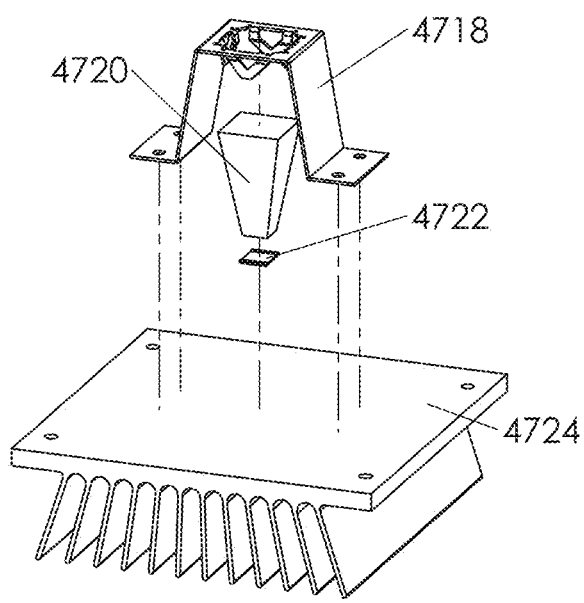

FIGS. 47A-C show details of another receiver assembly that uses individual heat sink and cell assemblies that join to a carrier chassis according to an embodiment of the present invention.

FIG. 47A shows an exploded view of a receiver assembly 4700. A top chassis 4702 is joined to a bottom chassis 4704 to create a stiff, effectively tubular structure. Individual cell assemblies 4706 are each joined to lower chassis 4704 and each protrude through a respective hole in bottom chassis 4704. Cell assemblies 4706 may be joined to lower chassis 4704 in a number of ways including adhesive, welding, or mechanical fastening. Light reaches the individual cell assemblies 4706 through apertures in the upper chassis 4702. Cell assemblies 4706 may or may not be joined to upper chassis 4702 at the perimeter of the apertures. If the cell assemblies 4706 are joined to the upper chassis 4702, then receiver 4700 may become a sealed or semi-sealed unit which has the benefits that liquid water may be kept away from the cell and electrical conductors and also exposure of people to high voltage components can be avoided. It may be desirable to include a breathable moisture barrier (not shown) somewhere in the perimeter of receiver assembly 4700 to allow the pressure inside receiver assembly 4700 to equalize with the pressure outside, but without allowing liquid water to pass inside. Upper chassis 4702 and lower chassis 4704 may be formed from steel or other material with a moderate coefficient of thermal expansion (CTE), even though individual heat sinks may be made from aluminum or other material with a higher CTE. Such a scheme may avoid potential problems posed by long lengths of receiver with continuous aluminum (or other high CTE) as the primary structural member. Note that many different materials could be used for the upper and lower chassis. It may be of particular interest for inflated film-based concentrators to match the net expansion at operating temperature of the chassis components with the expected expansion of the primary optic films at their operating temperature.

FIG. 47B shows an exploded view of one embodiment of a cell assembly. A heat sink 4716 serves as a structural base for the assembly. A cell 4712 is electrically and mechanically attached to a substrate 4714 which is in turn attached (at least thermally coupled) to heat sink 4716. A secondary optic 4710 has an entry aperture (top face) and angled sides which allow total internal reflection (TIR) to concentrate, homogenize and guide incoming light. Optic 4710 is placed on top of cell 4712, with an optional optical coupling agent such as a silicone or other compound formulated to withstand highly concentrated sunlight. A holder 4708 captures optic 4710, aligns it to cell 4712 and substrate 4714 and keeps it in place on heat sink 4716. Holder 4708 may or may not include compliant elements ("fingers") to ensure contact and accommodate component tolerance variations.

FIG. 47C shows another variation of a cell assembly that does require a substrate. Instead, a cell 4722 may be bonded (thermally or mechanically or both) directly to a heat sink 4724. Secondary optic 4720 and holder 4718 are similar in structure and function to their analogous components in FIG. 47B. An advantage of bonding cell 4722 directly to heat sink 4724 is that cell 4722 may be able to operate at a lower temperature for a given incident power because heat transfer to heat sink 4724 may be enhanced. A thermal grease, or thermally conductive adhesive or both may be used between cell 4722 and heat sink 4724. In some embodiments, a material having a thermal conductivity between 0.005 W/m-k and 180 W/m-k may be used in the grease/adhesive. It may be advantageous to use grease or a low-modulus adhesive so that stresses in cell 4722 due to CTE mismatch may be minimized. Two other schemes that may be considered: 1) a "dot" of adhesive in the center of cell 4722 surrounded by a ring of thermal grease out to the edges of cell 4722 may be employed to both retain the cell while allowing its corners to float or expand and contract as needed. 2) The perimeter of the cell may be bonded with adhesive while the center may be covered by thermal grease. This would restrain the perimeter of the cell and prevent grease from escaping, while allowing the center of the cell to move to mitigate stresses.

Figure 48A:
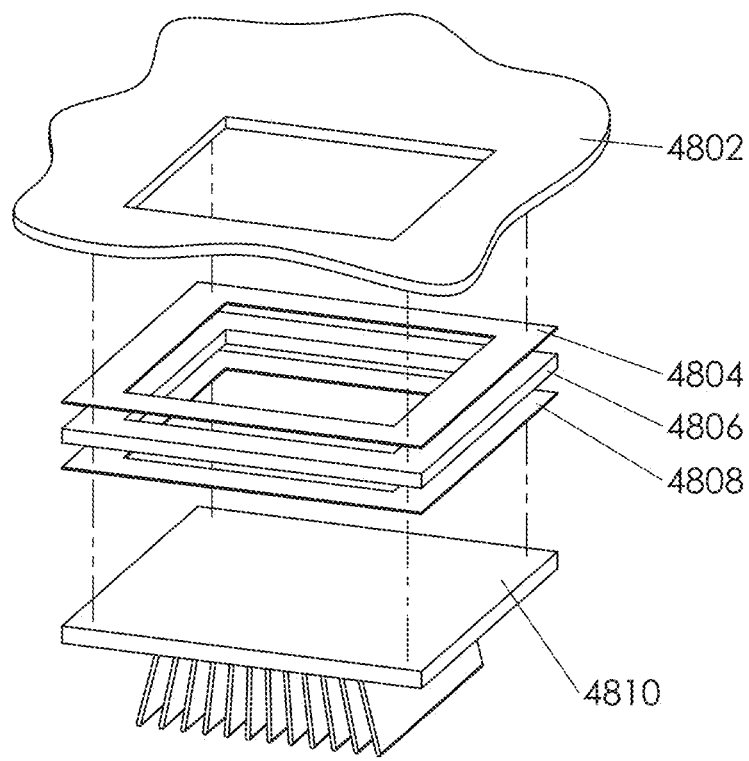
FIGS. 48A-48D show an embodiment of a solar receiver chassis thermally insulated from heat sinks according to an embodiment of the present invention.
Figure 48B:
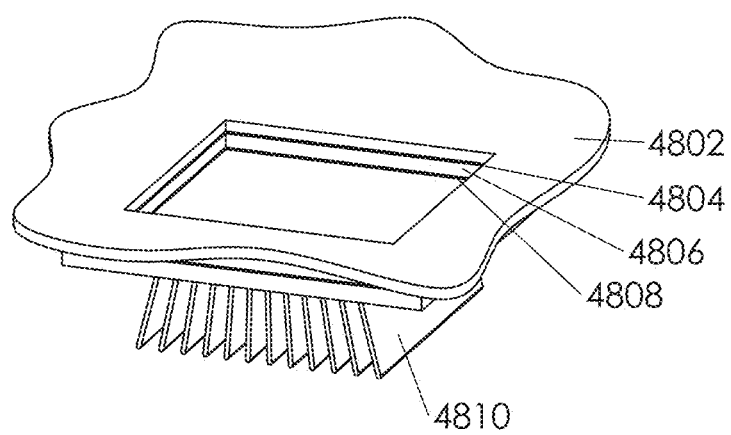
Figure 48C:
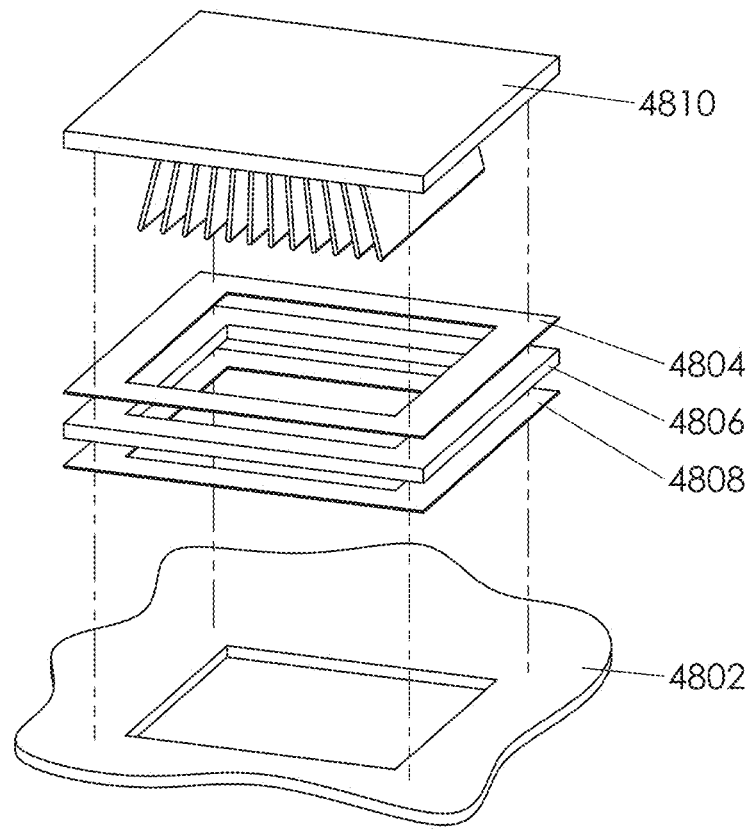
Figure 48D:
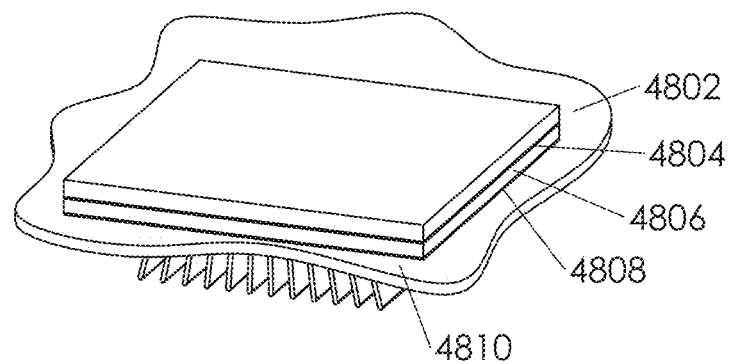

FIGS. 48A-48D show a parts of a partial receiver assembly including thermal insulation according to an embodiment of the present invention. FIG. 48A shows an exploded view of a partial receiver assembly similar to that of FIG. 47. The cell and secondary are omitted for clarity. Heat sink 4810 mounts from below to lower receiver chassis 4802. An insulating material 4806 such as a foamed isocyanurate, or filled or foamed epoxy or silicone filled with glass spheres ("microballoons") or other insulating material is mounted between heat sink 4810 and lower chassis 4802. Insulating material 4806 may be mounted or sealed with adhesive or sealant layers 4804 and 4808. FIG. 48B shows the receiver assembly of FIG. 48A assembled. FIG. 48C shows a receiver assembly variation. This assembly is similar to that of FIG. 48A except that heat sink 4810 mounts to lower chassis 4802 from the top instead of from the bottom. FIG. 48D shows the receiver assembly of FIG. 48C assembled.

FIGS. 49A-49F show another tubular solar concentrator design and associated frame and tracking system according to an embodiment of the present invention.

Figure 49A:
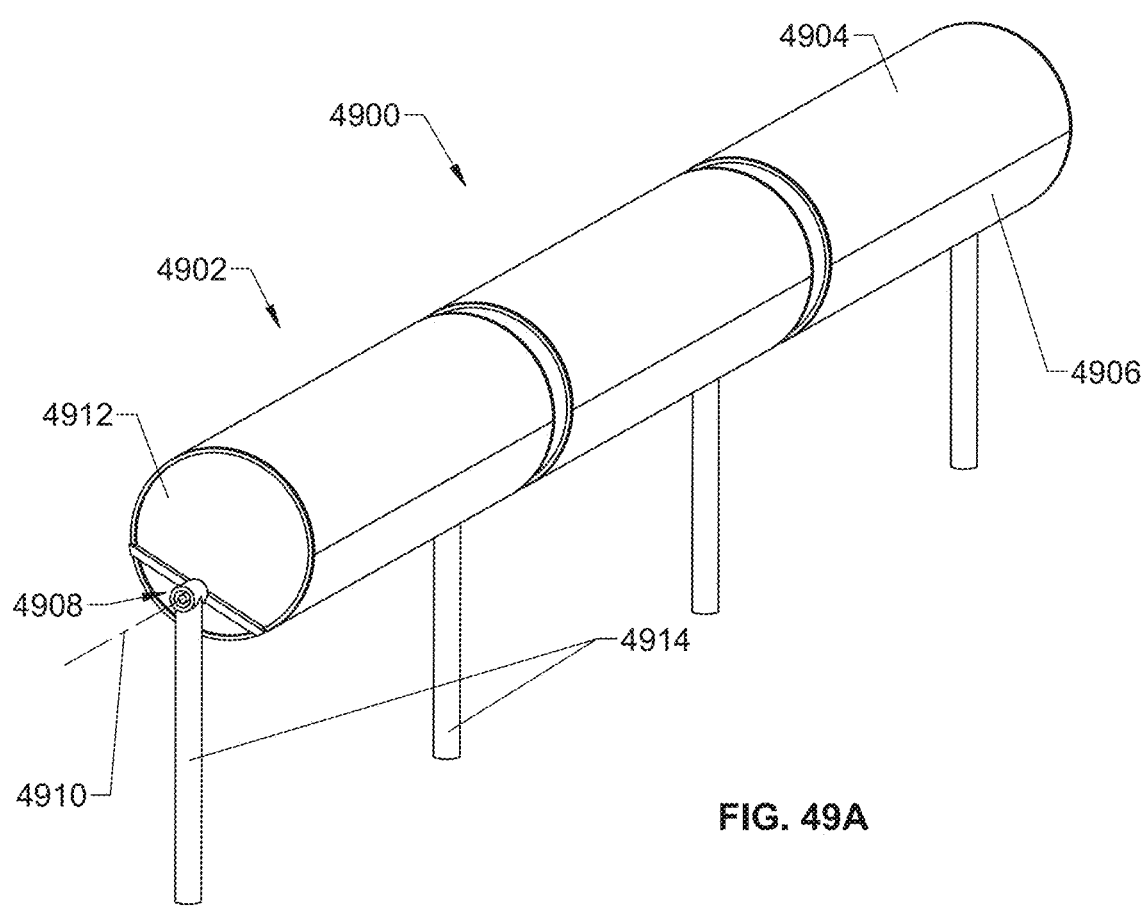
FIGS. 49A-49D show partial cross section views of variations of another solar concentrator and tracking system according to an embodiment of the present invention.

FIG. 49A shows an isometric overview of a solar concentrator and tracking system 4900. Three individual tubular concentrators 4902 are shown mounted to a simple base frame and tracking system 4914 to form a row of repeating units. In practice, any number of concentrators 4902 and tracker units 4914 may be connected together to form a system 4900 of arbitrary length. Each tubular concentrator 4902 has a refractive front film 4904, one or more side film(s) or membrane(s) 4906, end cap(s) 4912, and pivot joints 4908 which define a pivot axis 4910. System 4900 may be installed so that pivot axes 4910 runs north-south, or east-west, or at a different orientation. Frame and tracker 4914 may be anchored to the ground via ground screws or footings, or it may be simply held in place by sufficient ballast weight. Frame and tracker 4914 may include adjustment mechanisms (not shown) for accommodating un-even ground while maintaining pivot axes level and/or collinear. Concentrators 4902 may be made to rotate about pivot axes 4910 by a simple actuator (not shown) that applies a torque to them with respect to frame 4914. Axes 4910 may be located at approximately the center of gravity of concentrators 4902 so that actuation loads may be minimized. System 4900 has features which enable it to be used with concentrating refractive optics. While 1-D concentrating reflective trough type systems are able to operate with a 1-axis tracker without excessive energy losses, 1-D refractive optics would conventionally require a 2-axis tracking system because their region of focus would move substantially away from the plane of the receiver if they were used on a conventional 1-D tracking system. This would cause the receiver to be positioned away from the region of tight focus and would result in light missing the receiver. However, 1-axis trackers can be mechanically simpler and can enable a higher system power rating per area of land used than 2-axis trackers, and it would be desirable to use a refractive system on a 1-axis tracker if possible. The system described in FIGS. 49A-F makes it possible to use refractive optics in a system that has only a single pivot axis and has the benefits of simplicity and packing density of traditional 1-axis trackers, while adding only minor additional components.

Figure 49B:
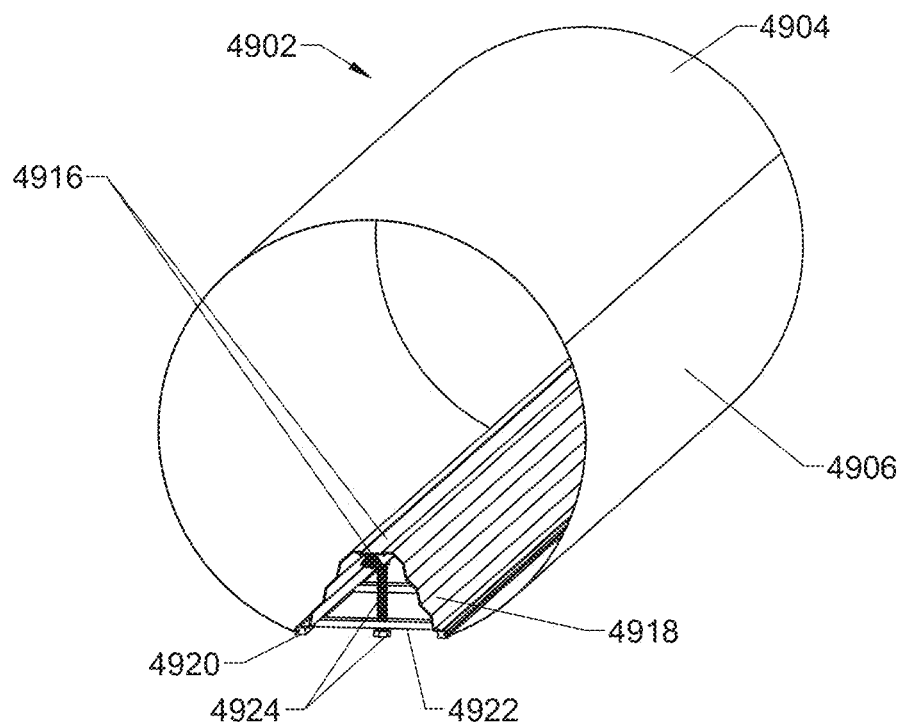

FIG. 49B shows a view of one concentrator 4902 with endcaps removed for clarity. Concentrator system 4902 keeps a receiver assembly 4916 in the plane of focus for most or all incident light angles by moving the plane of receiver assembly 4916 up and down as needed. Motion of receiver 4916 is accomplished via actuator screws 4924 which act on threaded crossbars 4922 to change the distance between receiver 4916 and the plane of film attachment defined by crossbars 4922 and film holders 4920. There are many mechanisms and types of actuators that can be used to move the receiver. This particular version depicts a screw arrangement which could be turned by a motor (not shown), but linkages, sliders, inflatable actuators, hydraulics, linear motors, rack and pinion sets and many other actuator types are also possible. Side films 4906 are attached to film holders 4920. Film holders 4920 are also attached to and sealed to expanding webs 4918 which are in turn attached and sealed to receiver 4916. Expanding webs 4918 may have a bellows or accordion-like shape, or they may be made of an elastic material that stretches as needed, or they may be constructed of multiple sealed but sliding leaves to allow the required expansion as receiver 4916 moves. Crossbars 4922 maintain the appropriate distance between film holders 4920 on each side so that receiver 4916 can be moved while the overall shape of concentrator 4902 and in particular the shape of refractive film 4904 remains constant.

Figure 49C:
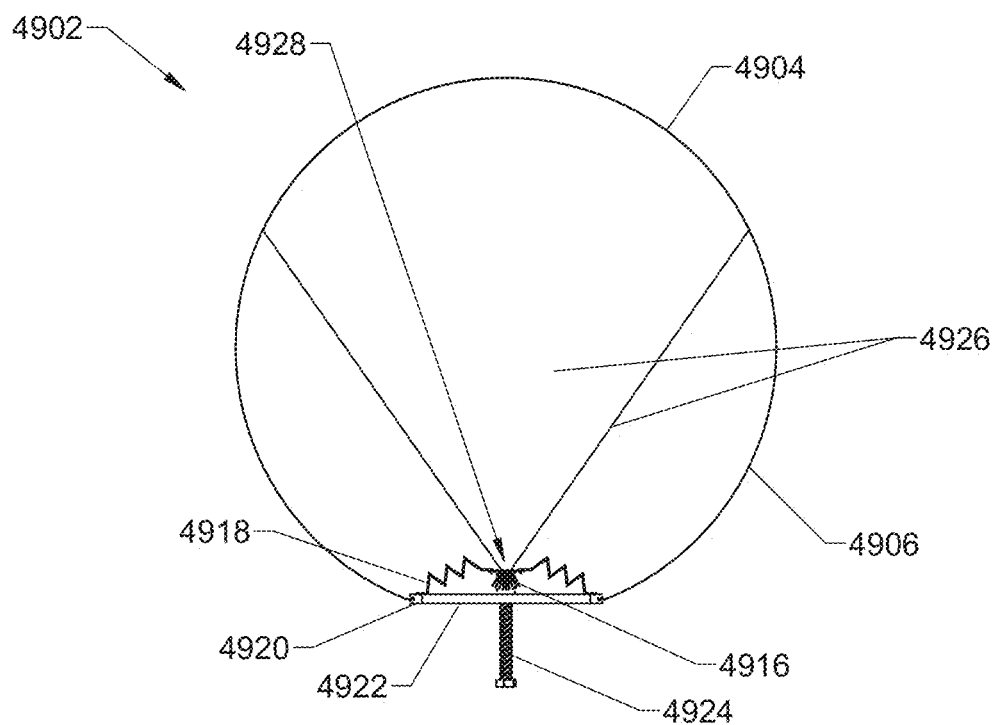
Figure 49D:
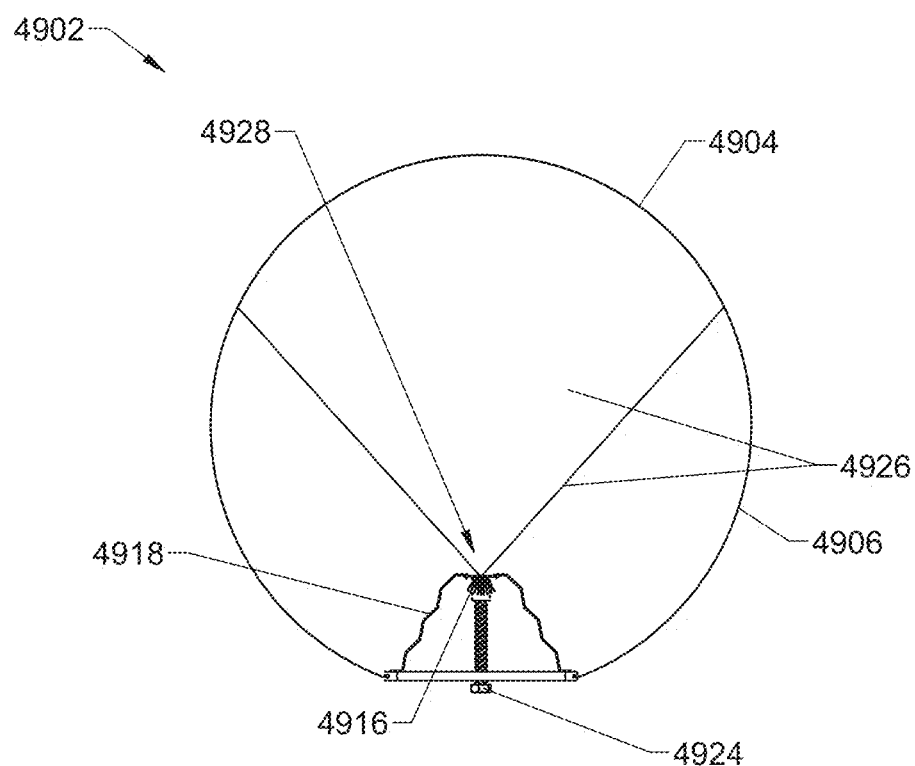

FIGS. 49C and 49D show cross section views of the inflated concentrator of system 4902 in different states. A volume 4926 containing all the refracted light paths from refractive film 4904 is shown, along with the area of tightest focus 4928. FIG. 49C shows receiver 4916 at its most distant position from refractive film 4904. FIG. 49D shows receiver 4916 at its closest position to refractive film 4904.

Figure 49E:
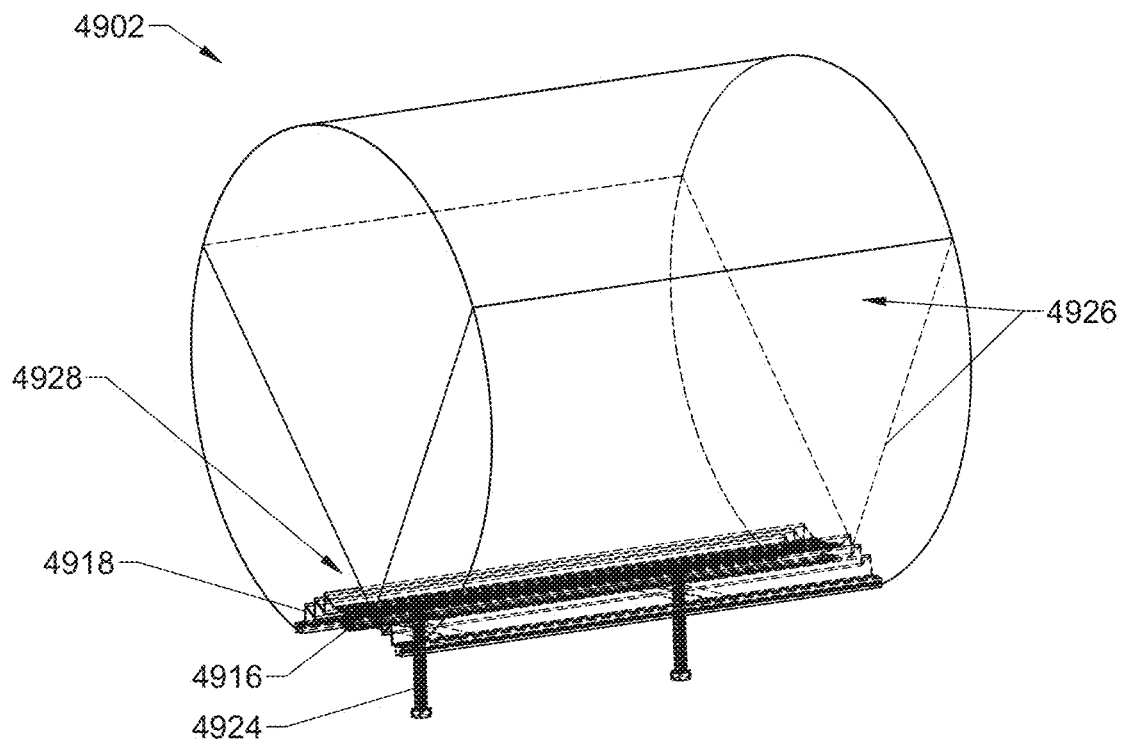
FIGS. 49E and 49F show isometric views with different tracking positions of the solar concentrator system of FIGS. 49A-49D.
Figure 49F:
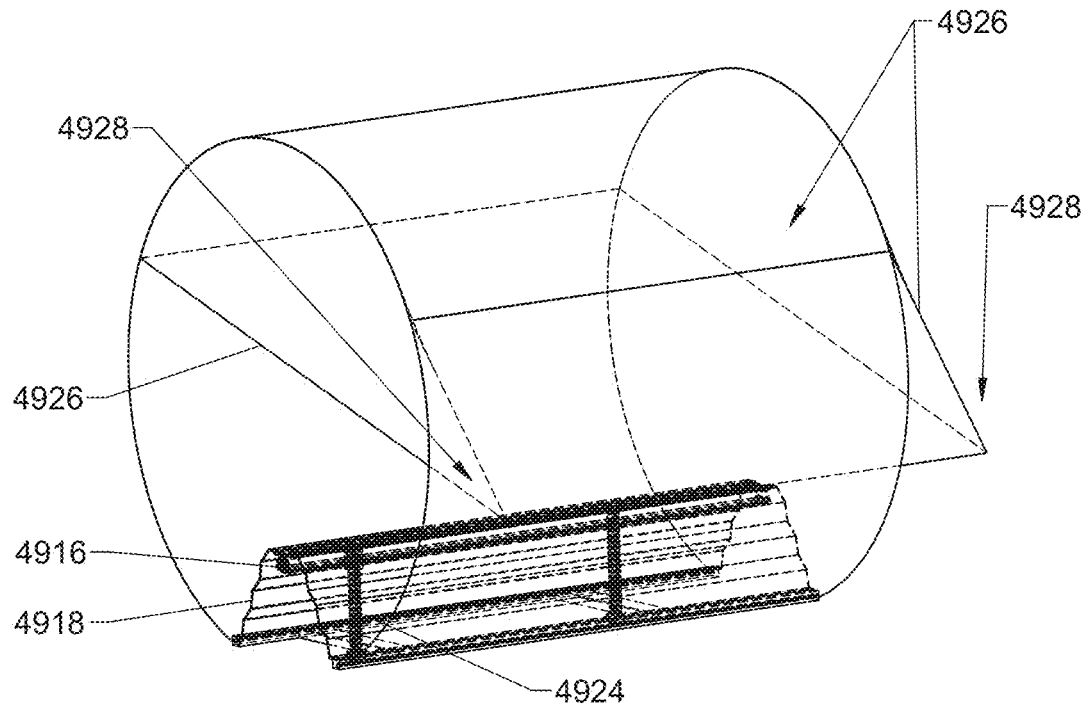

FIGS. 49E and 49F show isometric views of the same receiver positions shown in FIGS. 49C and 49D respectively. FIG. 49E represents the direction of refracted rays and the correspondingly defined volume 4926 that occur when incident light strikes concentrator system 4902 in a direction normal to the cylinder axis. Receiver 4916 is in a corresponding position coincident with the tightest region of focus 4928 in volume 4926. FIG. 49F shows what happens to the shape of volume 4926 and the location of region of focus 4928 when incident light is not normal to the axis of the cylinder, or is arriving at a skew angle. This would happen to some degree most of the time because with only one axis of rotation 4910 (see FIG. 49A) which in this particular version of the system would allow the system to track the sun's elevation angle in the sky, the sun's varying azimuth position would generally cause light to arrive at the refractive film with some non-normal angle with respect to the tubular concentrator axis. The case of light arriving exactly normal to the cylinder axis would happen instantaneously only once per day. Note that the skewed shape of volume 4926 in FIG. 49F would tend to suggest that the active length of the primary optic (film 4904) be longer than the active portion of receiver 4916. While not needed, such an arrangement would prevent ends of the active portion of receiver 4916 from "going dark", i.e. having some cells illuminated while others are not.

Figure 50A:
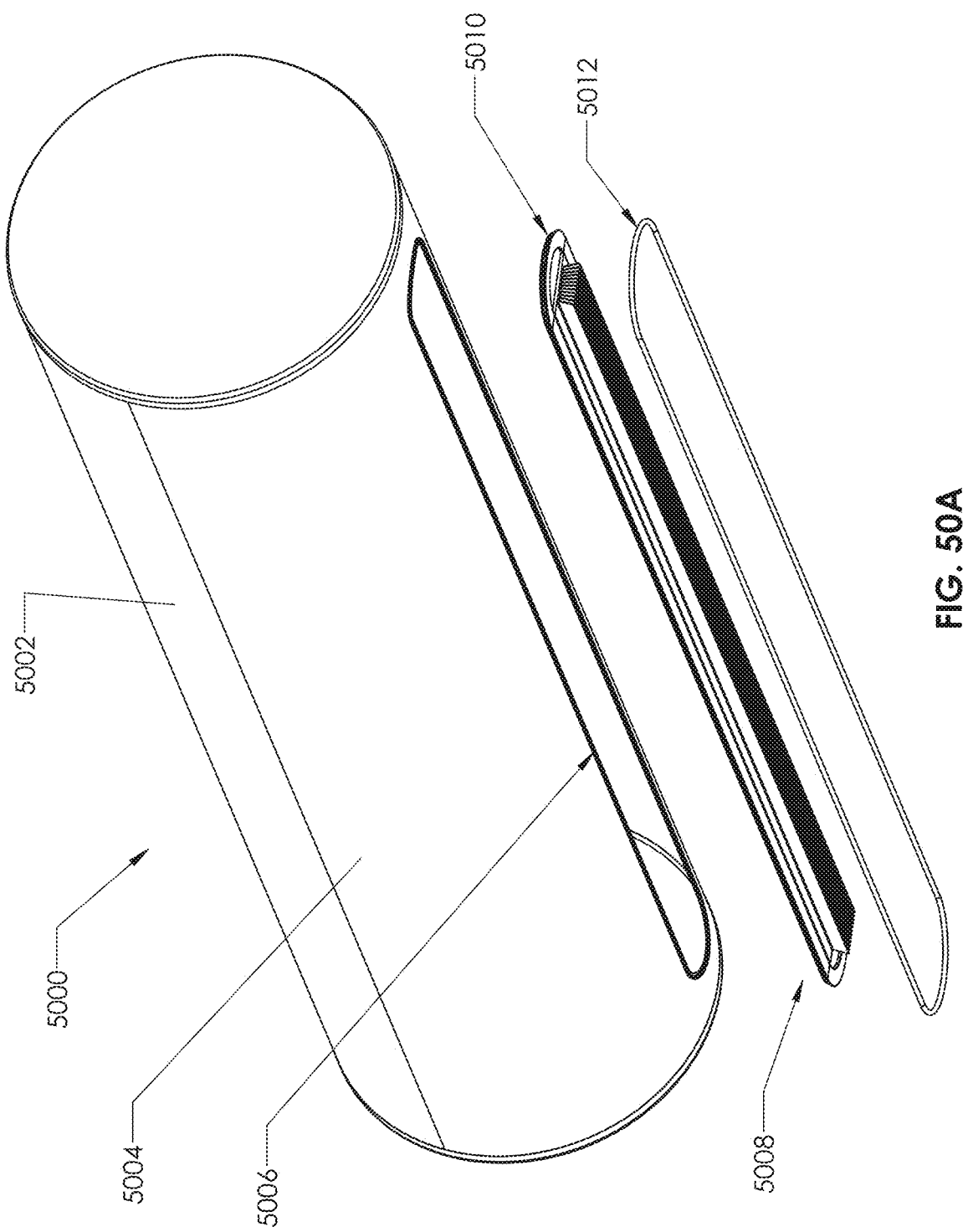
FIG. 50A-50E illustrate another method of attaching an inflatable tubular concentrator to a receiver heat sink and sealing its ends according to an embodiment of the present invention.
Figure 50B:
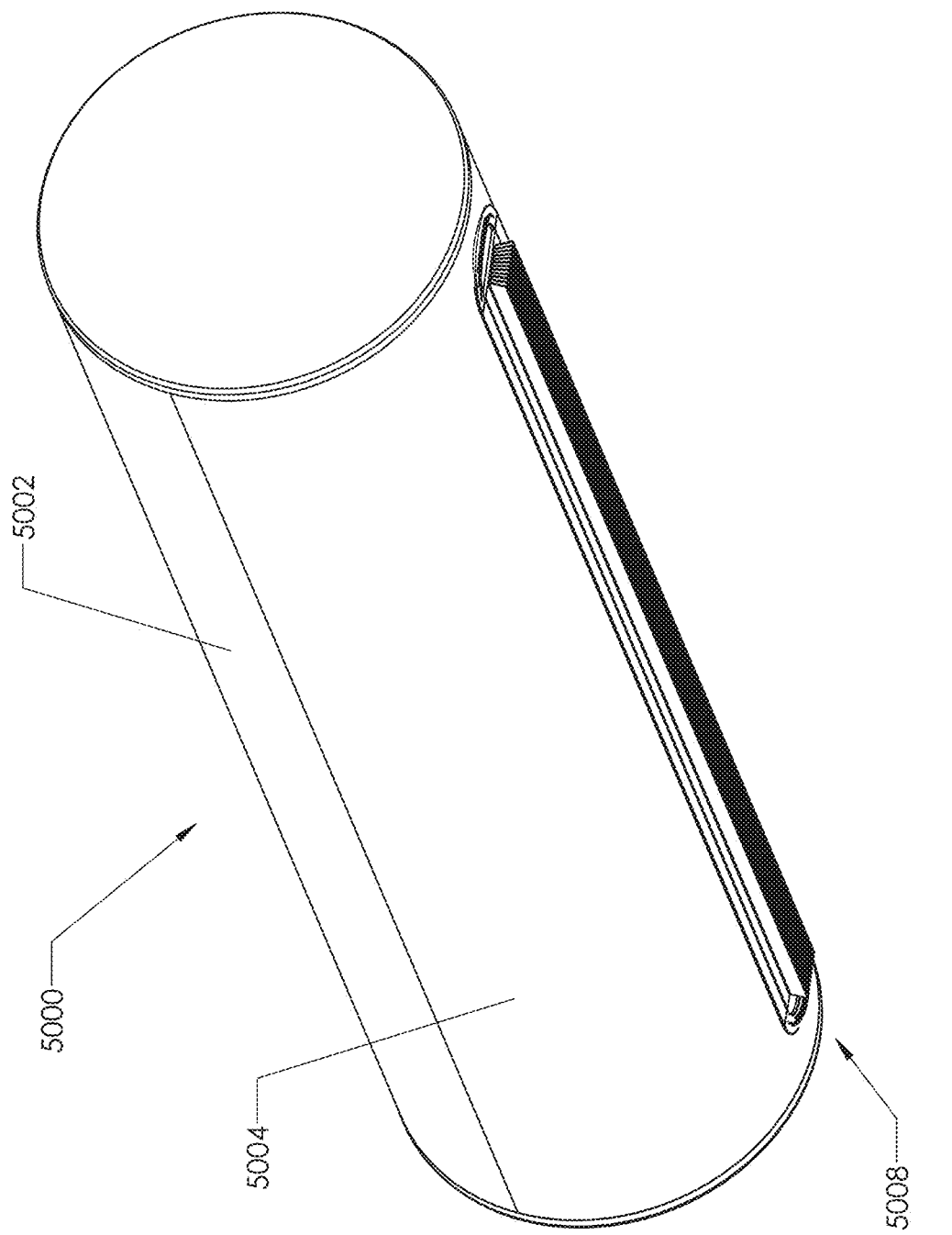
Figure 50C:
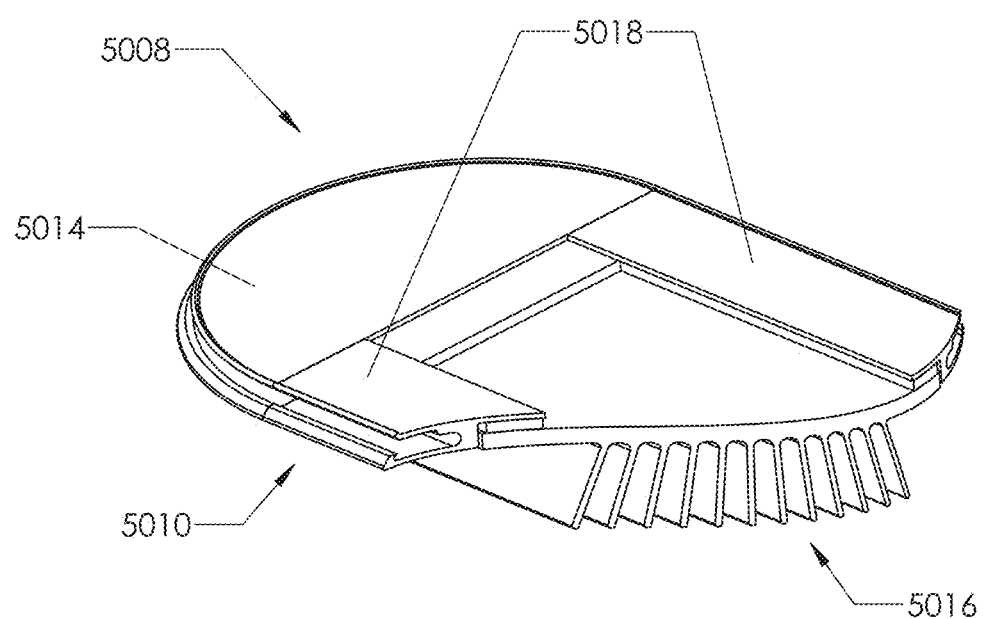
Figure 50D:
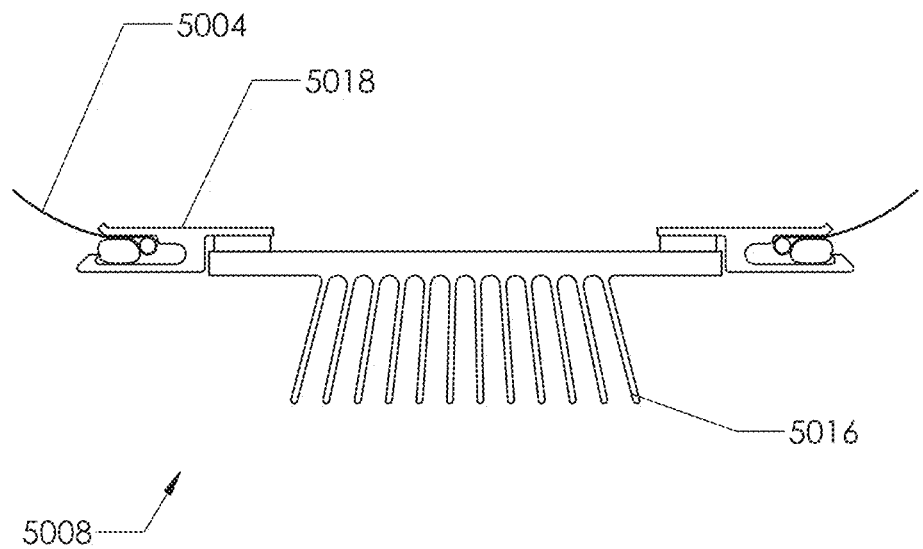
Figure 50E:
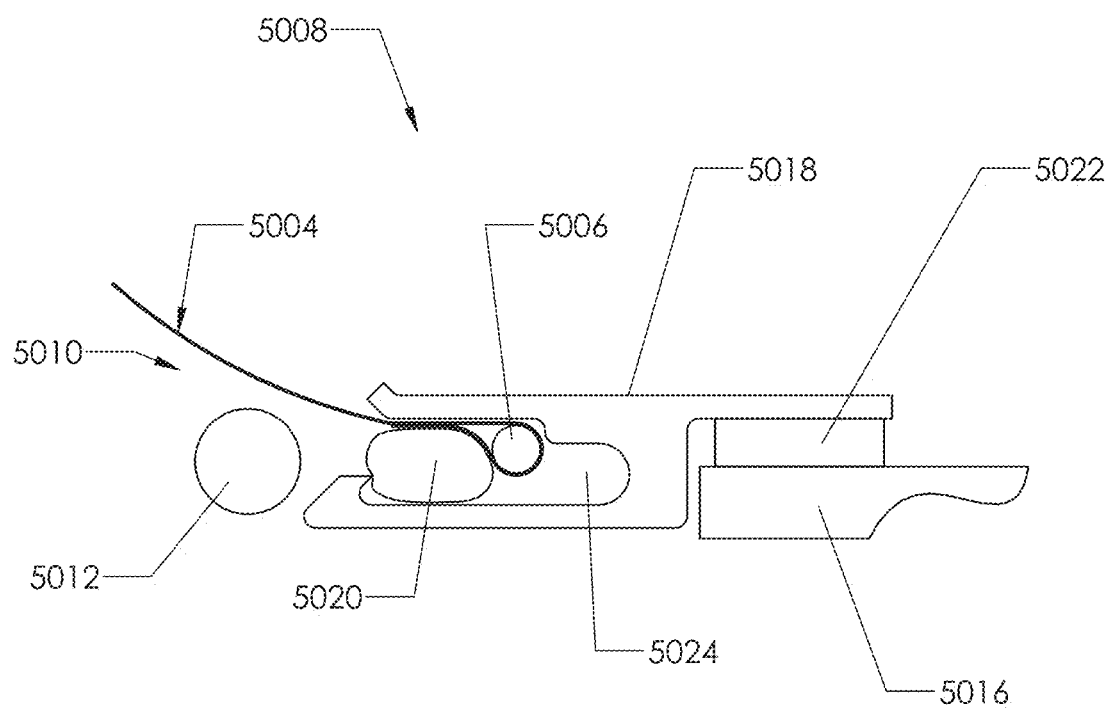

FIGS. 50A-50E show another solar concentrator construction according to an embodiment of the present invention. FIG. 50A shows an exploded or pre-assembly view of some of the components of a solar concentrator assembly 5000. An optical front film 5002 is joined to one or more side film(s) 5004. An anchor bead 5006 lines the perimeter of a cutout in side film 5004. During assembly, anchor bead 5006 serves to retain film 5004 on a receiver assembly 5008. Receiver 5008 has a retaining groove 5010 into which anchor bead 5006 fits. Anchor bead 5006 is held in place by retainer band 5012. Retainer band 5012 wedges into retaining groove 5012. FIG. 50B shows an assembled configuration of concentrator 5000. Films 5002 and 5004 are secured to receiver 5008. FIG. 50C shows a partial cutaway view of one end of receiver assembly 5008. A heat sink 5016 supports film retainers 5018 and round ends 5014. Both film retainers 5018 and ends 5014 contain retaining groove 5010. Ends 5014 have a rounded shape so that groove 5010 can be continuous all the way around receiver 5008. FIG. 50D shows a partial cross section view of receiver 5008. Film 5004 is retained in film retainer 5018. Heat sink 5016 provides structural support to the assembly. FIG. 50E shows a close-up partial cross section view of one side of receiver 5008. Film 5004 is held in film retainer 5018 via bead 5006. Bead 5006 is held in retaining groove 5010 by deformed retaining band 5020 which gets deformed during installation. Retaining band 5012 shows the shape of the retaining band before installation. Note that the shape of retaining band 5012 may be circular or square or some other shape. Retaining band 5012 may be made of rubber or other elastomer, or some other material that can be deformed during installation. An inner groove 5024 provides extra space where bead 5006 can move while the other side of the bead and films is being pulled over the other side of the receiver during installation. Heat sink 5016 may be separated from film retainer 5018 by an insulating material 5022 in order to limit heat transfer from heat sink 5016 to film retainer 5018.

Figure 51A:
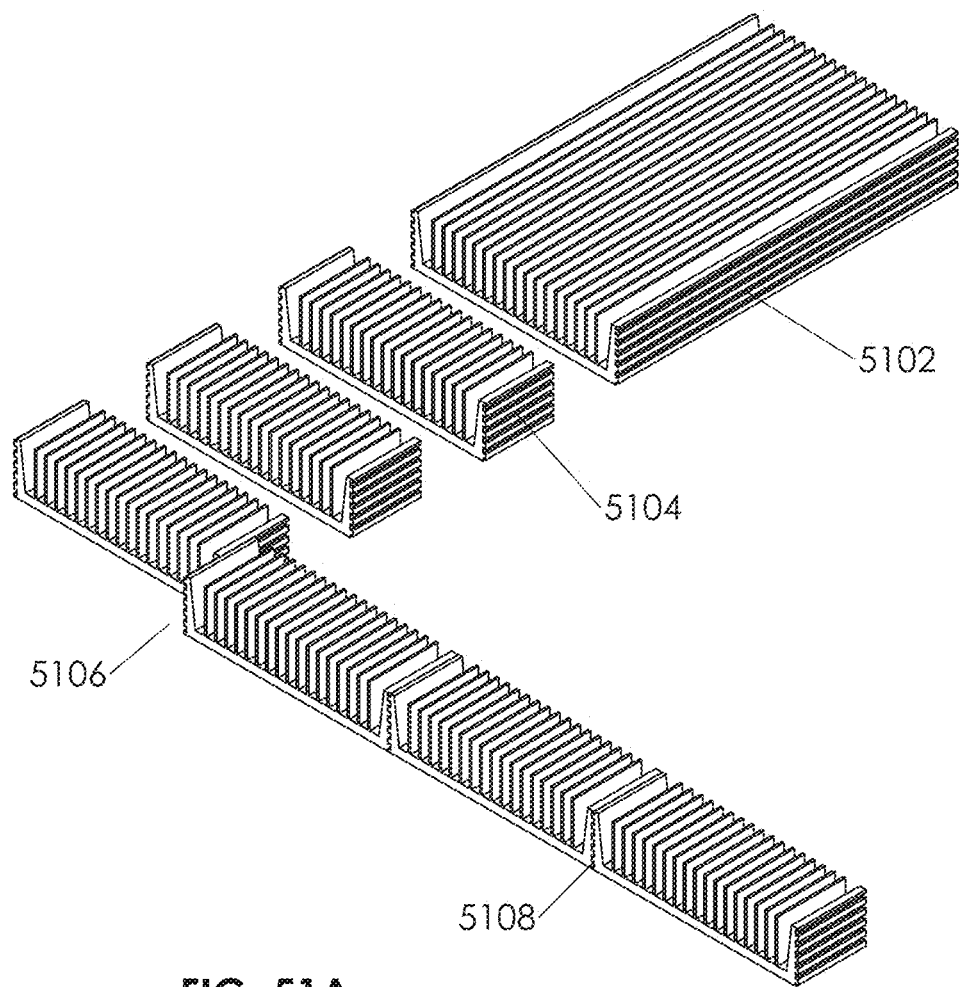
FIGS. 51A and 51B show a method for creating a heat sink with transverse fins according to an embodiment of the present invention.
Figure 51B:
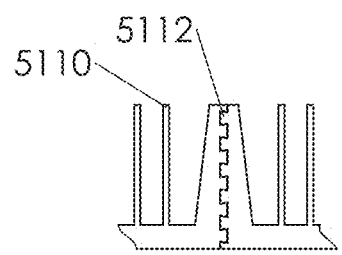

FIGS. 51A and 51B show another method for creating a heat sink with transverse fins according to an embodiment of the present invention. FIG. 51A shows how an extrusion of heat sink material 5102 may be cut perpendicular to its length into sections 5104. Sections 5104 may be re-joined together perpendicular to their original orientation at dovetail joints 5106 to form a heat sink of arbitrary length 5108 with fins that are perpendicular to the length of heat sink 5108. Having fins perpendicular to the length can increase heat transfer effectiveness in many circumstances. FIG. 51B shows a partial cross section view of a similar heat sink dovetail joint 5112. The cross section of fins 5110 is shown more clearly in this view.

Minimizing the levelized cost of energy depends heavily on the choice of film material. One form of polymer which may be suitable for use as the refractive film is polyester, examples of which include but are not limited to polyethylene terephthalate (PET) and similar or derivative polyesters such as polyethylene napthalate (PEN), or polyesters made from isophthalic acid, or other diols such as but not limited to butyl, 2,2,4,4 tetramethylcyclobutyl or cyclohexane. Polyethylene terephthalate (PET) is good material for solar optic applications contrary to conventional belief PET is the least expensive film known for the elastic modulus. The energy to break per unit thickness for PET is well over an order of magnitude higher than any other commodity polymer (with the possible exception of ionomer), thus resulting in hail resistance that is orders of magnitude better than acrylics. Third, PET is one of the most dimensionally stable polymers with respect to creep, temperature, coefficient of thermal expansion and water absorption. Typically, PET has a coefficient to thermal expansion as low as 18-20 ppm/C, which is very close to common structural metals such as aluminum (~20-25 ppm/C) and less expensive steels (~10-20 ppm/C), and a factor of 2-3× less than typical polymers. This is an important consideration for long structures. In the present embodiment, for example, the tubes are 23 ft. long. Even when the outside temperature is about 45° C., which is about 23° C. above design reference temperature, for PET, with a difference of less than 5 ppm/C compared to an Al heat sink, this amounts a differential expansion of only 0.16 inches from neutral axis (length 11.5 feet). A typical polymer other than PET will have a differential expansion of about 30 ppm from Al, and hence a differential expansion of nearly 1 inch under a similar scenario. Equilibrium water absorption is on the order of 1-2%, whereas acrylics are more on the order of 2-4%. While polymers typically have a range of properties such that an "acrylic" can match PET in one particular property, it is clear that PET is a superior material for the price when considering weatherizable optical elements. Lastly PET is inexpensive enough such that replacement of the film with time is a practical solution. PET-based optics allow one to spend less up front, and create an advantage due to the lower net-present-value (NPV) of future film replacement costs.

Conventionally, PET has been regarded as generally a poor choice for refractive optics application because PET has a high index of refraction, high wavelength dispersion, and high hydrolysis and photolysis conditions. However, using the techniques described herein it is possible to use PET for refractive optic applications. This has never been accomplished previously and all conventional literature regarding PET teaches away from using PET in refractive optics.

Figure 52A:
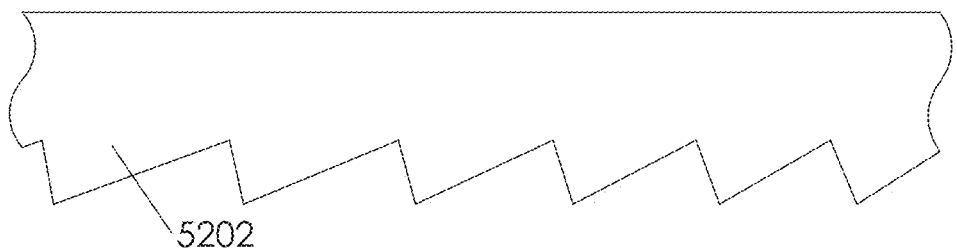
FIG. 52A-52C show several options for materials, construction and geometric features of films for use in refractive optical elements according to an embodiment of the present invention.

FIG. 52A shows a cross-section of an inflatable refractive optics film 5202 for CPV according to an embodiment of the present invention. In this figure, the film is monolithic and thus the photolysis resistance must be within the PET material itself since the PET faces the sun. In addition, the embossed pattern must be embossed within the PET material. A typical thickness of bulk PET material in this case would be 0.05 mm, while thickness between 0.012 mm and 20 mm would be possible.

Figure 52B:
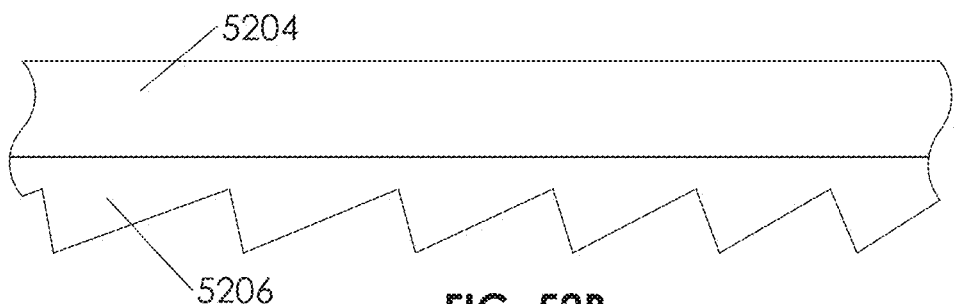

FIG. 52B shows a different configuration where the embossed pattern is made in a layer of acrylic type material 5206 which is part of a laminate with a layer of PET 5204, according to another embodiment of the present invention. In this embodiment, the reflection loss exiting the prism drops from about 5.5% to about 4% due to the lower index of the acrylic layer 5206, and the wavelength dispersion problem is minimized as the photons are largely refracted between air and acrylic vs. air and PET. In this configuration, the thickness of the acrylic material 5206 would be on the order of the thickness of the PET as long as the modulus of the acrylic was substantially less than that of the PET. If the acrylic modulus were high (½ to 1× the modulus of PET), then it may be desirable to make the acrylic thinner to prevent the dimensional instabilities of the acrylic from altering the shape and dimensional stability of the PET.

Choosing thicknesses of the acrylic and PET layers is non-trivial. In general, the acrylic thickness can be slightly larger than the embossing depth. Acrylic thicknesses of 1.5 to 2 times the embossing depth are typical. For a refractive optic design, diffraction effects will start to occur that potentially create losses by misdirecting light when the embossing depth and/or acrylic layer is thinner than about 0.03 mm, so for a purely refractive design, one would tend to choose an acrylic layer thickness that is as thin as possible (to minimize cost for example) but thick enough so that unwanted diffraction does not occur. However, it is also possible to create sophisticated diffractive optic designs that use diffraction to concentrate light and therefore are able to use shallower embossing patterns and a correspondingly thinner layer of acrylic. Using the thinnest practical layer of acrylic will generally create the least expensive and most dimensionally stable films. The acrylic may also include additives to remove unwanted portions of the solar spectrum; those that are not converted to electricity by the cells. For example, for a silicon receiver, the acrylic may include absorbers that absorb radiation above 1100 nm, thereby keep the heat off of the receiver where it can reduce the efficiency of the cells. The acrylic can be embossed directly on the PET, or can be embossed separately and laminated to the PET in an additional step.

Figure 52C:
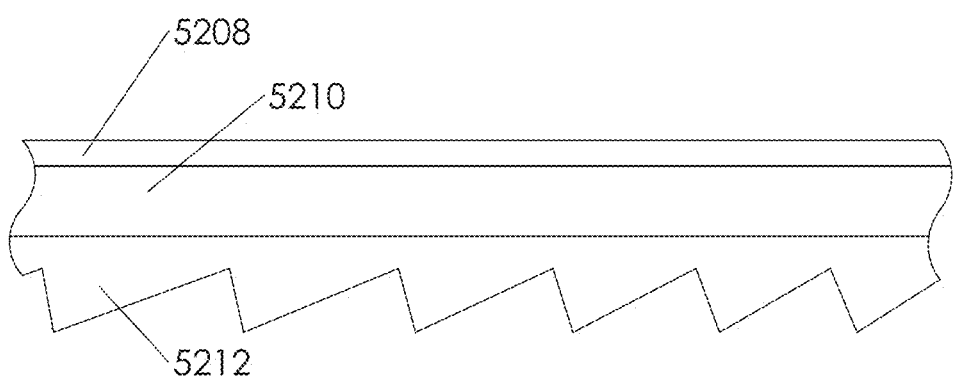

FIG. 52C shows a further optimized configuration. In this figure, a fluorinated, silicone or otherwise radiation resistant material coating 5208 is coated on top of a PET layer 5210, which in turn is on top of the embossed structures in an acrylic layer 5212. There are two major advantages to this structure. First, the UV absorbers may be placed within the radiation resistant coating 5208, which can eliminate the photolysis of the PET altogether. Absorbed energy in the thin coating 5208 can be more easily directed toward heat or toward less damaging mechanisms if the polymer itself is not susceptible to radiolyis. Second fluoropolymers in particular have low indices of refraction, on the order of 1.3-1.4, lowering the overall reflection loss of the new front surface of coating 5208. In addition, embossing or other shaping of the front film may be used for the purposes of refracting light, or may be used for the purposes of lowering the reflection even more such as the known "moth's eye" structure anti-reflection coating. Hence, a coating that is thick enough to contain enough UV absorber to not allow passage of light below 390 nm, but also capable of handling the absorber without being hazy would be preferred. Other metrics of the coating may include abrasion resistance, oxidation resistance from either water, oxygen, ozone or the like. A typical coating may be as thin as 0.001 mm to as thick as 1 mm, but most preferably between 0.003 mm and 0.015 mm. The optimal coating thickness is dependent on the lifetime that that the coating imparts vs. the cost of the coating and is a complex trade-off with the time value of money and labor costs, etc.

The strength, dimensional stability, and cost of PET-based materials makes them attractive materials for inflated and replaceable optics for CPV applications. A thin, acrylic-type material for the actively shaped or embossed refracting optic layer may be beneficial to improve performance. The use of an optional weather resistant coating can keep the UV photons from reaching and damaging the PET material. The materials mentioned above can be used in conjunction with or in addition to the materials mentioned herein.

Figure 53A:
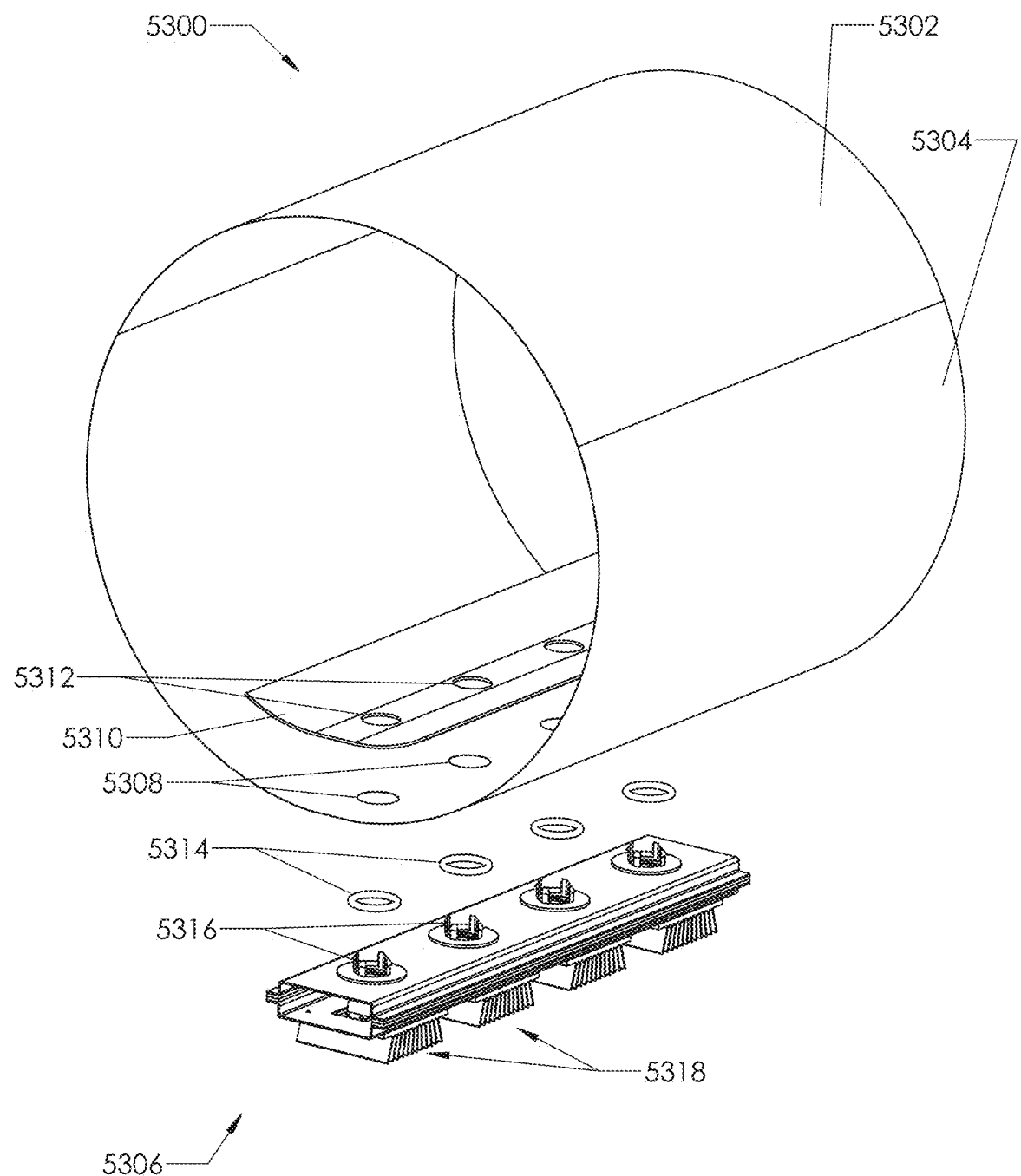
FIGS. 53A-53C illustrate a solar concentrator system according to yet another embodiment of the present invention.
Figure 53B:
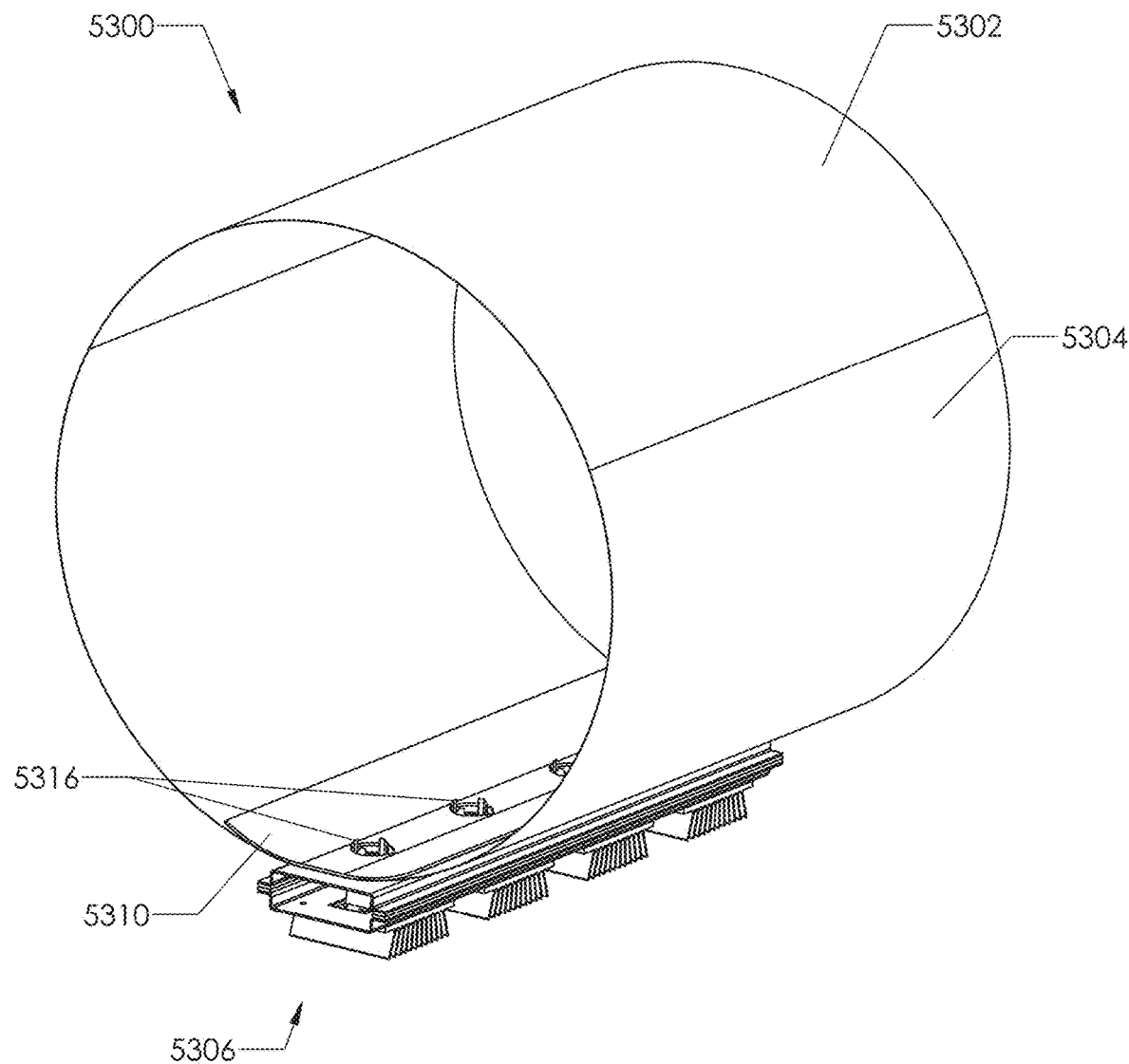
Figure 53C:
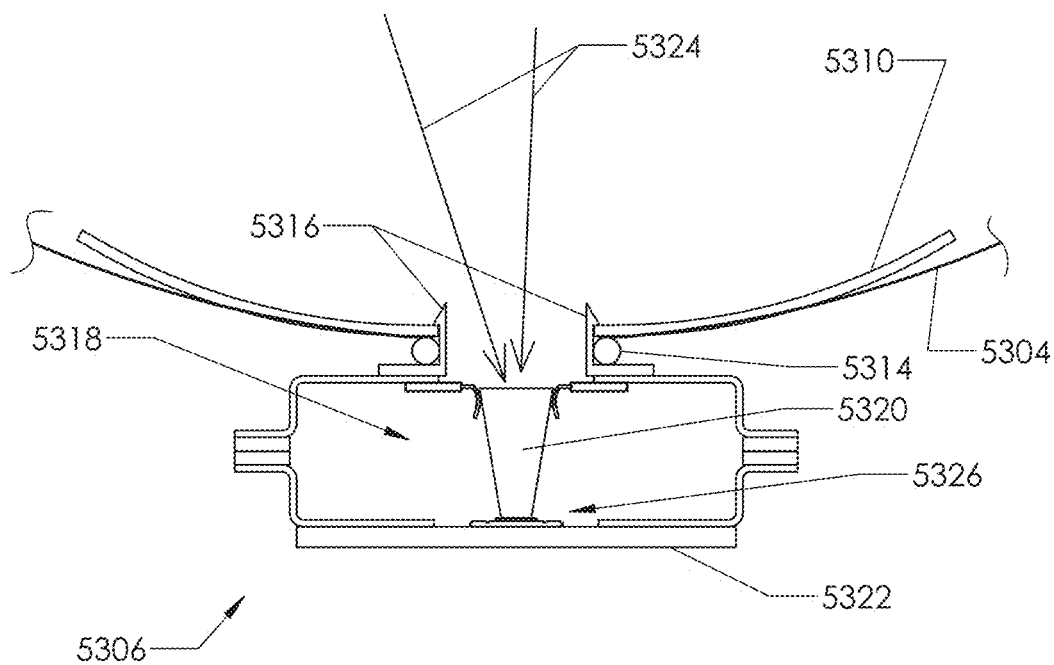

FIGS. 53A-53C show another solar concentrator and receiver system. FIG. 53A shows an exploded view of a partial length of an inflated solar concentrator 5300 and receiver assembly 5306. The ends of the inflated concentrator 5300 and receiver 5306 have been removed for clarity. Inflated concentrator 5300 includes an optical film 5302 and a back film 5304. Back film 5304 has one or more holes 5308. An inner plate 5310 has retaining holes 5312. O-rings 5314 form a seal between film 5304 and receiver 5306 to limit the leak rate of inflation gas out of concentrator 5300. Receiver 5306 includes securing features 5316 which secure inner plate 5310 to receiver 5306 with film 5304 in between them. Securing features 5316 may be snap features, barbs, bayonet features, twist-lock features, threaded retainers, taper-lock members, retaining ring/groove members or other such feature or member that may serve to provide positive retention between inner plate 5310, film 5304, and receiver 5306. It may also be desirable to include spacers or thermal insulators (not shown) between film 5304 and inner plate 5310. Inner plate 5310 serves both to provide a rigid member for securing features 5316 to attach to or pull on and also it may serve to protect film 5304 from concentrated sunlight during planned or unplanned mis-pointing (i.e. times when concentrator 5300 is not perfectly pointing at the sun). Securing features 5316 pass through film holes 5308 and retaining holes 5312 in order to securely retain inner plate 5310. Holes 5308 and 5312 allow concentrated sunlight to reach individual cell assemblies 5318 on receiver 5306 without being impeded by film 5304 or inner plate 5310. Inflated concentrator 5300 and receiver 5306 may be shorter or longer than shown here. For example, a solar concentrator may use a version longer than shown here and may include more cell assemblies 5318 than shown here. In an embodiment, the solar concentrator may include just a single cell assembly. Securing features 5316 are latched onto inner plate 5310 which traps film 5304 and retains concentrator 5300 to receiver 5306. While the ends of concentrator 5300 and receiver 5306 are removed for clarity, these would be enclosed or sealed to limit the leak rate of gas out of concentrator 5300. In other related embodiments, cell assemblies similar to 5318 may attach to a film similar to 5304 independently and without other plates or receiver structures.

FIG. 53B shows the system of FIG. 53A now assembled with concentrator 5300 attached and sealed to receiver 5306. The ends of concentrator 5300 and receiver 5306 are removed for clarity, but these would be enclosed or sealed to limit the leak rate of gas out of concentrator 5300. FIG. 53C shows a partial cross section view of the system of FIG. 53A. This view more clearly shows how O-ring 5314 forms a seal between film 5304 and receiver assembly 5306. Securing features 5316 are shown latched onto inner plate 5310. Light rays 5324 are shown passing through plate 5310 and film 5304 to reach a secondary optic element 5320 which is part of cell assembly 5318. A solar cell 5326 may be located at the lower end of optic element 5320. Film 5304 is shown truncated for clarity. A heat sink 5322 is in thermal communication with cell 5326 to facilitate heat transfer from cell 5326 to the ambient air. This view also shows more clearly how inner plate 5310 can shield film 5304 from concentrated light due to mispointing or other phenomena.

There are several advantages of curved refractive optics described herein. The first is that the curved lens lowers the losses due to fabrication errors. Specifically, the shapes created by the radius of curvature of the diamond tool can be hidden in optically inactive areas created by the curve. This is not possible with flat Fresnel lenses. The second advantage is that it keeps the light away from the non-optical draft faces. The third advantage is that it improves the chromatic aberration problem. The fourth advantage is improved tolerance to displacement of the lens.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A solar concentrator comprising:
a film configured to refract sunlight and comprising a first light transmitting layer and a second light transmitting layer, the film forming a cylindrical shape enclosing a cavity, the cylindrical shape defining a cylindrical axis and having a cylindrical shape diameter perpendicular to the cylindrical axis, the second light transmitting layer being disposed between the first light transmitting layer and the cavity, the second light transmitting layer including a cylindrical refractive region comprising a first end refractive region, a central refractive region, and a second end refractive region; the first end refractive region extending along the cylindrical axis between a first end of the refractive region to a first intermediate plane perpendicular to the cylindrical axis, the central refractive region extending along the cylindrical axis between the first intermediate plane and a second intermediate plane perpendicular to the cylindrical axis, the second end refractive region extending along the cylindrical axis between the second intermediate plane and a second end of the refractive region, wherein each of the first and second end refractive regions is configured to concentrate sunlight incident on the respective end refractive region to a focus region within the cavity and disposed between the first and second intermediate planes, the first and second intermediate planes being separated by a distance in a range of 40 percent to 70 percent of a length of the refractive region parallel to the cylindrical axis, the focus region having a focus region width perpendicular to the cylindrical axis less than the cylindrical shape diameter;
an inflation gas at least partially filling the cavity so as to maintain the cylindrical shape of the film; and
a solar receiver located inside the cavity and at the focus region, the solar receiver comprising at least one of a thermal energy receiver and a photovoltaic receiver, wherein the solar receiver is disposed between the first and second intermediate planes,
wherein the cylindrical refractive region includes tiled refractive prism groups, wherein one or more of the tiled refractive prism groups is disposed between an adjacent two of the solar receivers, and wherein each of the tiled refractive prism groups disposed between an adjacent two of the solar receivers is configured to refract sunlight onto one of the adjacent two of the solar receivers when the cylindrical axis is aligned perpendicular to a direction of incidence of the sunlight, wherein each of the tiled refractive prism groups comprise prism grooves; and wherein the prism grooves of each of two or more of the tiled refractive prism groups are misaligned with the prism grooves of an adjacent one or more of the tiled refractive prism group.

2. The solar concentrator of claim 1 wherein the solar concentrator comprises the photovoltaic receiver.

3. The solar concentrator of claim 1 wherein the solar receiver comprises the thermal energy receiver.

4. The solar concentrator of claim 1 wherein:
the refractive region comprises prisms configured to refract the sunlight;
the prisms are arranged in two or more groups of prisms; and
each of the prisms comprise one or more grooves, wherein each of the grooves has a depth.

5. The solar concentrator of claim 4 wherein the two or more groups of prisms are arranged symmetrically within the refractive region.

6. The solar concentrator of claim 1 wherein the refractive region is about 30% to 50% of a total surface area of the cylindrical shape.

7. The solar concentrator of claim 1 wherein the tiles include a first tile having a first surface area and a second tile having a second surface area, and wherein the first surface area of the first tile is larger than the second surface area of the second tile.

8. The solar concentrator of claim 7 wherein the first tile is located at a first distance from a center of the refractive region and the second tile is located at a second distance from the center of the refractive region, and wherein the first distance is less than the second distance.

9. The solar concentrator of claim 1 wherein the film comprises one or more of PET, acrylic, Polyolefins, Ionomer, or Flourinated polymers.

10. The solar concentrator of claim 1 wherein a portion of the film comprises a metal.

11. The solar concentrator of claim 1 wherein the solar receiver comprises the photovoltaic receiver, the photovoltaic receiver comprising an active element having a width, wherein the active element is disposed perpendicular to the cylindrical axis and the width of the active element is less than 15% of the cylindrical shape diameter.

12. The solar concentrator of claim 1, wherein:
the first layer in the film comprises Polyethylene terephthalate (PET);
the second layer comprises acrylic, fluorinated acrylic, ionomer, or other fluorinated polymer; and
a thickness of the second layer ranges between 0.001 mm and 0.1 mm.

13. The solar concentrator of claim 12, further comprising a plurality of grooves formed in the second layer.

14. The solar concentrator of claim 1, wherein the first layer comprises fluorinated polymer or silicone.

15. The solar concentrator of claim 14, wherein the first layer further comprises an ultraviolet (UV) radiation absorbing material.

16. The solar concentrator of claim 15, wherein the UV radiation absorbing material comprises fluorinated acrylic.

17. The solar concentrator of claim 15, wherein the film further comprises a third layer disposed between the second layer and the first layer, the third layer configured to block ultraviolet radiation from reaching the second layer.

18. The solar concentrator of claim 15, wherein the film further comprises a third layer disposed between the second layer and the first layer, the third layer configured to prevent migration of chemical compounds between the first layer and the second layer.

19. The solar concentrator of claim 12, wherein the PET comprises an ultraviolet light absorber material as an additive.

20. The solar concentrator of claim 1, wherein the second layer comprises a metal.

21. A solar concentrator comprising:
a film configured to refract sunlight and comprising a first light transmitting layer and a second light transmitting layer, the film forming a cylindrical shape enclosing a cavity, the cylindrical shape defining a cylindrical axis and having a cylindrical shape diameter perpendicular to the cylindrical axis, the second light transmitting layer being disposed between the first light transmitting layer and the cavity, the second light transmitting layer including a cylindrical refractive region;
an inflation gas at least partially filling the cavity so as to maintain the cylindrical shape of the film; and
solar receivers located inside the cavity, each of the solar receivers being separated from one or more of the other solar receivers by a respective intervening distance parallel to the cylindrical axis,
wherein the cylindrical refractive region includes tiled refractive prism groups, wherein one or more of the tiled refractive prism groups is disposed between an adjacent two of the solar receivers, and wherein each of the tiled refractive prism groups disposed between an adjacent two of the solar receivers is configured to refract sunlight onto one of the adjacent two of the solar receivers when the cylindrical axis is aligned perpendicular to a direction of incidence of the sunlight, wherein the tiled refractive prism groups comprise a first tiled refractive prism group and a second tiled refractive prism group, wherein the first tiled refractive prism group covers a first surface area of the cylindrical shape, wherein the second tiled refractive prism group covers a second surface area of the cylindrical shape; and wherein the first surface area is greater than the second surface area.

22. The solar concentrator of claim 21, wherein:
each of the tiled refractive prism groups comprise prism grooves; and
the prism grooves of each of two or more of the tiled refractive prism groups are misaligned with the prism grooves of an adjacent one or more of the tiled refractive prism groups.

23. The solar concentrator of claim 1 wherein:
- the tiled refractive prism groups comprise a first tiled refractive prism group and a second tiled refractive prism group;
- the first tiled refractive prism group covers a first surface area of the cylindrical shape;
- the second tiled refractive prism group covers a second surface area of the cylindrical shape; and
- the first surface area is greater than the second surface area.

* * * * *